US012359120B2

(12) United States Patent
Ahn et al.

(10) Patent No.: US 12,359,120 B2
(45) Date of Patent: Jul. 15, 2025

(54) ORGANOMETALLIC COMPOUND, ORGANIC LIGHT-EMITTING DEVICE INCLUDING ORGANOMETALLIC COMPOUND, AND APPARATUS INCLUDING ORGANOMETALLIC COMPOUND

(71) Applicant: Samsung Display Co., Ltd., Yongin-si (KR)

(72) Inventors: Eunsoo Ahn, Yongin-si (KR); Soobyung Ko, Yongin-si (KR); Hyunjung Lee, Yongin-si (KR); Mina Jeon, Yongin-si (KR); Sungbum Kim, Yongin-si (KR); Haejin Kim, Yongin-si (KR); Sujin Shin, Yongin-si (KR); Eunyoung Lee, Yongin-si (KR); Jaesung Lee, Yongin-si (KR); Junghoon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 525 days.

(21) Appl. No.: 16/714,608

(22) Filed: Dec. 13, 2019

(65) Prior Publication Data

US 2020/0350505 A1 Nov. 5, 2020

(30) Foreign Application Priority Data

May 3, 2019 (KR) ........................ 10-2019-0052377

(51) Int. Cl.

*C09K 11/06* (2006.01)
*C07F 15/00* (2006.01)

(Continued)

(52) U.S. Cl.

CPC .......... *C09K 11/06* (2013.01); *C07F 15/0086* (2013.01); *H10K 85/346* (2023.02);

(Continued)

(58) Field of Classification Search

CPC ............ H01L 51/0087; C07F 15/0086; C09K 2211/1029; C09K 2211/1044; C09K 2211/185; H10K 85/346

See application file for complete search history.

(56) References Cited

U.S. PATENT DOCUMENTS 9,224,963 B2 12/2015 Li et al.
9,318,725 B2 4/2016 Li (Continued)

FOREIGN PATENT DOCUMENTS

CN 107501335 A * 12/2017
JP 2009-267244 A 11/2009

(Continued)

OTHER PUBLICATIONS

Machine Translation of CN107501335A (Year: 2017).*

(Continued)

*Primary Examiner* — Jenna N Chandhok

(74) *Attorney, Agent, or Firm* — Womble Bond Dickinson (US) LLP

(57) ABSTRACT

Provided are an organometallic compound represented by Formula 1, wherein in $L_{11}$ is a ligand represented by Formula 1-1, an organic light-emitting device including the organometallic compound, and an apparatus including the organometallic compound. The organic light-emitting device includes a first electrode; a second electrode; and an organic layer between the first electrode and the second electrode and including an emission layer, wherein the organic layer includes the organometallic compound.

$$M_{11}(L_{11})_{n11}(L_{12})_{n12} \quad \text{Formula 1}$$

(Continued)

Formula 1-1

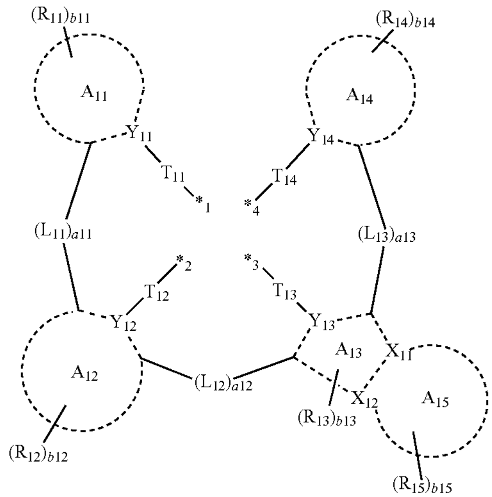

16 Claims, 2 Drawing Sheets

(51) Int. Cl.

| | |
|---|---|
| ***H10K 50/11*** | (2023.01) |
| ***H10K 50/15*** | (2023.01) |
| ***H10K 50/16*** | (2023.01) |
| ***H10K 50/17*** | (2023.01) |
| ***H10K 50/18*** | (2023.01) |
| ***H10K 85/30*** | (2023.01) |
| ***H10K 101/10*** | (2023.01) |

(52) U.S. Cl.

CPC ................. *C09K 2211/1029* (2013.01); *C09K 2211/1044* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 2101/10* (2023.02)

(56) References Cited

U.S. PATENT DOCUMENTS

| | | | | |
|---|---|---|---|---|
| 9,385,329 | B2 | 7/2016 | Li et al. | |
| 9,461,254 | B2 | 10/2016 | Tsai et al. | |
| 2013/0048963 | A1 | 2/2013 | Beers et al. | |
| 2014/0364605 | A1* | 12/2014 | Li | H10K 85/346 546/4 |
| 2015/0014659 | A1* | 1/2015 | Kim | C09K 11/06 546/4 |
| 2016/0133862 | A1 | 5/2016 | Li et al. | |
| 2018/0130964 | A1 | 5/2018 | Kim et al. | |
| 2018/0212163 | A1 | 7/2018 | Lin et al. | |
| 2019/0067601 | A1* | 2/2019 | Ji | H01L 51/0085 |
| 2019/0119312 | A1* | 4/2019 | Chen | C07F 15/0086 |

FOREIGN PATENT DOCUMENTS

| | | | |
|---|---|---|---|
| KR | 10-2014-0144152 | A | 12/2014 |
| KR | 10-2015-0007605 | A | 1/2015 |
| KR | 10-2015-0069309 | A | 6/2015 |
| KR | 10-2018-0050122 | A | 5/2018 |
| KR | 10-2018-0083811 | A | 7/2018 |

OTHER PUBLICATIONS

Liao, Kuan-Yu et al. "Pt(II) Metal Complexes Tailored With a Newly Designed Spiro Arranged Tetradetnate Ligand; Harnessing of Charge-Transfer Phosphorescence and Fabrication of Sky Blue and White OLEDs." Inorg. Chem 54.8 (2015): 4029-4038 (Year: 2015).*

Office Action for U.S. Appl. No. 16/742,066 dated Feb. 23, 2023, 12 pages.

U.S. Office Action for U.S. Appl. No. 16/742,066 dated Jul. 11, 2023, 13 pages.

US Notice of Allowance dated Oct. 11, 2023, issued in U.S. Appl. No. 16/742,066 (9 pages).

* cited by examiner

ORGANOMETALLIC COMPOUND, ORGANIC LIGHT-EMITTING DEVICE INCLUDING ORGANOMETALLIC COMPOUND, AND APPARATUS INCLUDING ORGANOMETALLIC COMPOUND

CROSS-REFERENCE TO RELATED APPLICATION

This application claims priority to and the benefit of Korean Patent Application No. 10-2019-0052377, filed on May 3, 2019, in the Korean Intellectual Property Office, the entire content of which is incorporated herein by reference.

BACKGROUND

1. Field

Embodiments of the present disclosure relate to an organometallic compound, an organic light-emitting device including the organometallic compound, and an apparatus including the organometallic compound.

2. Description of the Related Art

Organic light-emitting devices (OLEDs) are self-emissive devices that, as compared with devices of the related art, have wide viewing angles, high contrast ratios, and short response times, and excellent characteristics in terms of luminance, driving voltage, and response speed. In addition, OLEDs may produce full-color images.

OLEDs may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit (e.g., transition or relax) from an excited state to a ground state to thereby generate light.

SUMMARY

Provided are an organometallic compound, an organic light-emitting device including the organometallic compound, and an apparatus including the organometallic compound.

Additional aspects of embodiments will be set forth in part in the description which follows and, in part, will be apparent from the description, or may be learned by practice of the presented embodiments.

According to an aspect of an embodiment, an organometallic compound is represented by Formula 1:

$$M_{11}(L_{11})_{n11}(L_{12})_{n12} \qquad \text{Formula 1}$$

wherein, in Formula 1, $M_{11}$ may be selected from a first-row transition metal, a second-row transition metal, and a third-row transition metal, $L_{11}$ may be a ligand represented by Formula 1-1, $L_{12}$ may be selected from a monodentate ligand and a bidentate ligand, n11 may be 1, and n12 may be selected from 0, 1, and 2:

Formula 1-1

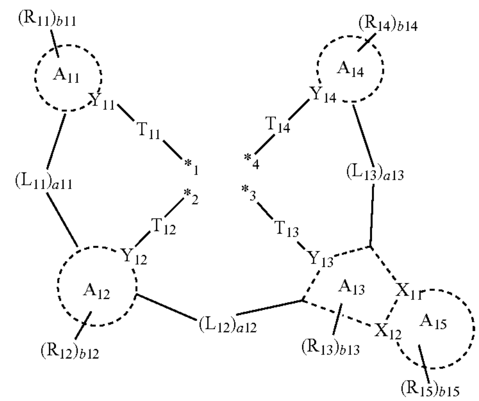

wherein, in Formula 1-1, $X_{11}$ and $X_{12}$ may each independently be N or C, provided that at least one selected from $X_{11}$ and $X_{12}$ may be N, $Y_{11}$ to $Y_{14}$ may each independently be N or C, $T_{11}$ to $T_{14}$ may each independently be selected from a single bond, *—O—*', *—S*', *—C($R_{16}$)($R_{17}$)—*', *—Si($R_{16}$)($R_{17}$)—*', *—B($R_{16}$)—*', *—N($R_{16}$)—*', and *—P($R_{16}$)—*', $L_{11}$ to $L_{13}$ may each independently be selected from *—O—*', *—S—*', *—C($R_{13}$)($R_{19}$)—*', *—C($R_{13}$)═*', *═C($R_{19}$)—*', *—C($R_{18}$)═C($R_{18}$)—*', *—C(═O)—*', *—C(═S)—*', *—C≡C—*', *—B($R_{13}$)—*', *—N($R_1$)—*', *—P($R_{18}$)—*', *—Si($R_{18}$)($R_{19}$)—*', *—P($R_{18}$)($R_{19}$)—*', and *—Ge($R_{18}$)($R_{19}$)—*', a11 to a13 may each independently be selected from 0, 1, 2, and 3, and when a11 is 0, $(L_{11})_{a11}$ may be a single bond, when a12 is 0, $(L_{12})_{a12}$ may be a single bond, and when a13 is 0, $(L_{13})_{a13}$ may be a single bond, $A_{11}$, $A_{12}$, and $A_{14}$ may each independently be selected from a $C_5$-$C_{60}$ carbocyclic group and a $C_1$-$C_{60}$ heterocyclic group, $A_{13}$ may be a 6-membered N-containing heterocyclic group, $A_{15}$ may be a 5-membered N-containing heterocyclic group, $R_1$ to $R_{19}$ may each independently be selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), and —P(═S)($Q_1$)($Q_2$), wherein two adjacent groups selected from $R_{11}$ to $R_{19}$ may optionally be bound to form a substituted or unsubstituted $C_5$-$C_{30}$ carbocyclic group or a substituted or unsubstituted $C_1$-$C_{30}$ heterocyclic group, and b11 to b15 may each independently be an integer from 1 to 10, and wherein $Q_1$ to $Q_3$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{60}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, a cyano group, a $C_1$-$C_{60}$ alkyl group, a phenyl group, and a biphenyl group, a $C_6$-$C_{60}$ aryl group substituted with at least one selected from deuterium, —F, a cyano group, a $C_1$-$C_{10}$ alkyl group, a phenyl group, and a biphenyl group, and a $C_1$-$C_{60}$ heteroaryl group substituted with at least one selected from deuterium, —F, a cyano group, a $C_1$-$C_{10}$ alkyl group, a phenyl group, and a biphenyl group, and

*1 to *4 may each indicate a binding site to $M_{11}$.

According to an aspect of another embodiment, an organic light-emitting device may include a first electrode; a second electrode; and an organic layer between the first electrode and the second electrode and including an emission layer, wherein the organic layer may include the organometallic compound.

According to one or more embodiments, an apparatus may include a thin-film transistor including a source electrode, a drain electrode, and an active layer; and the organic light-emitting device, wherein the first electrode of the organic light-emitting device may be electrically coupled to any one of the source electrode and the drain electrode of the thin-film transistor.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Figure 1:
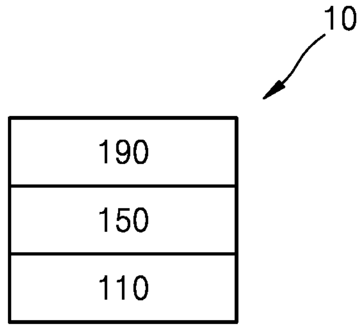
FIG. 1 illustrates a schematic cross-sectional view of an embodiment of an organic light-emitting device.

Reference will now be made in more detail to embodiments of the present disclosure, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described herein below, by referring to the figures, to explain aspects of embodiments. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, certain embodiments will be illustrated in the drawings and described in more detail in the written description. Effects and features of embodiments of the present disclosure, and a method of achieving the same, will be readily apparent by referring to example embodiments of the present disclosure with reference to the attached drawings. The subject matter of the present disclosure may, however, be embodied in many different forms and should not be construed as being limited to the embodiments set forth herein.

Hereinafter, the subject matter of the present disclosure will be described in more detail by explaining example embodiments of the present disclosure with reference to the attached drawings. Like reference numerals in the drawings denote like elements, and thus, duplicative description thereof will not be repeated.

In the embodiments described in the present specification, an expression used in the singular encompasses the expression of the plural, unless it has a clearly different meaning in the context.

In the present specification, it is to be understood that the terms such as "including," "having," and "comprising" are intended to indicate the existence of the features or components disclosed in the specification, and are not intended to preclude the possibility that one or more other features or components may be present or may be added.

It will be understood that when a layer, region, or component is referred to as being "on" or "onto" another layer, region, or component, it may be directly or indirectly formed over the other layer, region, or component. For example, intervening layers, regions, or components may be present.

Sizes of components in the drawings may be exaggerated for convenience of explanation. In other words, because sizes and thicknesses of components in the drawings may be arbitrarily illustrated for convenience of explanation, the following embodiments are not limited thereto.

The term "organic layer," as used herein, refers to a single layer and/or a plurality of layers between the first electrode and the second electrode in an organic light-emitting device. A material included in the "organic layer" is not limited to an organic material. For example, the "organic layer" may include an inorganic material.

An organometallic compound may be represented by Formula 1:

$$M_{11}(L_{11})_{n11}(L_{12})_{n12} \quad \text{Formula 1}$$

wherein, in Formula 1, $M_{11}$ may be selected from a first-row transition metal, a second-row transition metal, and a third-row transition metal.

For example, in Formula 1, $M_{11}$ may be selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm), but the present disclosure is not limited thereto.

In some embodiments, in Formula 1, $M_{11}$ may be selected from Pt, Pd, Cu, Ag, Au, Rh, Ir, Ru, and Os, but the present disclosure is not limited thereto.

In some embodiments, in Formula 1, $M_{11}$ may be selected from Pt, Pd, Cu, Ag, Au, Ru, and Os, but the present disclosure is not limited thereto.

In some embodiments, in Formula 1, $M_{11}$ may be selected from Pt, Pd, Ru, and Os, but the present disclosure is not limited thereto.

In Formula 1, 11 may be a ligand represented by Formula 1-1:

Formula 1-1

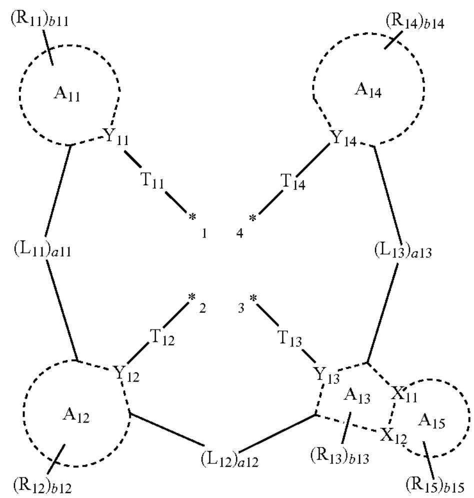

wherein, in Formula 1-1, $X_{11}$ and $X_{12}$ may each independently be N or C, provided that at least one selected from $X_{11}$ and $X_{12}$ may be N.

In some embodiments, in Formula 1-1, $X_{11}$ may be C, and $X_{12}$ may be N, but the present disclosure is not limited thereto.

In Formula 1-1, $Y_{11}$ to $Y_{14}$ may each independently be N or C.

In Formula 1-1, $T_{11}$ to $T_{14}$ may each independently be selected from a single bond, *—O—*', *—S—*', *—C($R_{16}$)($R_{17}$)—*', *—Si($R_{16}$)($R_{17}$)—*', *—B($R_{18}$)—*', *—N($R_{18}$)—*' and *—P($R_{18}$)—*'. $R_{16}$ and $R_{17}$ may respectively be understood by referring to the descriptions therefor provided herein.

In some embodiments, in Formula 1-1, $T_{11}$ to $T_{14}$ may each independently be selected from a single bond, *—O—*', and *—S—*', but the present disclosure is not limited thereto.

In some embodiments, in Formula 1-1, $T_{11}$ to $T_{14}$ may each be a single bond, but the present disclosure is not limited thereto.

In Formula 1-1, $L_{11}$ to $L_{13}$ may each independently be selected from *—O—*' *—S—*', *—C($R_{13}$)($R_{19}$)—*', *—C($R_{18}$)=*', *=C($R_{13}$)—*', *—C($R_{13}$)=C($R_{19}$)—*', *—C(=O)—*', *—C(=S)—*', *—C≡C—*', *—B($R_{18}$)—*', *—N($R_{13}$)—*', *—P($R_{13}$)—*', *—Si($R_{18}$)($R_{19}$)—*', *—P($R_{13}$)($R_{19}$)—*', and *—Ge($R_{18}$)($R_{19}$)—*'. $R_{18}$ and $R_{19}$ may respectively be understood by referring to the descriptions therefor provided herein.

In some embodiments, in Formula 1-1, $L_{11}$ to $L_{13}$ may each independently be selected from *—O—*', *—S—*', *—C($R_{18}$)($R_{19}$)—*', and *—N($R_{13}$)—*', but the present disclosure is not limited thereto.

In Formula 1-1, a11 to a13 may each independently be selected from 0, 1, 2, and 3, and when a11 is 0, $(L_{11})_{a11}$ may be a single bond, when a12 is 0, $(L_{12})_{a12}$ may be a single bond, and when a13 is 0, $(L_{13})_{a13}$ may be a single bond.

In some embodiments, in Formula 1-1, the sum of a11 to a13 may be selected from 1 to 3, but the present disclosure is not limited thereto.

In some embodiments, in Formula 1-1, the sum of a11 to a13 may be 1 or 2, but the present disclosure is not limited thereto.

In some embodiments, in Formula 1-1, all may be 0, and a12 and a13 may each be 1, or a11 and a13 may each be 0, and a12 may be 1, but the present disclosure is not limited thereto.

In Formula 1-1, $A_{13}$ may be a 6-membered N-containing heterocyclic group.

In some embodiments, in Formula 1-1, $A_{13}$ may be selected from a pyridine group, a dihydropyridine group, a tetrahydropyridine group, a piperidine group, a pyrimidine group, a dihydropyrimidine group, a tetrahydropyrimidine group, a hexahydropyrimidine group, a pyrazine group, a dihydropyrazine group, a tetrahydropyrazine group, a piperazine group, a pyridazine group, a dihydropyridazine group, a tetrahydropyridazine group, a triazine group, a dihydrotriazine group, a tetrahydrotriazine group, and a triazinane group, but the present disclosure is not limited thereto.

In some embodiments, in Formula 1-1, $A_{13}$ may be selected from a dihydropyridine group, a dihydropyrimidine group, a dihydropyrazine group, a dihydropyridazine group, and a dihydrotriazine group, but the present disclosure is not limited thereto.

In Formula 1-1, $A_{15}$ may be a 5-membered N-containing heterocyclic group.

In some embodiments, in Formula 1-1, $A_{15}$ may be selected from a pyrrole group, an oxazole group, a dihydrooxazole group, an isoxazole group, a dihydroisoxazole group, a thiazole group, a dihydrothiazole group, an isothiazole group, a dihydroisothiazole group, a pyrazole group, a dihydropyrazole group, an imidazole group, a dihydroimidazole group, a triazole group, a dihydrotriazole group, a tetrazole group, and a dihydrotetrazole group, but the present disclosure is not limited thereto.

In some embodiments, in Formula 1-1, $A_{15}$ may be selected from a pyrrole group, an imidazole group, a triazole group, and a tetrazole group, but the present disclosure is not limited thereto.

In some embodiments, in Formula 1-1, a group represented by

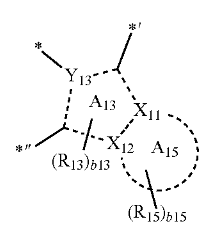

may be represented by any one of Formulae 2-1 and 2-2:

Formula 2-1

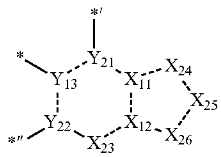

Formula 2-2

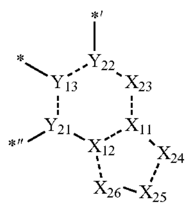

wherein, in Formulae 2-1 and 2-2, $X_{11}$, $X_{12}$, and $Y_{13}$ may respectively be understood by referring to the descriptions therefor in Formula 1-1 provided herein, $Y_{21}$ and $Y_{22}$ may each be C, $X_{23}$ may be N or $C(R_{23})$, $X_{24}$ may be N or $C(R_{24})$, $X_{25}$ may be N or $C(R_{25})$, $X_{26}$ may be N or $C(R_{26})$, $R_{23}$ may be understood by referring to the descriptions for $R_{13}$ in Formula 1-1 provided herein, $R_{24}$ to $R_{26}$ may each be understood by referring to the descriptions for $R_{15}$ in Formula 1-1 provided herein,

*may indicate a binding site to $T_{13}$,

*' may indicate a binding site to $L_{13}$, and

*" may indicate a binding site to $L_{12}$.

wherein, in Formulae 2-1 and 2-2, "---" represents a chemical bond.

For example, in Formulae 2-1 and 2-2, "---" may be a single bond or a double bond.

In some embodiments, in Formula 1-1, a group represented by

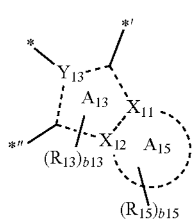

may be represented by any one of Formulae 2-11 to 2-14, but the present disclosure is not limited thereto:

Formula 2-11

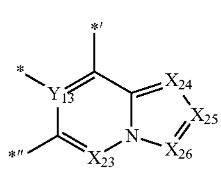

-continued

Formula 2-12

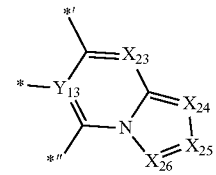

Formula 2-13

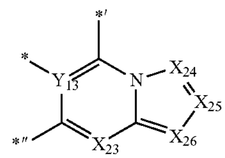

Formula 2-14

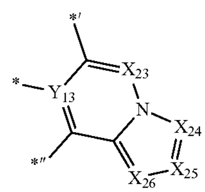

wherein, in Formulae 2-11 and 2-14, $Y_{13}$ may be understood by referring to the descriptions therefor in Formula 1-1 provided herein, $X_{23}$ may be N or $C(R_{23})$, $X_{24}$ may be N or $C(R_{24})$, $X_{25}$ may be N or $C(R_{25})$, $X_{26}$ may be N or $C(R_{26})$, $R_{23}$ may be understood by referring to the descriptions for $R_{13}$ in Formula 1-1 provided herein, $R_{24}$ to $R_{26}$ may each be understood by referring to the descriptions for $R_{15}$ in Formula 1-1 provided herein,

* may indicate a binding site to $T_{13}$,

*' may indicate a binding site to $L_{13}$, and

*" may indicate a binding site to $L_{12}$.

In some embodiments, in Formula 1-1, a group represented by

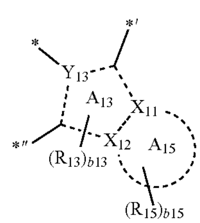

may be represented by any one of Formulae 2-21 to 2-28, but the present disclosure is not limited thereto:

2-21

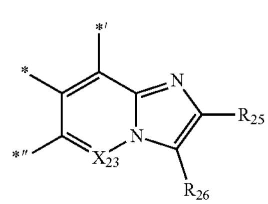

-continued 2-22

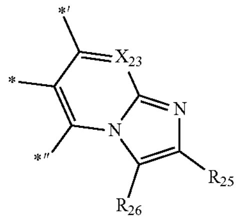

2-23

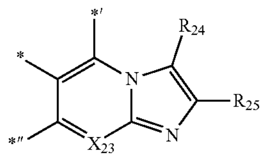

2-24

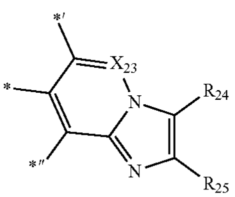

2-25

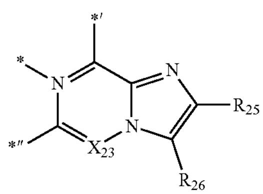

2-26

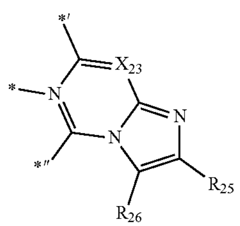

2-27

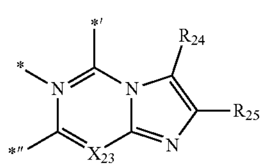

2-28

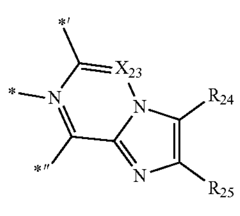

wherein, in Formulae 2-21 and 2-28, $X_{23}$ may be N or $C(R_{23})$, $R_{23}$ may be understood by referring to the descriptions for $R_{13}$ in Formula 1-1 provided herein, $R_{24}$ to $R_{26}$ may each be understood by referring to the descriptions for $R_{15}$ in Formula 1-1 provided herein,

* may indicate a binding site to $T_{13}$,

*' may indicate a binding site to $L_{13}$, and

*" may indicate a binding site to $L_{12}$.

In Formula 1-1, $A_{11}$, $A_{12}$, and $A_{14}$ may each independently be selected from a $C_5$-$C_{60}$ carbocyclic group and a $C_1$-$C_{60}$ heterocyclic group.

In some embodiments, in Formula 1-1, $A_{11}$, $A_{12}$ and $A_{14}$ may each independently be i) a first ring, ii) a second ring, iii) a condensed ring in which at least two first rings are condensed (e.g., combined together), iv) a condensed ring in which at least two second rings are condensed (e.g., combined together), or v) a condensed ring in which at least one first ring and at least one second ring are condensed (e.g., combined together), the first ring may be selected from a cyclopentane group, a cyclopentene group, a cyclopentadiene group, a furan group, a thiophene group, a pyrrole group, a borole group, a phosphole group, a silole group, a germole group, a selenophene group, an oxazole group, a dihydrooxazole group, an isoxazole group, a dihydroisoxazole group, an oxadiazole group, a dihydrooxadiazole group, an isooxadiazole group, a dihydroisooxadiazole group, an oxatriazole group, a dihydrooxatriazole group, an isooxatriazole group, a dihydroisooxatriazole group, a thiazole group, a dihydrothiazole group, an isothiazole group, a dihydroisothiazole group, a thiadiazole group, a dihydrothiadiazole group, an isothiadiazole group, a dihydroisothiadiazole group, a thiatriazole group, a dihydrothiatriazole group, an isothiatriazole group, a dihydroisothiatriazole group, a pyrazole group, a dihydropyrazole group, an imidazole group, a dihydroimidazole group, a triazole group, a dihydrotriazole group, a tetrazole group, a dihydrotetrazole group, an azasilole group, a diazasilole group, and a triazasilole group, and the second ring may be selected from a cyclohexane group, a cyclohexene group, a cyclohexadiene group, an adamantane group, a norbonane group, a norbonene-group, a benzene group, a pyridine group, a dihydropyridine group, a tetrahydropyridine group, a pyrimidine group, a dihydropyrimidine group, a tetrahydropyrimidine group, a pyrazine group, a dihydropyrazine group, a tetrahydropyrazine group, a pyridazine group, a dihydropyridazine group, a tetrahydropyridazine group, a triazine group, a dihydrotriazine group, a tetrahydrotriazine group, and a triazinane group, but the present disclosure is not limited thereto.

In some embodiments, in Formula 1-1, $A_{11}$, $A_{12}$, and $A_{14}$ may each independently be selected from a benzene group, a naphthalene group, an anthracene group, a phenanthrene group, a triphenylene group, a pyrene group, a chrysene group, a furan group, a thiophene group, a silole group, an indene group, a fluorene group, a benzofuran group, a dibenzofuran group, a benzothiophene group, a dibenzothiophene group, a benzosilole group, a dibenzosilole group, an indole group, a carbazole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a pyridine group, a pyrimidine group, a pyrazine group, a pyridazine group, a triazine group, a quinoline group, an isoquinoline group, a quinoxaline group, a quinazoline group, a cinnoline group, a phthalazine group, a phenanthroline group, a pyrrole group, a pyrazole group, an imidazole group, a dihydroimidazole group, a triazole group, a dihydrotriazole group, an oxazole group, a dihydrooxazole group, an isooxazole group, a thiazole group, a dihydrothiazole group, an isothiazole group, an oxadiazole group, a dihydrooxadiazole group, a thiadiazole group, a dihydrothiadiazole group, a benzopyrazole group, a benzimidazole group, a dihydrobenzimidazole group, an imidazopyridine group, an imidazopyrimidine group, an imidazopyrazine group, a benzoxazole group, a dihydrobenzoxazole group, a benzothiazole group, a dihydrobenzothiazole group, a benzoxadiazole group, a dihydrobenzoxadiazole group, a benzothiadiazole group, and a dihydrobenzothiadiazole group, but the present disclosure is not limited thereto.

In some embodiments, in Formula 1-1, $A_{11}$, $A_{12}$, and $A_{14}$ may each independently be selected from a benzene group, a naphthalene group, an indene group, a fluorene group, a benzofuran group, a dibenzofuran group, a benzothiophene group, a dibenzothiophene group, an indole group, a carbazole group, an indenopyridine group, an indolopyridine group, a benzofuropyridine group, a benzothienopyridine group, an indenopyrimidine group, an indolopyrimidine group, a benzofuropyrimidine group, a benzothienopyrimidine group, a pyridine group, a pyrimidine group, a pyrazine group, a pyridazine group, a triazine group, a quinoline group, an isoquinoline group, a quinoxaline group, a quinazoline group, a cinnoline group, a phthalazine group, a phenanthroline group, a pyrrole group, a pyrazole group, an imidazole group, a dihydroimidazole group, a triazole group, a dihydrotriazole group, an oxazole group, a dihydrooxazole group, an isooxazole group, a thiazole group, a dihydrothiazole group, an isothiazole group, an oxadiazole group, a dihydrooxadiazole group, a thiadiazole group, a dihydrothiadiazole group, a benzopyrazole group, a benzimidazole group, a dihydrobenzimidazole group, an imidazopyridine group, an imidazopyrimidine group, an imidazopyrazine group, a benzoxazole group, a dihydrobenzoxazole group, a benzothiazole group, a dihydrobenzothiazole group, a benzoxadiazole group, a dihydrobenzoxadiazole group, a benzothiadiazole group, and dihydrobenzothiadiazole group, but the present disclosure is not limited thereto.

In some embodiments, in Formula 1-1, $A_{11}$, $A_{12}$, and $A_{14}$ may each independently be represented by any one of Formulae 3-1 to 3-43, but the present disclosure is not limited thereto:

3-1

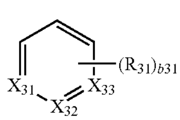

3-2

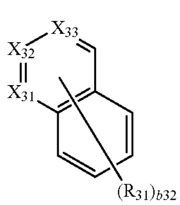

3-3

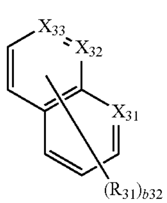

-continued 3-4

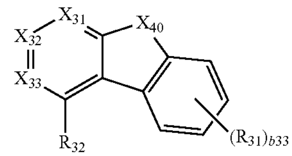

3-5

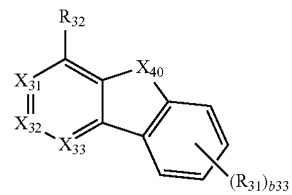

3-6

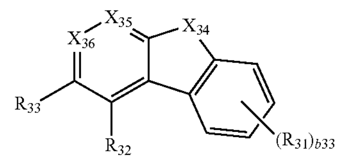

3-7

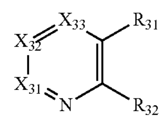

3-8

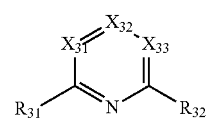

3-9

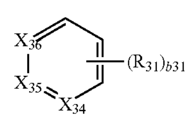

3-10

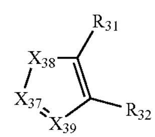

3-11

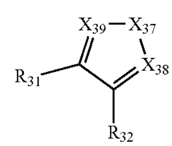

3-12

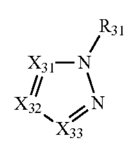

3-13

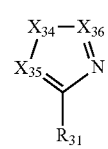

3-14

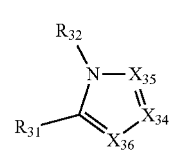

-continued
3-15
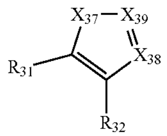
3-16
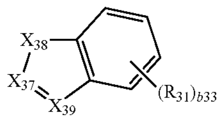
3-17
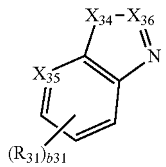
3-18
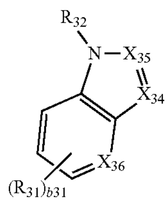
3-19
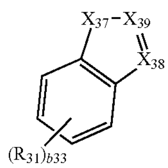
3-20
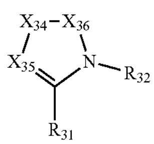
3-21
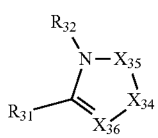
3-22
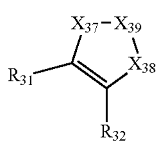
3-23
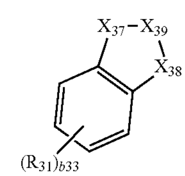
3-24
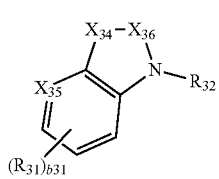
-continued
3-25
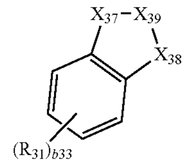
3-26
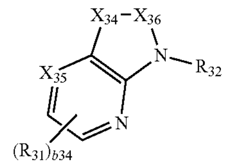
3-27
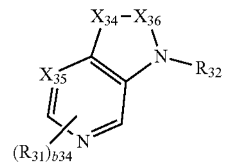
3-28
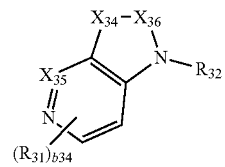
3-29
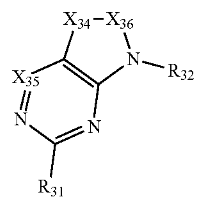
3-30
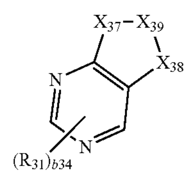
3-31
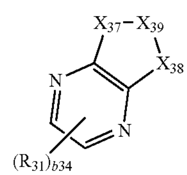
3-32
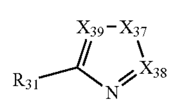
3-33
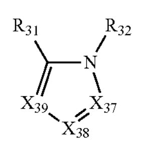
3-34
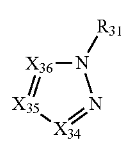

-continued 3-35

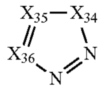

3-36

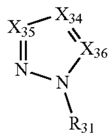

3-37

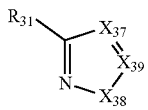

3-38

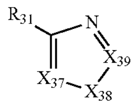

3-39

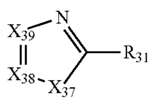

3-40

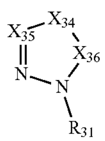

3-41

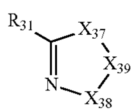

3-42

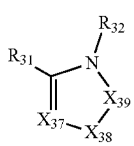

3-43

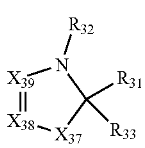

wherein, in Formulae 3-1 to 3-43, $X_{31}$ to $X_{33}$ may each independently be selected from $C(R_{34})$ and C—*, provided that at least two selected from $X_{31}$ to $X_{33}$ may each be C—*, $X_{34}$ may be N—*, $X_{35}$ and $X_{36}$ may each independently be selected from $C(R_{34})$ and C—*, provided that at least one selected from $X_{35}$ and $X_{36}$ may be C—*, $X_{37}$ and $X_{38}$ may each independently be selected from O, S, $C(R_{34})$, N, $N(R_{35})$, and N—*, $X_{39}$ may be selected from O, S, $C(R_{34})$, and C—*, provided that i) at least one selected from $X_{37}$ and $X_{38}$ may be N—*, and $X_{39}$ may be C—*, or ii) $X_{37}$ and $X_{38}$ may each be N—*, and $X_{39}$ may be selected from O, S, and $C(R_{34})$, $X_{40}$ may be selected from O, S, $N(R_{33})$, and $C(R_{33})(R_{34})$, $R_{31}$ to $R_{34}$ may each independently be understood by referring to the descriptions for $R_{11}$ in Formula 1 provided herein, b31 may be selected from 1, 2, and 3, b32 may be selected from 1, 2, 3, 4, and 5, b33 may be selected from 1, 2, 3, and 4, b34 may be selected from 1 and 2, and

* indicates a binding site to an adjacent atom.

In Formula 1-1, $R_{11}$ to $R_{19}$ may each independently be selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, $—C(Q_1)(Q_2)(Q_3)$, $—Si(Q_1)(Q_2)(Q_3)$, $—B(Q_1)(Q_2)$, $—N(Q_1)(Q_2)$, $—P(Q_1)(Q_2)$, $—C(=O)(Q_1)$, $—S(=O)(Q_1)$, $—S(=O)_2(Q_1)$, $—P(=O)(Q_1)(Q_2)$, and $—P(=S)(Q_1)(Q_2)$, wherein two adjacent groups selected from $R_{11}$ to $R_{19}$ may optionally be bound to form a substituted or unsubstituted $C_5$-$C_{30}$ carbocyclic group or a substituted or unsubstituted $C_1$-$C_{30}$ heterocyclic group, and $Q_1$ to $Q_3$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a $C_1$-$C_6$ alkyl group substituted with at least one selected from deuterium, —F, a cyano group, a $C_1$-$C_{60}$ alkyl group, a phenyl group, and a biphenyl group, a $C_6$-$C_{60}$ aryl group substituted with at least one selected from deuterium, —F, a cyano group, a $C_1$-$C_{10}$ alkyl group, a phenyl group, and a biphenyl group, and a $C_1$-$C_{60}$ heteroaryl group substituted with at least one selected from deuterium, —F, a cyano group, a $C_1$-$C_{10}$ alkyl group, a phenyl group, and a biphenyl group.

In some embodiments, in Formula 1-1, $R_{11}$ to $R_{19}$ may each independently be selected from hydrogen, deuterium, —F, —Cl, —Br, —I, a cyano group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a cyano group, a phenyl group, a biphenyl group, and a terphenyl group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, and an indolocarbazolyl group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, and an indolocarbazolyl group, each substituted with at least one selected from deuterium, —F, —Cl, —Br, —I, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, an indolocarbazolyl group, $—C(Q_{31})(Q_{32})(Q_{33})$, $—Si(Q_{31})(Q_{32})(Q_{33})$, $—B(Q_{31})(Q_{32})$, $—N(Q_{31})(Q_{32})$, $—P(Q_{31})(Q_{32})$, $—C(═O)(Q_{31})$, $—S(═O)(Q_{31})$, $—S(═O)_2(Q_{31})$, $—P(═O)(Q_{31})(Q_{32})$, and $—P(═S)(Q_{31})(Q_{32})$; and $—C(Q_1)(Q_2)(Q_3)$, $—Si(Q_1)(Q_2)(Q_3)$, $—B(Q_1)(Q_2)$, $—N(Q_1)(Q_2)$, $—P(Q_1)(Q_2)$, $—C(═O)$ $(Q_1)$, —S(=O)$(Q_1)$, —S(=O)$_2(Q_1)$, —P(=O)$(Q_1)(Q_2)$, and —P(=S)$(Q_1)(Q_2)$, wherein $Q_1$ to $Q_3$ and $Q_{31}$ to $Q_{33}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, a cyano group, a $C_1$-$C_{60}$ alkyl group, a phenyl group, and a biphenyl group, a $C_6$-$C_{60}$ aryl group substituted with at least one selected from deuterium, —F, a cyano group, a $C_1$-$C_{06}$ alkyl group, a phenyl group, and a biphenyl group, and a $C_1$-$C_{60}$ heteroaryl group substituted with at least one selected from deuterium, —F, a cyano group, a $C_1$-$C_{60}$ alkyl group, a phenyl group, and a biphenyl group, but the present disclosure is not limited thereto.

In some embodiments, in Formula 1-1, $R_{11}$ to $R_{19}$ may each independently be selected from hydrogen, deuterium, —F, —Cl, —Br, —I, a cyano group, and a $C_1$-$C_{20}$ alkyl group;

a $C_1$-$C_{20}$ alkyl group substituted with at least one selected from deuterium, —F, —Cl, —Br, —I, and a cyano group;

groups represented by Formulae 5-1 to 5-138; and $C(Q_1)(Q_2)(Q_3)$, —Si$(Q_1)(Q_2)(Q_3)$, —B$(Q_1)(Q_2)$, —N$(Q_1)(Q_2)$, —P$(Q_1)(Q_2)$, —C(=O)$(Q_1)$, —S(=O)$(Q_1)$, —S(=O)$_2(Q_1)$, —P(=O)$(Q_1)(Q_2)$, and —P(=S)$(Q_1)(Q_2)$, but the present disclosure is not limited thereto:

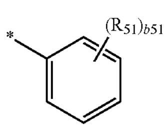

5-1

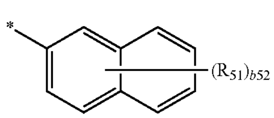

5-2

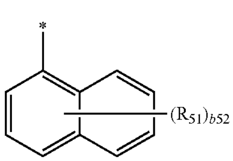

5-3

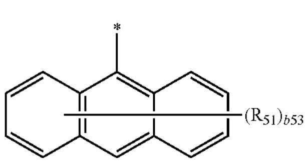

5-4

-continued

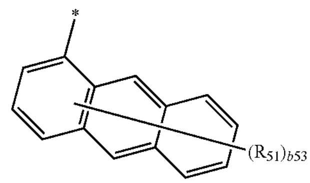

5-5

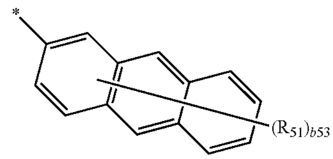

5-6

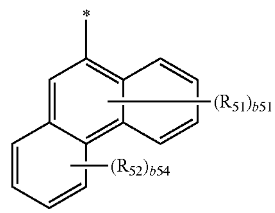

5-7

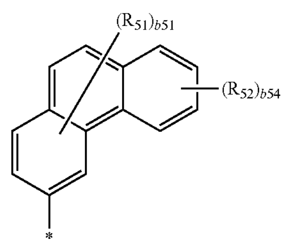

5-8

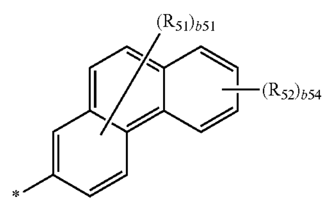

5-9

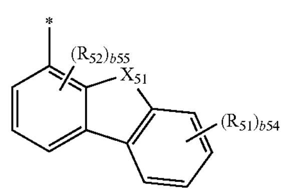

5-10

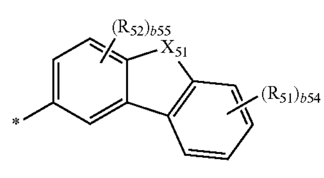

5-11

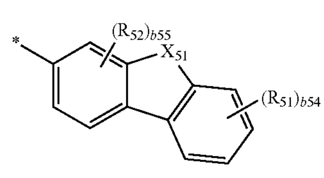

5-12

-continued
5-13
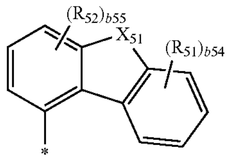
5-14
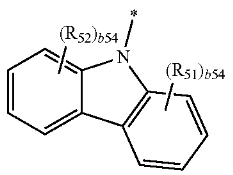
5-15
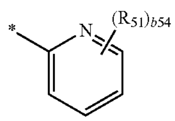
5-16
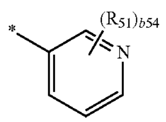
5-17
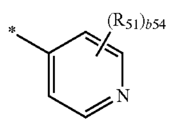
5-18
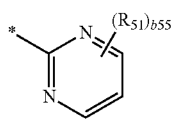
5-19
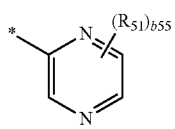
5-20
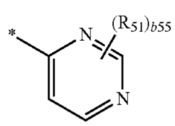
5-21
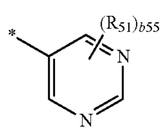
5-22
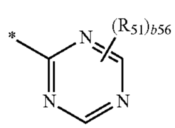
5-23
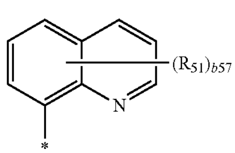
-continued
5-24
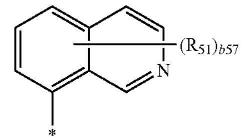
5-25
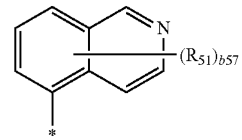
5-26
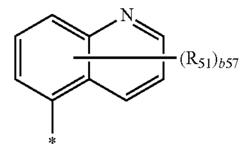
5-27
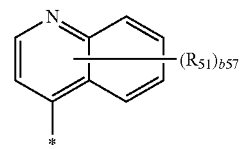
5-28
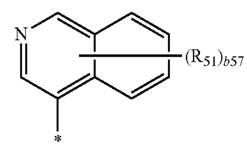
5-29
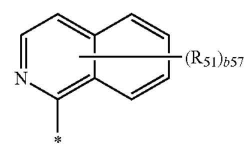
5-30
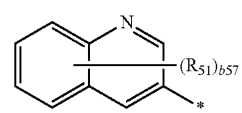
5-31
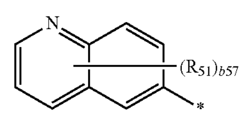
5-32
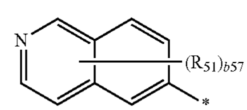
5-33
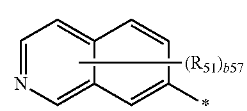
5-34
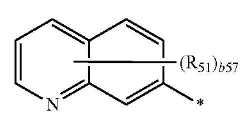
5-35
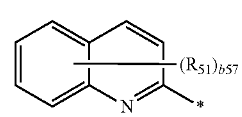

-continued
5-36
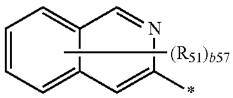
5-37
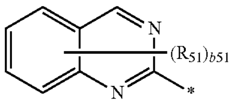
5-38
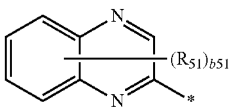
5-39
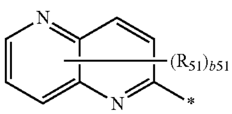
5-40
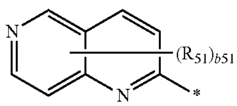
5-41
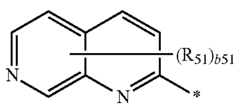
5-42
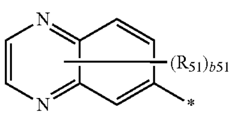
5-43
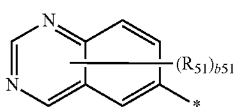
5-44
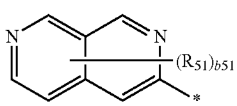
5-45
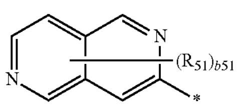
5-46
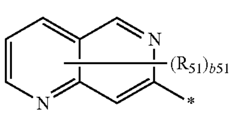
5-47
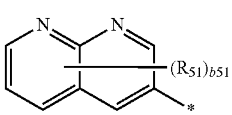
5-48
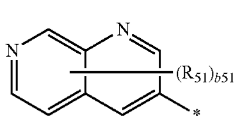
5-49
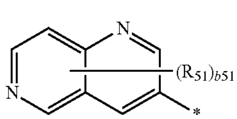
-continued
5-50
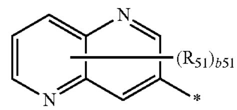
5-51
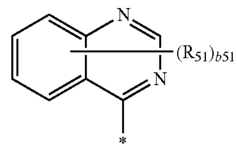
5-52
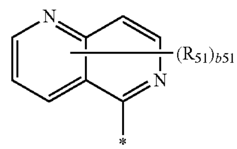
5-53
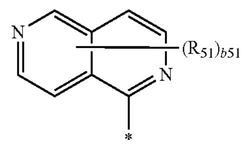
5-54
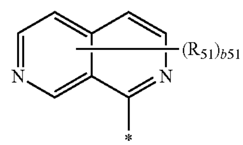
5-55
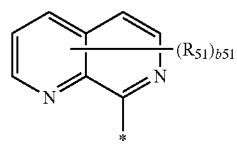
5-56
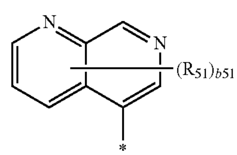
5-57
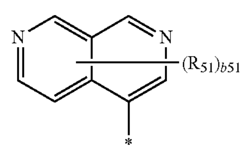
5-58
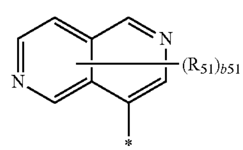
5-59
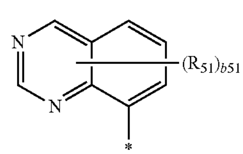

-continued
5-60
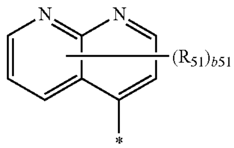
5-61
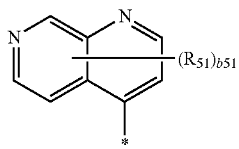
5-62
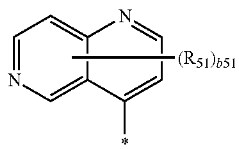
5-63
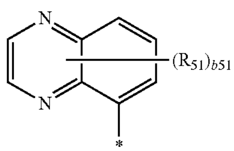
5-64
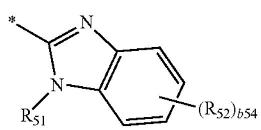
5-65
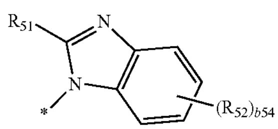
5-66
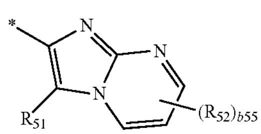
5-67
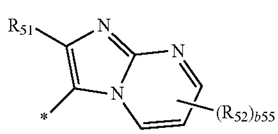
5-68
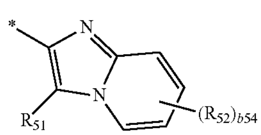
5-69
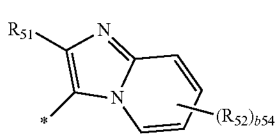
5-70
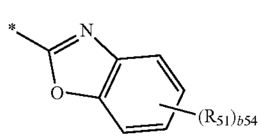
-continued
5-71
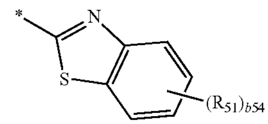
5-72
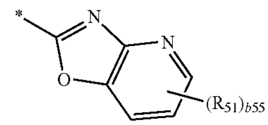
5-73
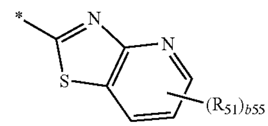
5-74
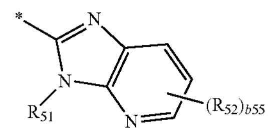
5-75
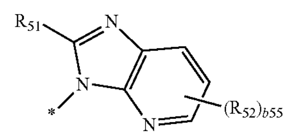
5-76
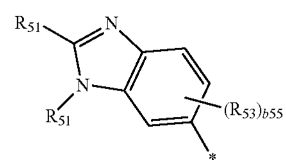
5-77
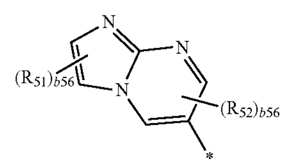
5-78
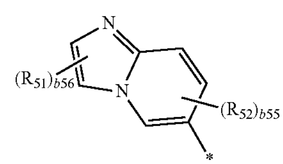
5-79
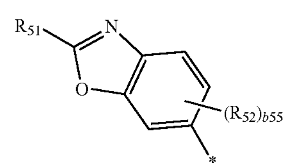
5-80
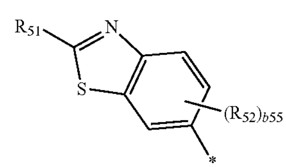

-continued
5-81
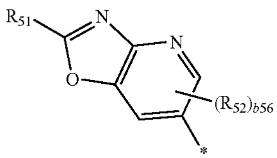
5-82
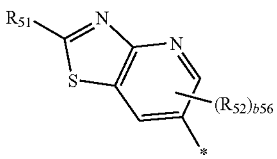
5-83
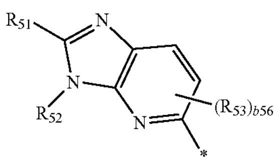
5-84
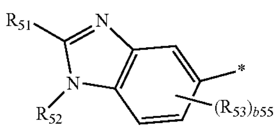
5-85
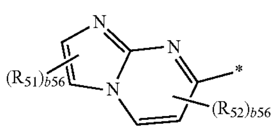
5-86
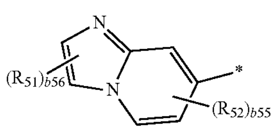
5-87
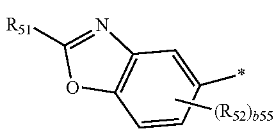
5-88
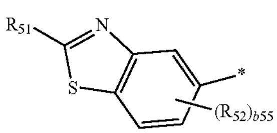
5-89
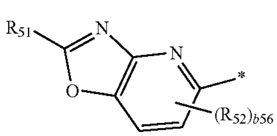
5-90
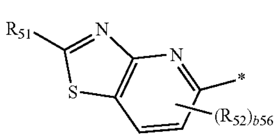
5-91
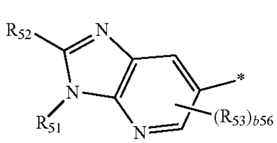
-continued
5-92
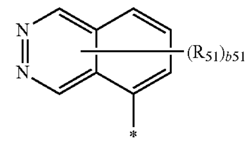
5-93
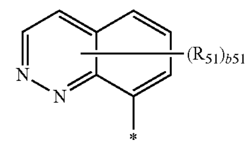
5-94
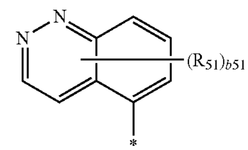
5-95
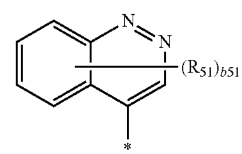
5-96
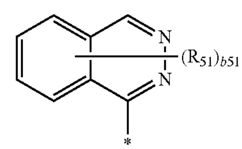
5-97
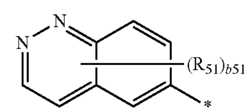
5-98
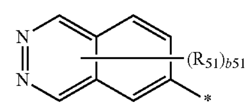
5-99
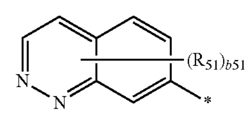
5-100
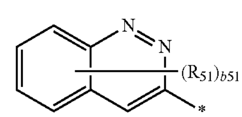
5-101
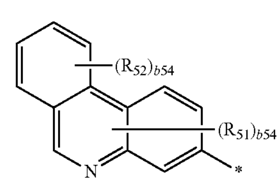
5-102
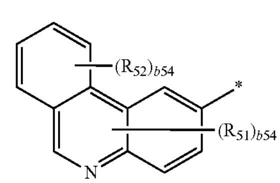

-continued
5-103
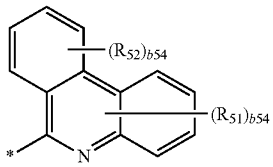
5-104
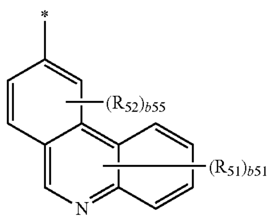
5-105
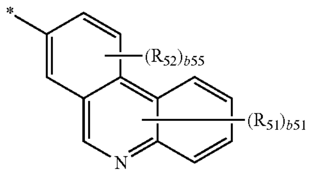
5-106
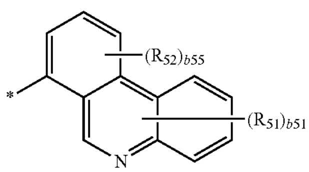
5-107
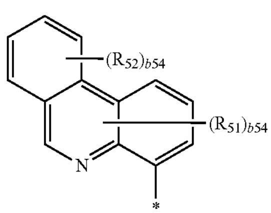
5-108
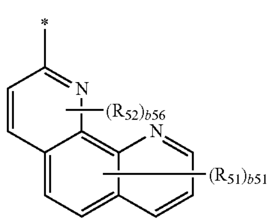
5-109
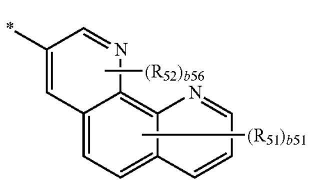
5-110
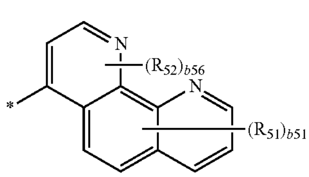
-continued
5-111
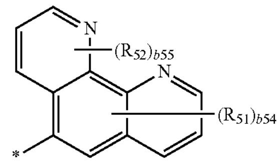
5-112
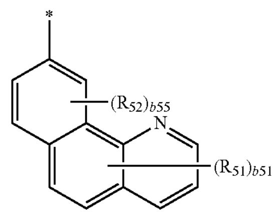
5-113
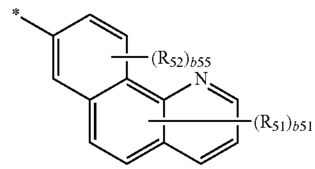
5-114
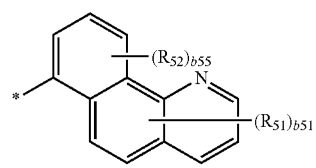
5-115
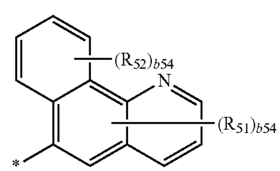
5-116
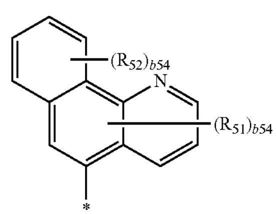
5-117
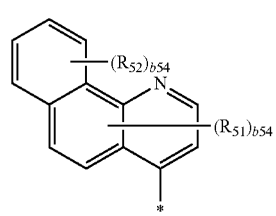
5-118
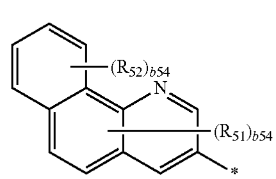

-continued
5-119
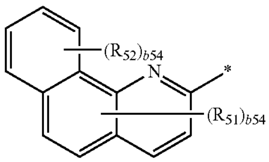
5-120
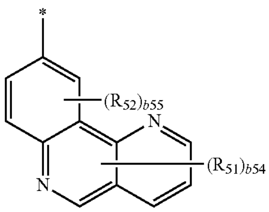
5-121
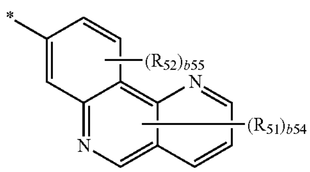
5-122
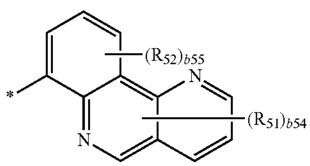
5-123
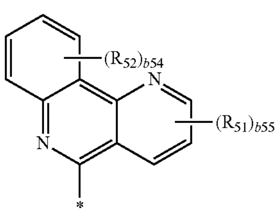
5-124
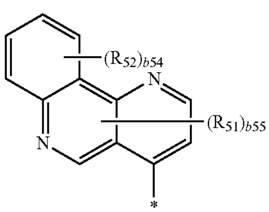
5-125
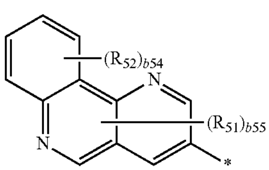
5-126
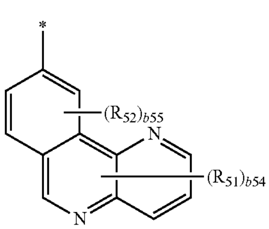
-continued
5-127
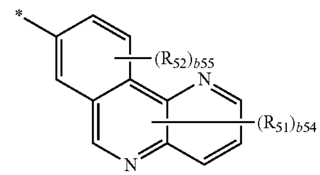
5-128
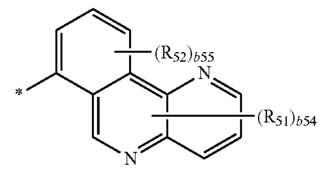
5-129
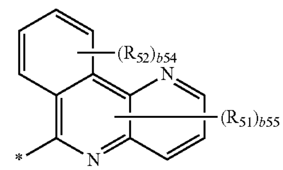
5-130
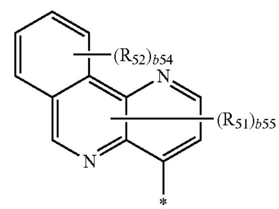
5-131
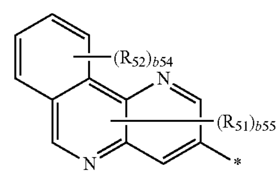
5-132
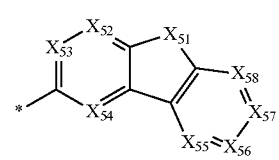
5-133
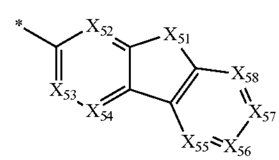
5-134
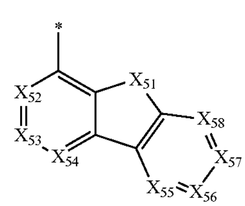
5-135
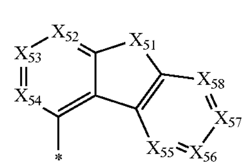

-continued 5-136

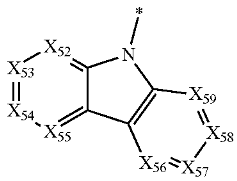

5-137

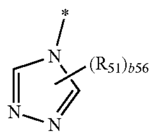

5-138

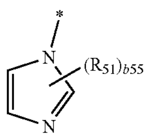

wherein, in Formulae 5-1 to 5-138, $X_{51}$ may be selected from O, S, N($R_{51}$), and C($R_{51}$)($R_{60}$), $X_{52}$ may be N or C($R_{52}$), $X_{53}$ may be N or C($R_{53}$), $X_{54}$ may be N or C($R_{54}$), $X_{55}$ may be N or C($R_{55}$), $X_{56}$ may be N or C($R_{56}$), $X_{57}$ may be N or C($R_{57}$), $X_{58}$ may be N or C($R_{58}$), $X_{59}$ may be N or C($R_{59}$), $R_{51}$ to $R_{60}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a thiophenyl group, a furanyl group, a silolyl group, a carbazolyl group, an indolyl group, an isoindolyl group, a benzofuranyl group, a benzothiophenyl group, a benzosilolyl group, a dibenzofuranyl group, a dibenzothiophenyl group, a benzocarbazolyl group, a dibenzocarbazolyl group, a dibenzosilolyl group, —C($Q_{31}$)($Q_{32}$)($Q_{33}$), —Si($Q_{31}$)($Q_{32}$)($Q_{33}$), —B($Q_{31}$)($Q_{32}$), —N($Q_{31}$)($Q_{32}$), —P($Q_{31}$)($Q_{32}$), —C(=O)($Q_{31}$), —S(=O)($Q_{31}$), —S(=O)$_2$($Q_{31}$), —P(=O)($Q_{31}$)($Q_{32}$), and —P(=S)($Q_{31}$)($Q_{32}$), wherein $Q_1$ to $Q_3$ and $Q_{31}$ to $Q_{33}$ may each independently be selected from a methyl group, an ethyl group, an n-propyl group, an iso-propyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, a biphenyl group, a $C_1$-$C_{20}$ alkylphenyl group, and a naphthyl group; and a methyl group, an ethyl group, an n-propyl group, an iso-propyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, and a naphthyl group, each substituted with at least one selected from deuterium and a phenyl group, b51 may be selected from 1, 2, 3, 4, and 5, b52 may be selected from 1, 2, 3, 4, 5, 6, and 7, b53 may be selected from 1, 2, 3, 4, 5, 6, 7, 8, and 9, b54 may be selected from 1, 2, 3, and 4, b55 may be selected from 1, 2, and 3, b56 may be selected from 1 and 2, b57 may be selected from 1, 2, 3, 4, 5, and 6, and

* indicates a binding site to an adjacent atom.

In some embodiments, in Formula 1-1, $R_{11}$ to $R_{19}$ may each independently be selected from hydrogen, deuterium, —F, —Cl, —Br, —I, a cyano group, and groups represented by Formulae 9-1 to 9-16;

groups represented by Formulae 9-1 to 9-16, each substituted with at least one selected from deuterium, —F, —Cl, —Br, —I, and a cyano group; and groups represented by Formulae 6-1 to 6-257, but the present disclosure is not limited thereto:

9-1

9-2

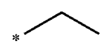

9-3

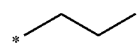

9-4

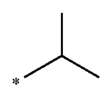

9-5

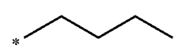

9-6

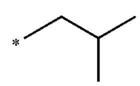

9-7

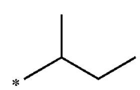

9-8

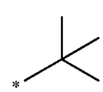

9-9

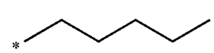

9-10

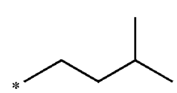

9-11

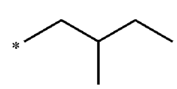

9-12

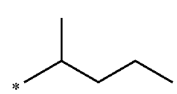

9-13

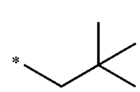

-continued
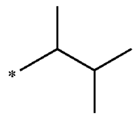
9-14
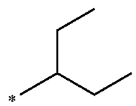
9-15
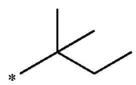
9-16
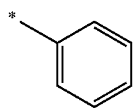
6-1
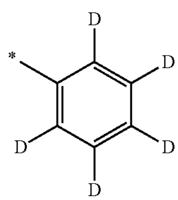
6-2
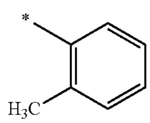
6-3
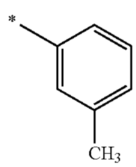
6-4
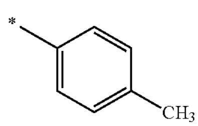
6-5
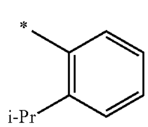
6-6
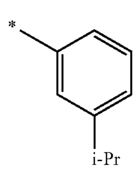
6-7
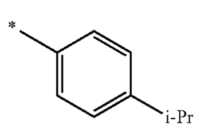
6-8
-continued
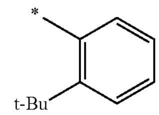
6-9
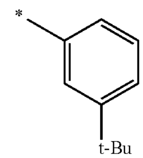
6-10
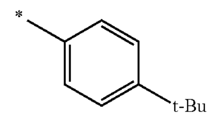
6-11
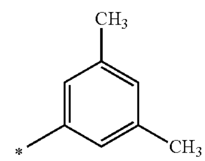
6-12
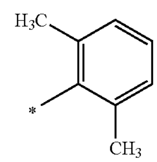
6-13
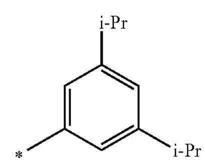
6-14
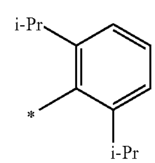
6-15
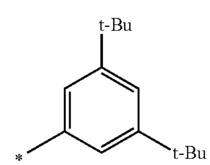
6-16
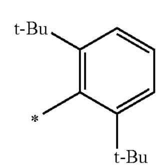
6-17
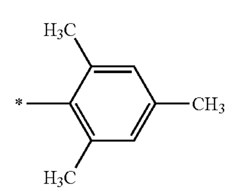
6-18

-continued
6-19
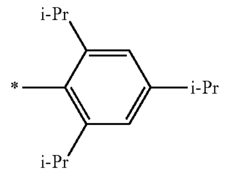
6-20
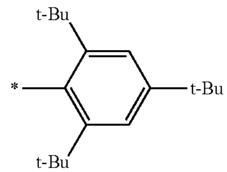
6-21
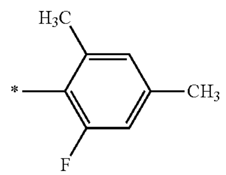
6-22
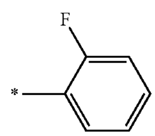
6-23
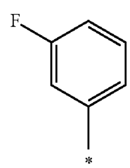
6-24
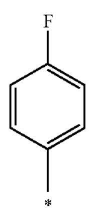
6-25
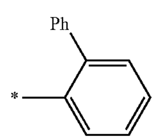
6-26
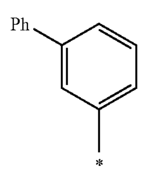
6-27
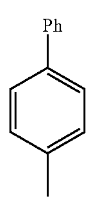
-continued
6-28
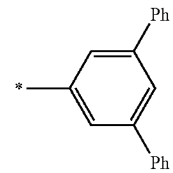
6-29
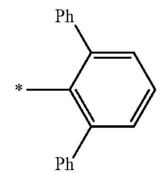
6-30
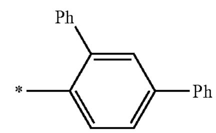
6-31
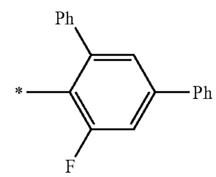
6-32
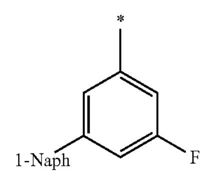
6-33
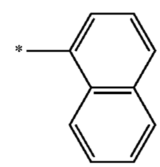
6-34
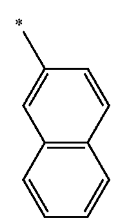
6-35
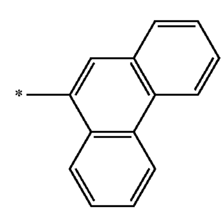

-continued
6-36
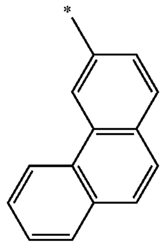
6-37
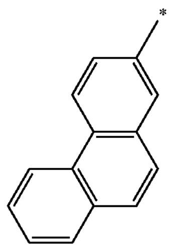
6-38
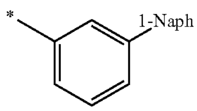
6-39
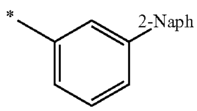
6-40
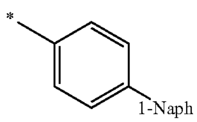
6-41
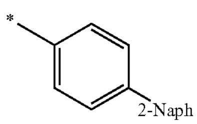
6-42
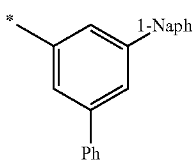
6-43
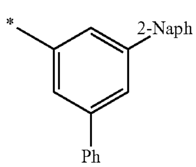
6-44
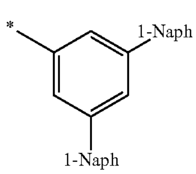
-continued
6-45
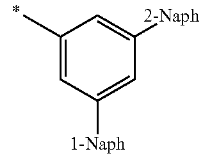
6-46
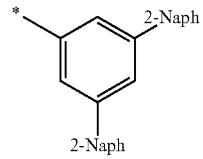
6-47
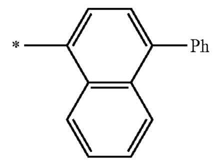
6-48
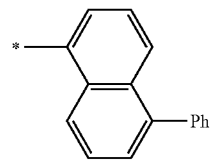
6-49
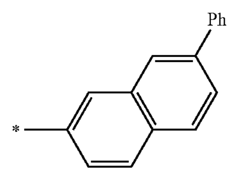
6-50
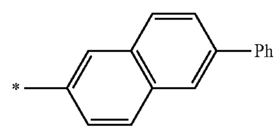
6-51
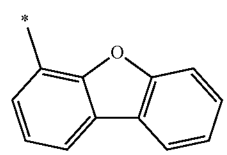
6-52
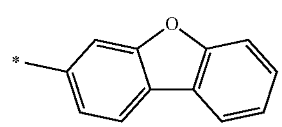
6-53
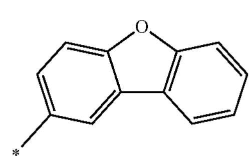
6-54
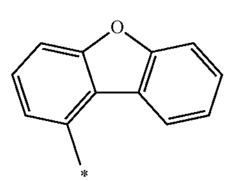

-continued
6-55
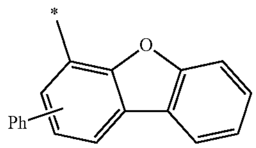
6-56
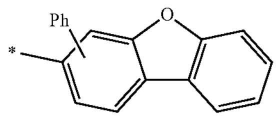
6-57
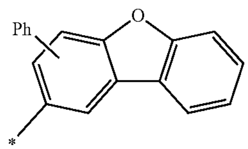
6-58
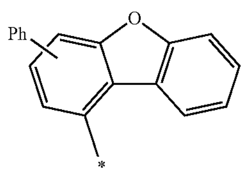
6-59
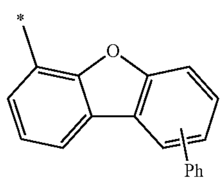
6-60
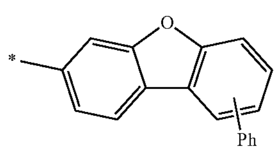
6-61
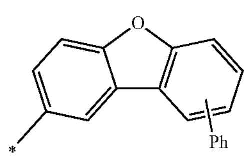
6-62
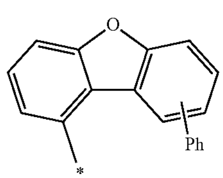
6-63
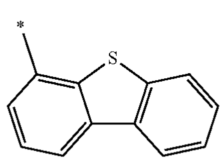
6-64
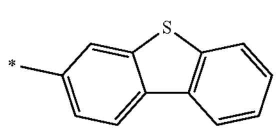
-continued
6-65
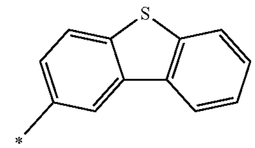
6-66
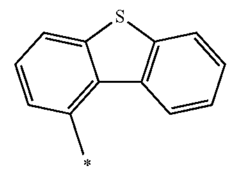
6-67
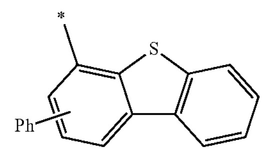
6-68
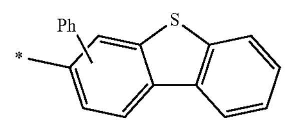
6-69
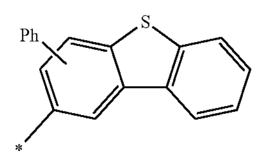
6-70
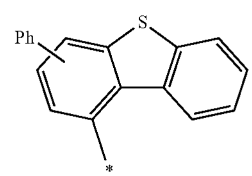
6-71
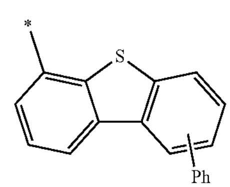
6-72
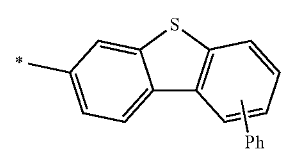
6-73
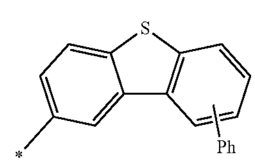

-continued
6-74
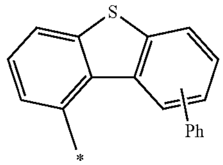
6-75
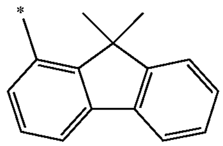
6-76
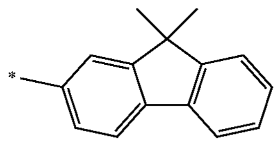
6-77
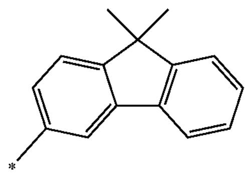
6-78
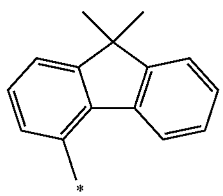
6-79
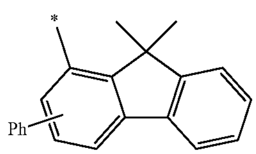
6-80
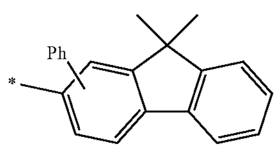
6-81
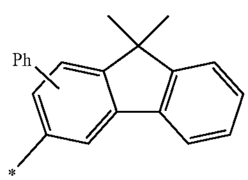
6-82
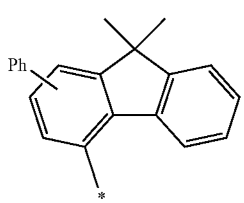
-continued
6-83
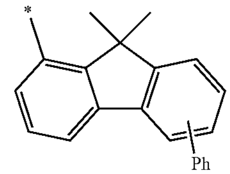
6-84
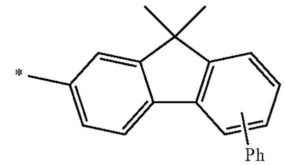
6-85
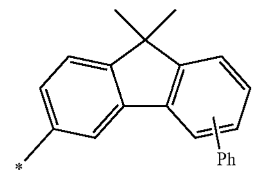
6-86
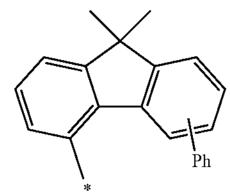
6-87
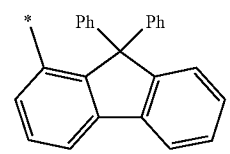
6-88
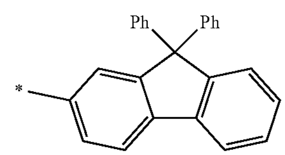
6-89
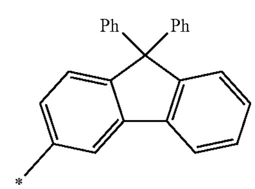
6-90
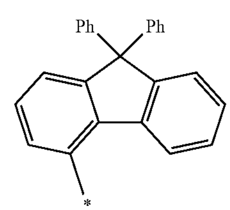

6-91
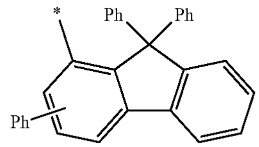
6-92
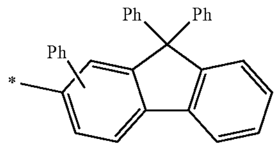
6-93
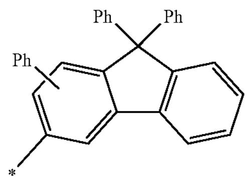
6-94
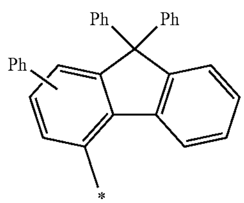
6-95
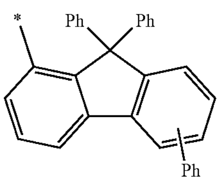
6-96
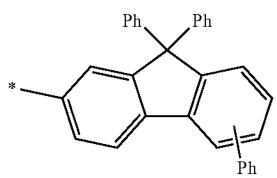
6-97
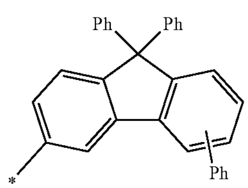
6-98
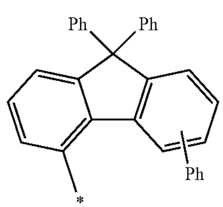
6-99
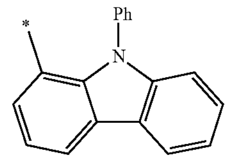
6-100
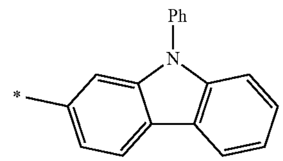
6-101
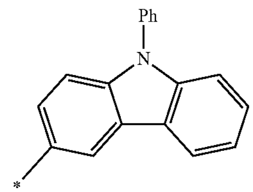
6-102
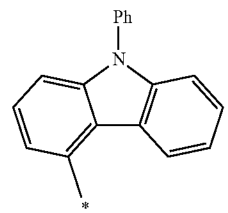
6-103
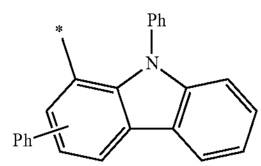
6-104
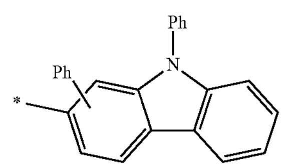
6-105
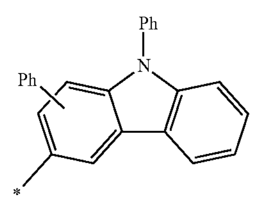
6-106
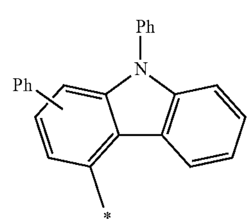

-continued
6-107
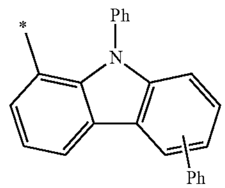
6-108
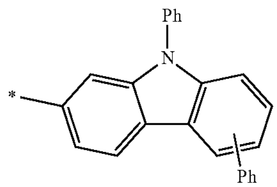
6-109
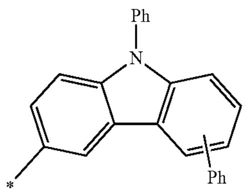
6-110
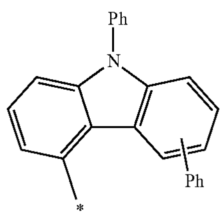
6-111
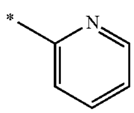
6-112
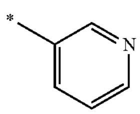
6-113
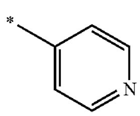
6-114
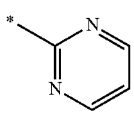
6-115
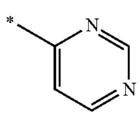
6-116
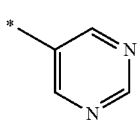
-continued
6-117
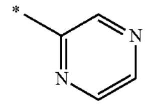
6-118
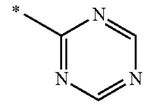
6-119
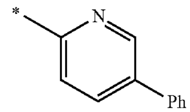
6-120
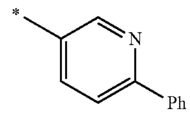
6-121
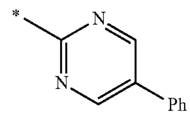
6-122
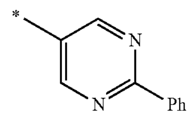
6-123
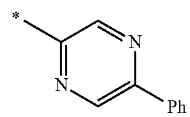
6-124
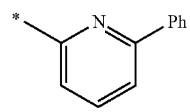
6-125
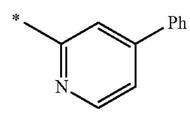
6-126
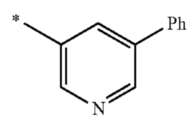
6-127
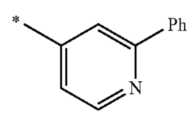
6-128
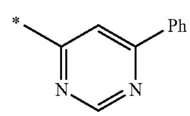
6-129
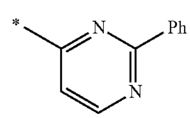

-continued
6-130
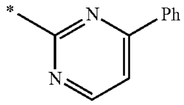
6-131
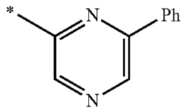
6-132
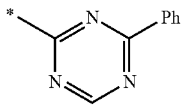
6-133
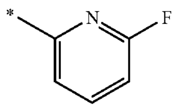
6-134
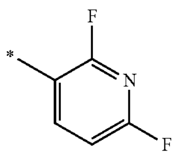
6-135
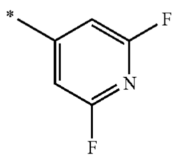
6-136
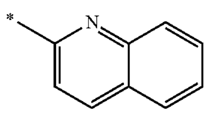
6-137
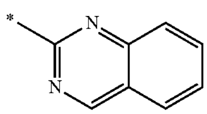
6-138
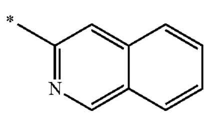
6-139
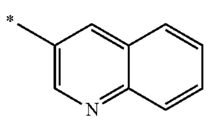
6-140
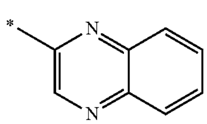
6-141
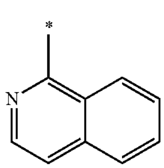
-continued
6-142
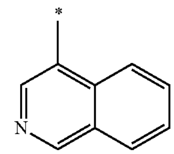
6-143
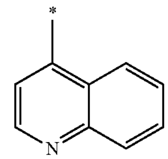
6-144
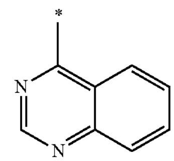
6-145
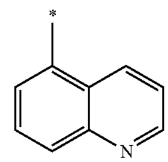
6-146
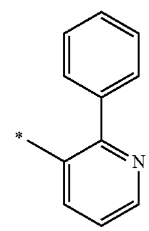
6-147
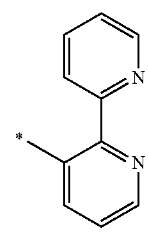
6-148
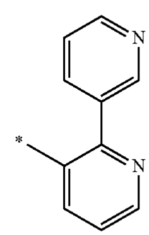
6-149
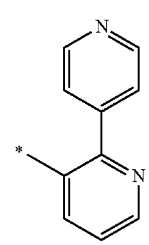

-continued
6-150
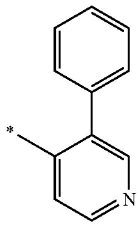
6-151
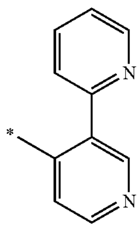
6-152
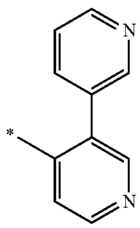
6-153
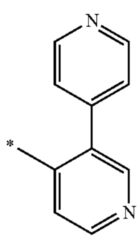
6-154
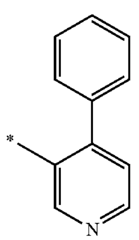
6-155
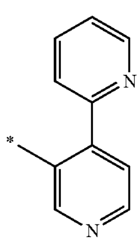
-continued
6-156
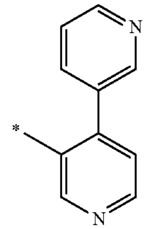
6-157
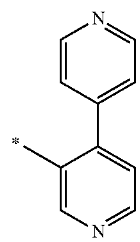
6-158
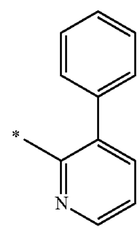
6-159
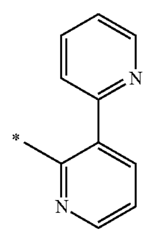
6-160
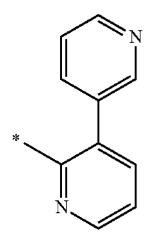
6-161
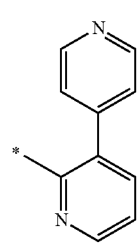

-continued
6-162
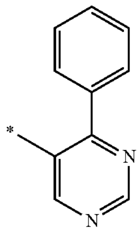
6-163
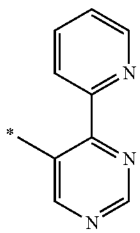
6-164
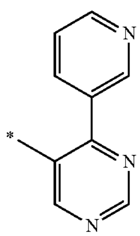
6-165
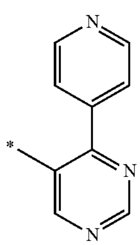
6-166
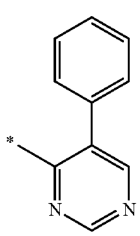
6-167
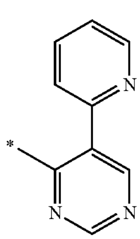
-continued
6-168
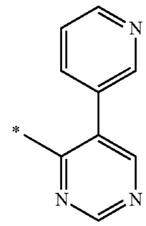
6-169
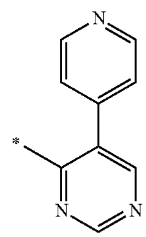
6-170
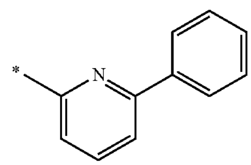
6-171
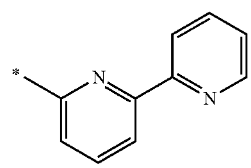
6-172
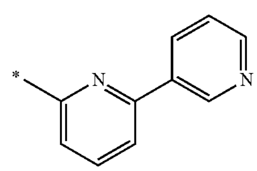
6-173
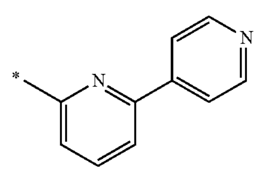
6-174
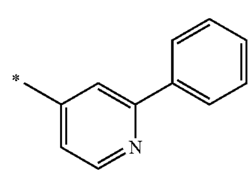
6-175
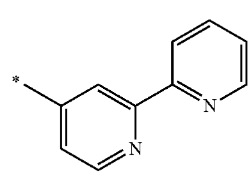

-continued
6-176
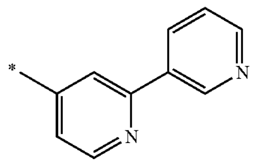
6-177
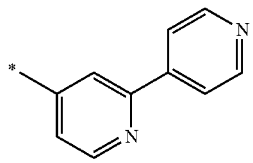
6-178
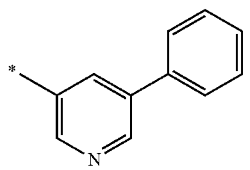
6-179
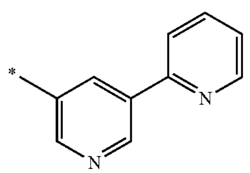
6-180
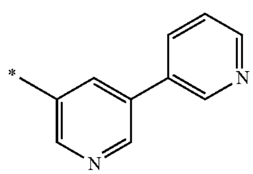
6-181
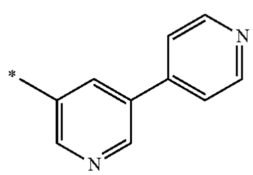
6-182
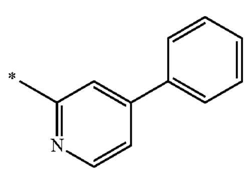
6-183
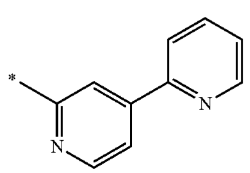
6-184
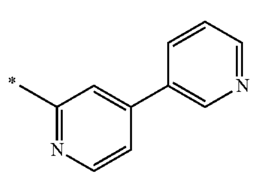
-continued
6-185
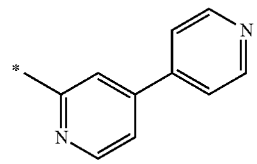
6-186
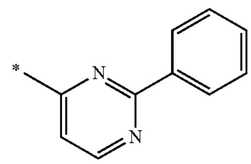
6-187
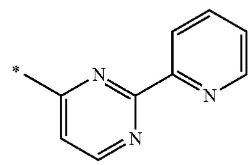
6-188
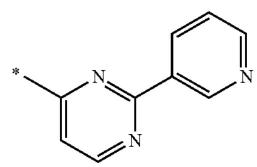
6-189
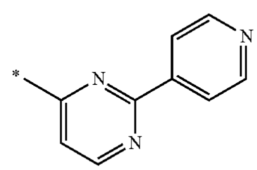
6-190
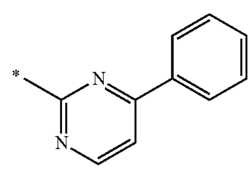
6-191
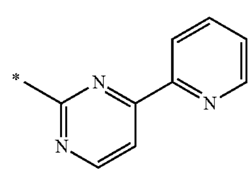
6-192
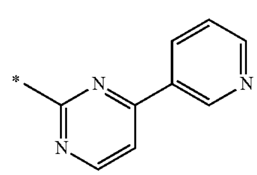
6-193
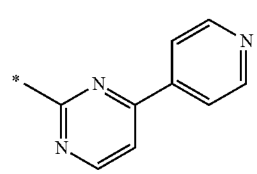

-continued
6-194
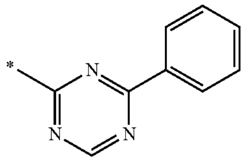
6-195
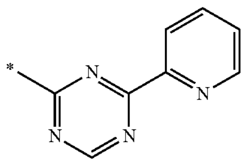
6-196
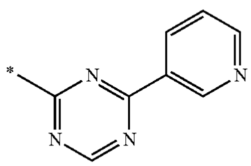
6-197
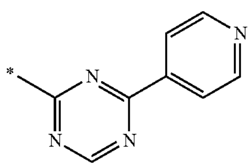
6-198
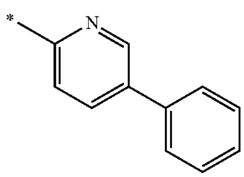
6-199
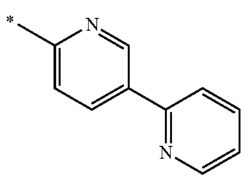
6-200
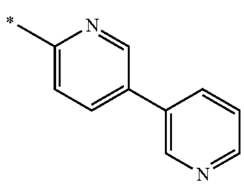
6-201
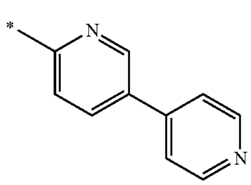
6-202
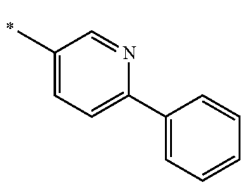
-continued
6-203
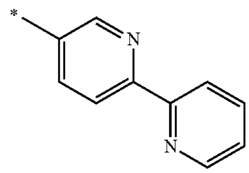
6-204
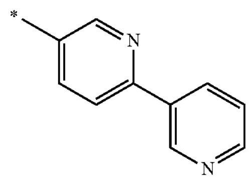
6-205
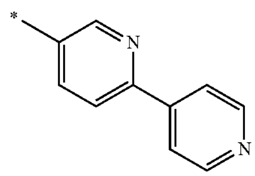
6-206
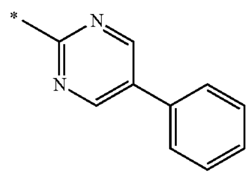
6-207
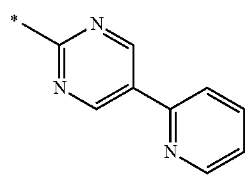
6-208
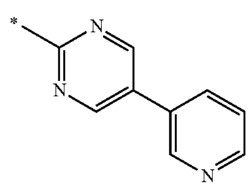
6-209
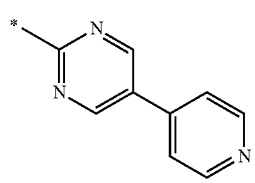
6-210
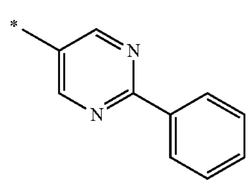

-continued
6-211
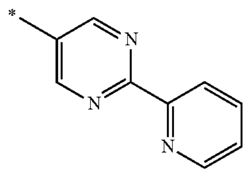
6-212
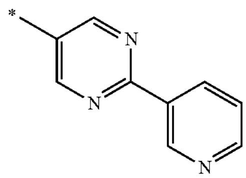
6-213
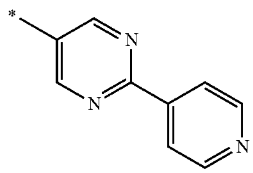
6-214
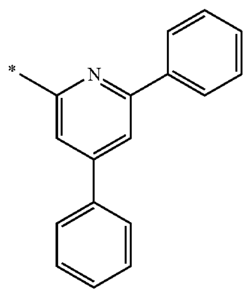
6-215
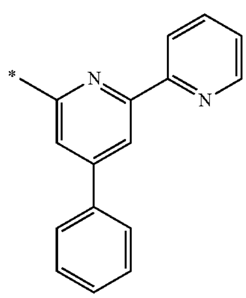
6-216
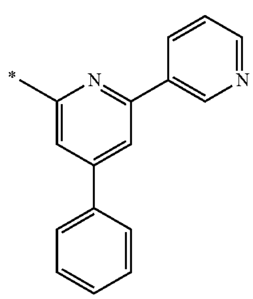
-continued
6-217
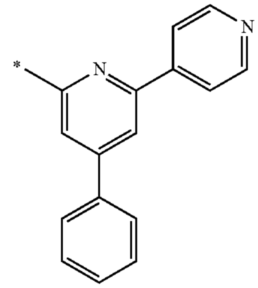
6-218
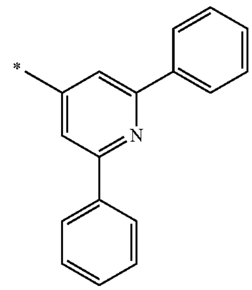
6-219
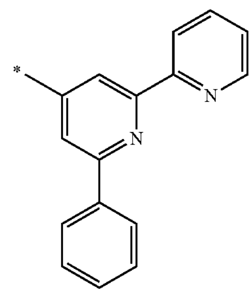
6-220
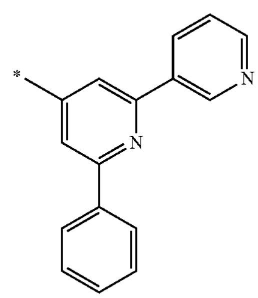
6-221
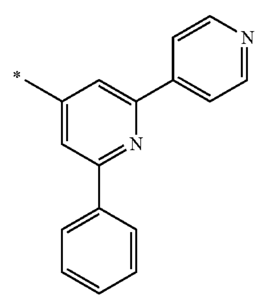

-continued
6-222
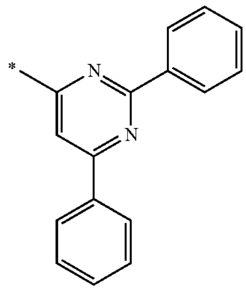
6-223
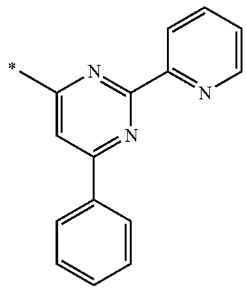
6-224
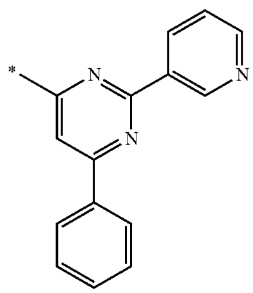
6-225
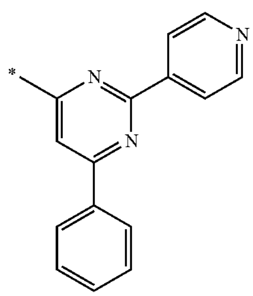
6-226
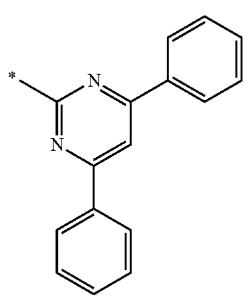
-continued
6-227
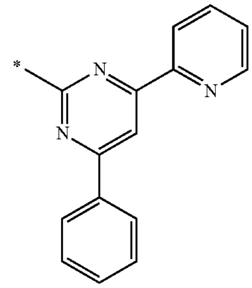
6-228
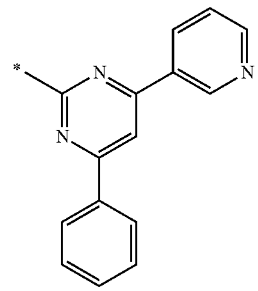
6-229
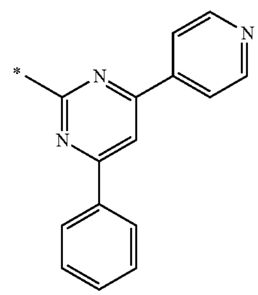
6-230
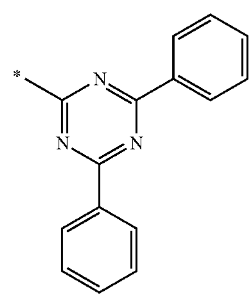
6-231
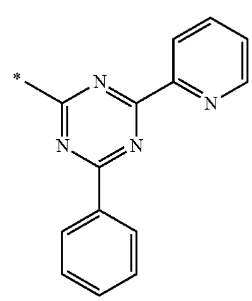

-continued
6-232
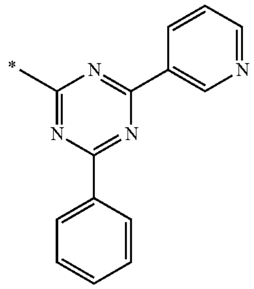
6-233
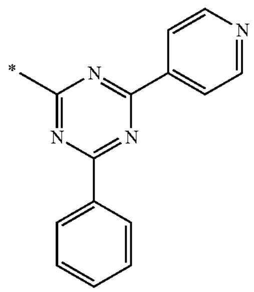
6-234
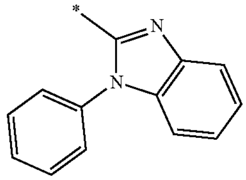
6-235
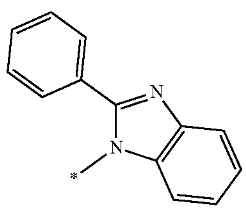
6-236
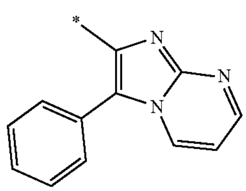
6-237
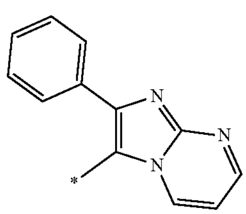
6-238
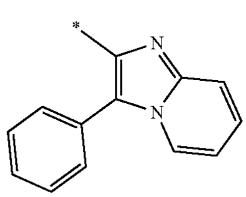
-continued
6-239
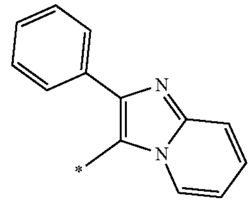
6-240
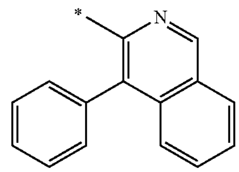
6-241
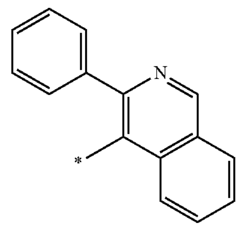
6-242
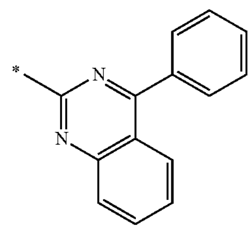
6-243
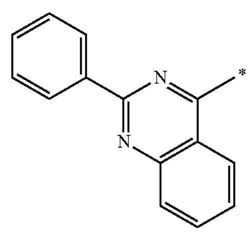
6-244
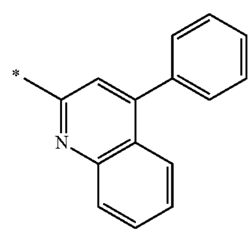
6-245
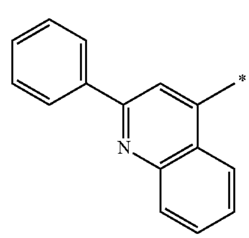

-continued 6-246

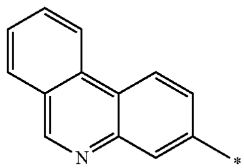

6-247

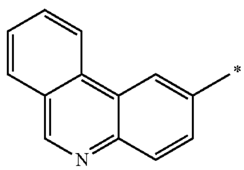

6-248

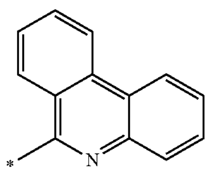

6-249

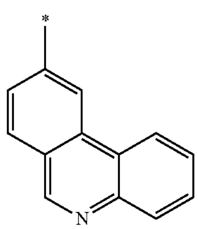

6-250

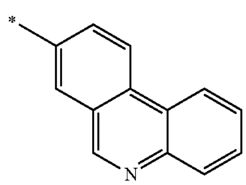

6-251

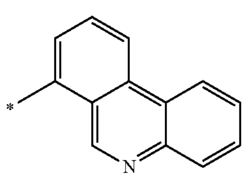

6-252

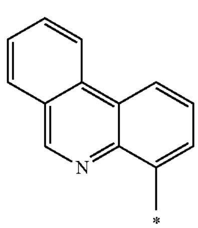

6-253

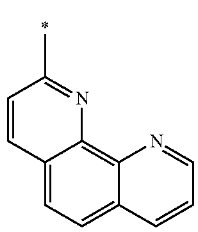

-continued 6-254

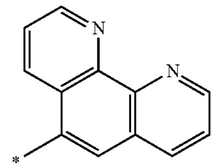

6-255

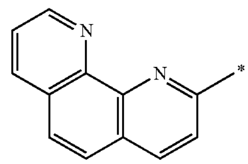

6-256

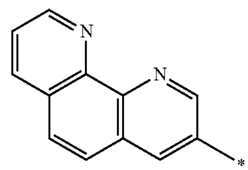

6-257

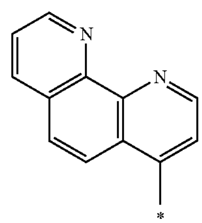

wherein, in Formulae 6-1 to 6-257,

"i-Pr" represents an iso-propyl group,

"t-Bu" represents a tert-butyl group,

"Ph" represents a phenyl group,

"1-Naph" represents a 1-naphthyl group,

"2-Naph" represents a 2-naphthyl group, and

* indicates a binding site to an adjacent atom.

In Formula 1-1, b11 to b15 may each independently be an integer from 1 to 10.

In Formula 1-1, *1 to *4 may each indicate a binding site to $M_{11}$.

In some embodiments, in Formula 1-1, $L_{11}$ may be a ligand represented by any one of Formulae 1-11 to 1-14, but the present disclosure is not limited thereto:

1-11

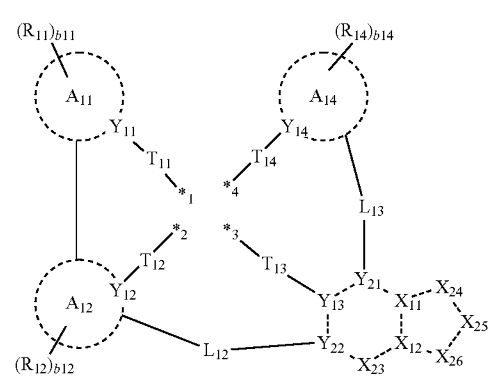

-continued 1-12

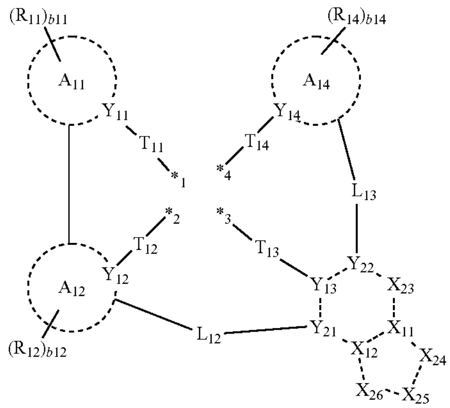

1-13

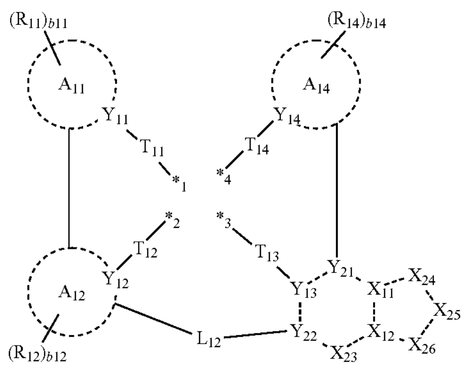

1-14

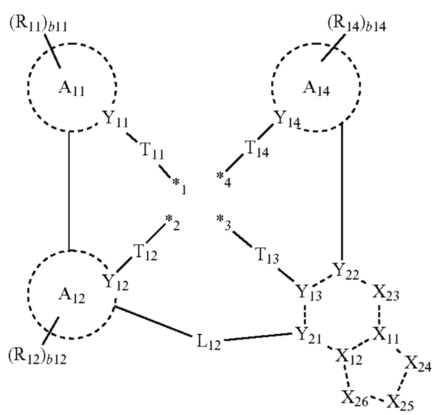

wherein, in Formulae 1-11 to 1-14, $X_{11}$, $X_{12}$, $Y_{11}$ to $Y_{14}$, $T_{11}$ to $T_{14}$, $L_{12}$, $L_{13}$, $A_{11}$, $A_{12}$, $A_{14}$, $R_{11}$, $R_{12}$, $R_{14}$, b11, b12, b14, and *1 to *4 may respectively be understood by referring to the descriptions therefor in Formula 1-1 provided herein, $Y_{21}$ and $Y_{22}$ may each be C, $X_{23}$ may be N or $C(R_{23})$, $X_{24}$ may be N or $C(R_{24})$, $X_{25}$ may be N or $C(R_{25})$, $X_{26}$ may be N or $C(R_{26})$, $R_{23}$ may be understood by referring to the descriptions for $R_{13}$ in Formula 1-1 provided herein, and $R_{24}$ to $R_{26}$ may each be understood by referring to the descriptions for $R_{15}$ in Formula 1-1 provided herein.

In some embodiments, in Formula 1-1, $L_{11}$ may be a ligand represented by any one of Formulae 1-21 to 1-24, but the present disclosure is not limited thereto:

1-21

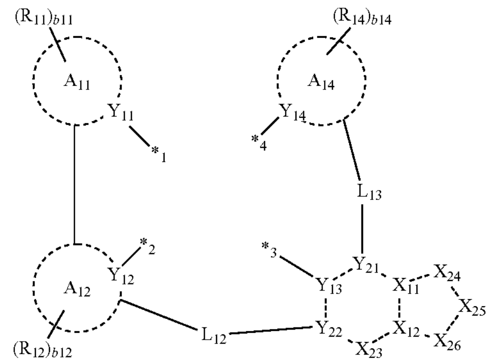

1-22

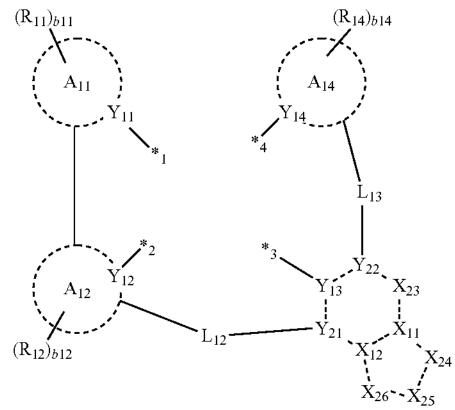

1-23

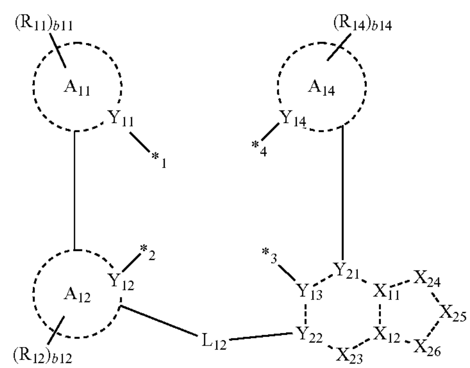

1-24

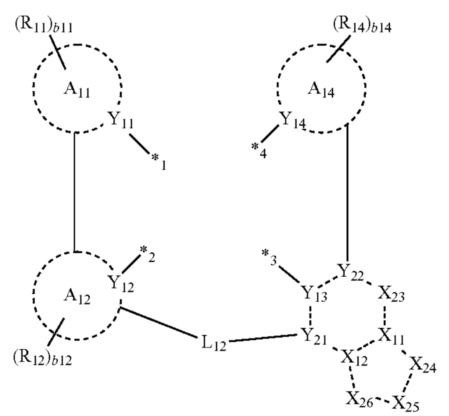

wherein, in Formulae 1-21 to 1-24, $X_{11}$, $X_{12}$, $Y_{11}$ to $Y_{14}$, $L_{12}$, $L_{13}$, $A_{11}$, $A_{12}$, $A_{14}$, $R_{11}$, $R_{12}$, $R_{14}$, b11, b12, b14, and *1 to *4 may respectively be understood by referring to the descriptions therefor in Formula 1-1 provided herein, $Y_{21}$ and $Y_{22}$ may each be C, $X_{23}$ may be N or $C(R_{23})$, $X_{24}$ may be N or $C(R_{24})$, $X_{25}$ may be N or $C(R_{25})$, $X_{26}$ may be N or $C(R_{26})$, $R_{23}$ may be understood by referring to the descriptions for $R_{13}$ in Formula 1-1 provided herein, and $R_{24}$ to $R_{26}$ may each be understood by referring to the descriptions for $R_{15}$ in Formula 1-1 provided herein.

In some embodiments, in Formula 1-1, $L_{11}$ may be a ligand represented by any one of Formulae 1-31 to 1-34, but the present disclosure is not limited thereto:

1-31

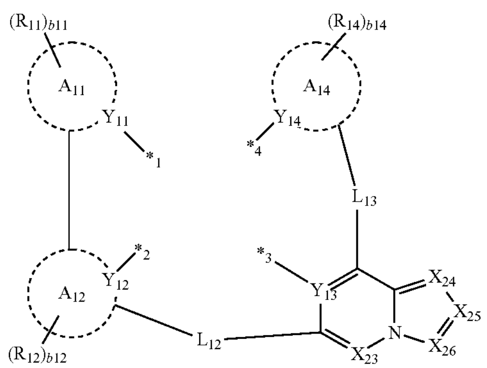

1-32

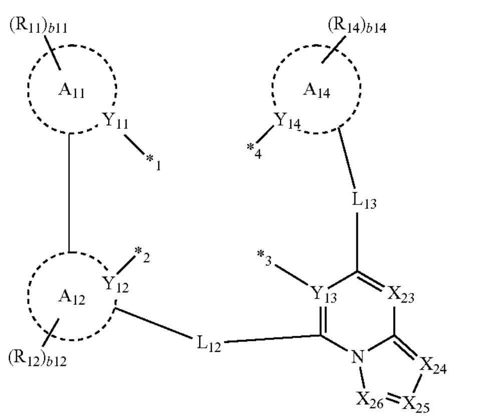

1-33

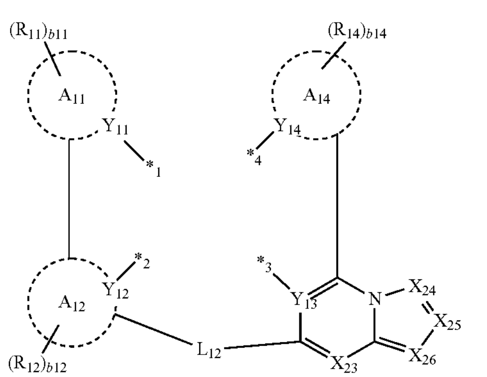

-continued 1-34

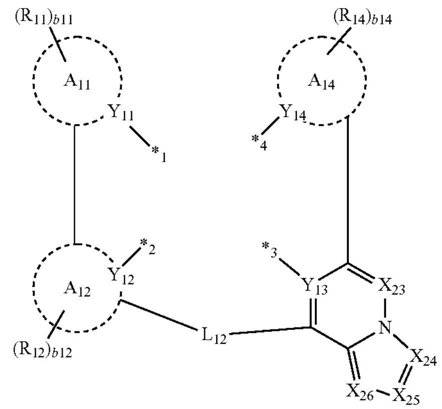

wherein, in Formulae 1-31 to 1-34, $X_{11}$, $X_{12}$, $Y_{11}$ to $Y_{14}$, $L_{12}$, $L_{13}$, $A_{11}$, $A_{12}$, $A_{14}$, $R_{11}$, $R_{12}$, $R_{14}$, b11, b12, b14, and *1 to *4 may respectively be understood by referring to the descriptions therefor in Formula 1-1 provided herein, $X_{23}$ may be N or $C(R_{23})$, $X_{24}$ may be N or $C(R_{24})$, $X_{25}$ may be N or $C(R_{25})$, $X_{26}$ may be N or $C(R_{26})$, $R_{23}$ may be understood by referring to the descriptions for $R_{13}$ in Formula 1-1 provided herein, and $R_{24}$ to $R_{26}$ may each be understood by referring to the descriptions for $R_{15}$ in Formula 1-1 provided herein.

In Formula 1, $L_{12}$ may be selected from a monodentate ligand and a bidentate ligand.

In some embodiments, in Formula 1, $L_{12}$ may be a ligand represented by any one of Formulae 7-1 to 7-11, but the present disclosure is not limited thereto:

7-1

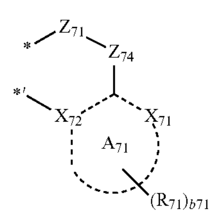

7-2

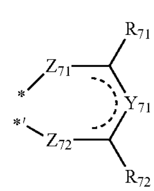

7-3

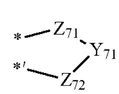

7-4

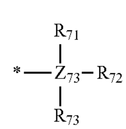

7-5

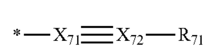

-continued 7-6

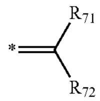

7-7

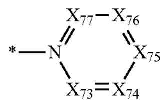

7-8

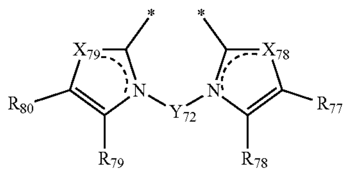

7-9

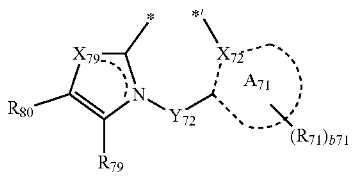

7-10

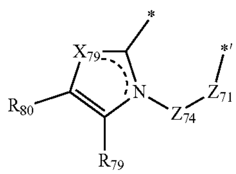

7-11

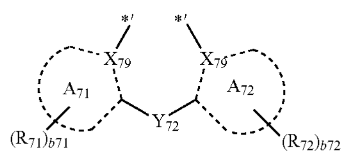

wherein, in Formulae 7-1 to 7-11, $A_{71}$ and $A_{72}$ may each independently be selected from a $C_5$-$C_{20}$ carbocyclic group and a $C_1$-$C_{20}$ heterocyclic group, $X_{71}$ and $X_{72}$ may each independently be selected from C and N, $X_{73}$ may be N or $C(Q_{73})$, $X_{24}$ may be N or $C(Q_{74})$, $X_{75}$ may be N or $C(Q_{75})$, $X_{76}$ may be N or $C(Q_{76})$, $X_{27}$ may be N or $C(Q_{77})$, $X_{78}$ may be O, S, or $N(Q_{78})$, $X_{29}$ may be O, S, or $N(Q_{79})$, $Y_{71}$ and $Y_{72}$ may each independently be selected from a single bond, a double bond, a substituted or unsubstituted $C_1$-$C_5$ alkylene group, a substituted or unsubstituted $C_2$-$C_5$ alkenylene group, and a substituted or unsubstituted $C_6$-$C_{10}$ arylene group, $Z_{71}$ and $Z_{72}$ may each independently be selected from N, O, $N(R_{75})$, $P(R_{75})(R_{76})$, and $As(R_{75})(R_{76})$, $Z_{73}$ may be selected from P and As, $Z_{74}$ may be selected from CO and $CH_2$, $R_{71}$ to $R_{80}$ and $Q_{73}$ to $Q_{79}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_6$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein $R_{71}$ and $R_{72}$ may optionally be bound to form a ring, $R_{77}$ and $R_{78}$ may optionally be bound to form a ring, $R_{78}$ and $R_{79}$ may optionally be bound to form a ring, and $R_{79}$ and $R_{80}$ may optionally be bound to form a ring, b71 and b72 may each independently be selected from 1, 2, and 3, and

* and *' may each indicate a binding site to an adjacent atom.

In some embodiments, in Formula 7-1, $A_{71}$ and $A_{72}$ may each independently be selected from a benzene group, a naphthalene group, an imidazole group, a benzimidazole group, a pyridine group, a pyrimidine group, a triazine group, a quinoline group, and an isoquinoline group, but the present disclosure is not limited thereto.

In some embodiments, in Formula 7-1, $X_{72}$ and $X_{79}$ may each be N, but the present disclosure is not limited thereto.

In some embodiments, in Formula 7-7, $X_{73}$ may be $C(Q_{73})$, $X_{74}$ may be $C(Q_{74})$, $X_{75}$ may be $C(Q_{75})$, $X_{76}$ may be $C(Q_{76})$, and $X_{77}$ may be $C(Q_{77})$, but the present disclosure is not limited thereto.

In some embodiments, in Formula 7-8, $X_{78}$ may be $N(Q_{78})$, and $X_{79}$ may be $N(Q_{79})$, but the present disclosure is not limited thereto.

In some embodiments, in Formulae 7-2, 7-3, and 7-8, $Y_{71}$ and $Y_{72}$ may each independently be selected from a substituted or unsubstituted methylene group and a substituted or unsubstituted phenylene group, but the present disclosure is not limited thereto.

In some embodiments, in Formulae 7-1 and 7-2, $Z_{71}$ and $Z_{72}$ may each be O, but the present disclosure is not limited thereto.

In some embodiments, in Formula 7-4, $Z_{73}$ may be P, but the present disclosure is not limited thereto.

In some embodiments, in Formulae 7-1 to 7-8, $R_{71}$ to $R_{80}$ and $Q_{73}$ to $Q_{79}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, and a pyrimidinyl group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group; and a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, but the present disclosure is not limited thereto.

In some embodiments, in Formula 1, $L_{12}$ may be represented by one of Formulae 8-1 to 8-11, but the present disclosure is not limited thereto:

8-1

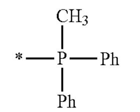

8-2

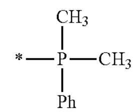

8-3

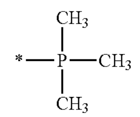

8-4

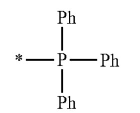

8-5

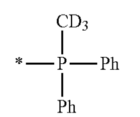

8-6

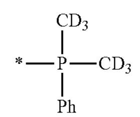

8-7

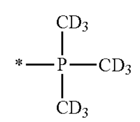

8-8

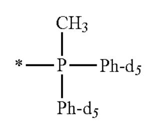

8-9

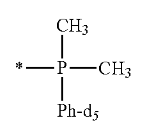

8-10

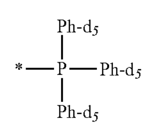

8-11

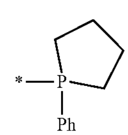

wherein,*indicates a binding site to an adjacent atom.

In Formula 1, n11 indicates the number of $L_{11}$(s). n11 may be 1.

In Formula 1, n12 indicates the number of $L_{12}$(s). n12 may be selected from 0, 1, and 2. When n12 is 2, two $L_{12}$(s) may be identical to or different from each other.

In some embodiments, in Formula 1, n11 may be 1, and n12 may be 0.
In some embodiments, in Formula 1, n11 may be 1, and n12 may be 2.
In some embodiments, in Formula 1, $M_{11}$ may be selected from Pt and Pd, n11 may be 1, and n12 may be 0.
In some embodiments, the organometallic compound represented by Formula 1 may be selected from Group I, but the present disclosure is not limited thereto:
Group I
1
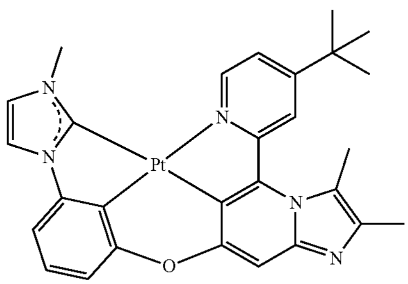
2
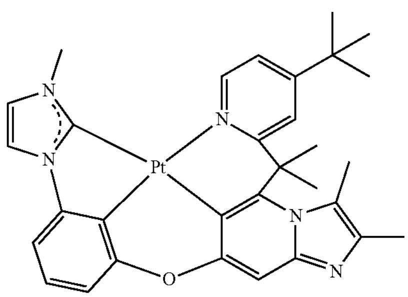
3
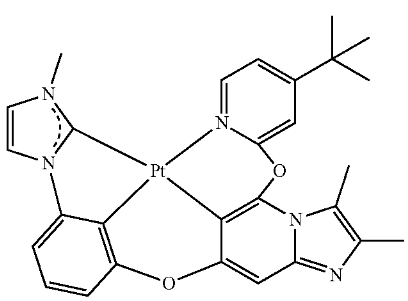
4
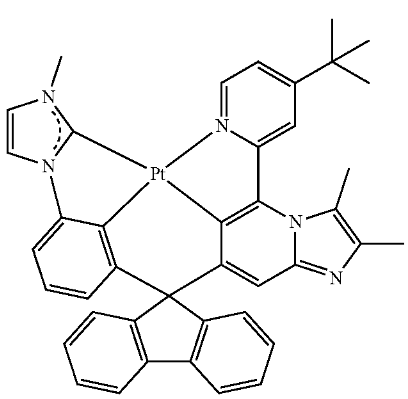
-continued
5
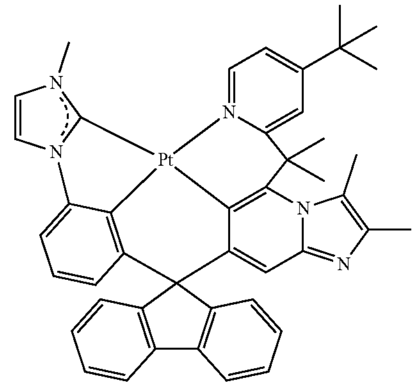
6
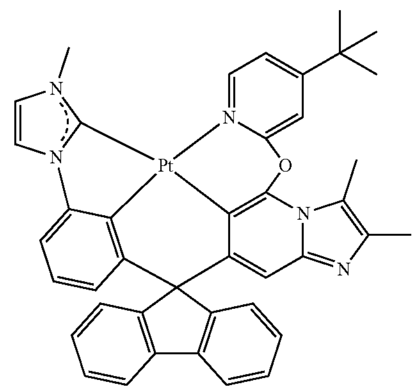
7
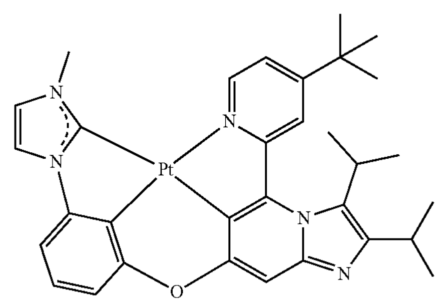
8
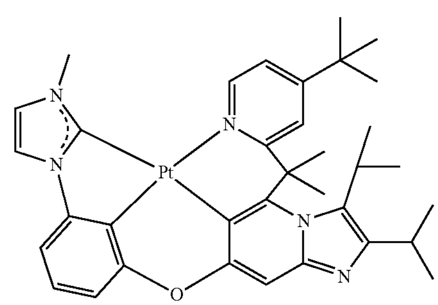

-continued
9
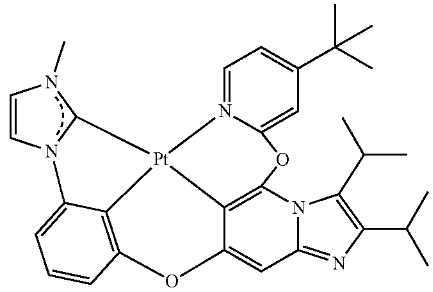
10
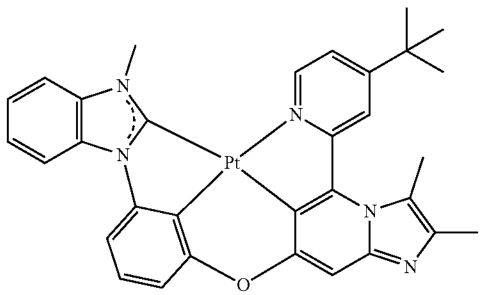
11
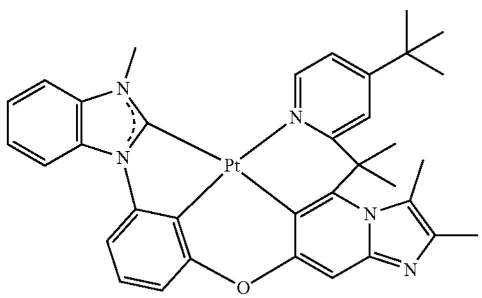
12
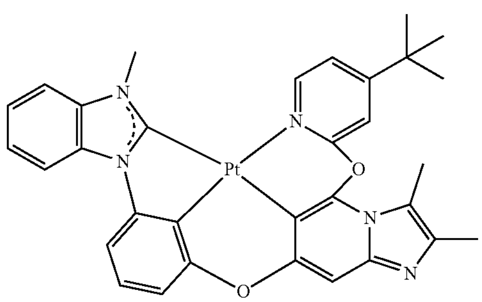
13
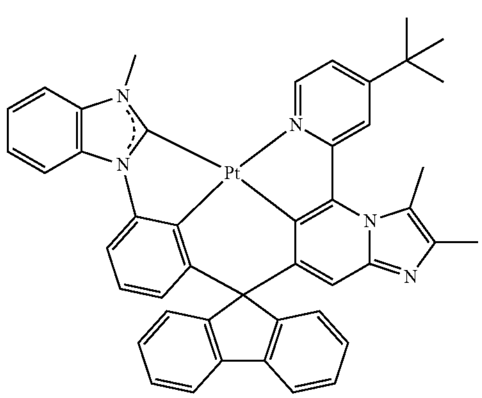
-continued
14
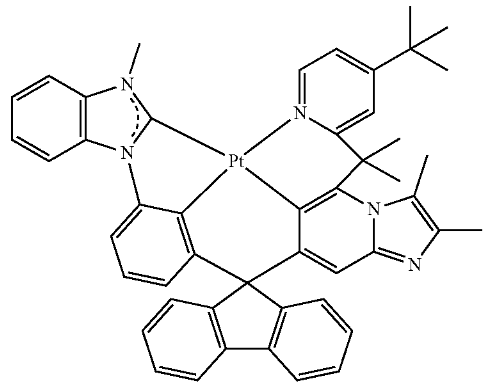
15
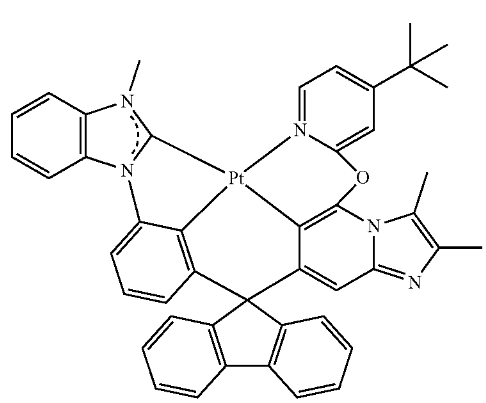
16
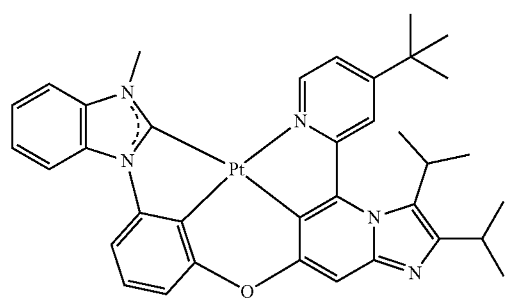
17
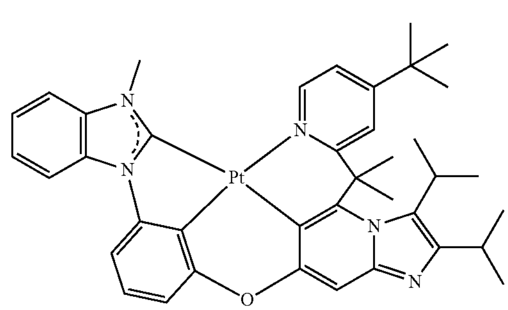

-continued
18
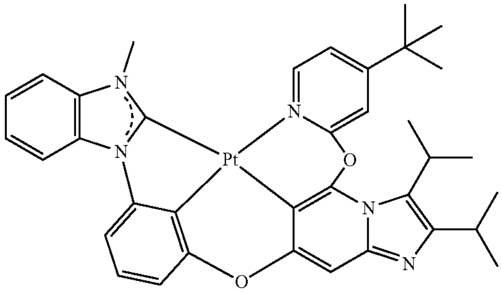
19
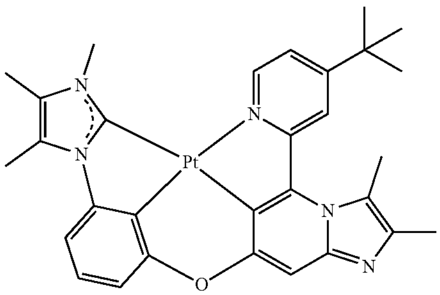
20
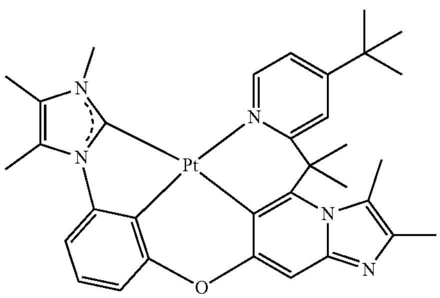
21
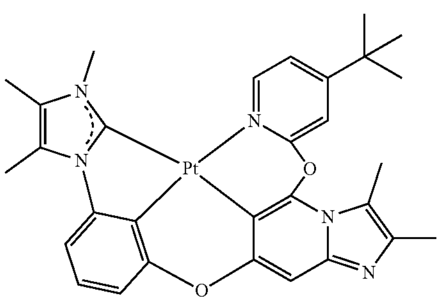
22
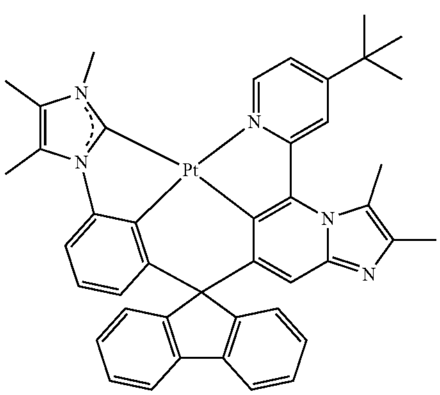
-continued
23
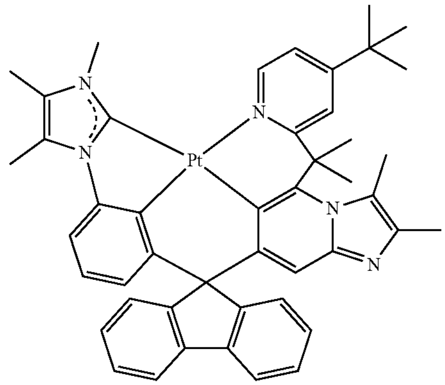
24
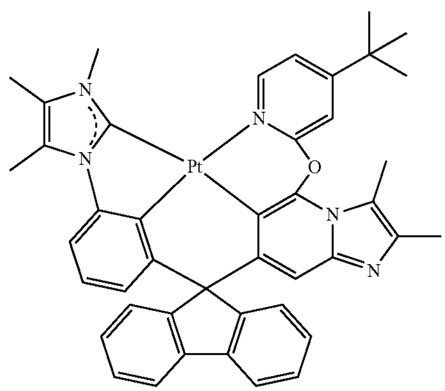
25
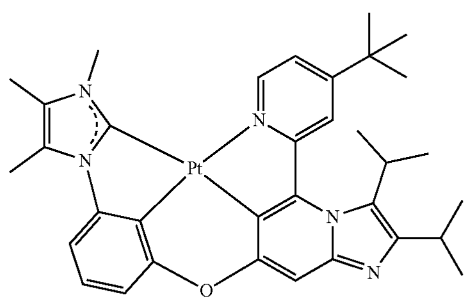
26
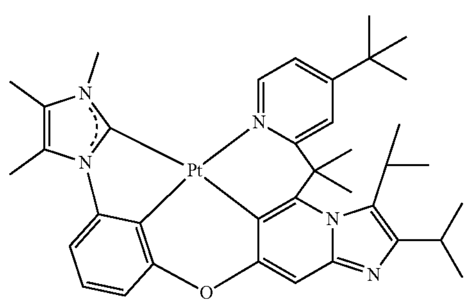

27
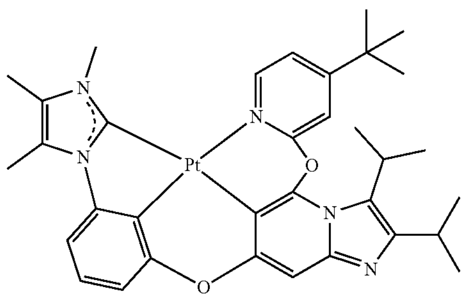
28
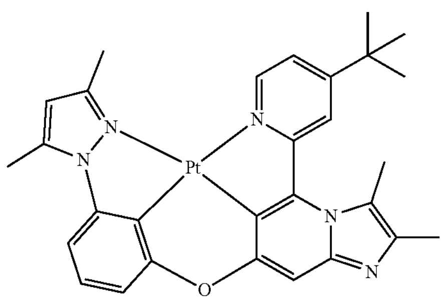
29
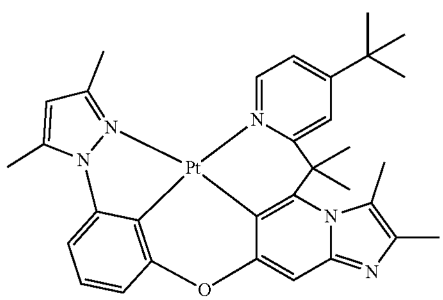
30
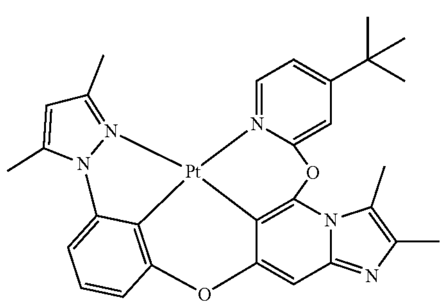
31
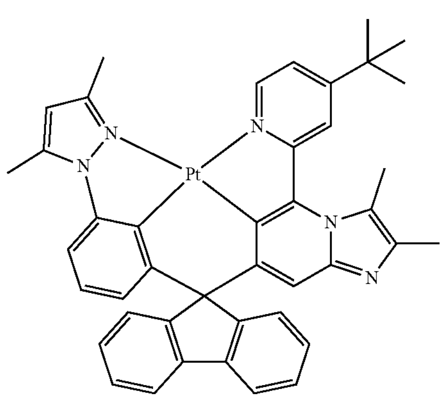
32
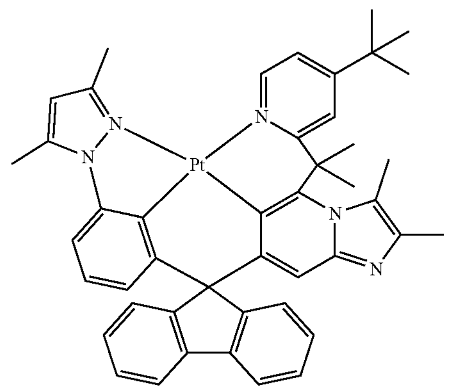
33
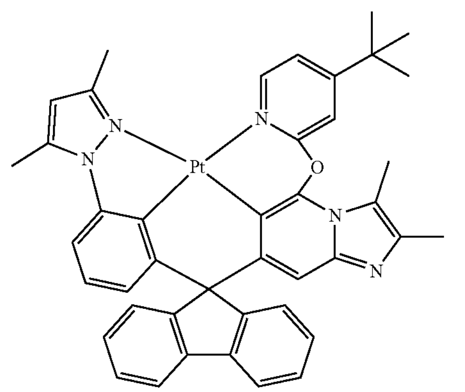
34
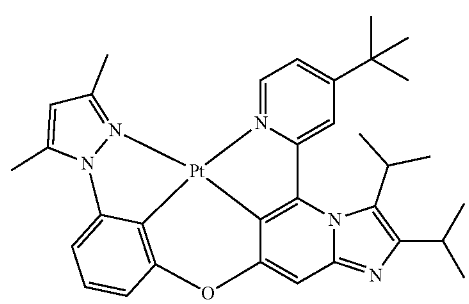
35
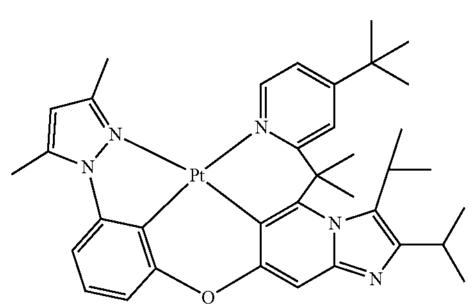

36
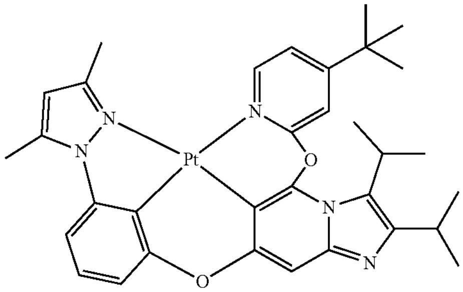
37
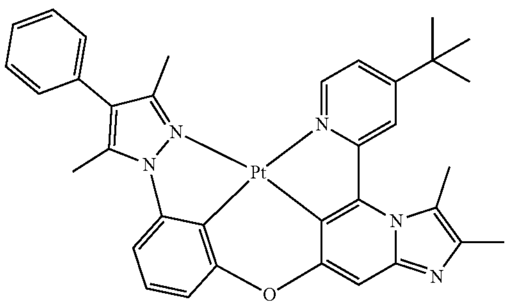
38
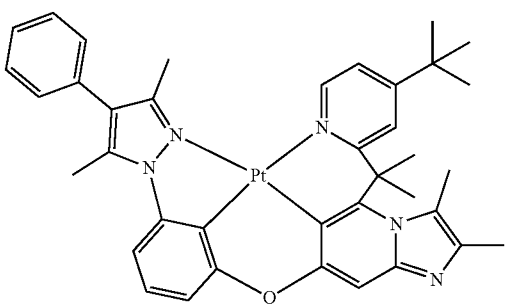
39
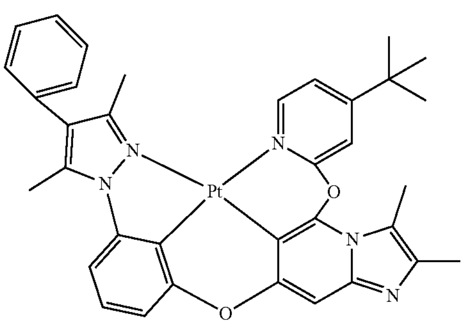
40
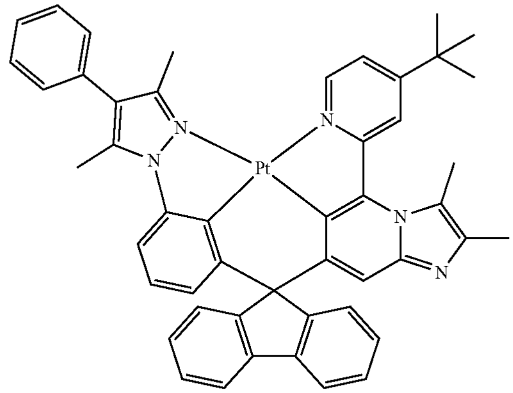
41
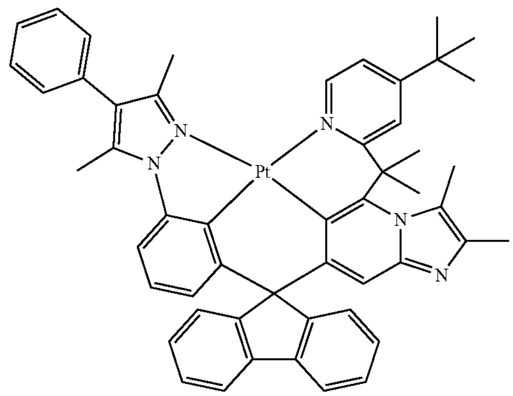
42
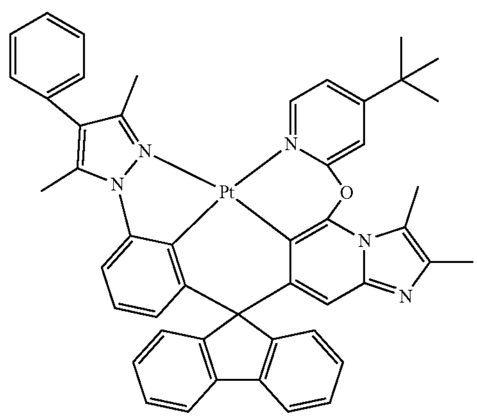
43
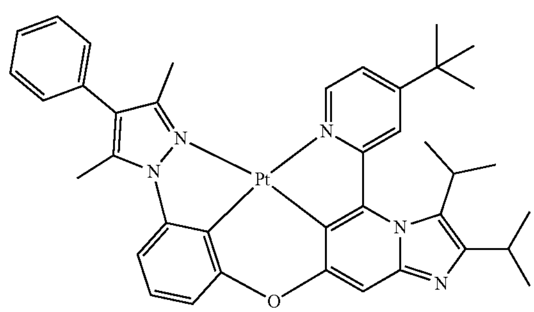

-continued
44
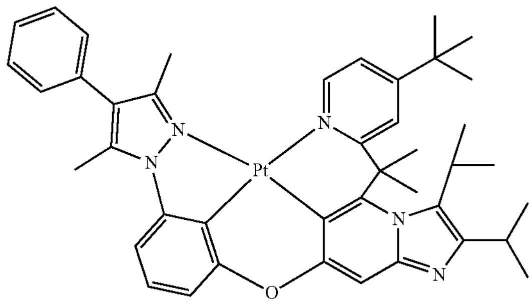
45
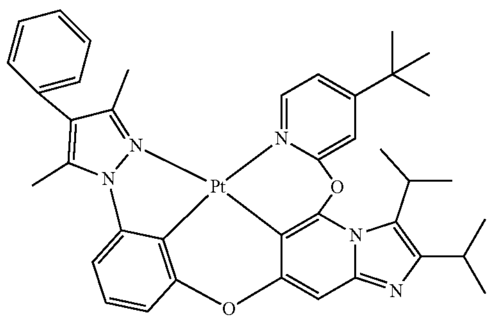
46
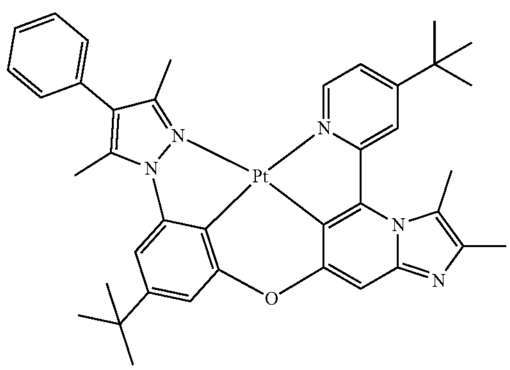
47
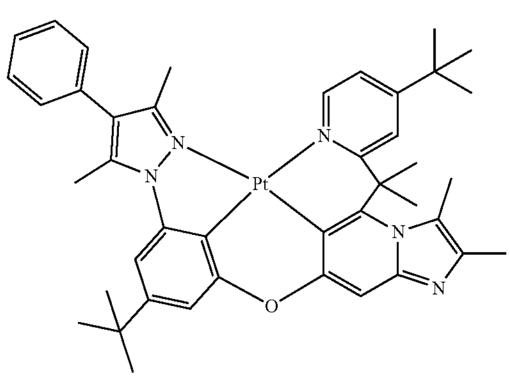
-continued
48
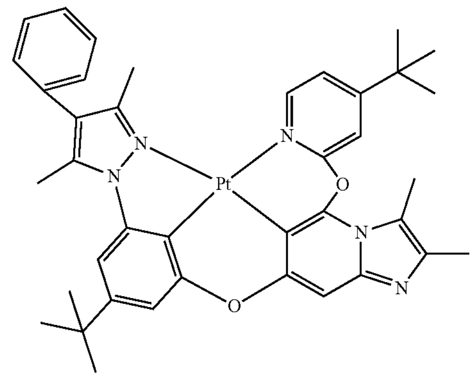
49
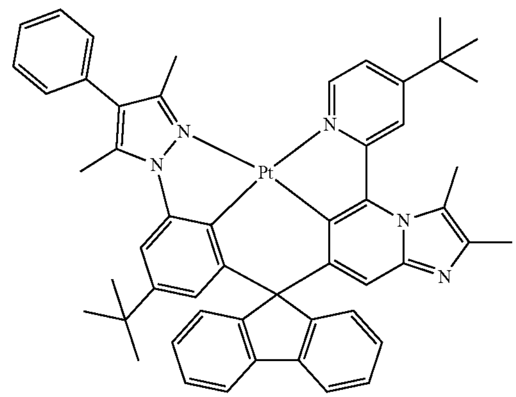
50
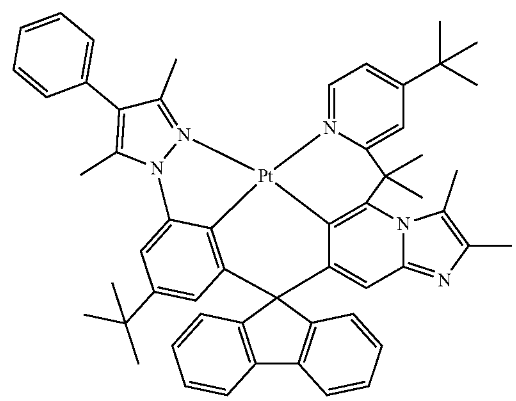
51
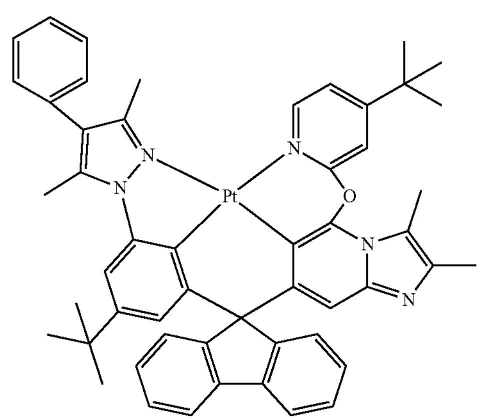

-continued
52
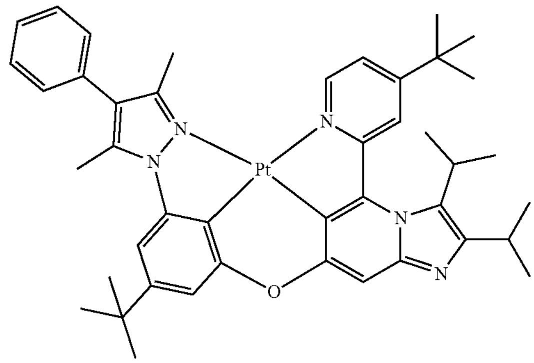
53
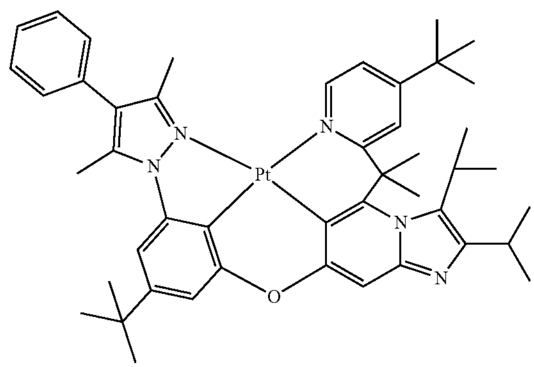
54
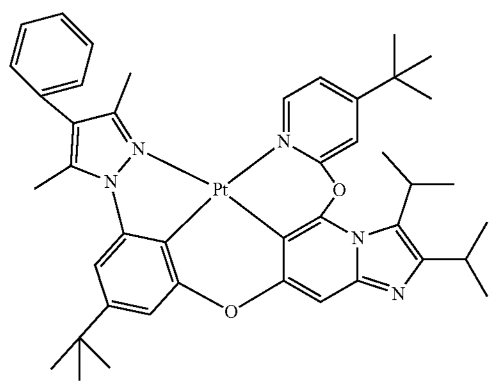
55
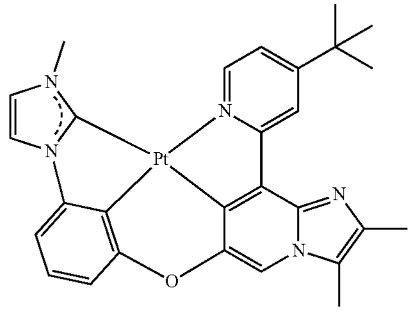
-continued
56
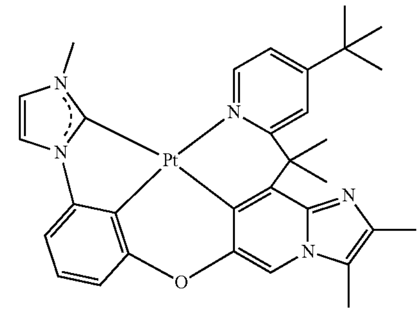
57
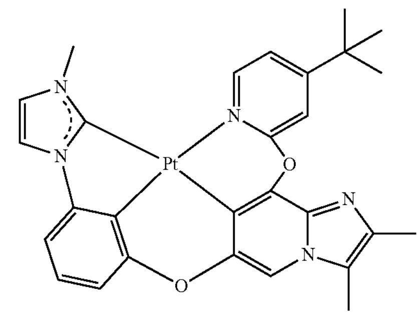
58
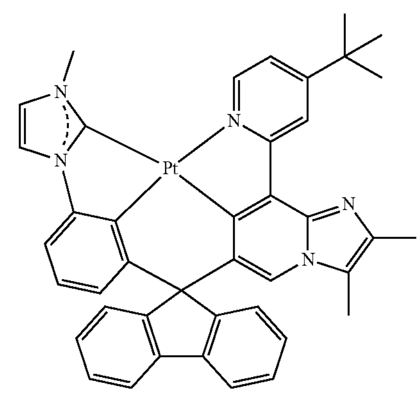
59
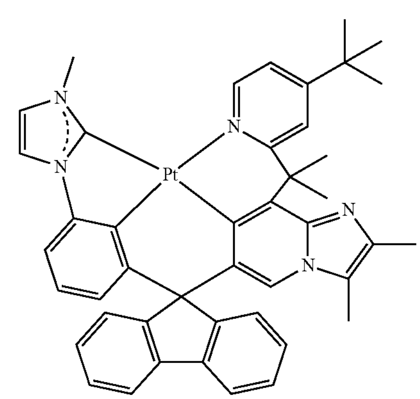

-continued
60
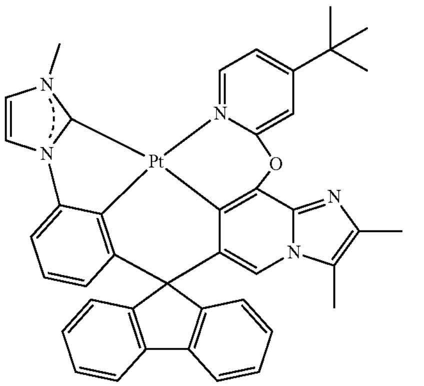
61
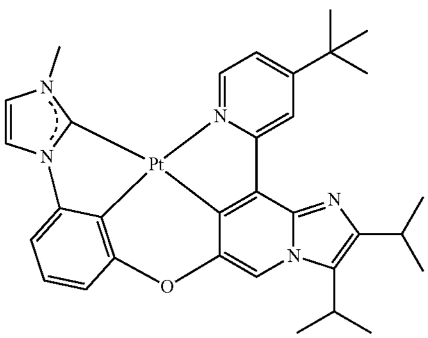
62
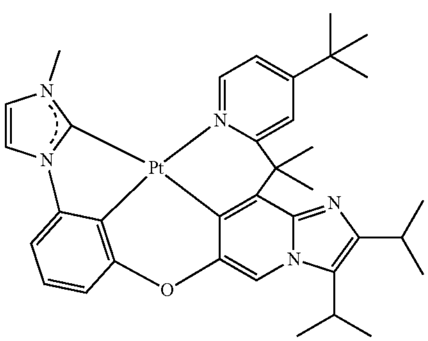
63
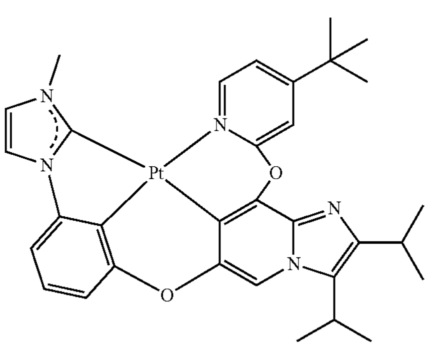
-continued
64
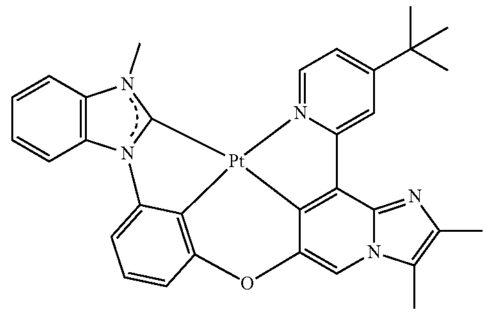
65
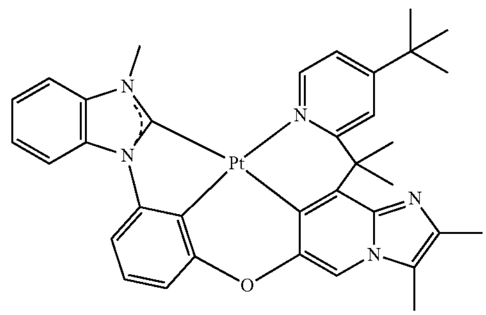
66
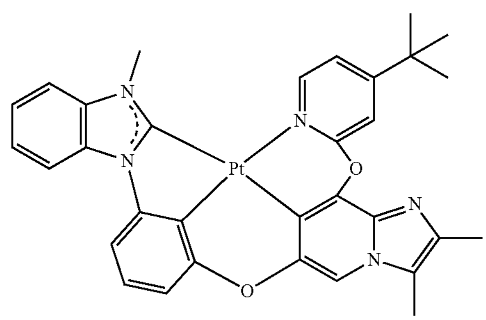
67
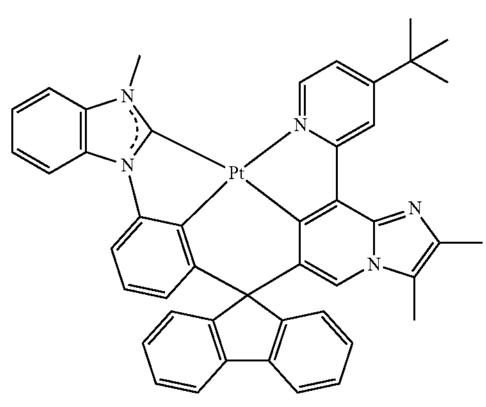

-continued
68
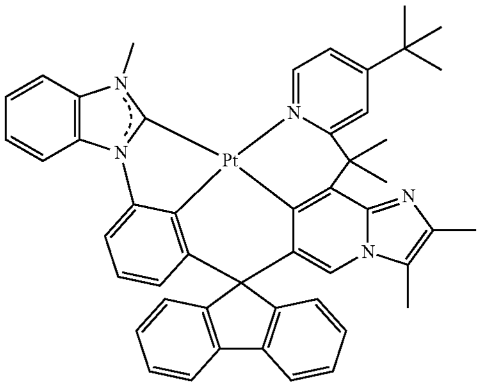
69
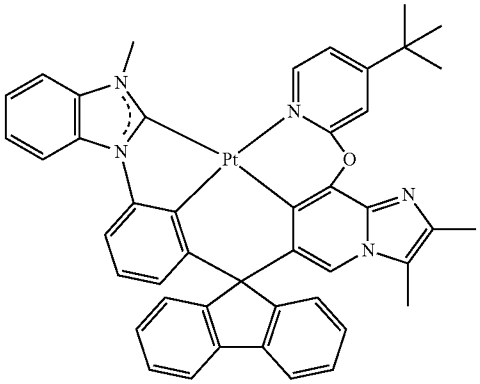
70
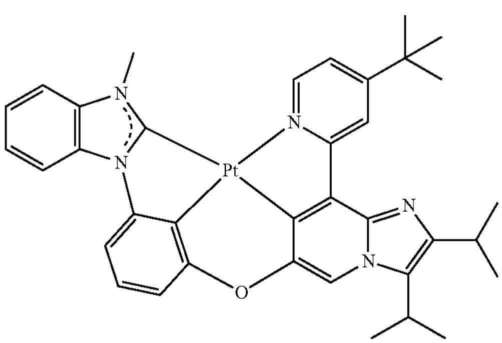
71
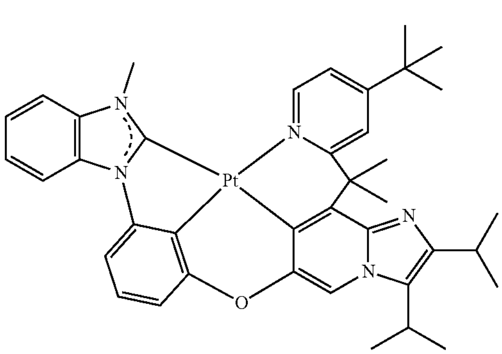
-continued
72
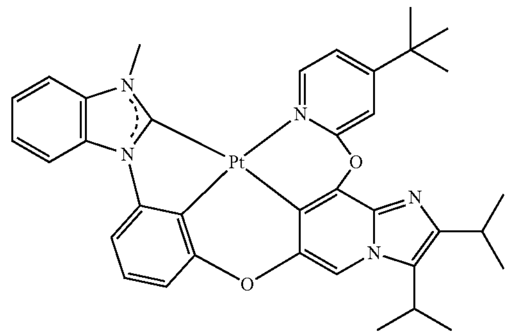
73
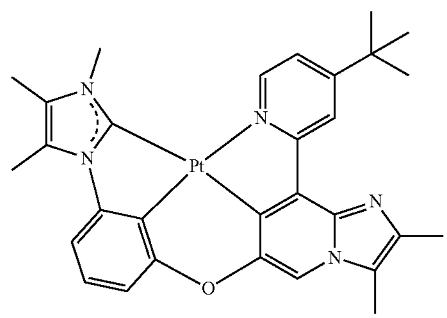
74
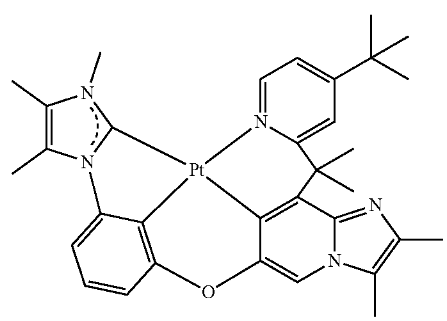
75
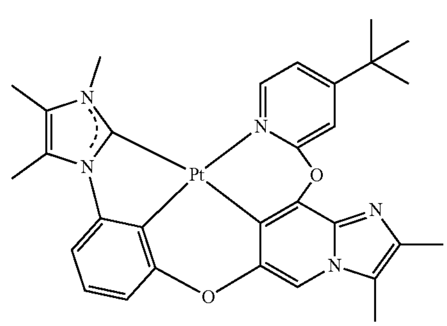

-continued
76
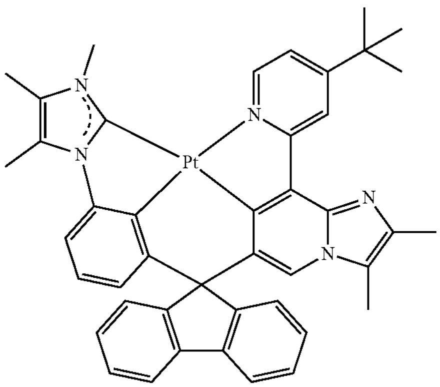
77
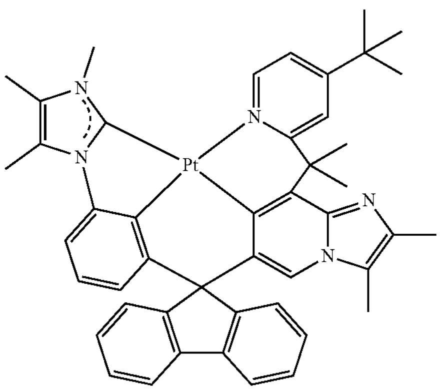
78
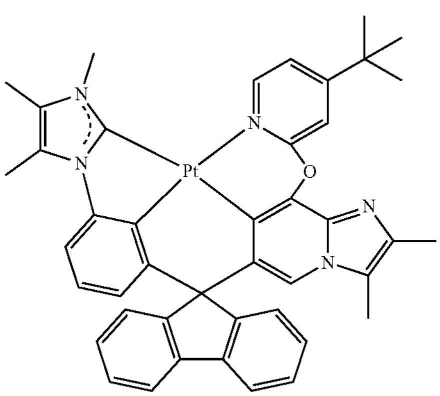
79
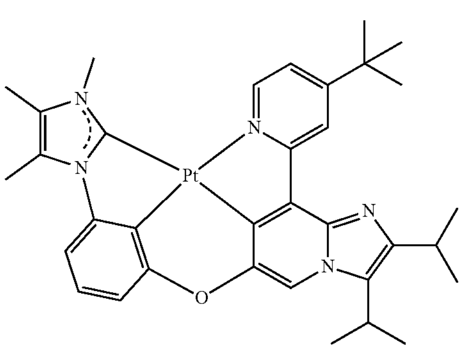
-continued
80
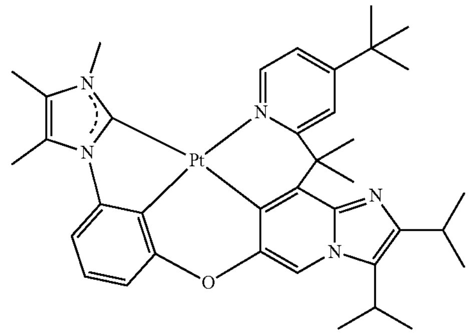
81
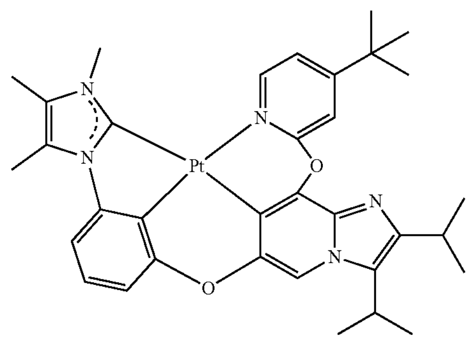
82
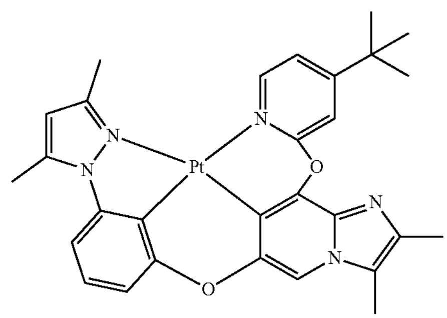
83
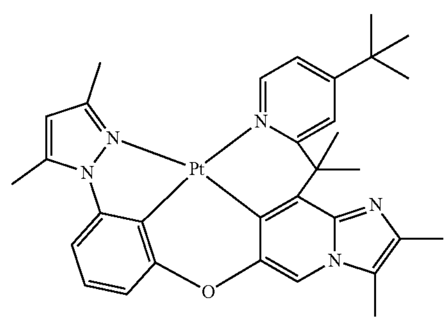
84
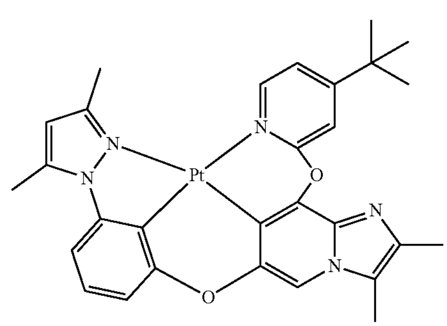

-continued
85
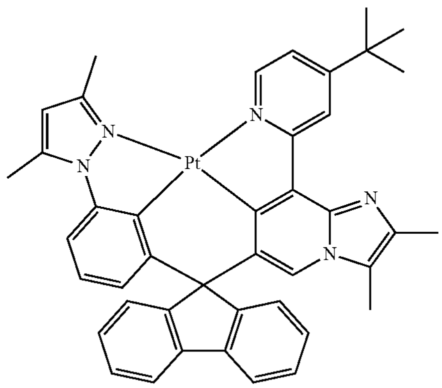
86
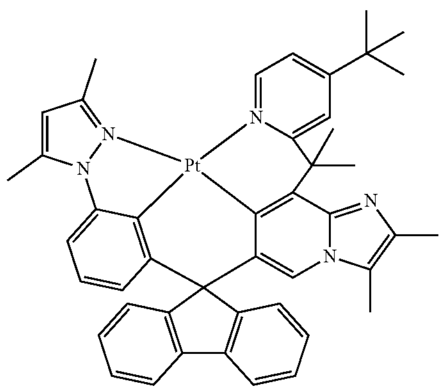
87
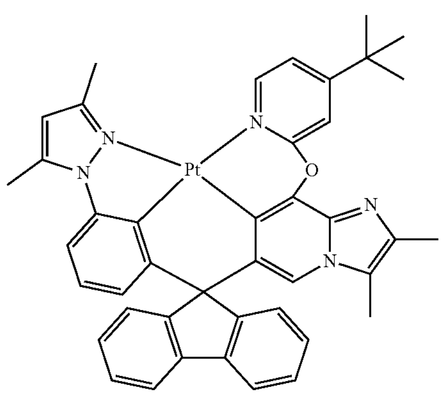
88
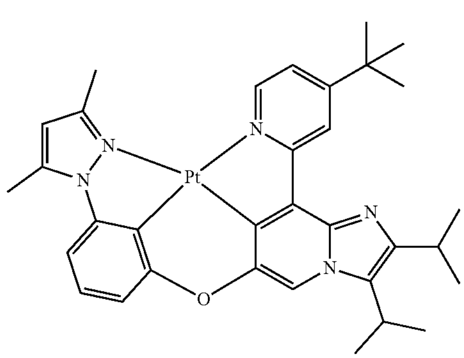
-continued
89
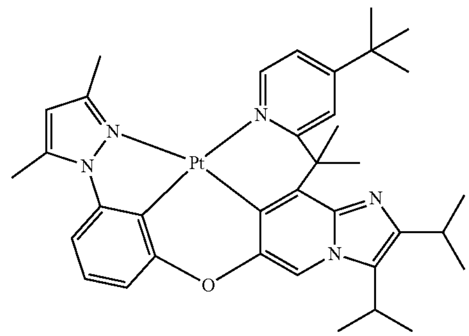
90
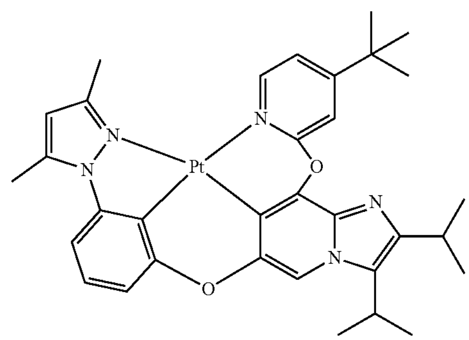
91
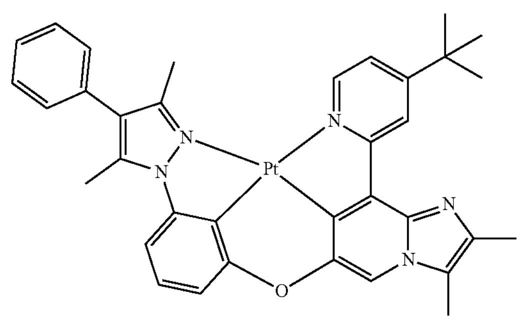
92
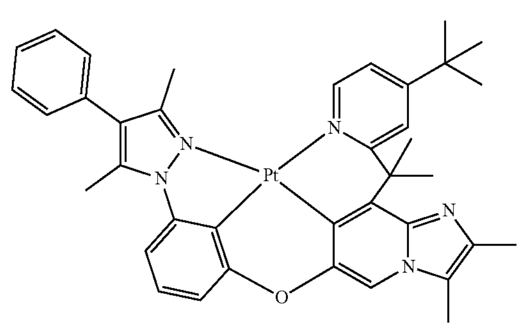

-continued
93
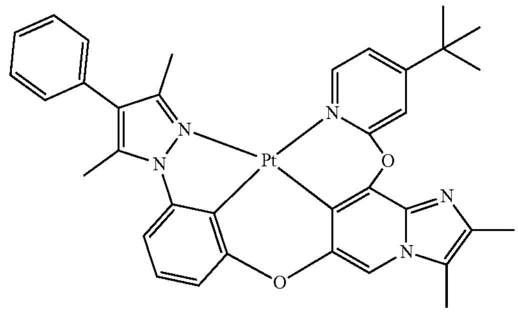
94
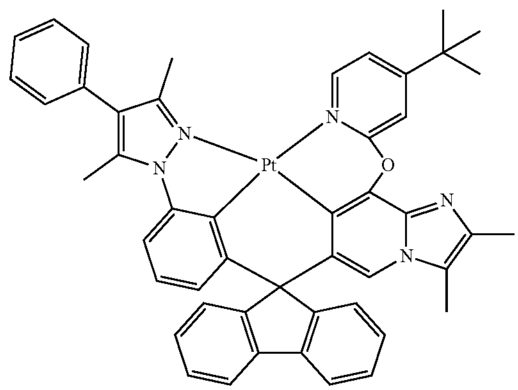
95
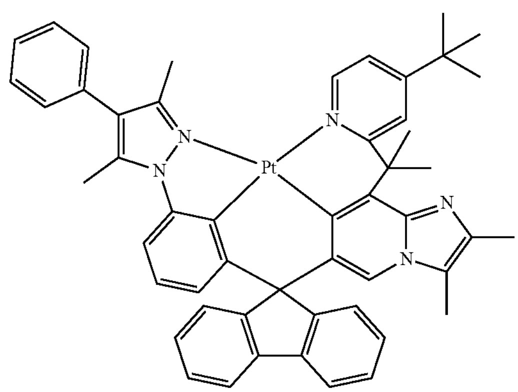
96
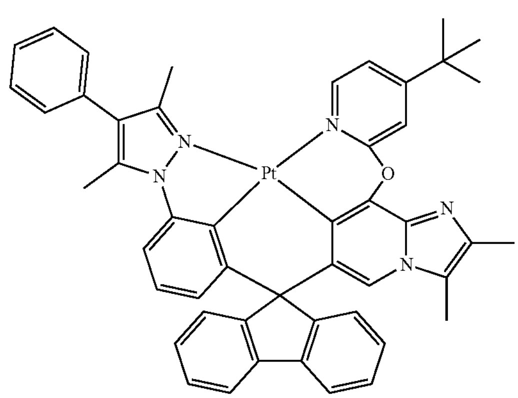
-continued
97
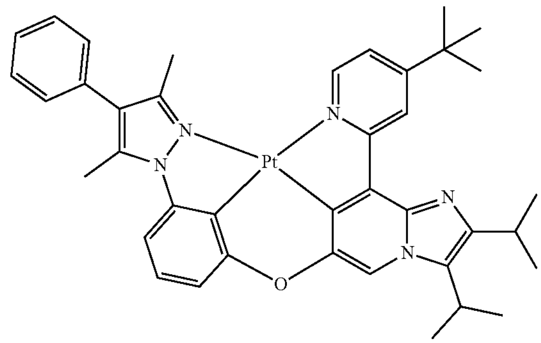
98
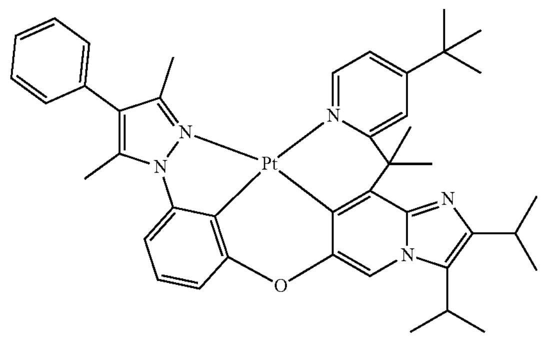
99
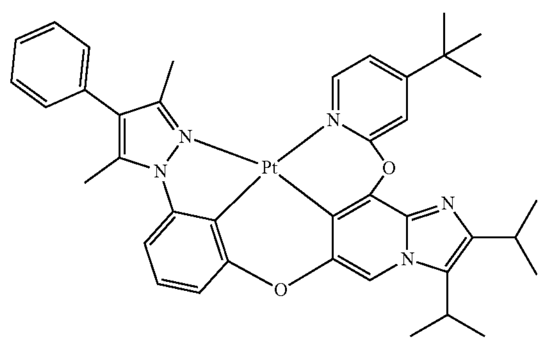
100
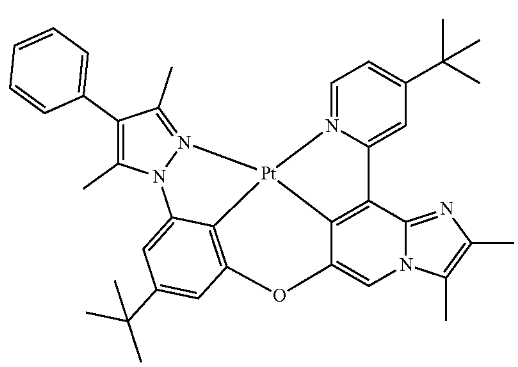

-continued
101
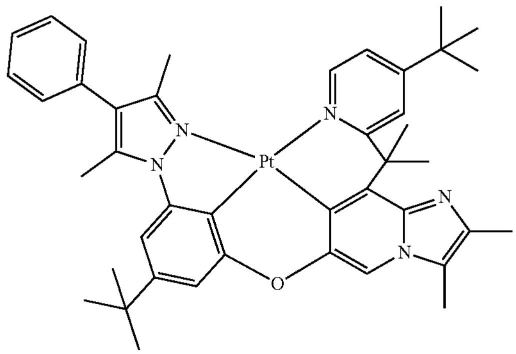
102
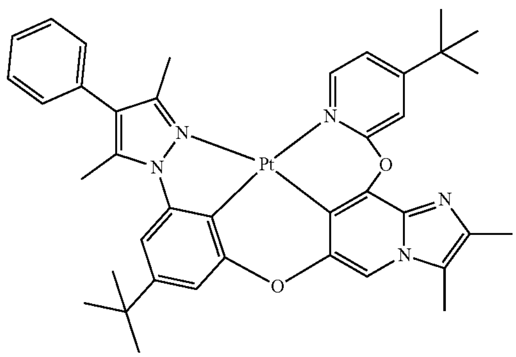
103
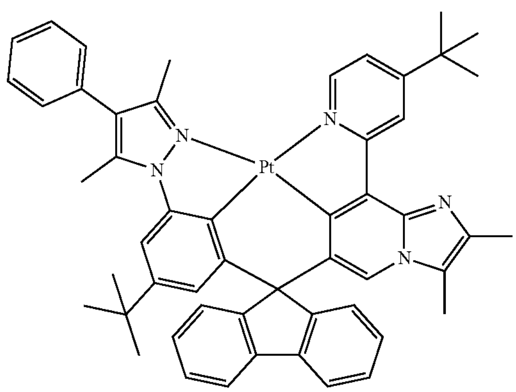
104
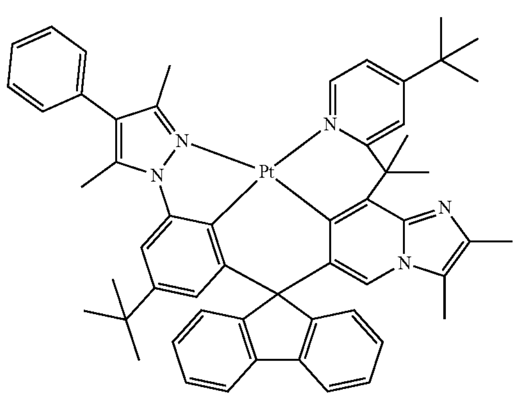
-continued
105
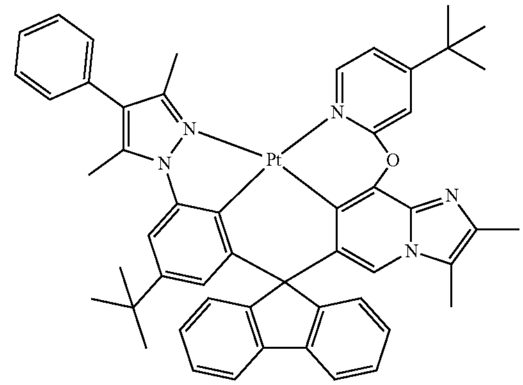
106
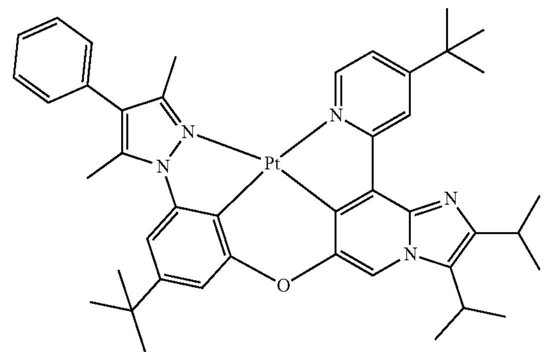
107
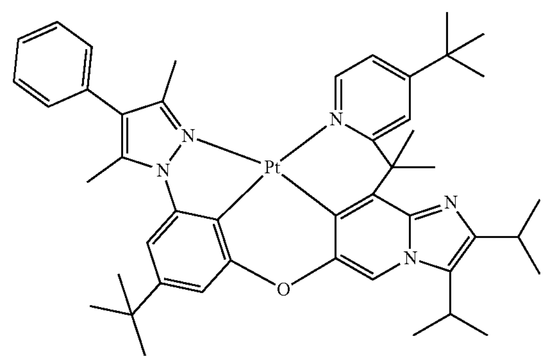
108
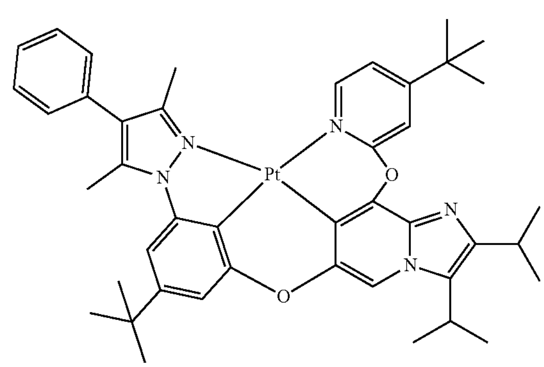

-continued
109
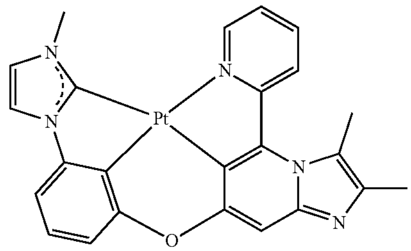
110
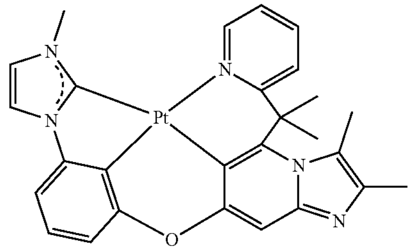
111
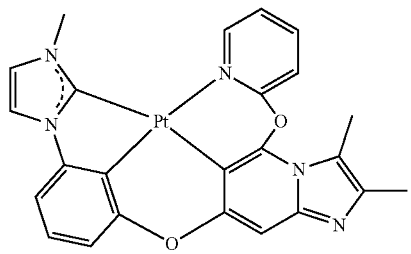
112
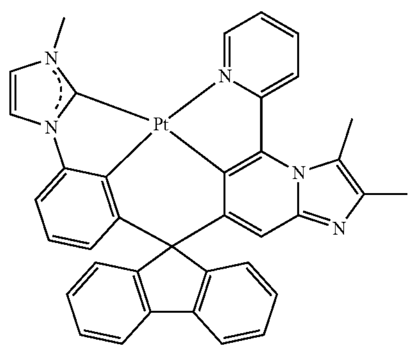
113
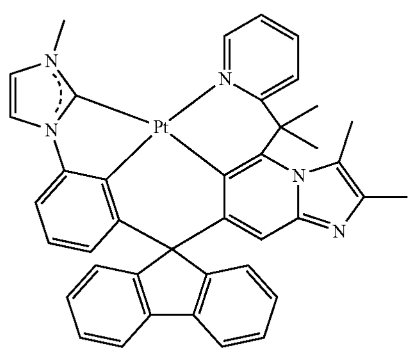
-continued
114
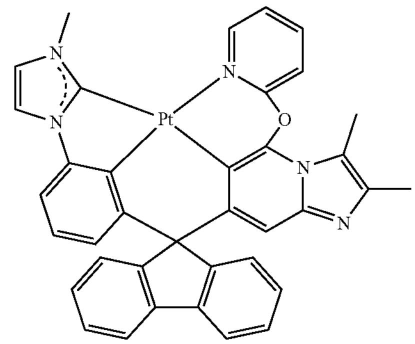
115
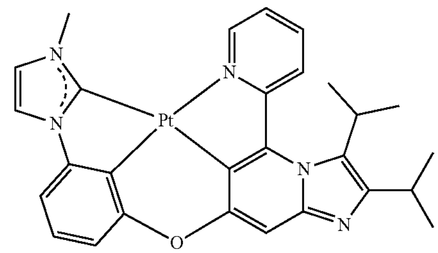
116
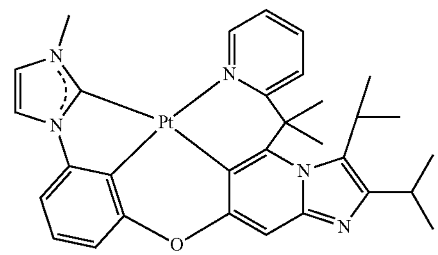
117
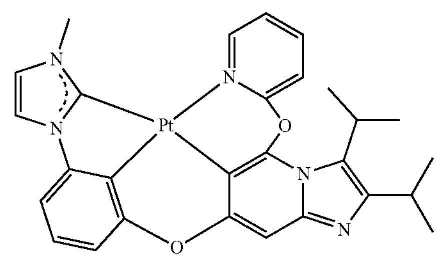
118
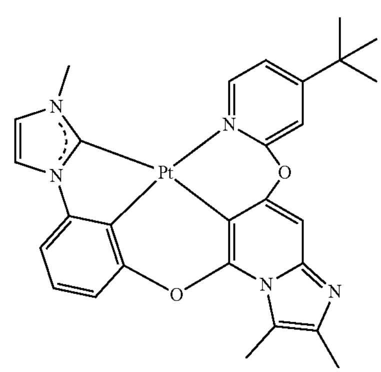

119
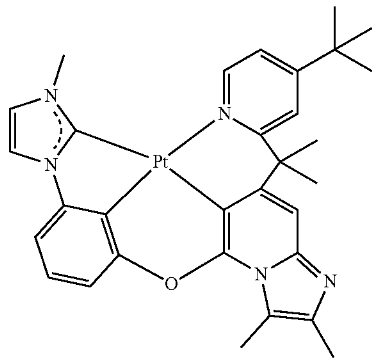
120
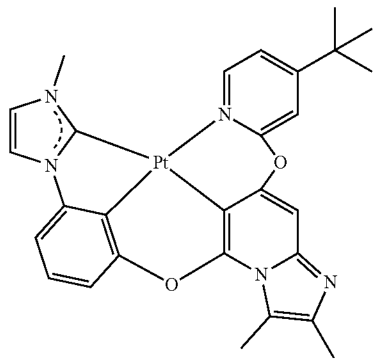
121
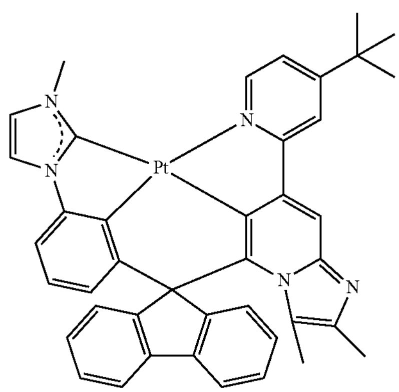
122
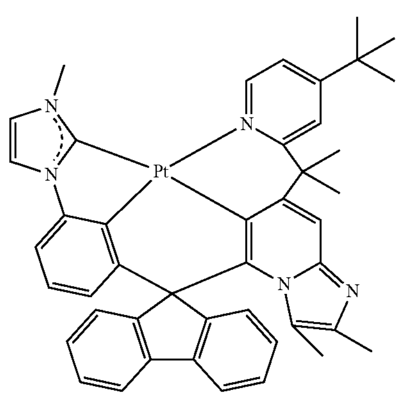
123
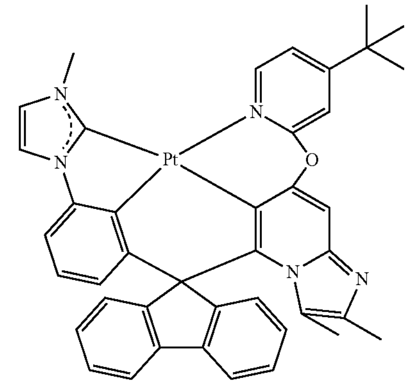
124
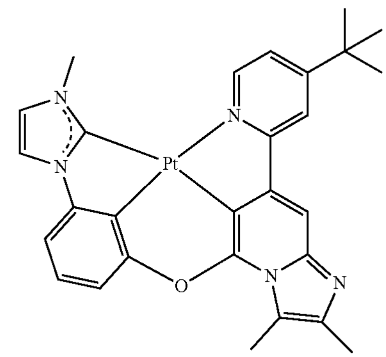
125
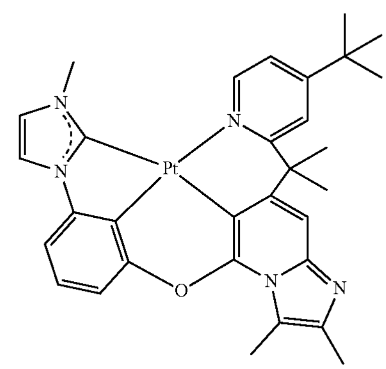
126
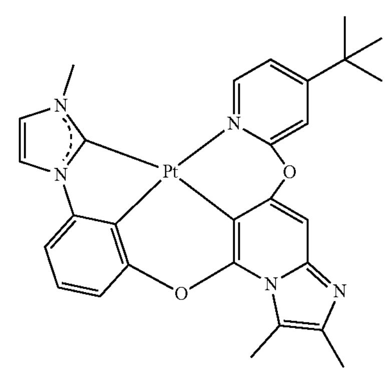

-continued
127
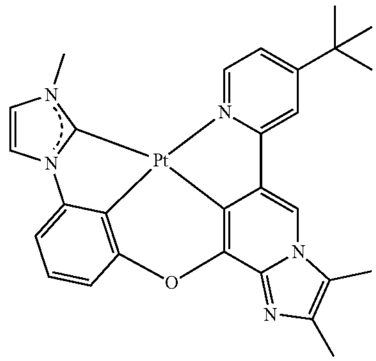
128
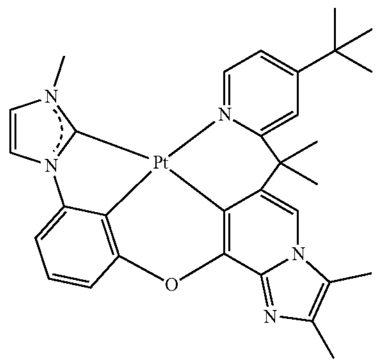
129
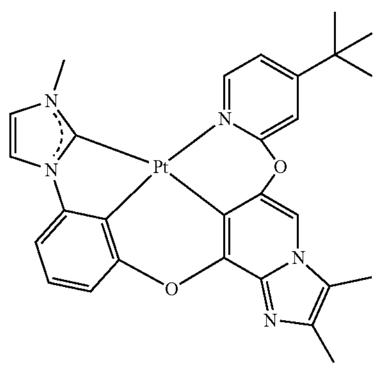
130
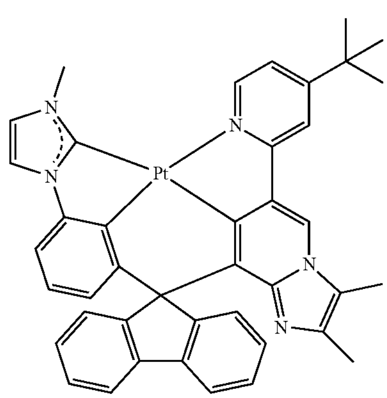
-continued
131
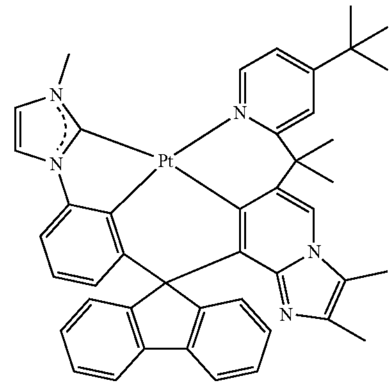
132
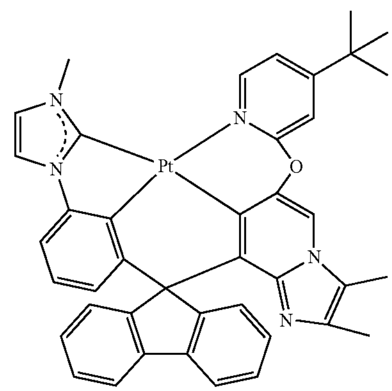
133
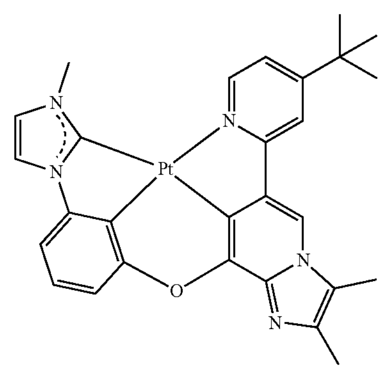
134
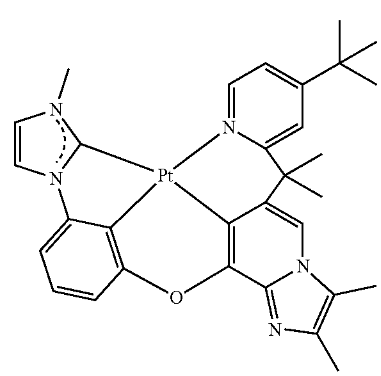

-continued

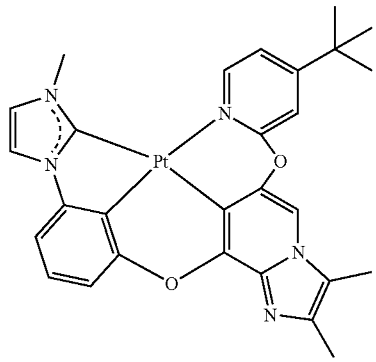

As the organometallic compound essentially include a group represented by

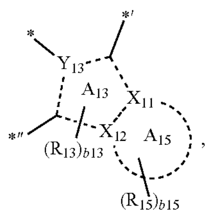

the organometallic compound may have a relatively high bond dissociation energy (BDE). In some embodiments, the group represented by

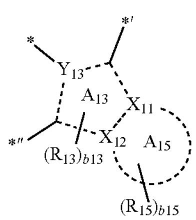

may have a high electron donating ability, and thus, a bond between $A_{14}$ and $M_{11}$ may be stabilized. Therefore, an electronic device (e.g., an organic light-emitting device) including the organometallic compound may have improved lifespan.

In addition, in the organometallic compound, as a substituent having a high electron donating ability is substituted at a partial structure having a relatively short metal-carbon bond, the metal-carbon binding force may further improve. Therefore, an electronic device (e.g., an organic light-emitting device) including the organometallic compound may have improved lifespan.

The organometallic compound represented by Formula 1 may have an energy level in a $^3$MC state of 10 kilocalories per mole (kcal/mol) or higher. In some embodiments, the organometallic compound represented by Formula 1 may have an energy level in a $^3$MC state of 12 kcal/mol or higher. When the energy level is within any of these ranges, the organometallic compound may be stable even in an excited state. Thus, an organic light-emitting device including the organometallic compound may have improved lifespan.

A bond dissociation energy (BDE) of the organometallic compound represented by Formula 1 may be higher than 3.03 electron volts (eV). In some embodiments, the organometallic compound represented by Formula 1 may have a BDE of 3.5 eV or higher. When the BDE is within any of these ranges, the organometallic compound may be highly stable. Thus, an organic light-emitting device including the organometallic compound may have improved lifespan.

The organometallic compound may emit green light or red light having a maximum emission wavelength ($\lambda_{max}$) of 500 nanometers (nm) or higher and 700 nm or less.

For example, an energy level of a triplet metal-to-ligand charge transfer state ($^3$MLCT), $\lambda_{max}$, an energy level of triplet metal-centered state ($^3$MC), and BDE of some of the compounds described herein above were evaluated by using the Gaussian program (available from Gaussian Inc.) according to a density functional theory (DFT) method (where the structure optimization was performed using the B3LYP hybrid functional, and the 6-31G(d,p) basis set). The results thereof are shown in Table 1.

TABLE 1

| Compound No. | $^3$MLCT (%) | $\lambda_{max}$ (nm) | $^3$MC (kcal/mol) | BDE (eV) |
|---|---|---|---|---|
| 1 | 7.74 | 550.29 | 0.54 | 3.38 |
| 10 | 8.45 | 540.43 | 1.46 | 4.01 |
| 19 | 6.48 | 545.48 | 6.15 | 3.94 |
| 28 | 5.78 | 552.18 | 2.55 | 3.42 |
| 55 | 7.72 | 550.74 | 0.65 | 3.54 |
| X | 6.121 | 520.26 | 0.20 | 2.47 |
| Y | 11.34 | 465.39 | 1.45 | 3.03 |
| Z | 5.26 | 500.24 | 0.48 | 1.25 |
| W | 10.00 | 470.45 | 6.12 | 2.132 |

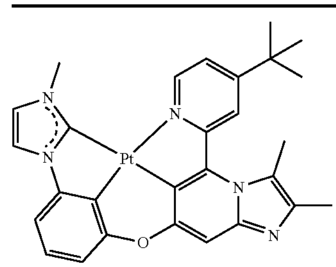

1

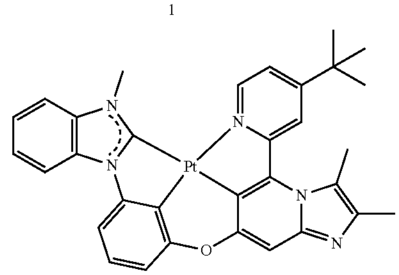

10

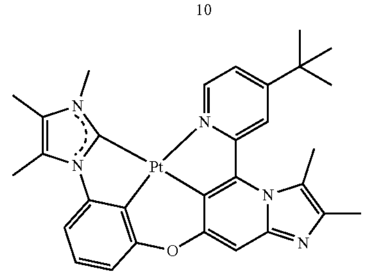

19

TABLE 1-continued

| Compound No. | $^3$MLCT (%) | $\lambda_{max}$ (nm) | $^3$MC (kcal/mol) | BDE (eV) |
|---|---|---|---|---|

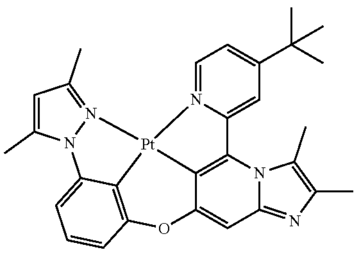

28

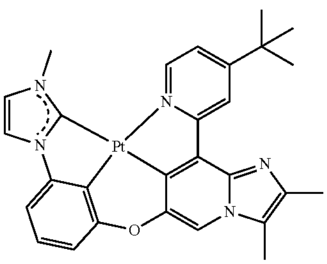

55

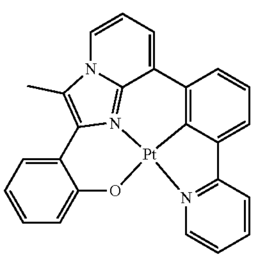

X

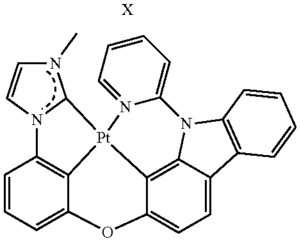

Y

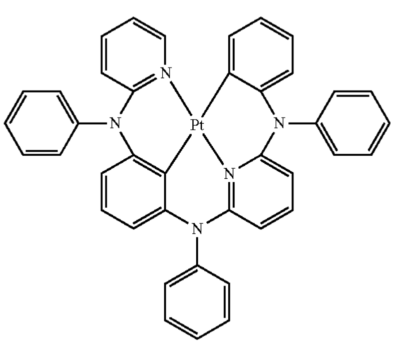

Z

TABLE 1-continued

| Compound No. | $^3$MLCT (%) | $\lambda_{max}$ (nm) | $^3$MC (kcal/mol) | BDE (eV) |
|---|---|---|---|---|

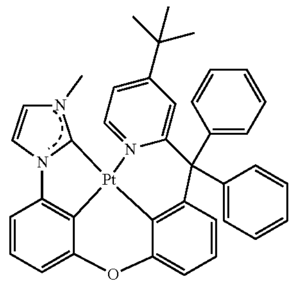

W

Referring to the results of Table 1, the organometallic compound represented by Formula 1 was found to have suitable electrical characteristics for use as a dopant in an electronic device, e.g., an organic light-emitting device.

Methods of synthesizing the organometallic compound represented by Formula 1 should be readily apparent to those of ordinary skill in the art by referring to the Examples described herein.

At least one organometallic compound represented by Formula 1 may be included between a pair of electrodes in an organic light-emitting device. Accordingly, there is provided an organic light-emitting device including a first electrode; a second electrode facing the first electrode; and an organic layer between the first electrode and the second electrode, wherein the organic layer may include an emission layer and at least one organometallic compound represented by Formula 1.

As used herein, the expression the "(organic layer) includes at least one organometallic compound" may be construed as meaning the "(organic layer) may include one organometallic compound of Formula 1 or two different organometallic compounds of Formula 1".

For example, Compound 1 may only be included in the organic layer as an organometallic compound. In this embodiment, Compound 1 may be included in the emission layer of the organic light-emitting device. In some embodiments, Compounds 1 and 2 may be included in the organic layer as organometallic compounds. In this embodiment, Compounds 1 and 2 may be included in the same layer (for example, both Compounds 1 and 2 may be included in an emission layer) or in different layers (for example, Compound 1 may be included in an emission layer, and Compound 2 may be included in an electron transport layer).

The organic layer may include i) a hole transport region between the first electrode (anode) and the emission layer that includes at least one selected from a hole injection layer, a hole transport layer, a buffer layer, and an electron blocking layer, and/or ii) an electron transport region between the emission layer and the second electrode (cathode) that includes at least one selected from a hole blocking layer, an electron transport layer, and an electron injection layer. The emission layer may include the at least one organometallic compound represented by Formula 1.

In some embodiments, at least one of the hole transport region and the emission layer may include an arylamine-containing compound, an acridine-containing compound, and a carbazole-containing compound, and/or at least one of the emission layer and the electron transport region may include a silicon-containing compound, a phosphine oxide-containing compound, a sulfur oxide-containing compound, a phosphorus oxide-containing compound, a triazine-containing compound, a pyrimidine-containing compound, a pyridine-containing compound, a dibenzofuran-containing compound, and a dibenzothiophene-containing compound.

Description of FIG. 1

FIG. 1 is a schematic view of an organic light-emitting device 10 according to an exemplary embodiment. The organic light-emitting device 10 may include a first electrode 110, an organic layer 150, and a second electrode 190.

Hereinafter, the structure of the organic light-emitting device 10 according to an embodiment and a method of manufacturing an organic light-emitting device according to an embodiment will be described in connection with FIG. 1.

First Electrode 110

In FIG. 1, a substrate may be additionally located under the first electrode 110 or above the second electrode 190. The substrate may be a glass substrate or a plastic substrate, each having excellent mechanical strength, thermal stability, transparency, surface smoothness, ease of handling, and water resistance.

The first electrode 110 may be formed by depositing or sputtering, onto the substrate, a material for forming the first electrode 110. When the first electrode 110 is an anode, the material for forming the first electrode 110 may be selected from materials with a high work function that facilitate hole injection.

The first electrode 110 may be a reflective electrode, a semi-transmissive electrode, or a transmissive electrode. When the first electrode 110 is a transmissive electrode, a material for forming the first electrode 110 may be selected from indium tin oxide (ITO), indium zinc oxide (IZO), tin oxide ($SnO_2$), zinc oxide (ZnO), and any combinations thereof, but the present disclosure is not limited thereto. In some embodiments, when the first electrode 110 is a semi-transmissive electrode or a reflective electrode, as a material for forming the first electrode 110, at least one of magnesium (Mg), silver (Ag), aluminum (AI), aluminum-lithium (Al—Li), calcium (Ca), magnesium-indium (Mg—In), magnesium-silver (Mg—Ag), and any combination thereof may be used, but the present disclosure is not limited thereto.

The first electrode 110 may have a single-layered structure, or a multi-layered structure including two or more layers. In some embodiments, the first electrode 110 may have a triple-layered structure of ITO/Ag/ITO, but the present disclosure is not limited thereto.

Organic Layer 150

The organic layer 150 may be on the first electrode 110. The organic layer 150 may include an emission layer.

The organic layer 150 may further include a hole transport region between the first electrode 110 and the emission layer and/or an electron transport region between the emission layer and the second electrode 190.

Hole Transport Region in Organic Layer 150

The hole transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The hole transport region may include at least one selected from a hole injection layer, a hole transport layer, an emission auxiliary layer, and an electron blocking layer.

For example, the hole transport region may have a single-layered structure including a single layer including a plurality of different materials or a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 110 in each stated order, but the present disclosure is not limited thereto.

The hole transport region may include at least one selected from m-MTDATA, TDATA, 2-TNATA, NPB (NPD), β-NPB, TPD, a spiro-TPD, a spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

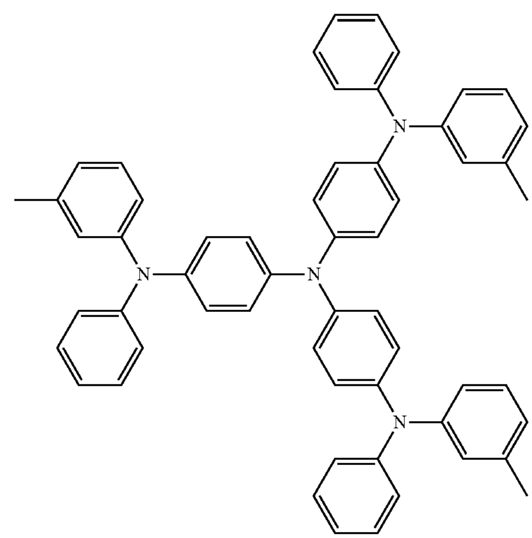

m-MTDATA

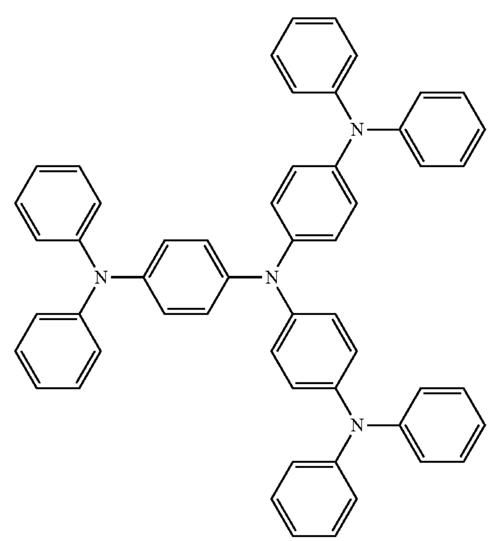

TDATA

-continued
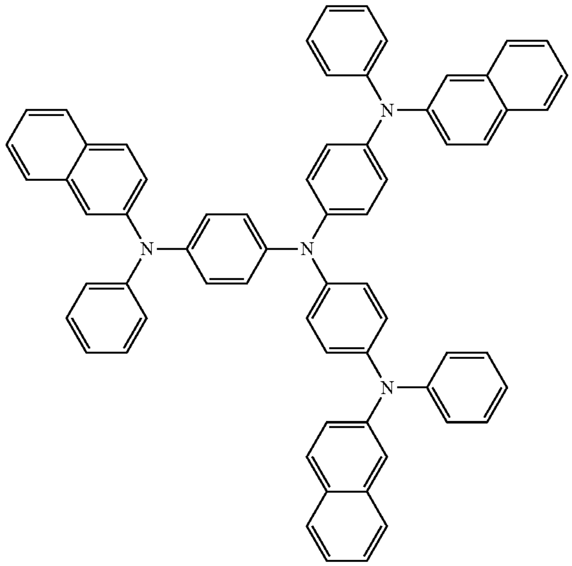
2-TNATA
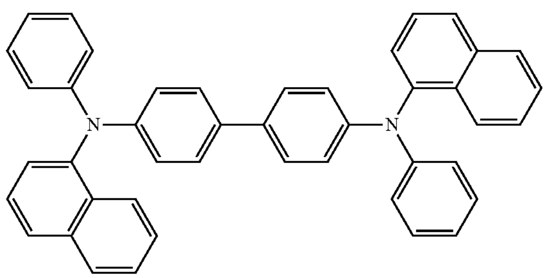
NPB
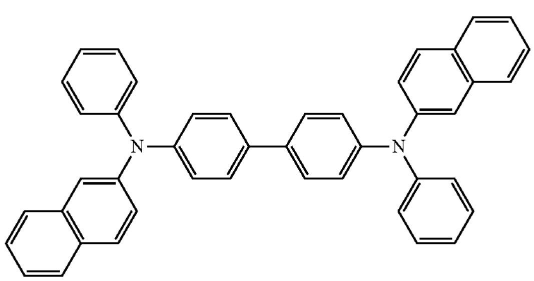
β-NPB
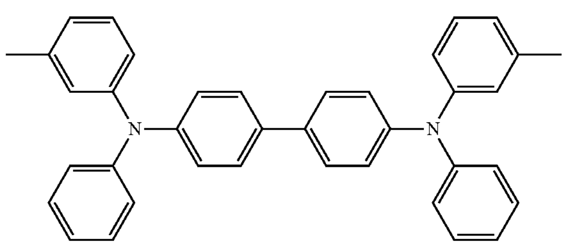
TPD
-continued
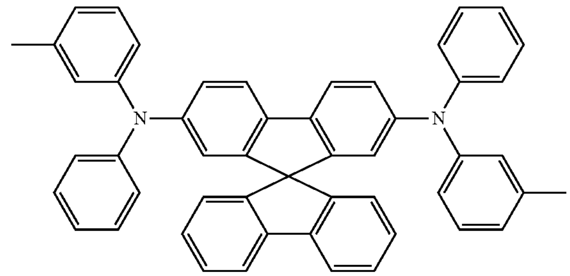
Spiro-TPD
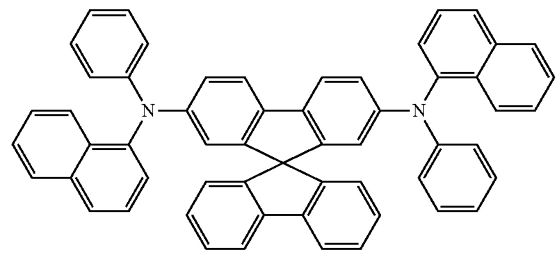
Spiro-NPB
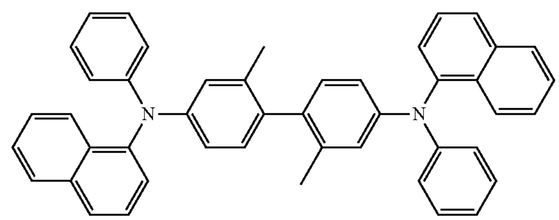
methylated NPB
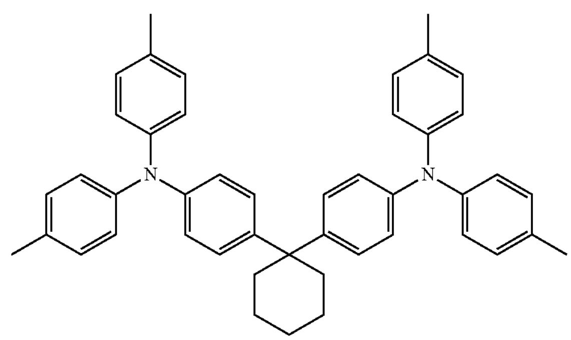
TAPC
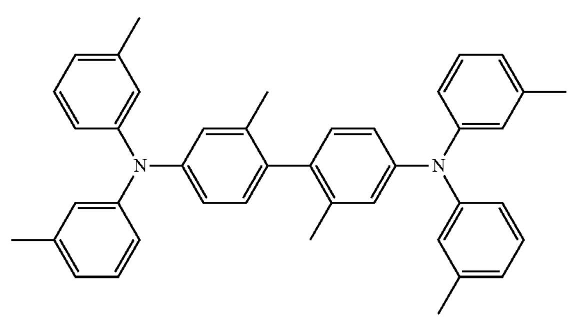
HMTPD
Formula 201
$$R_{201}—(L_{201})_{xa1}—N\begin{matrix}(L_{202})_{xa2}—R_{202}\\(L_{203})_{xa3}—R_{203}\end{matrix}$$

-continued

Formula 202

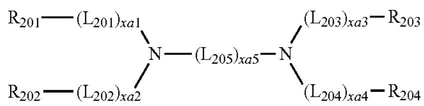

wherein, in Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formula 202, $R_{201}$ and $R_{202}$ may optionally be bound via a single bond, a dimethyl-methylene group, or a diphenyl-methylene group, and $R_{203}$ and $R_{204}$ may optionally be bound via a single bond, a dimethyl-methylene group, or a diphenyl-methylene group.

In some embodiments, in Formula 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In some embodiments, xa1 to xa4 may each independently be 0, 1, or 2.

In some embodiments, xa5 may be 1, 2, 3, or 4.

In some embodiments, $R_{201}$ to $R_{204}$ and $Q_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may respectively be understood by referring to the descriptions therefor provided herein.

In some embodiments, in Formula 201, at least one selected from $R_{201}$ to $R_{203}$ may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but the present disclosure is not limited thereto.

In some embodiments, in Formula 202, i) $R_{201}$ and $R_{202}$ may be bound via a single bond, and/or ii) $R_{203}$ and $R_{204}$ may be bound via a single bond.

In some embodiments, in Formula 202, at least one selected from $R_{201}$ to $R_{204}$ may be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but the present disclosure is not limited thereto.

The compound represented by Formula 201 may be represented by Formula 201A:

Formula 201A

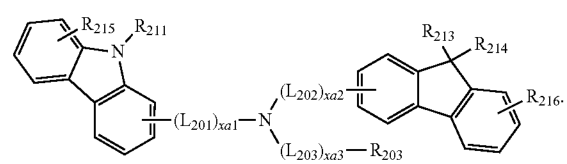

In some embodiments, the compound represented by Formula 201 may be represented by Formula 201A(1), but the present disclosure is not limited thereto:

Formula 201A(1)

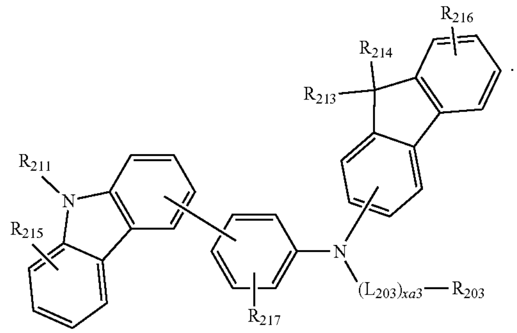

In some embodiments, the compound represented by Formula 201 may be represented by Formula 201A-1, but the present disclosure is not limited thereto:

Formula 201A-1

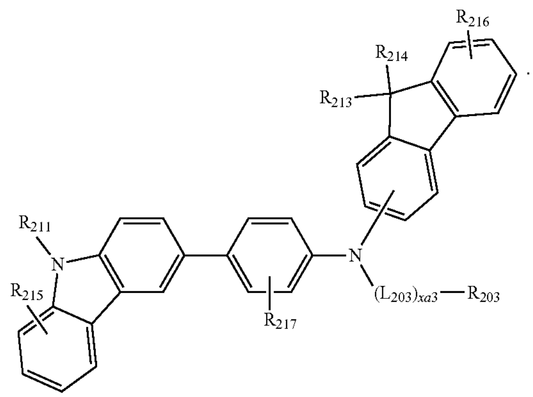

In some embodiments, the compound represented by Formula 202 may be represented by Formula 202A:

Formula 202A

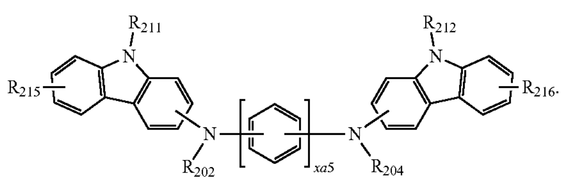

In some embodiments, the compound represented by Formula 202 may be represented by Formula 202A-1:

Formula 202A-1

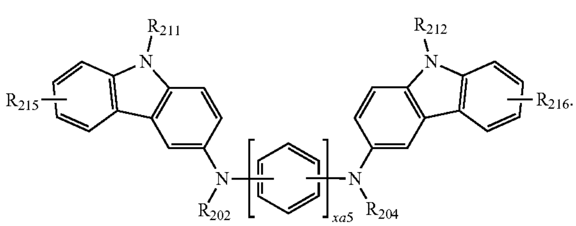

In Formulae 201A, 201A(1), 201A-1, 202A, and 202A-1, $L_{201}$ to $L_{203}$, xa1 to xa3, xa5, and $R_{202}$ to $R_{204}$ may respectively be understood by referring to the descriptions therefor provided herein, $R_{211}$ and $R_{212}$ may each be understood by referring to the descriptions for $R_{203}$ provided herein, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but the present disclosure is not limited thereto:

HT1

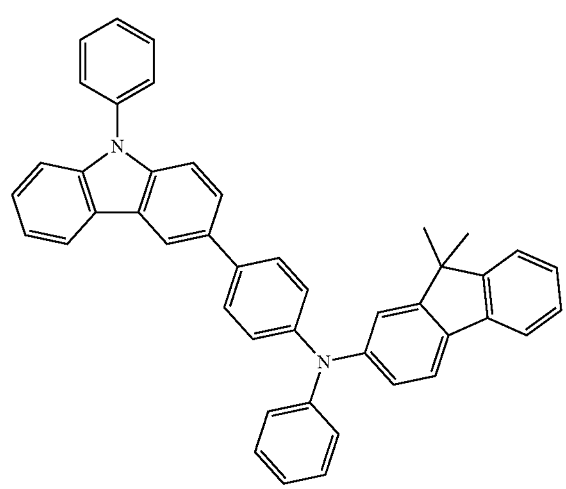

-continued
HT2
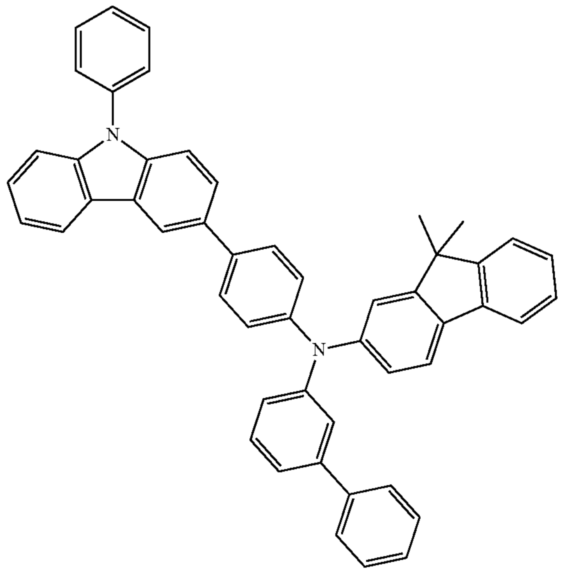
HT3
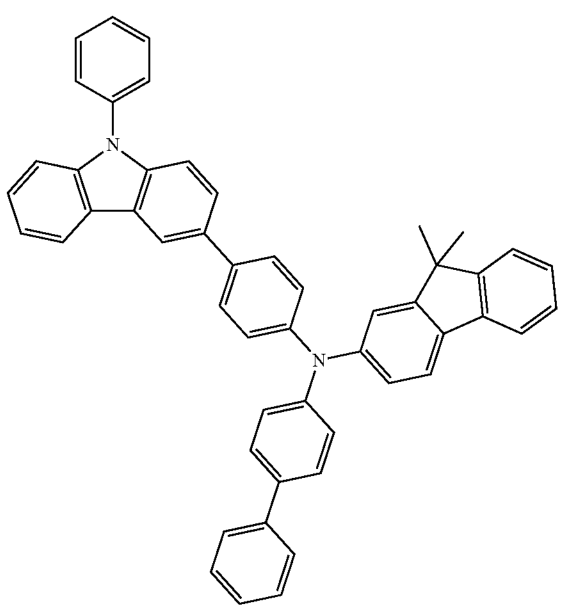
-continued
HT4
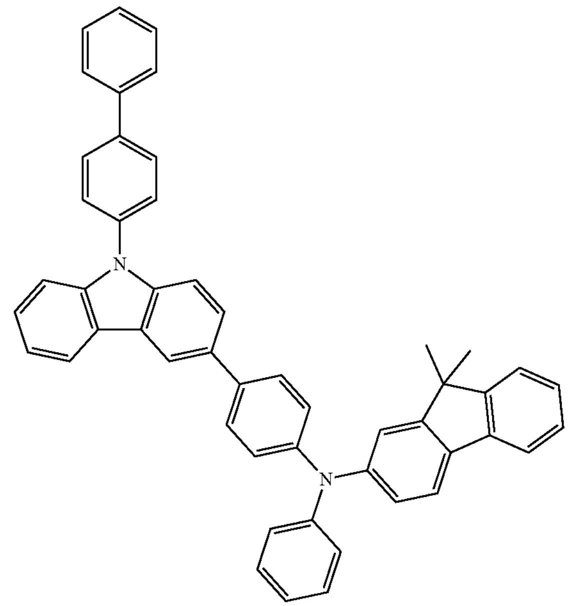
HT5
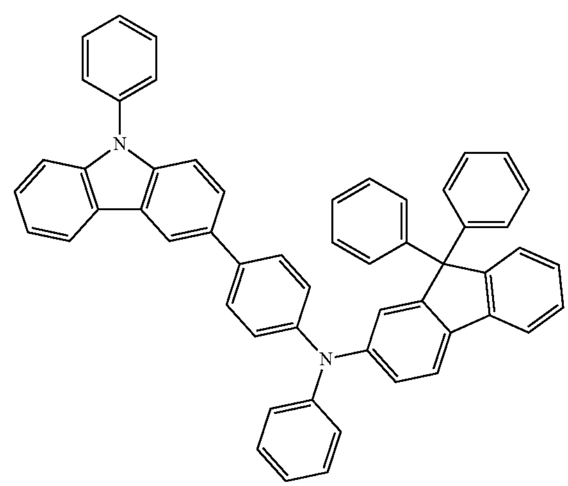

-continued
HT6
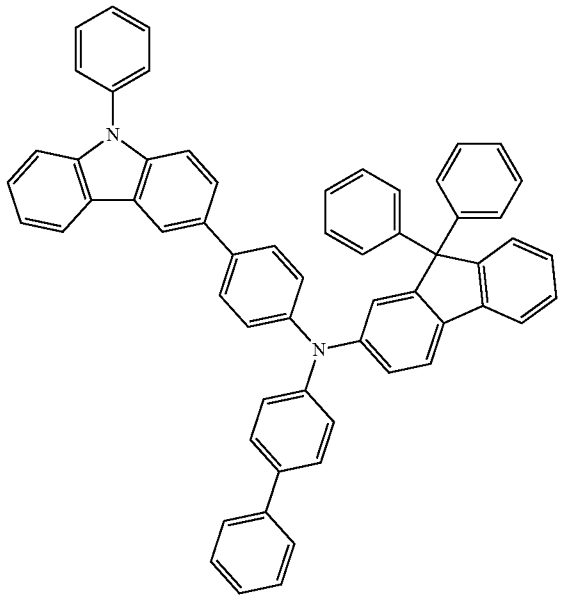
HT7
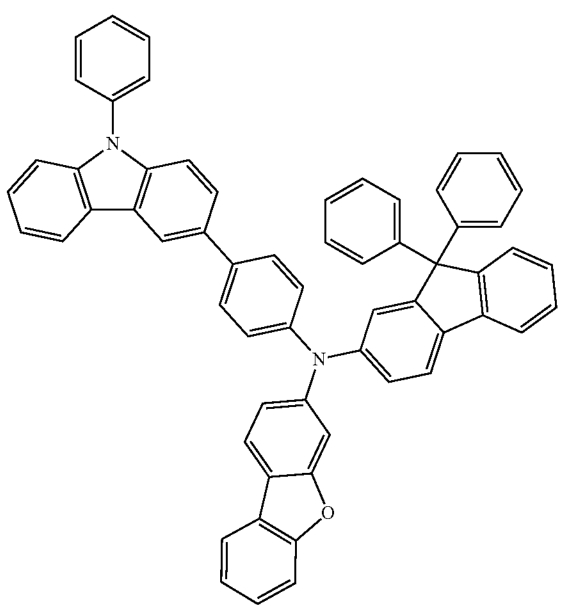
-continued
HT8
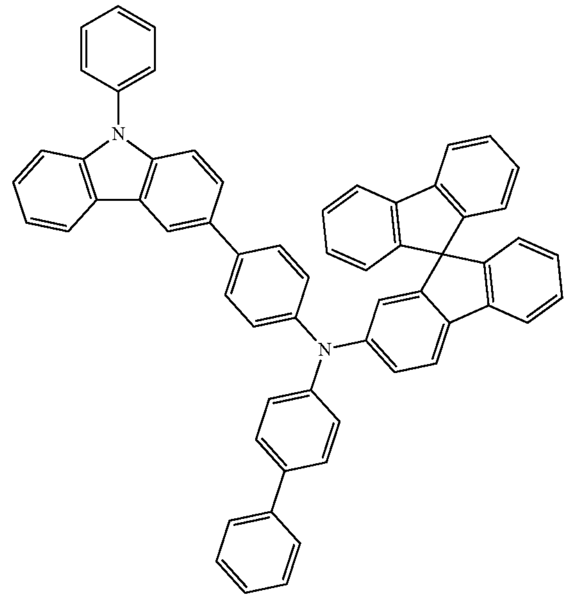
HT9
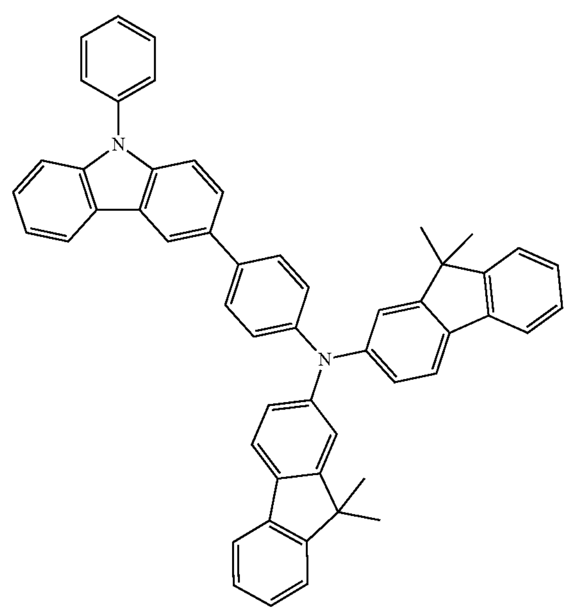

-continued
HT10
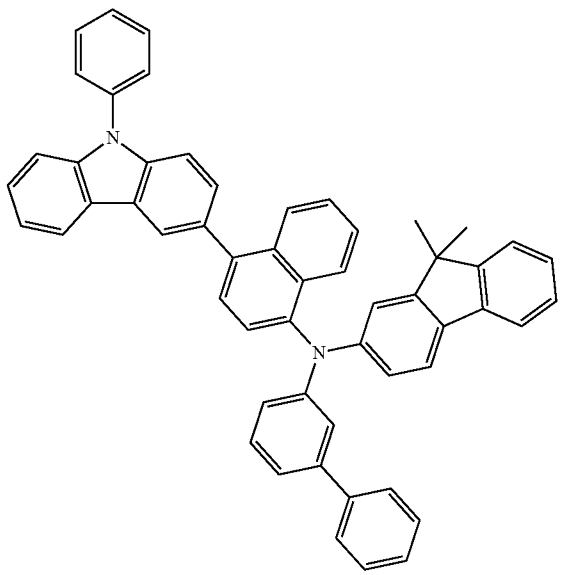
HT11
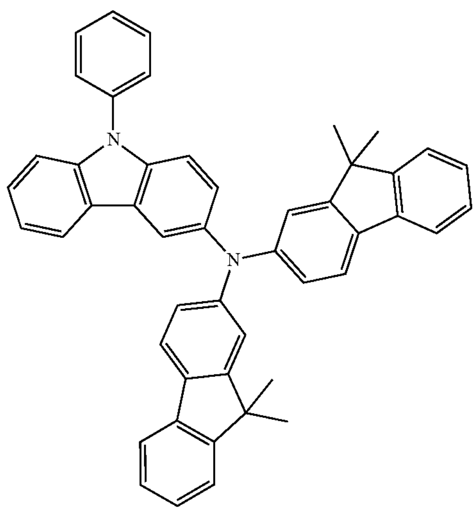
HT12
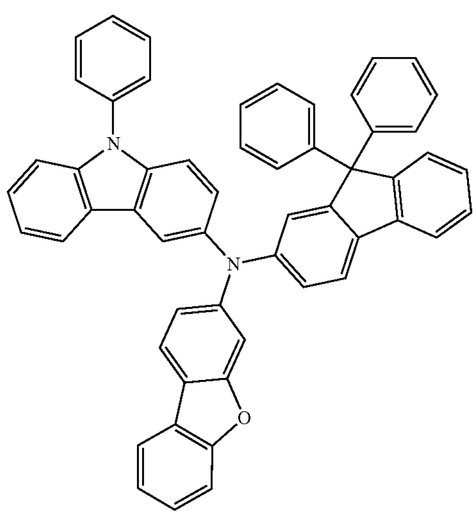
-continued
HT13
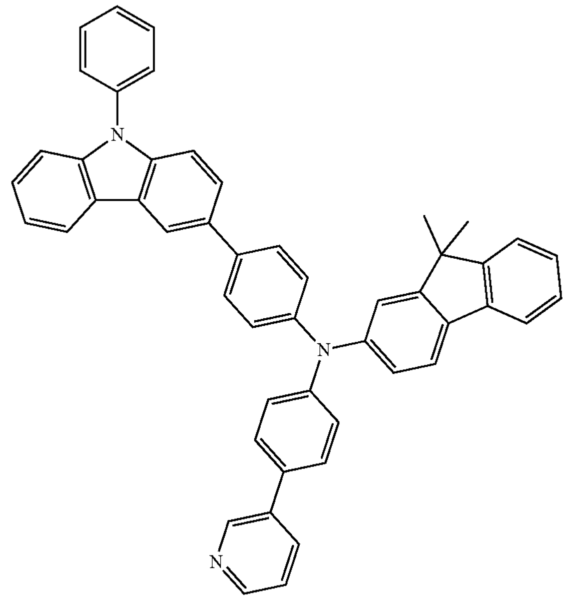
HT14
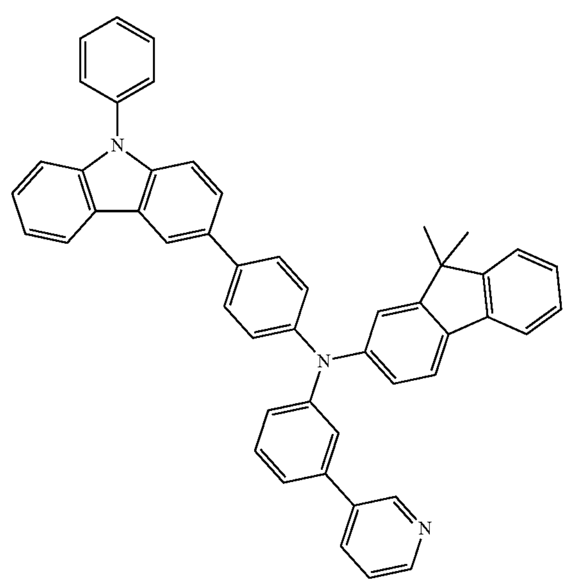

-continued
HT15
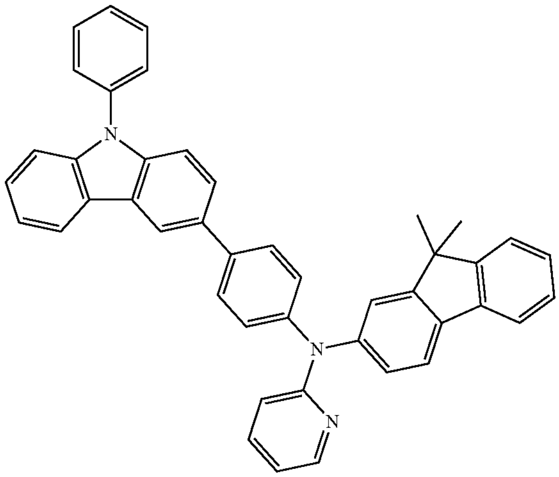
HT16
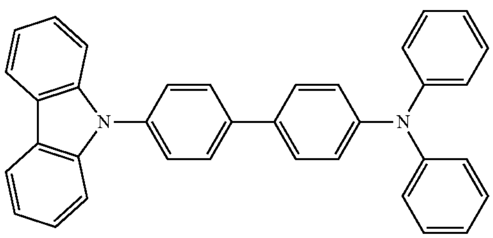
HT17
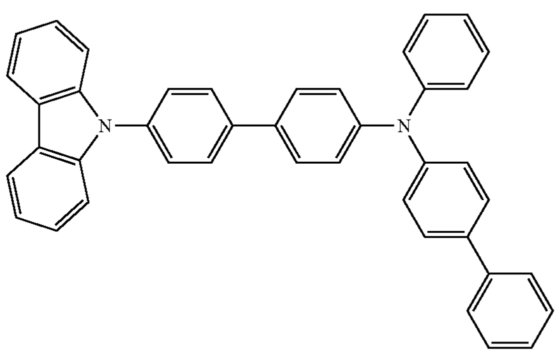
HT18
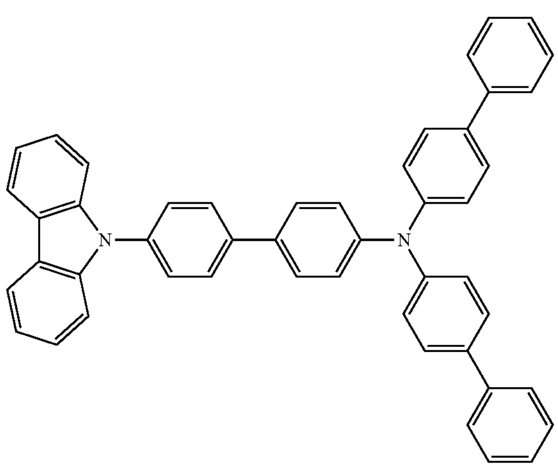
-continued
HT19
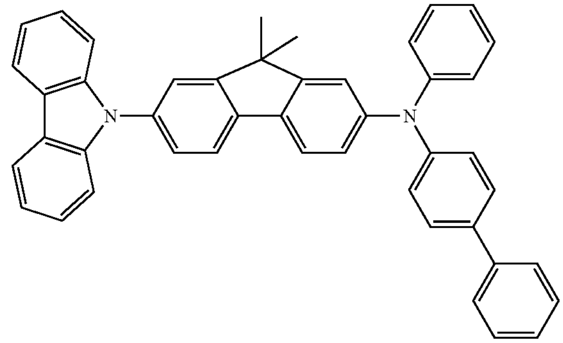
HT20
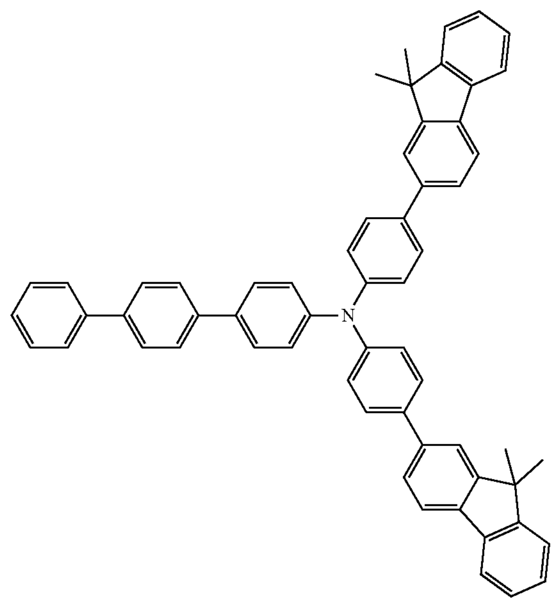
HT21
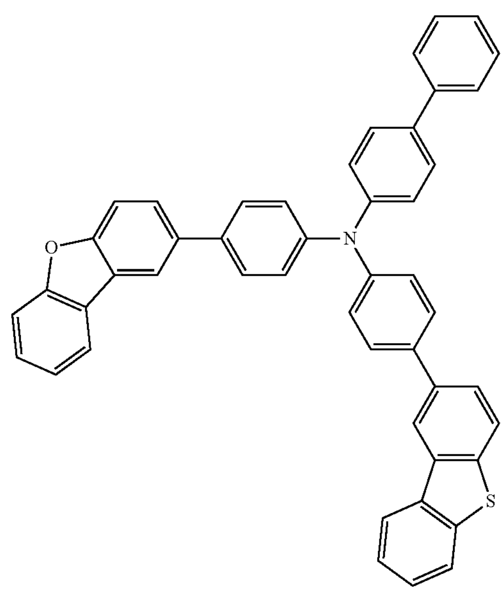

-continued
HT22
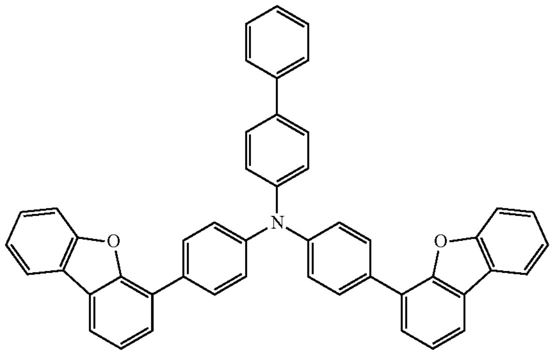
HT23
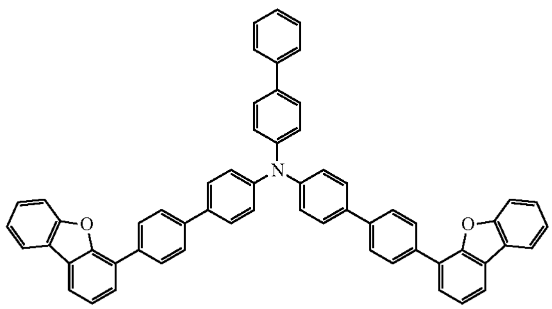
HT24
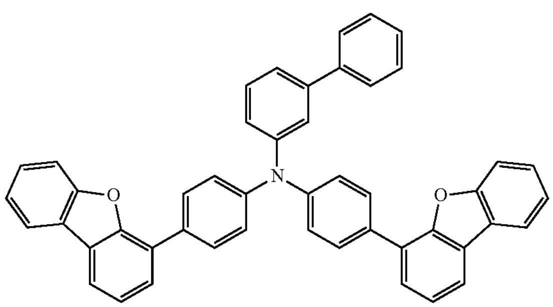
HT25
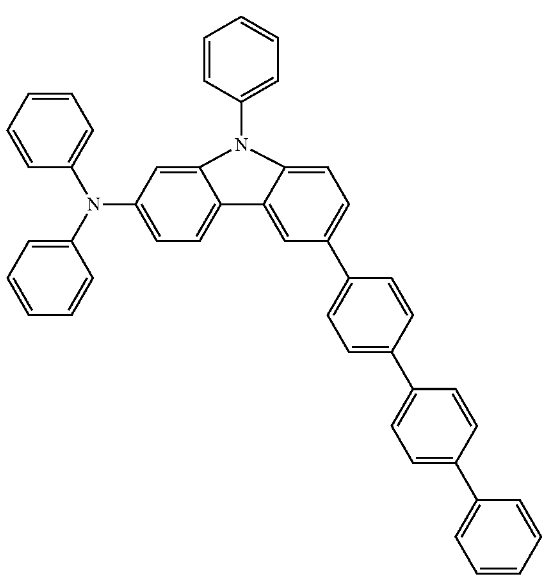
-continued
HT26
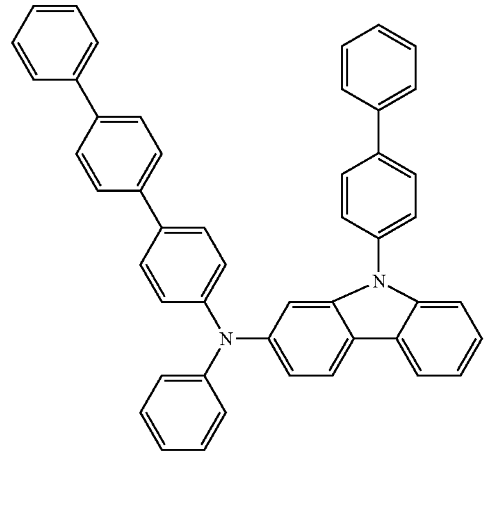
HT27
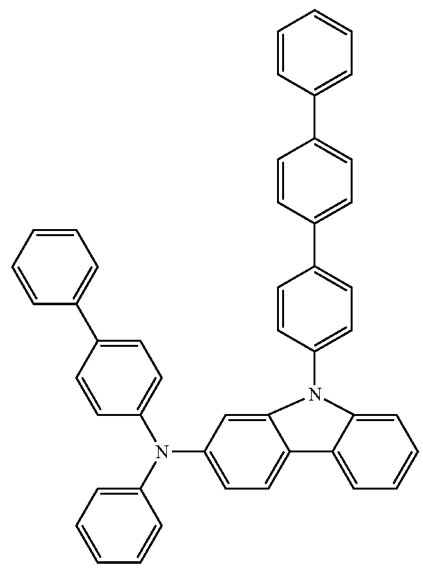
HT28
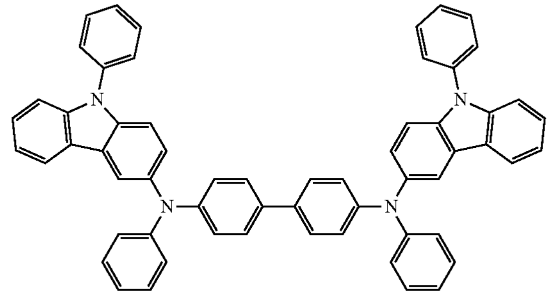

-continued
HT29
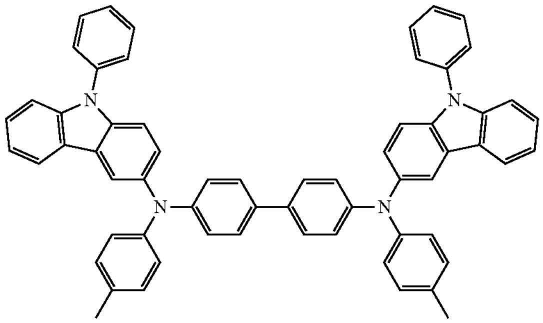
HT30
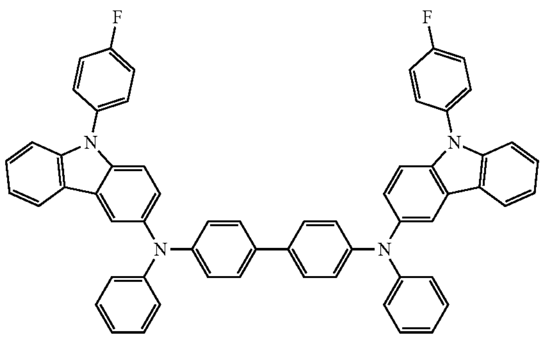
HT31
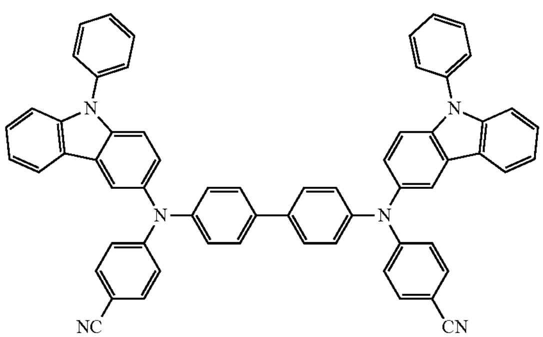
HT32
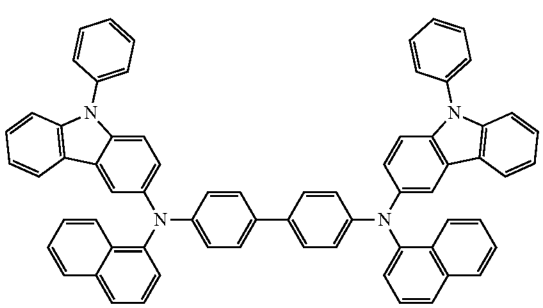
-continued
HT33
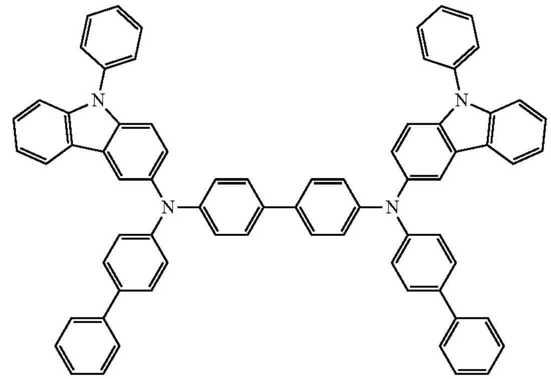
HT34
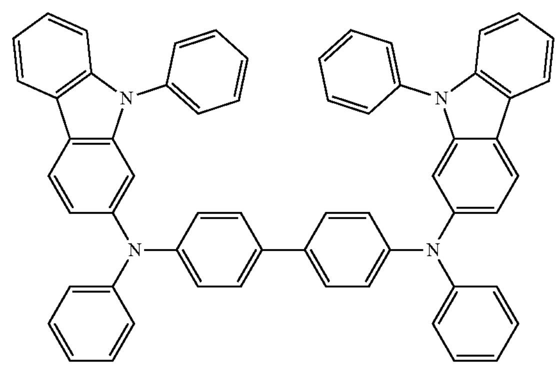
HT35
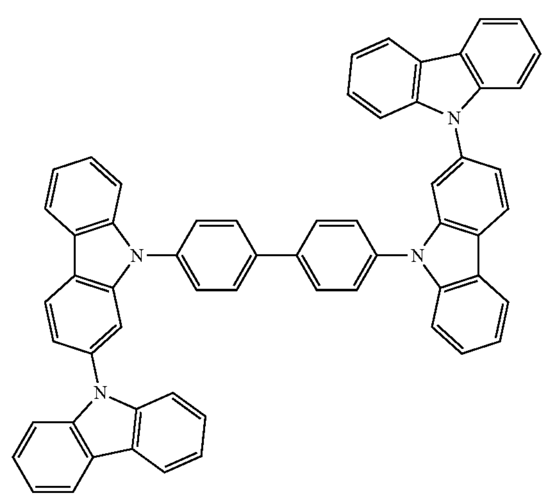

-continued

HT36

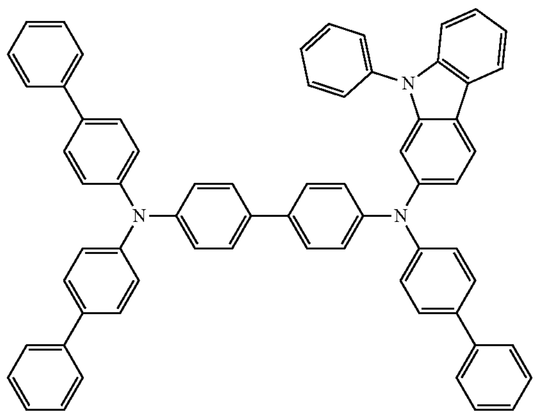

HT37

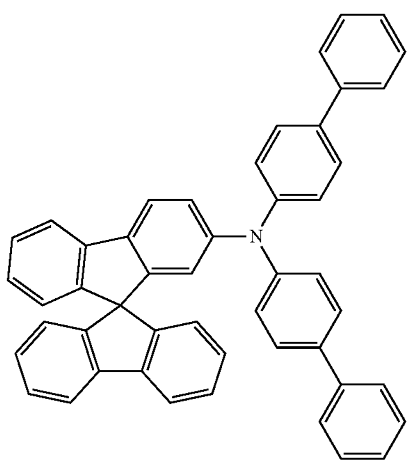

HT38

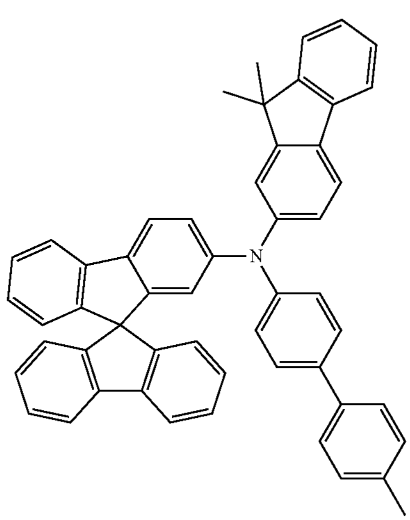

-continued

HT39

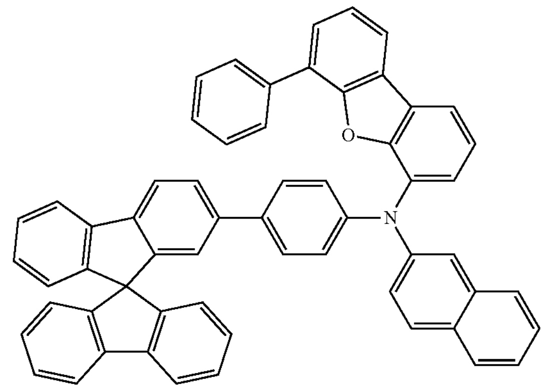

The thickness of the hole transport region may be in a range of about 100 (Angstroms) Å to about 10,000 Å, and in some embodiments, about 100 Å to about 1,000 Å. When the hole transport region includes at least one selected from a hole injection layer and a hole transport layer, the thickness of the hole injection layer may be in a range of about 100 Å to about 9,000 Å, and in some embodiments, about 100 Å to about 1,000 Å, and the thickness of the hole transport layer may be in a range of about 50 Å to about 2,000 Å, and in some embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase light emission efficiency by compensating for an optical resonance distance according to the wavelength of light emitted by an emission layer. The electron blocking layer may reduce or eliminate the flow of electrons from an electron transport region. The emission auxiliary layer and the electron blocking layer may include the aforementioned materials.

p-Dopant

The hole transport region may include a charge generating material as well as the aforementioned materials, to improve conductive properties of the hole transport region. The charge generating material may be substantially homogeneously or non-homogeneously dispersed in the hole transport region.

The charge-generating material may be, for example, a p-dopant.

In an embodiment, a lowest unoccupied molecular orbital (LUMO) of the p-dopant may be −3.5 eV or less.

The p-dopant may include at least one selected from a quinone derivative, a metal oxide, and a cyano group-containing compound, but the present disclosure is not limited thereto.

In some embodiments, the p-dopant may be selected from a quinone derivative, such as tetracyanoquinodimethane (TCNQ) or 2,3,5,6-tetrafluoro-7,7,8,8-tetracyanoquinodimethane (F4-TCNQ);

a metal oxide, such as tungsten oxide or molybdenum oxide;

1,4,5,8,9,11-hexaazatriphenylene-hexacarbonitrile (HAT-CN); and a compound represented by Formula 221, but the present disclosure is not limited thereto:

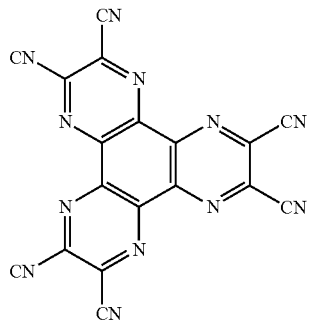

HAT-CN

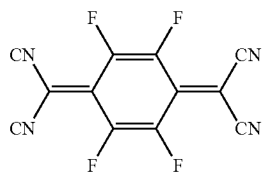

F4-TCNQ

Formula 221

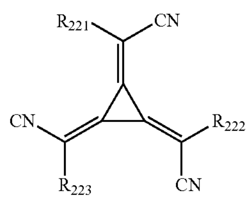

wherein, in Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may include at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Organic Layer 150

When the organic light-emitting device 10 is a full color organic light-emitting device, the emission layer may be patterned into a red emission layer, a green emission layer, or a blue emission layer, according to a sub-pixel. In one or more embodiments, the emission layer may have a stacked structure. The stacked structure may include two or more layers selected from a red emission layer, a green emission layer, and a blue emission layer. The two or more layers may be in direct contact with each other. In some embodiments, the two or more layers may be separated from each other. In one or more embodiments, the emission layer may include two or more materials. The two or more materials may include a red light-emitting material, a green light-emitting material, or a blue light-emitting material. The two or more materials may be mixed with each other in a single layer.

The two or more materials mixed with each other in the single layer may emit white light.

The emission layer may include a host and a dopant. The dopant may include the organometallic compound represented by Formula 1. In some embodiments, the dopant may further include at least one of a phosphorescent dopant and a fluorescent dopant, in addition to the organometallic compound represented by Formula 1.

The amount of the dopant in the emission layer may be, in general, in a range of about 0.01 parts to about 15 parts by weight based on 100 parts by weight of the host, but the present disclosure is not limited thereto.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

Host in Emission Layer

The host may include a compound represented by Formula 301:

$$[Ar_{301}]_{xb11}\text{-}[(L_{301})_{xb1}\text{-}R_{301}]_{xb21} \quad \text{Formula 301}$$

wherein, in Formula 301, $Ar_{301}$ may be selected from a substituted or unsubstituted $C_5$-$C_{60}$ carbocyclic group and a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_6$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), and —P(═O)($Q_{301}$)($Q_{302}$), and xb21 may be an integer from 1 to 5, wherein $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but the present disclosure is not limited thereto.

In some embodiments, in Formula 301, $Ar_{301}$ may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but the present disclosure is not limited thereto.

When xb11 in Formula 301 is 2 or greater, at least two $Ar_{301}$(s) may be bound via a single bond.

In one or more embodiments, the compound represented by Formula 301 may be represented by Formula 301-1 or Formula 301-2:

pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonapthothiophene group, and a dinaphthothiophene group, $X_{301}$ may be O, S, or N—[($L_{304}$)$_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may each independently be 0, 1, or 2, $L_{301}$, xb1, $R_{301}$, and $Q_{31}$ to $Q_{33}$ may respectively be understood by referring to the descriptions therefor provided herein, $L_{302}$ to $L_{304}$ may each be understood by referring to the descriptions for $L_{301}$ provided herein, xb2 to xb4 may each be understood by referring to the descriptions for xb1 provided herein, and $R_{302}$ to $R_{304}$ may each be understood by referring to the descriptions for $R_{301}$ provided herein.

In some embodiments, in Formulae 301, 301-1, and 301-2, $L_{301}$ to $L_{304}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzo- Formula 301-1

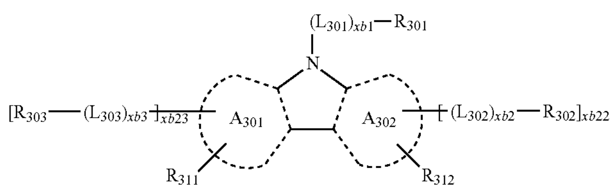

Formula 301-2

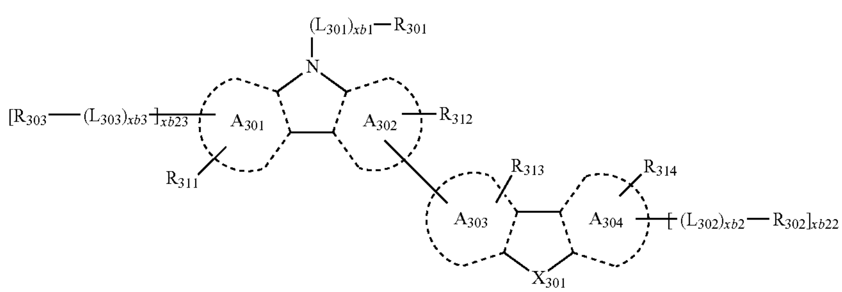

wherein, in Formulae 301-1 to 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a furanylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may respectively be understood by referring to the descriptions therefor provided herein.

In some embodiments, in Formulae 301, 301-1, and 301-2, $R_{301}$ to $R_{304}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$) and —P(=O)($Q_{31}$)($Q_{32}$), wherein $Q_{31}$ to $Q_{33}$ may respectively be understood by referring to the descriptions therefor provided herein.

In some embodiments, the host may include an alkaline earth metal complex. For example, the host may include a beryllium (Be) complex, e.g., Compound H55, a magnesium (Mg) complex, or a zinc (Zn) complex.

The host may include at least one selected from 9,10-di (2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), bis(4-(9H-carbazol-9-yl) phenyl)diphenylsilane), POPCPA(4-(1-(4-(diphenylamino) phenyl)cyclohexyl)phenyl)diphenyl-phosphine oxide (BCPDS), and Compounds H1 to H55, but the present disclosure is not limited thereto:

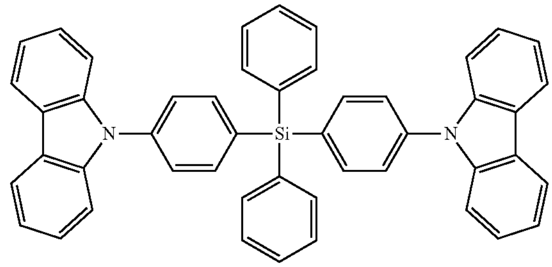

BCPDS

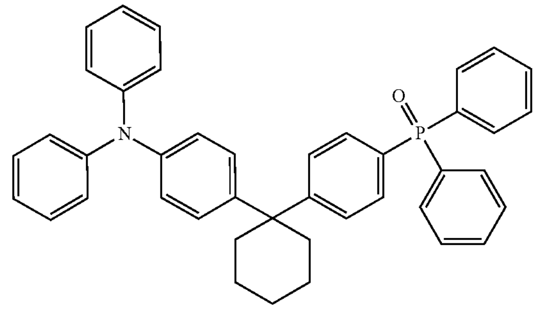

POPCPA

H1

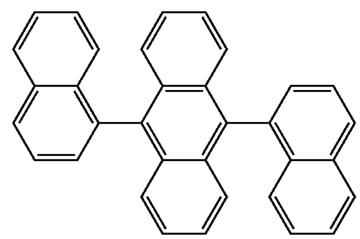

H2

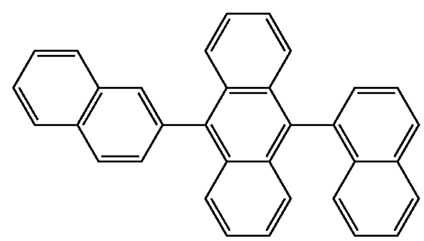

H3

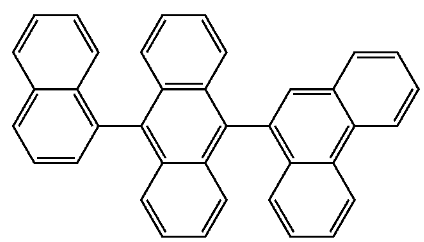

H4

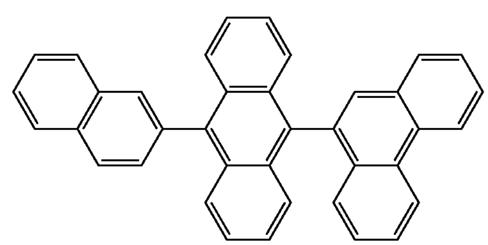

-continued
H5
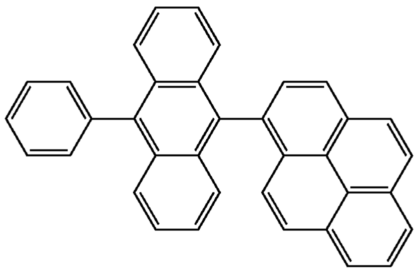
H6
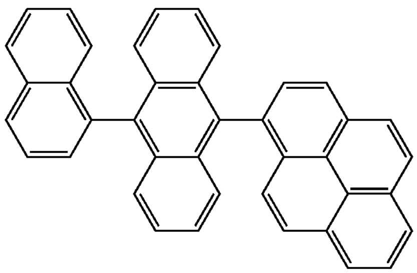
H7
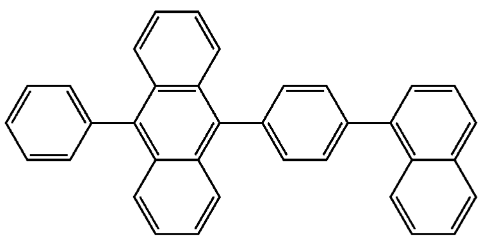
H8
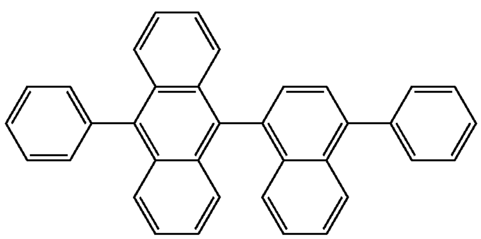
H9
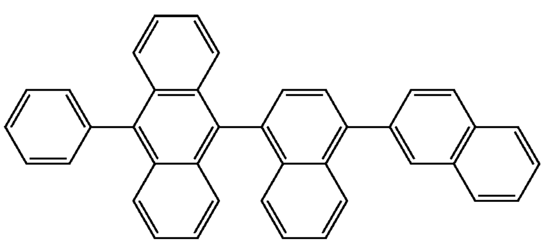
H10
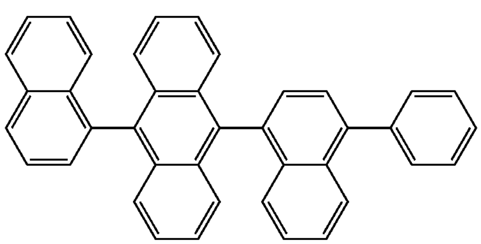
-continued
H11
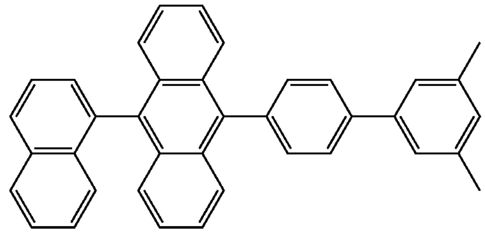
H12
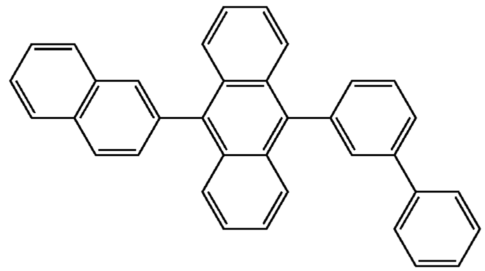
H13
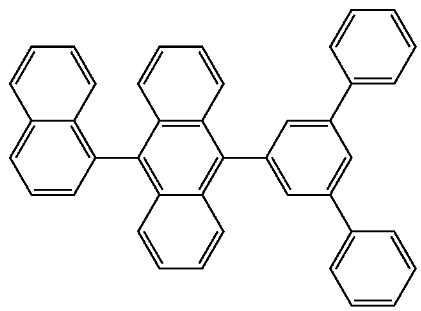
H14
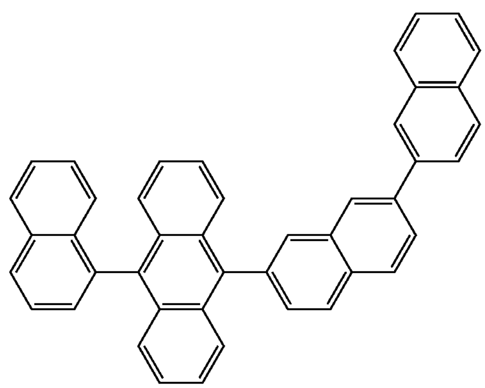
H15
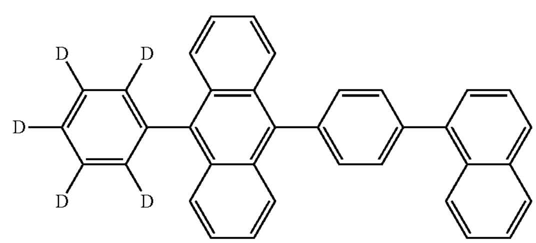

-continued
H16
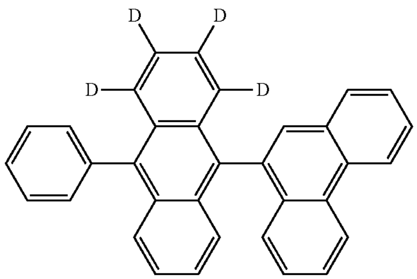
H17
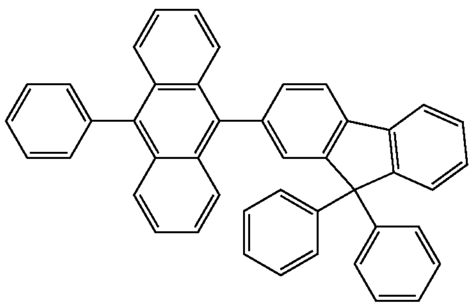
H18
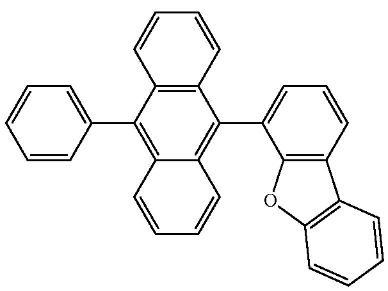
H19
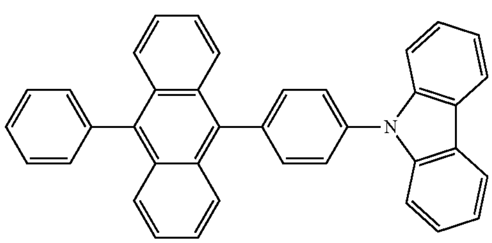
H20
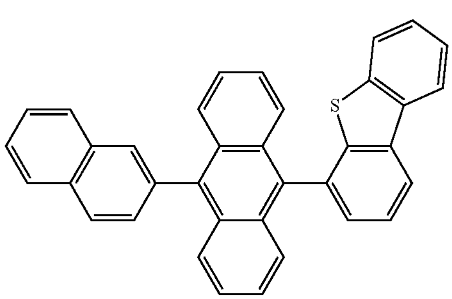
-continued
H21
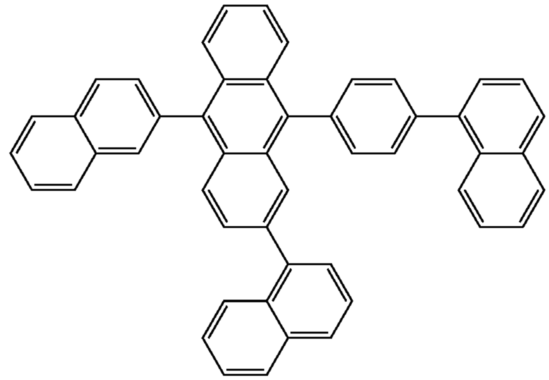
H22
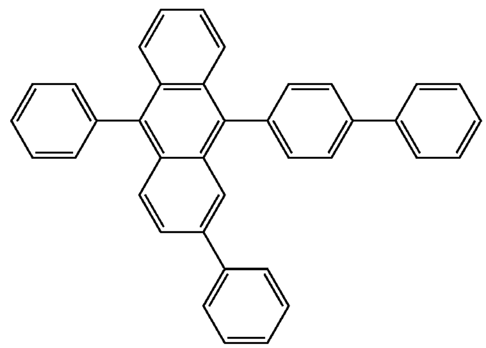
H23
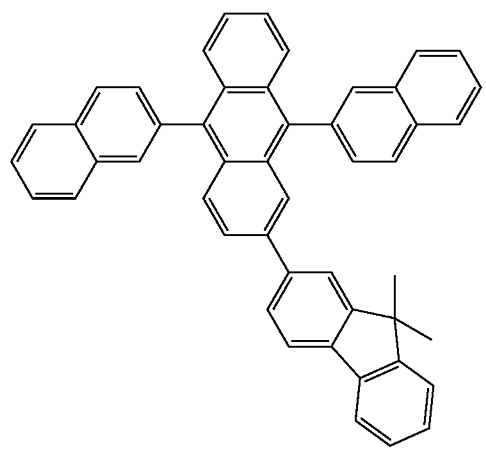
H24
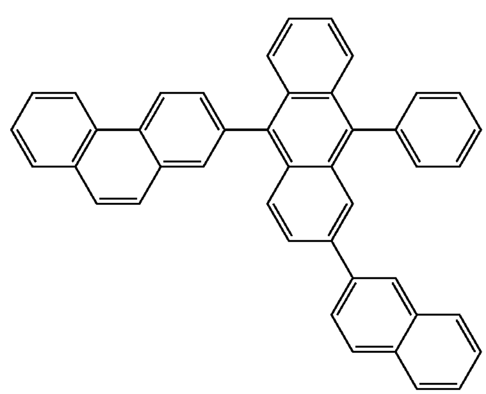

-continued
H25
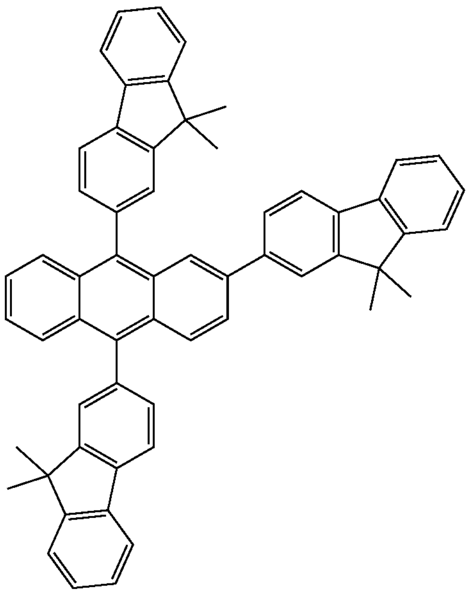
H26
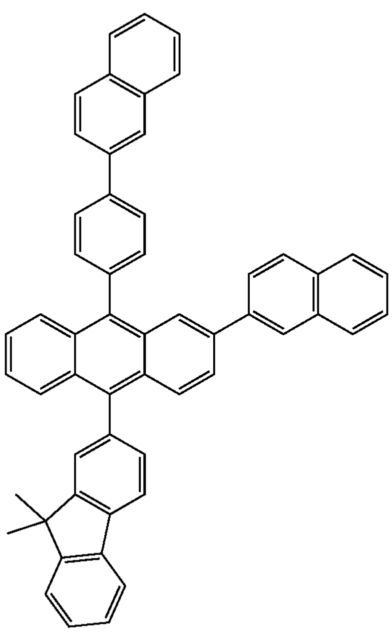
-continued
H27
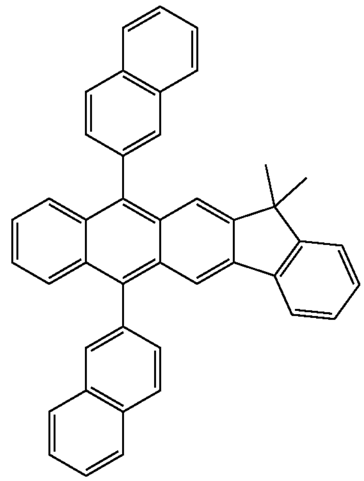
H28
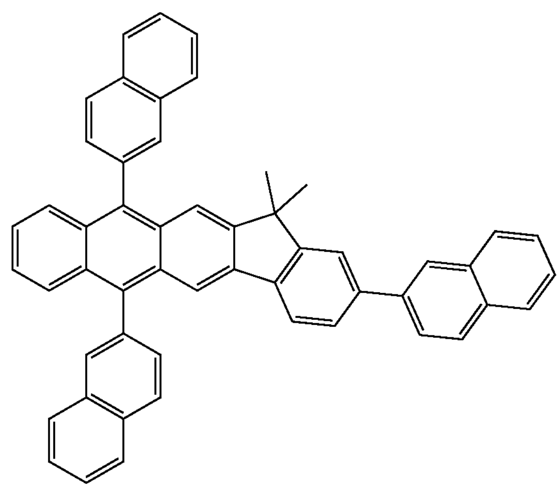
H29
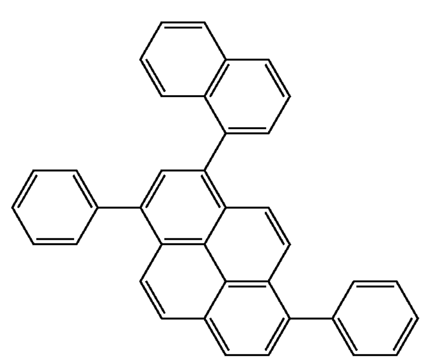

-continued
H30
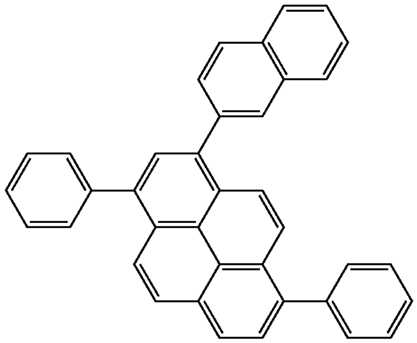
H31
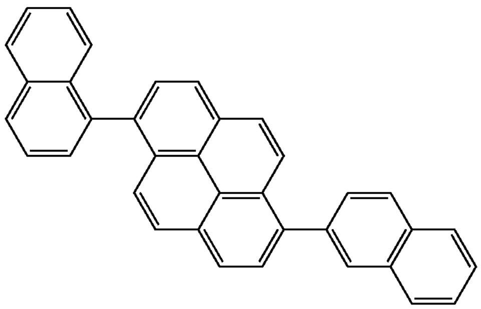
H32
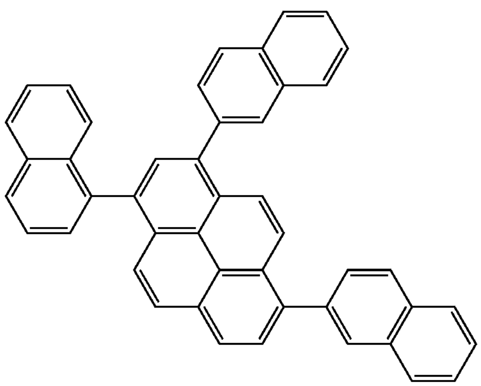
H33
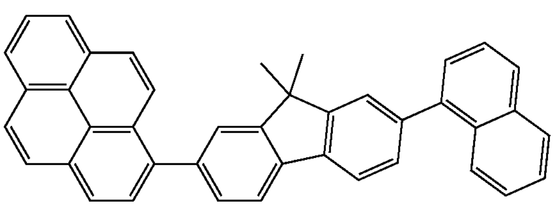
H34
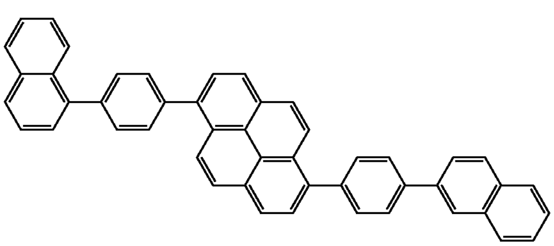
-continued
H35
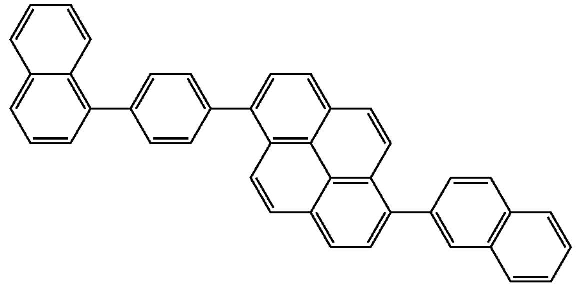
H36
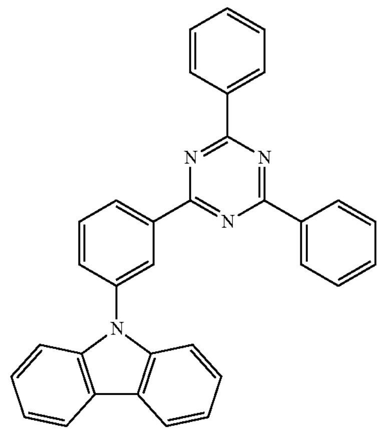
H37
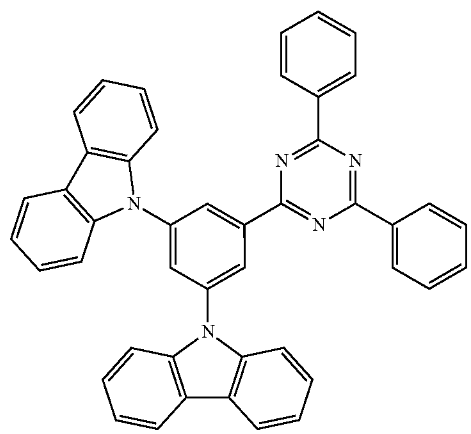
H38
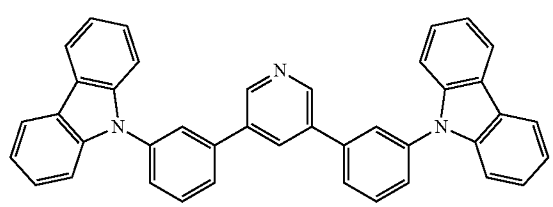

-continued
H39
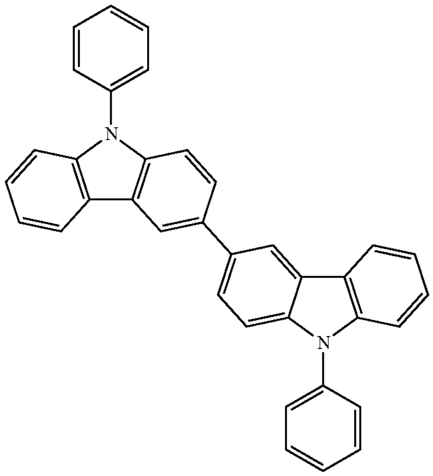
H40
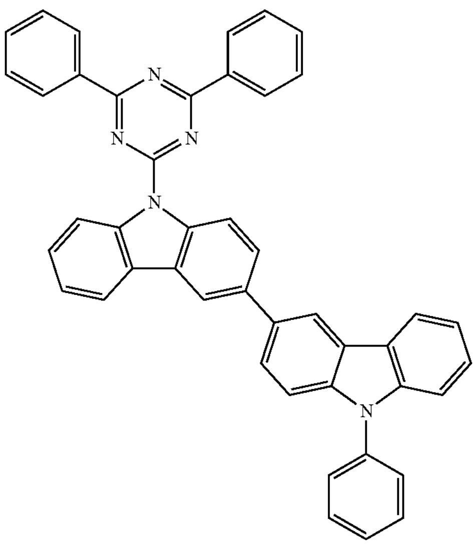
H41
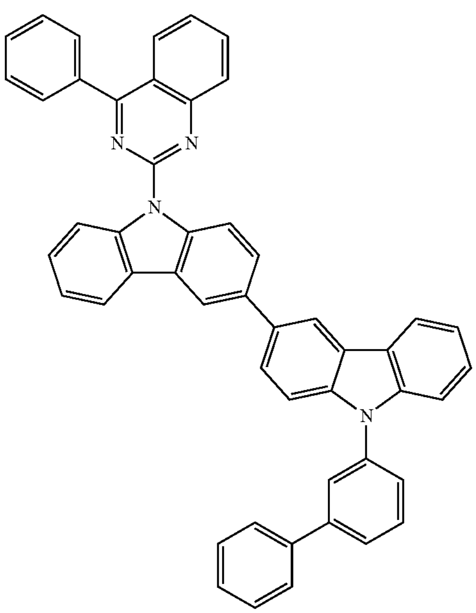
-continued
H42
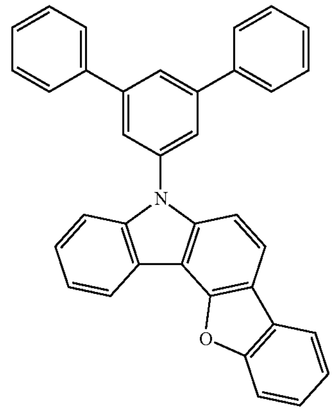
H43
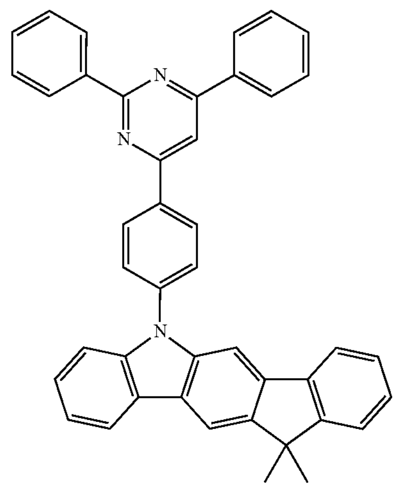
H44
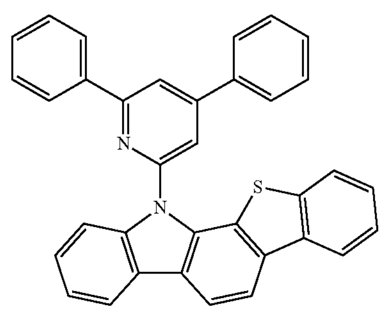
H45
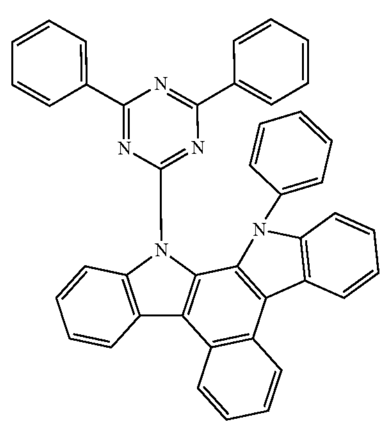

-continued

H46

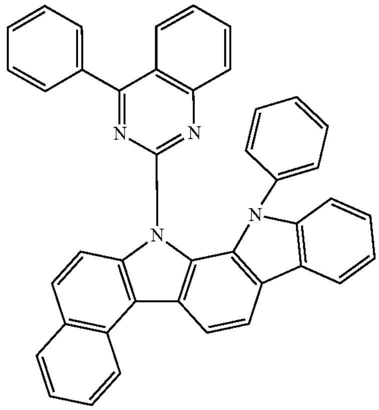

H47

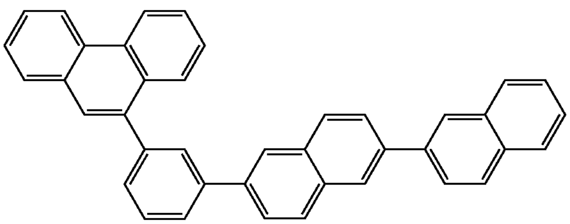

H48

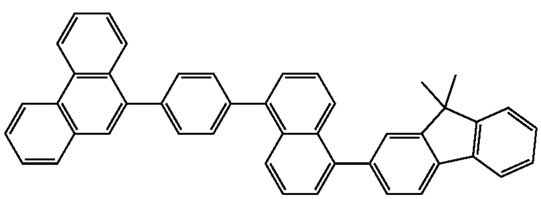

H49

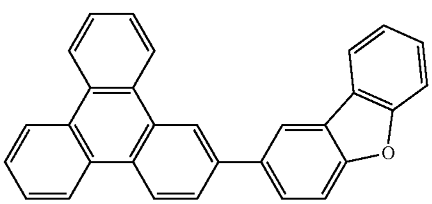

H50

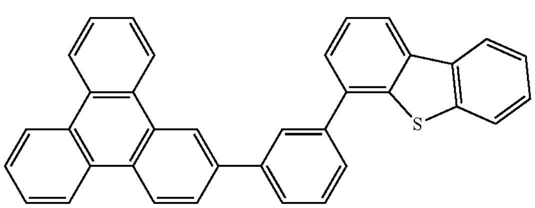

H51

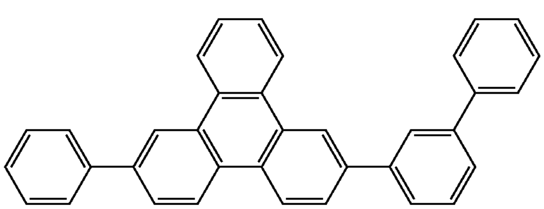

-continued

H52

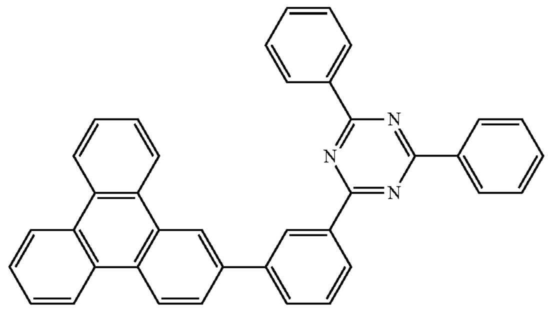

H53

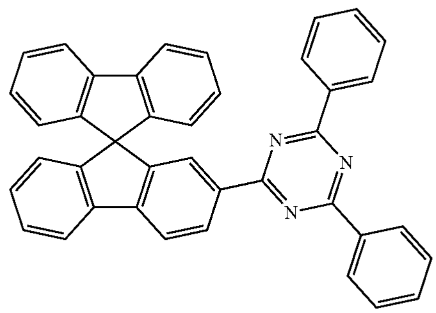

H54

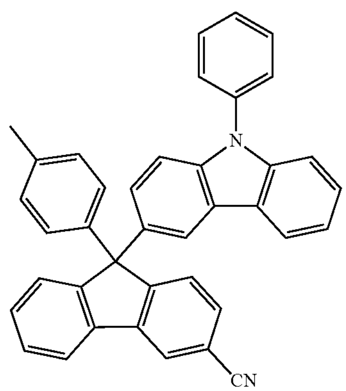

H55

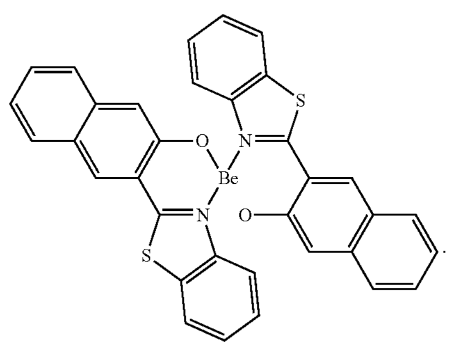

In some embodiments, the host may include at least one selected from a silicon-containing compound (e.g., BCPDS or the like used in Examples) and a phosphine oxide-containing compound (e.g., POPCPA or the like used in Examples).

The host may include one type or kind of compounds only or two or more different types or kinds of compounds (for example, the constituent hosts in Examples were BCPDS and POPCPA). As such, embodiments may be modified in various suitable ways.

In some embodiments, a content of a host in the emission layer may be greater than a content of a dopant, e.g., the organometallic compound represented by Formula 1.

Fluorescent Dopant Included in Emission Layer of Organic Layer 150

The fluorescent dopant may include an arylamine compound or a styrylamine compound.

In some embodiments, the fluorescent dopant may include a compound represented by Formula 501:

Formula 501

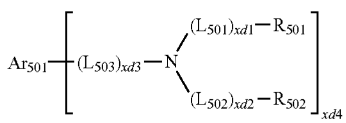

wherein, in Formula 501, $Ar_{501}$ may be selected from a substituted or unsubstituted $C_5$-$C_{60}$ carbocyclic group and a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_6$ heteroaryl group, a substituted or unsubstituted monovalent non-aromatic condensed polycyclic group, and a substituted or unsubstituted monovalent non-aromatic condensed heteropolycyclic group, and xd4 may be an integer from 1 to 6.

In some embodiments, in Formula 501, $Ar_{501}$ may be selected from a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, in Formula 501, $L_{501}$ to $L_{503}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In some embodiments, in Formula 501, $R_{501}$ and $R_{502}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —$Si(Q_{31})(Q_{32})(Q_{33})$, wherein $Q_{31}$ to $Q_{33}$ may be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but the present disclosure is not limited thereto.

In some embodiments, the fluorescent dopant may be selected from Compounds FD1 to FD22:

FD1

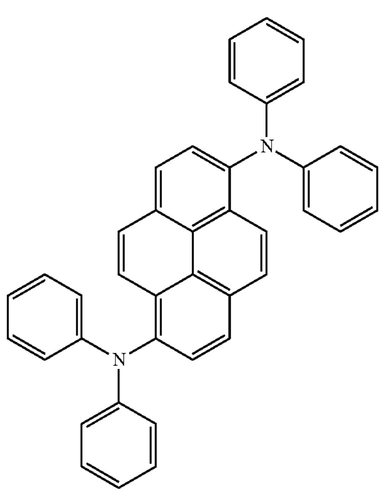

-continued

FD2

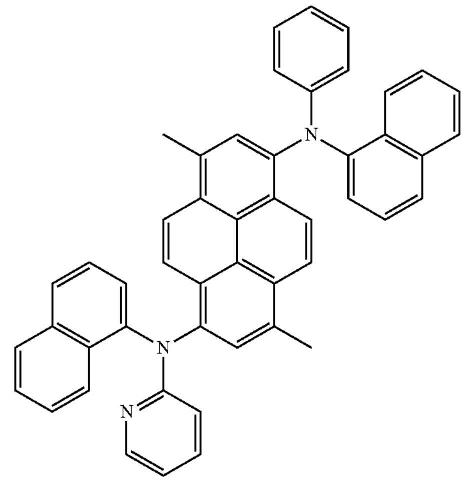

FD3

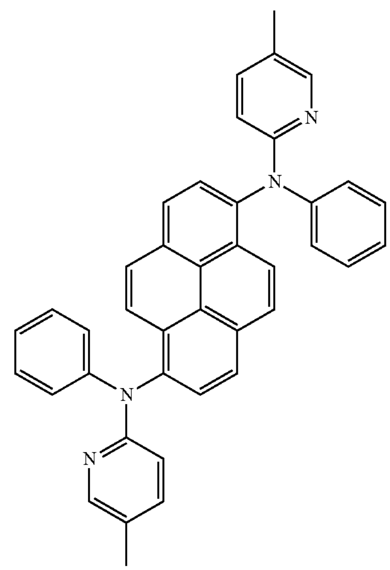

FD4

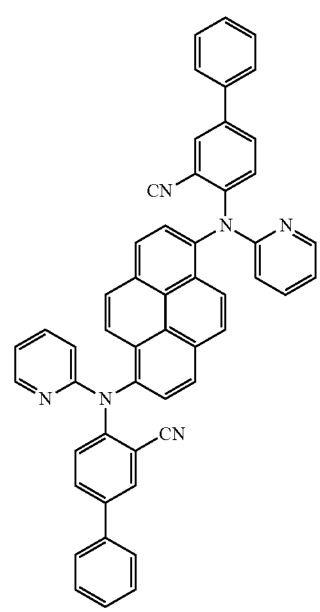

-continued
FD5
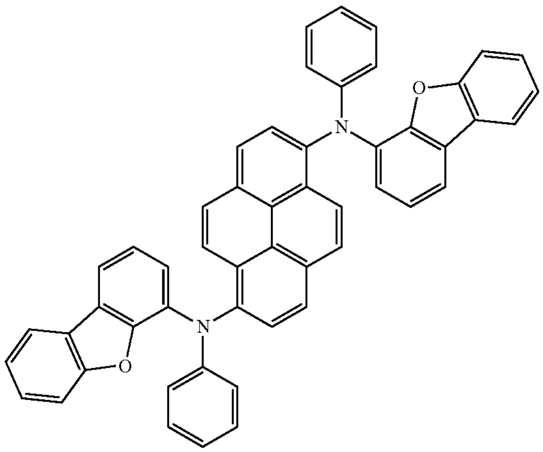
FD6
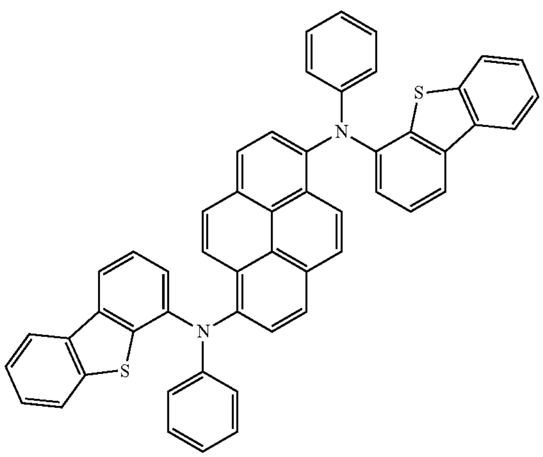
FD7
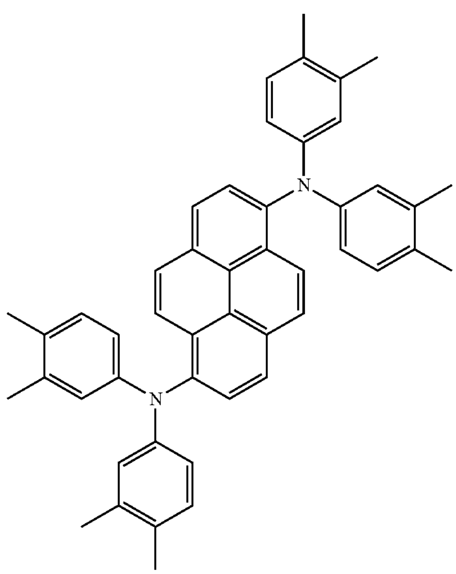
-continued
FD8
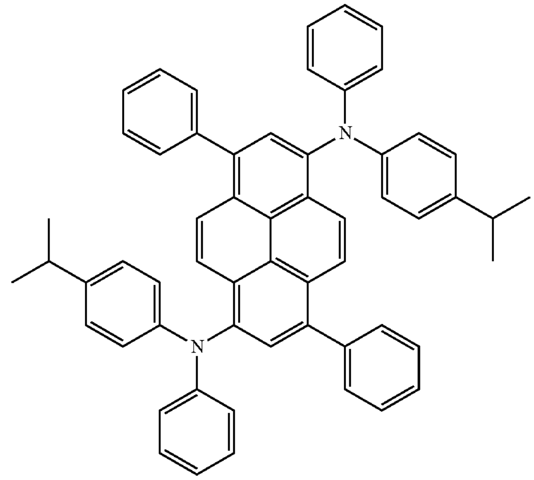
FD9
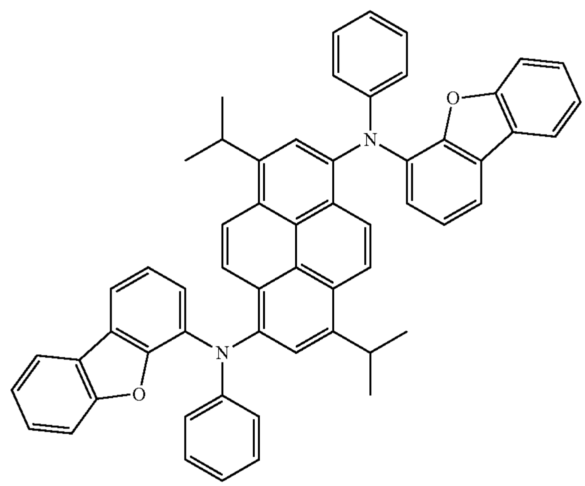
FD10
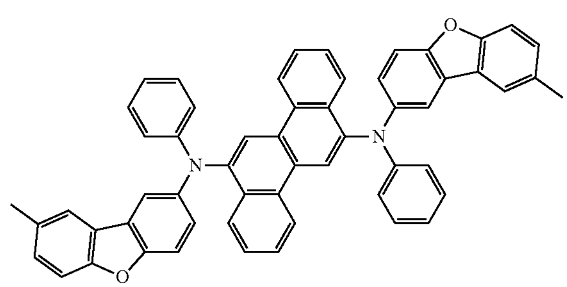
FD11
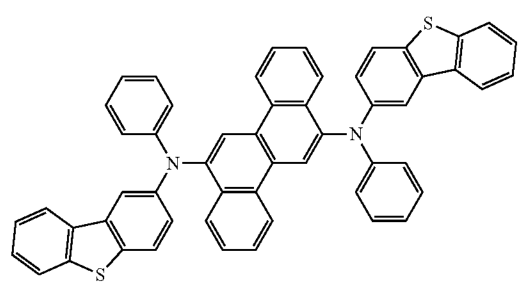

-continued
FD12
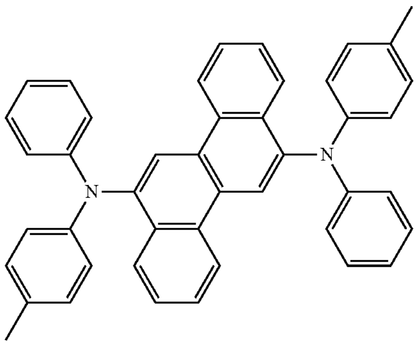
FD13
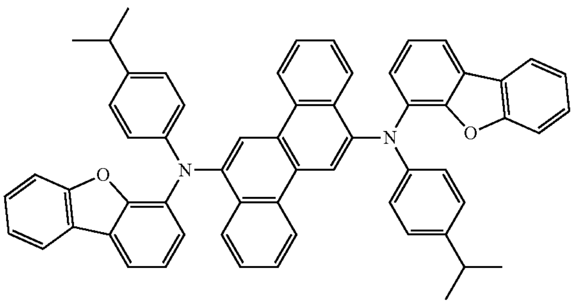
FD14
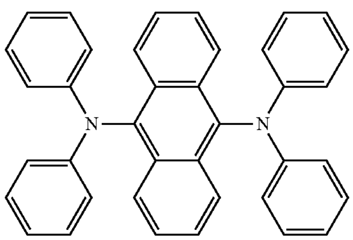
FD15
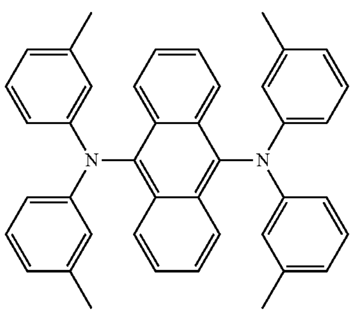
FD16
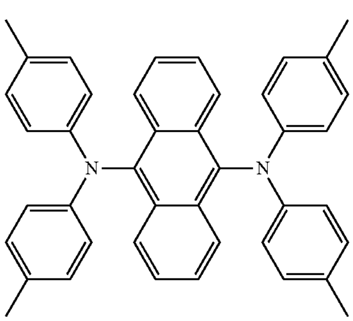
-continued
FD17
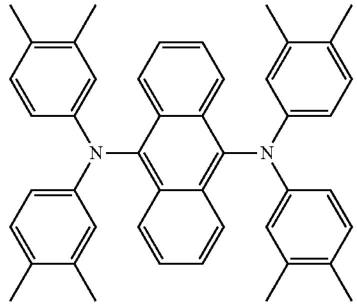
FD18
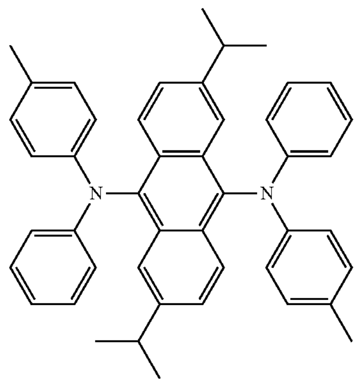
FD19
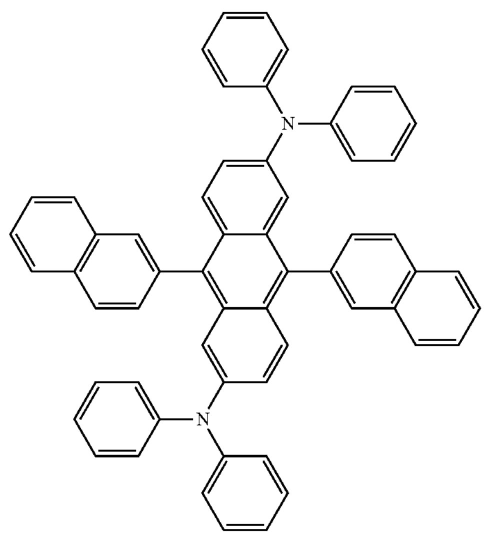
FD20
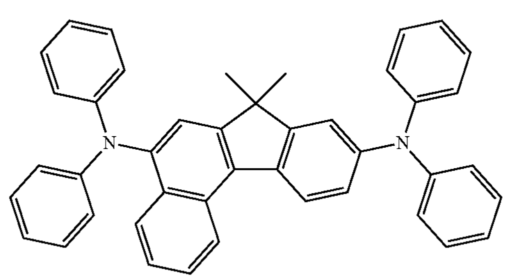

-continued
FD21
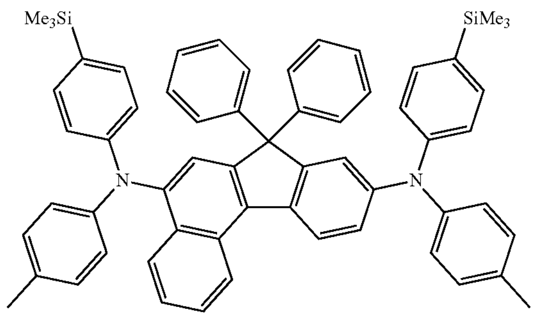
-continued
FD22
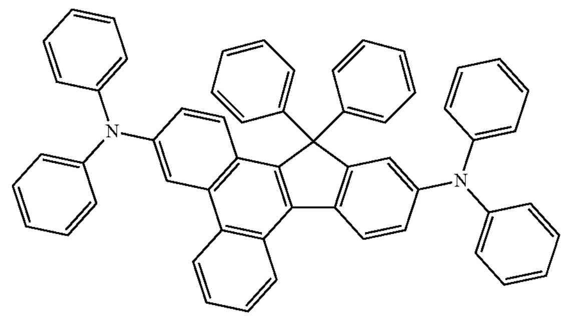
In some embodiments, the fluorescent dopant may be selected from the following compounds, but the present disclosure is not limited thereto:
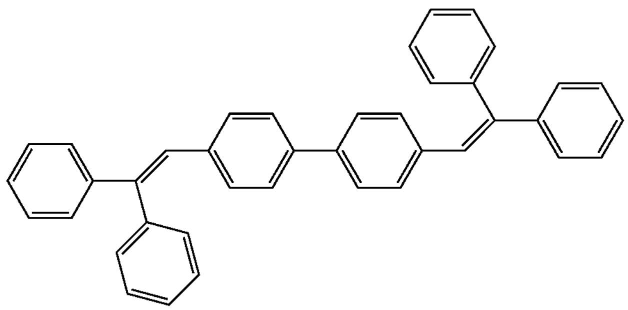
DPVBi
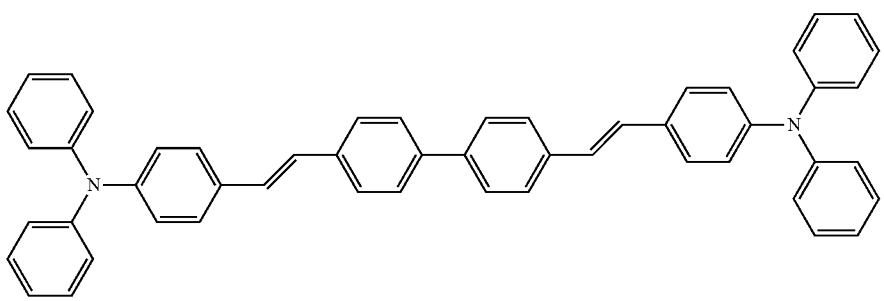
DPAVBi
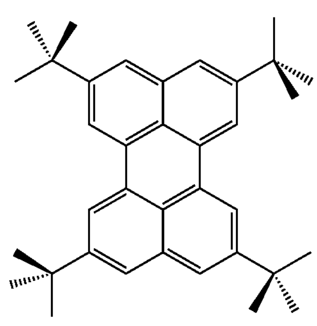
TBPe
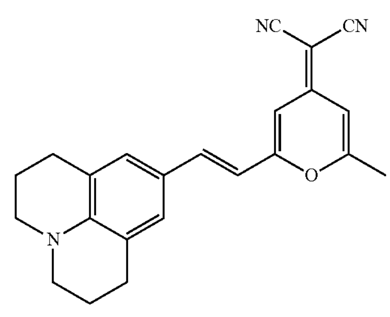
DCM -continued

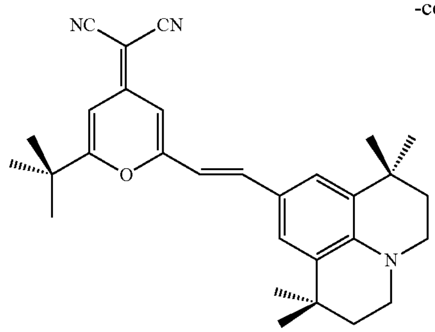

DCJTB

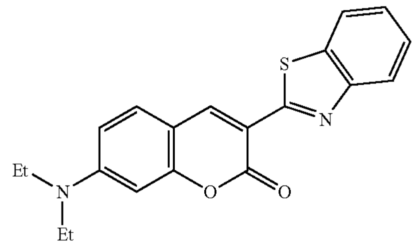

Coumarin 6

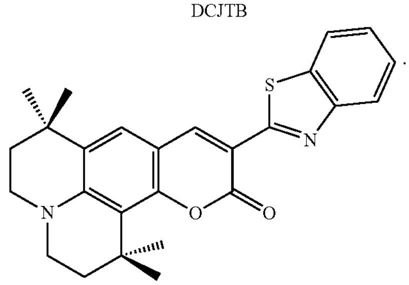

C545T

Electron Transport Region in Organic Layer 150

The electron transport region may have i) a single-layered structure consisting of a single layer consisting of a single material, ii) a single-layered structure consisting of a single layer including a plurality of different materials, or iii) a multi-layered structure each having a plurality of layers, each having a plurality of different materials.

The electron transport region may include at least one selected from a buffer layer, a hole blocking layer, an electron control layer, an electron transport layer, and an electron injection layer, but the present disclosure is not limited thereto.

In some embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the emission layer in each stated order, but the present disclosure is not limited thereto.

Also, the electron transport region may further include a second compound in addition to the materials described herein above.

In an embodiment, the electron transport region may include a buffer layer, wherein the buffer layer may directly contact the emission layer, and the buffer layer may include the second compound described herein above.

In one or more embodiments, the electron transport region may include a buffer layer, an electron transport layer, and an electron injection layer, wherein layers may be sequentially stacked on the emission layer in the stated order, and the buffer layer may include the second compound described herein above.

The electron transport region (for example, the buffer layer, the hole blocking layer, the electron control layer, or the electron transport layer in the electron transport region) may include a metal-free compound including at least one π electron-depleted nitrogen-containing ring.

The term "π electron-depleted nitrogen-containing ring," as used herein, refers to a $C_1$-$C_{60}$ heterocyclic group having at least one *—N=*' moiety as a ring-forming moiety.

For example, the "r electron-depleted nitrogen-containing ring" may be i) a 5-membered to 7-membered heteromonocyclic group having at least one *—N=*' moiety, ii) a heteropolycyclic group in which at least two 5-membered to 7-membered heteromonocyclic groups, each having at least one *—N=*' moiety, are condensed (e.g., combined together), or iii) a heteropolycyclic group in which at least one of a 5-membered to 7-membered heteromonocyclic group, each having at least one *—N=*' moiety, is condensed with (e.g., combined with) at least one $C_5$-$C_{60}$ carbocyclic group.

Examples of the π electron-depleted nitrogen-containing ring may include imidazole, pyrazole, thiazole, isothiazole, oxazole, isoxazole, pyridine, pyrazine, pyrimidine, pyridazine, indazole, purine, quinoline, isoquinoline, benzoquinoline, phthalazine, naphthyridine, quinoxaline, quinazoline, cinnoline, phenanthridine, acridine, phenanthroline, phenazine, benzimidazole, isobenzothiazole, benzoxazole, isobenzoxazole, triazole, tetrazole, oxadiazole, triazine, thiadiazole, imidazopyridine, imidazopyrimidine, and azacarbazole, but the present disclosure is not limited thereto.

In some embodiments, the electron transport region may include a compound represented by Formula 601:

$$[Ar_{601}]_{xe11}\text{-}[(L_{601})_{xe1}\text{-}R_{601}]_{xe21} \qquad \text{Formula 601}$$

wherein, in Formula 601, $Ar_{601}$ may be selected from a substituted or unsubstituted $C_5$-$C_{60}$ carbocyclic group and a substituted or unsubstituted $C_1$-$C_{10}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(═O)($Q_{601}$), —S(═O)$_2$($Q_{601}$), and —P(═O)($Q_{601}$)($Q_{602}$), wherein $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one selected from $Ar_{601}$(s) in the number of xe11 and $R_{601}$(s) in the number of xe21 may include the π electron-depleted nitrogen-containing ring.

In some embodiments, in Formula 601, $Ar_{601}$ may be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(═O)$_2$($Q_{31}$), and —P(═O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or greater, at least two $Ar_{601}$(s) may be bound via a single bond.

In one or more embodiments, $Ar_{601}$ in Formula 601 may be an anthracene group.

In one or more embodiments, a compound represented by Formula 601 may be represented by Formula 601-1:

Formula 601-1

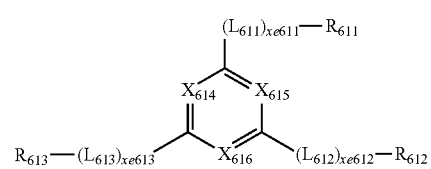

wherein, in Formula 601-1, $X_{614}$ may be N or C($R_{614}$), $X_{615}$ may be N or C($R_{615}$), $X_{616}$ may be N or C($R_{616}$), at least one selected from $X_{614}$ to $X_{616}$ may be N, $L_{611}$ to $L_{613}$ may each independently be understood by referring to the descriptions for $L_{601}$ provided herein, xe611 to xe613 may each independently be understood by referring to the descriptions for xe1 provided herein, $R_{611}$ to $R_{613}$ may each independently be understood by referring to the descriptions for $R_{601}$ provided herein, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In an embodiment, in Formulae 601 and 601-1, $L_{601}$ and $L_{611}$ to $L_{613}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but the present disclosure is not limited thereto.

In one or more embodiments, xe1 and xe611 to xe613 in Formulae 601 and 601-1 may each independently be 0, 1, or 2.

In one embodiment, in Formulae 601 and 601-1, $R_{601}$ and $R_{611}$ to $R_{613}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —$S(=O)_2(Q_{601})$ and —$P(=O)(Q_{601})(Q_{602})$, wherein $Q_{601}$ and $Q_{602}$ may respectively be understood by referring to the descriptions therefor provided herein.

The electron transport region may include at least one compound selected from Compounds ET1 to ET6, but the present disclosure is not limited thereto:

ET1

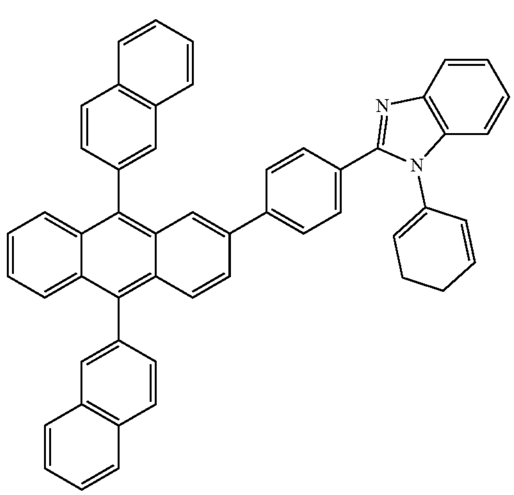

-continued

ET2

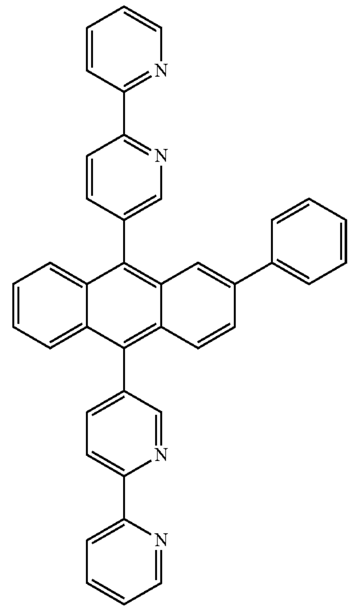

ET3

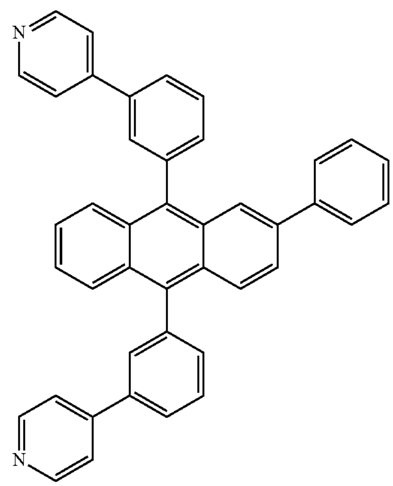

ET4

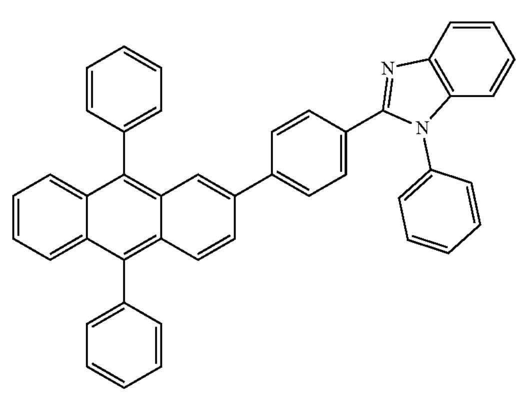

-continued
ET5
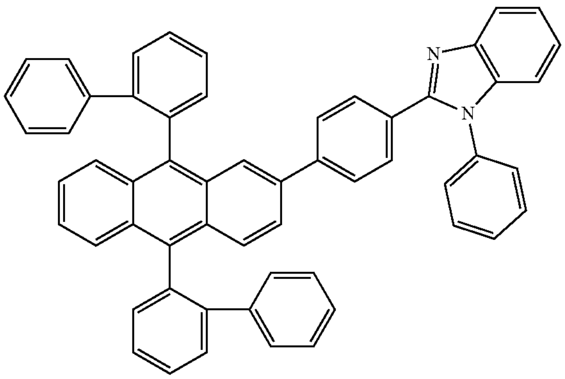
ET6
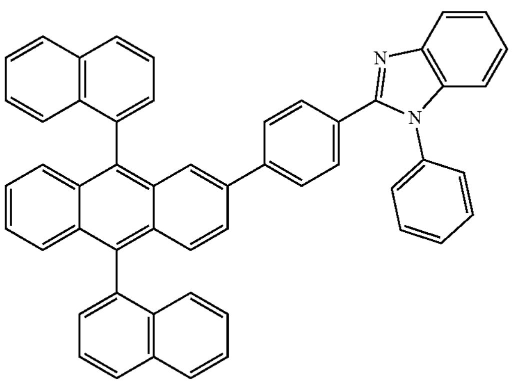
ET7
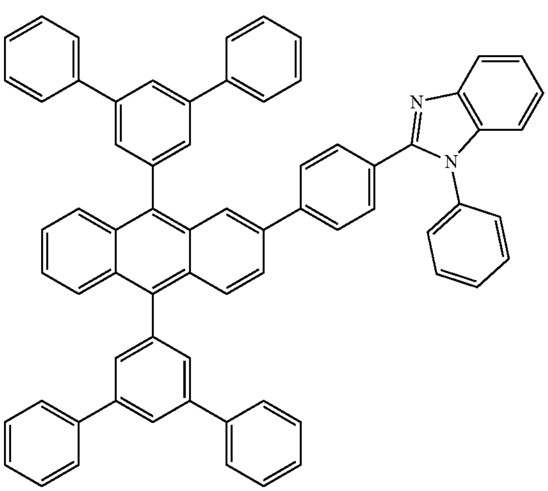
-continued
ET8
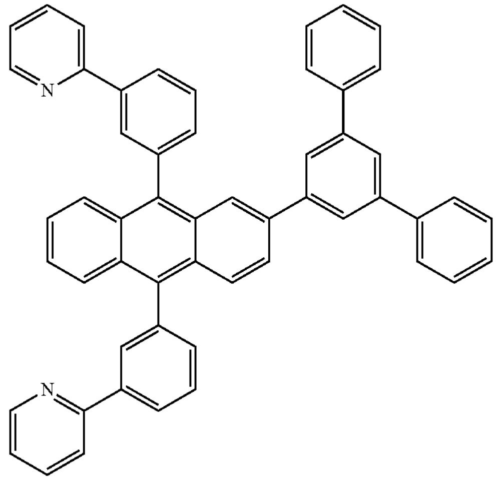
ET9
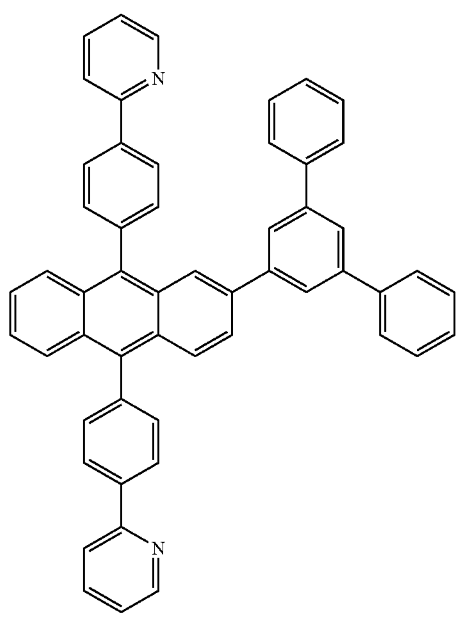

ET10
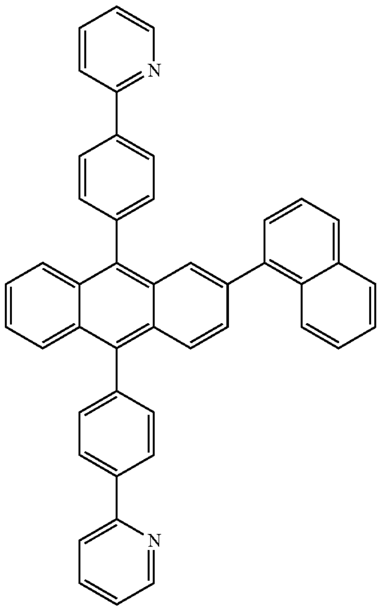
ET11
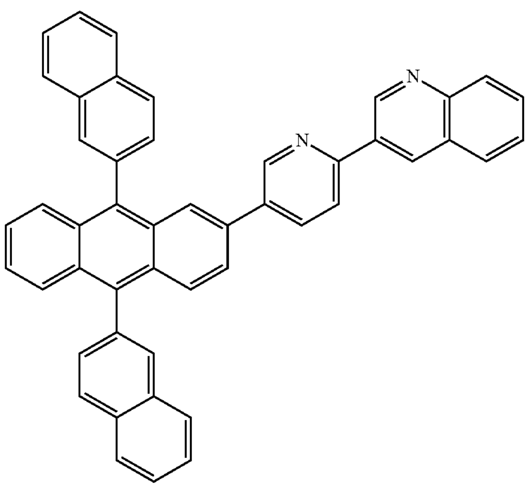
ET12
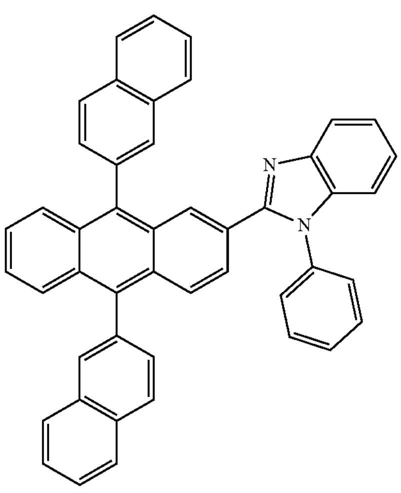
ET13
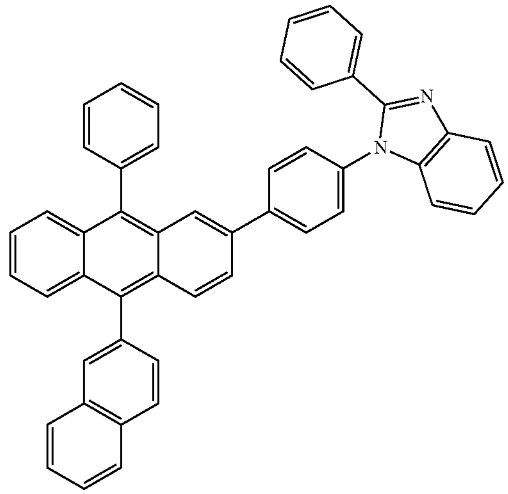
ET14
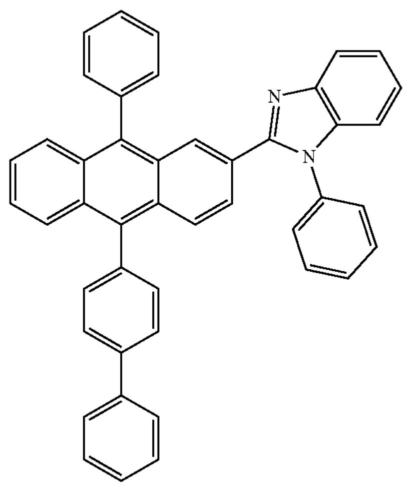
ET15
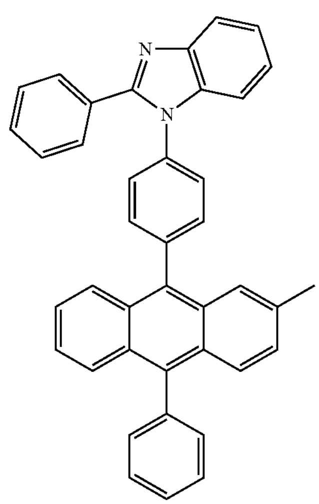

-continued
ET16
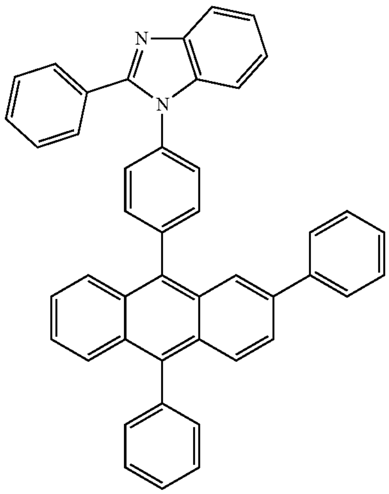
ET17
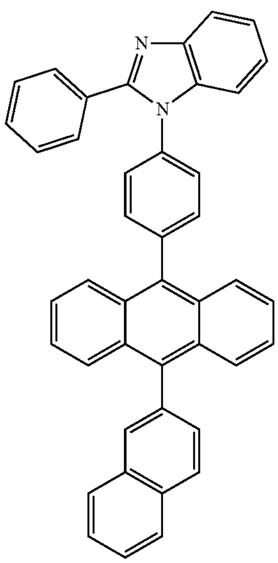
ET18
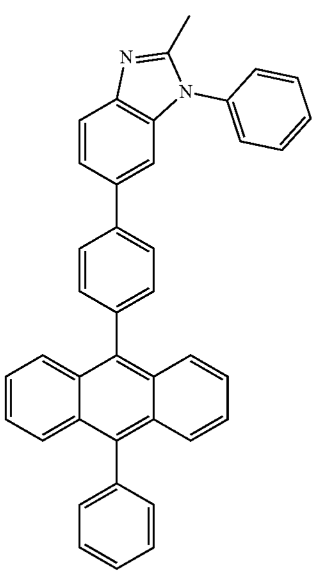
-continued
ET19
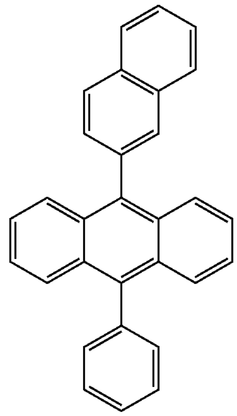
ET20
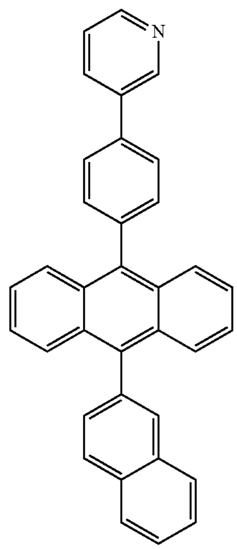
ET21
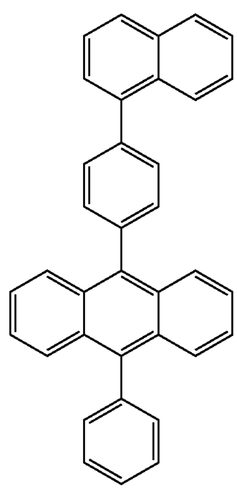

-continued
ET22
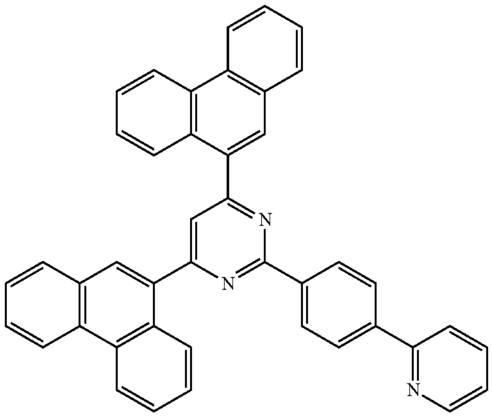
ET23
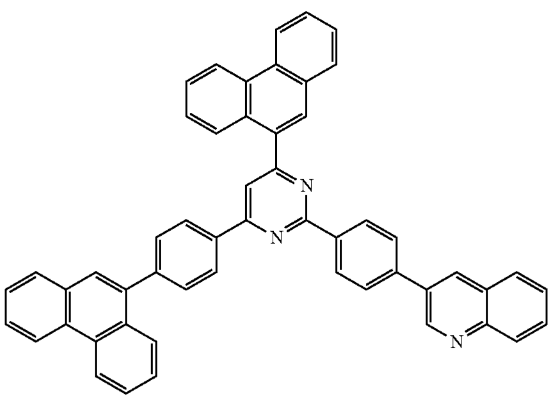
ET24
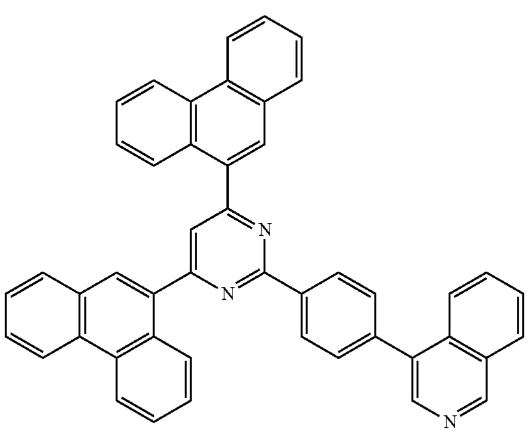
-continued
ET25
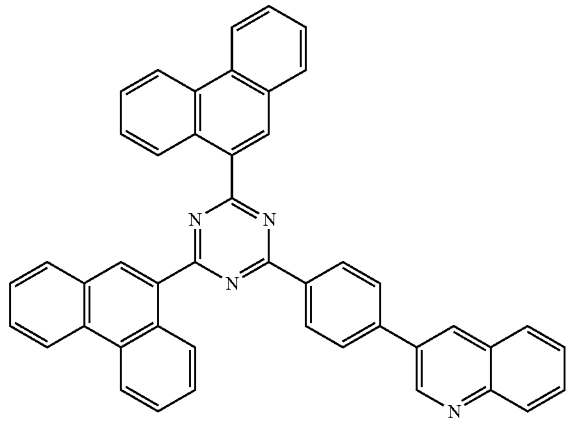
ET26
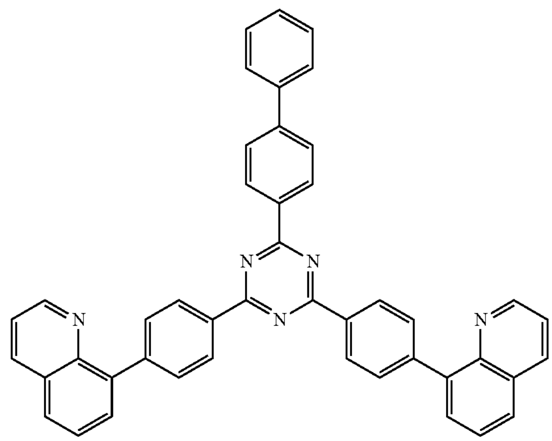
ET27
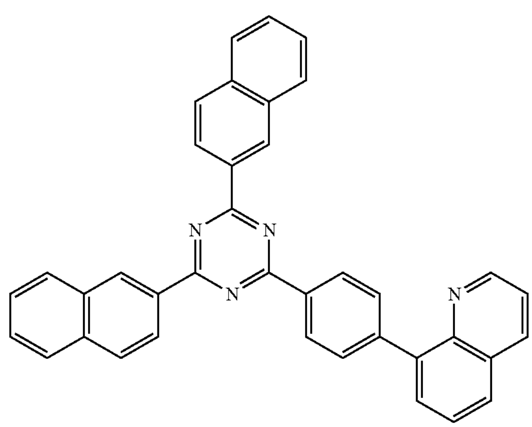

-continued
ET28
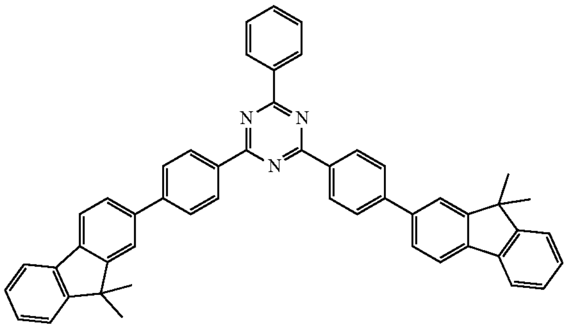
ET29
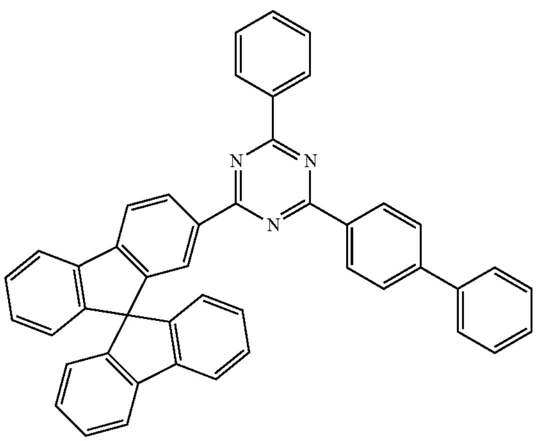
ET30
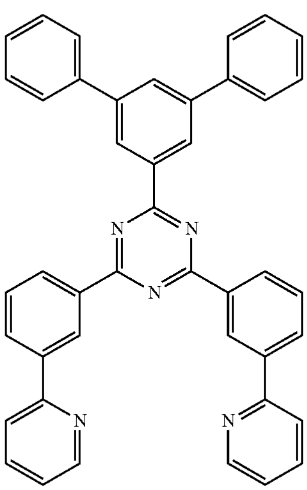
-continued
ET31
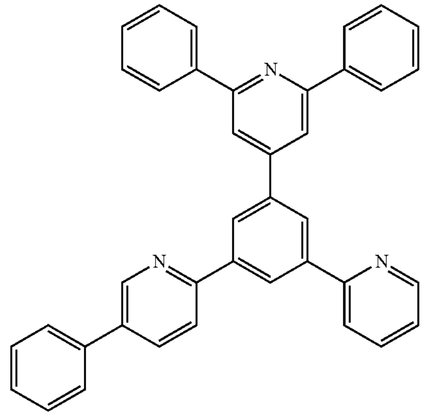
ET32
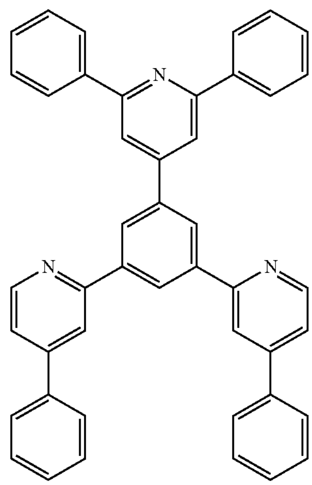
ET33
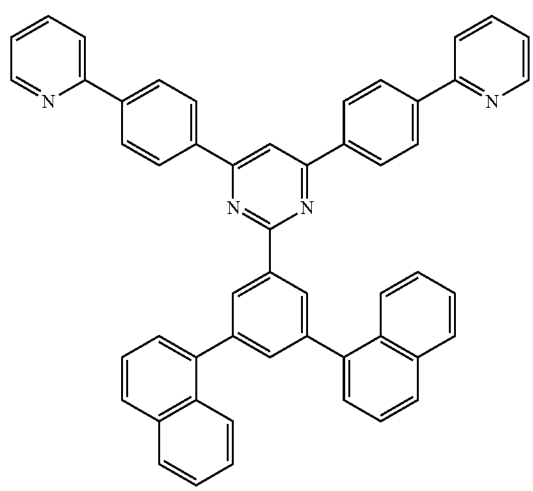

-continued
ET34
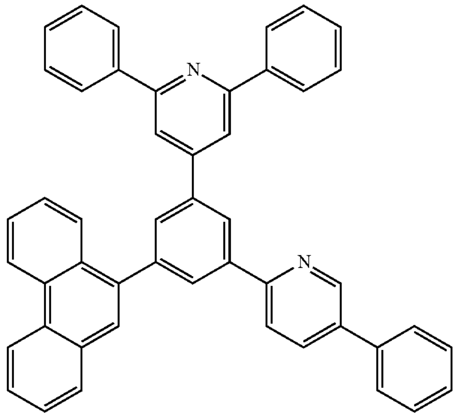
ET35
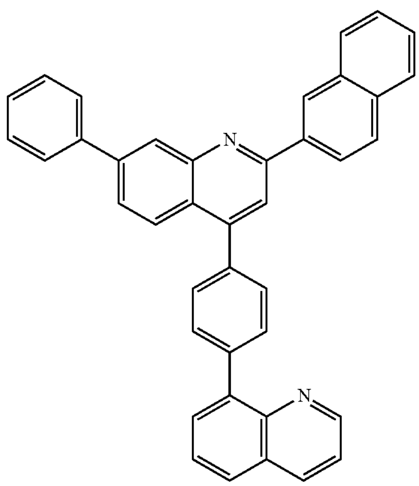
ET36
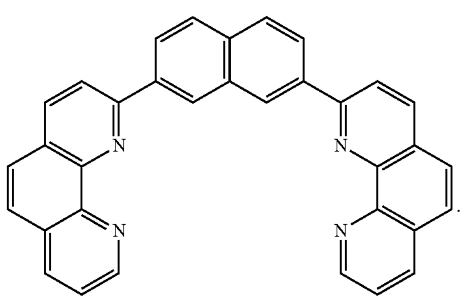
In some embodiments, the electron transport region may include at least one compound selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), NTAZ, diphenyl(4-(triphenylsilyl)phenyl)-phosphine oxide (TSPO1), and 3P-T2T:
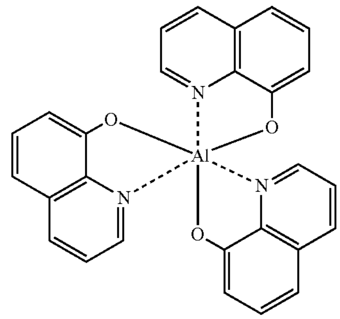
$Alq_3$
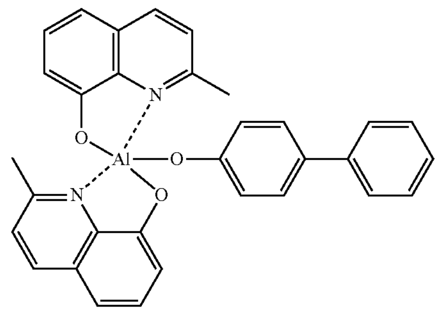
BAlq
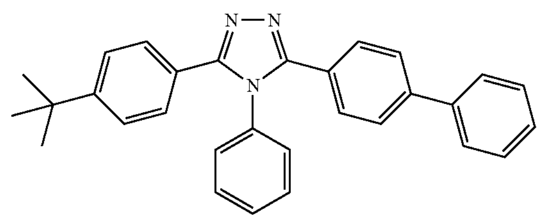
TAZ
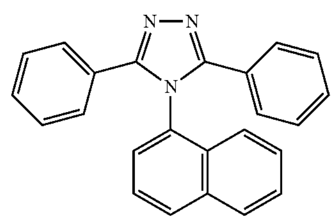
NTAZ
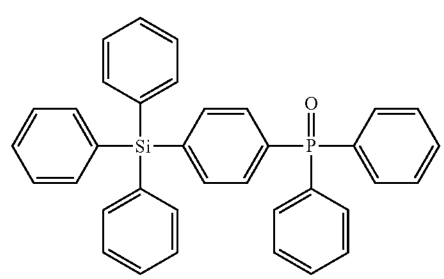
TSPO1

-continued

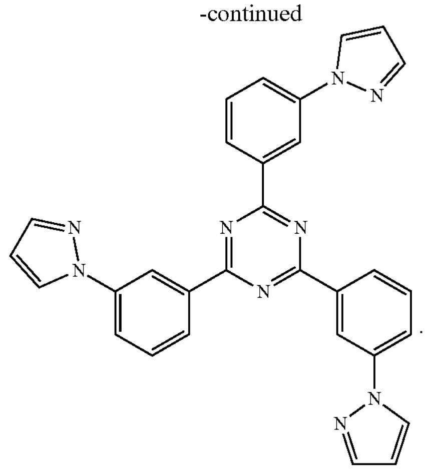

3P-T2T

ET-D1

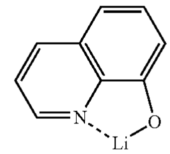

ET-D2

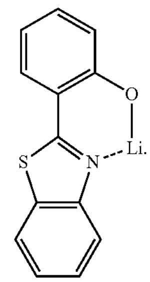

The thicknesses of the buffer layer, the hole blocking layer, or the electron control layer may each independently be in a range of about 20 Å to about 1,000 Å, and in some embodiments, about 30 Å to about 300 Å. When the thicknesses of the buffer layer, the hole blocking layer or the electron control layer are within any of these ranges, excellent hole blocking characteristics or excellent electron controlling characteristics may be obtained without a substantial increase in driving voltage.

The thickness of the electron transport layer may be in a range of about 100 Å to about 1,000 Å, and in some embodiments, about 150 Å to about 500 Å. When the thickness of the electron transport layer is within any of these ranges, excellent electron transport characteristics may be obtained without a substantial increase in driving voltage.

The electron transport region (for example, the electron transport layer in the electron transport region) may further include, in addition to the materials described herein above, a metal-containing material.

The metal-containing material may include at least one selected from an alkali metal complex and an alkaline earth metal complex. The alkali metal complex may include a metal ion selected from a lithium (Li) ion, a sodium (Na) ion, a potassium (K) ion, a rubidium (Rb) ion, and a cesium (Cs) ion. The alkaline earth metal complex may include a metal ion selected from a beryllium (Be) ion, a magnesium (Mg) ion, a calcium (Ca) ion, a strontium (Sr) ion, and a barium (Ba) ion. Each ligand coordinated with the metal ion of the alkali metal complex and the alkaline earth metal complex may independently be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazole, a hydroxy phenylpyridine, a hydroxy phenylbenzimidazole, a hydroxy phenylbenzothiazole, a bipyridine, a phenanthroline, and a cyclopentadiene, but the present disclosure is not limited thereto.

For example, the metal-containing material may include a Li complex. The Li complex may include, e.g., Compound ET-D1 (LiQ) or Compound ET-D2:

The electron transport region may include an electron injection layer that facilitates injection of electrons from the second electrode 190. The electron injection layer may be in direct contact with the second electrode 190.

The electron injection layer may have i) a single-layered structure consisting of a single layer consisting of a single material, ii) a single-layered structure consisting of a single layer including a plurality of different materials, or iii) a multi-layered structure having a plurality of layers, each including a plurality of different materials.

The electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

The alkali metal may be selected from Li, Na, K, Rb, and Cs. In an embodiment, the alkali metal may be Li, Na, or Cs. In one or more embodiments, the alkaline metal may be Li or Cs, but is not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth metal compound, and the rare earth metal compound may each independently be selected from oxides and halides (e.g., fluorides, chlorides, bromides, or iodines) of the alkali metal, the alkaline earth metal, and the rare earth metal, respectively.

The alkali metal compound may be selected from alkali metal oxides, such as $Li_2O$, $Cs_2O$, or $K_2O$, and alkali metal halides, such as LiF, NaF, CsF, KF, LiI, NaI, CsI, KI, or RbI. In an embodiment, the alkali metal compound may be selected from LiF, $Li_2O$, NaF, LiI, NaI, CsI, and KI, but the present disclosure is not limited thereto.

The alkaline earth-metal compound may be selected from alkaline earth-metal compounds, such as BaO, SrO, CaO, $Ba_xSr_{1-x}O$ (wherein $0<x<1$), and $Ba_xCa_{1-x}O$ (wherein $0<x<1$). In an embodiment, the alkaline earth metal compound may be selected from BaO, SrO, and CaO, but the present disclosure is not limited thereto.

The rare earth metal compound may be selected from $YbF_3$, $ScF_3$, $ScO_3$, $Y_2O_3$, $Ce_2O_3$, $GdF_3$, and $TbF_3$. In an embodiment, the rare earth metal compound may be selected from $YbF_3$, $ScF_3$, $TbF_3$, $YbI_3$, $ScI_3$, and $TbI_3$, but the present disclosure is not limited thereto.

The alkali metal complex, the alkaline earth metal complex, and the rare earth metal complex may each include ions of the above-described alkali metal, alkaline earth metal, and rare earth metal. Each ligand coordinated with the metal ion of the alkali metal complex, the alkaline earth metal complex, and the rare earth metal complex may independently be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazole, a hydroxy phenylpyridine, a hydroxy phenylbenzimidazole, a hydroxy phenylbenzothiazole, a bipyridine, a phenanthroline, and a cyclopentadiene, but the present disclosure is not limited thereto.

The electron injection layer may consist of an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof, as described herein above. In some embodiments, the electron injection layer may further include an organic material. When the electron injection layer further includes an organic material, the alkali metal, the alkaline earth metal, the rare earth metal, the alkali metal compound, the alkaline earth metal compound, the rare earth metal compound, the alkali metal complex, the alkaline earth metal complex, the rare earth metal complex, or a combination thereof may be homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

Second Electrode 190

The second electrode 190 may be on the organic layer 150. In an embodiment, the second electrode 190 may be a cathode that is an electron injection electrode. In this embodiment, a material for forming the second electrode 190 may be a material having a low work function, for example, a metal, an alloy, an electrically conductive compound, or a combination thereof.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but the present disclosure is not limited thereto. The second electrode 190 may be a transmissive electrode, a semi-transmissive electrode, or a reflective electrode.

The second electrode 190 may have a single-layered structure, or a multi-layered structure including two or more layers.

Figure 2:
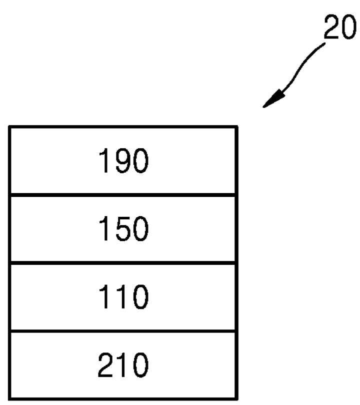
FIG. 2 illustrates a schematic cross-sectional view of an embodiment of an organic light-emitting device.
Figure 3:
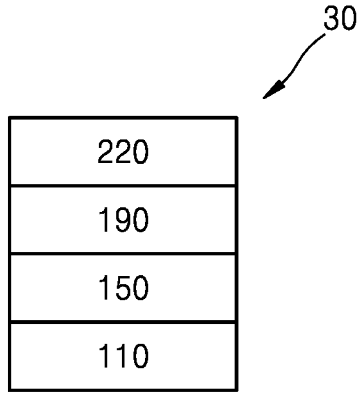
FIG. 3 illustrates a schematic cross-sectional view of an embodiment of an organic light-emitting device.
Figure 4:
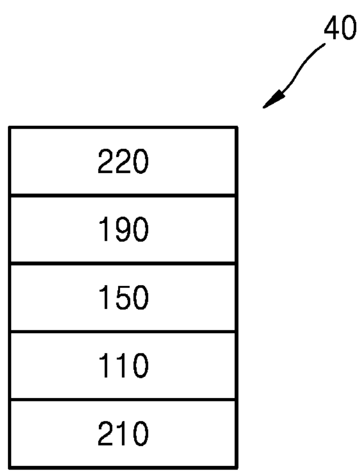
FIG. 4 illustrates a schematic cross-sectional view of an embodiment of an organic light-emitting device.

Description of FIGS. 2 to 4

Referring to FIG. 2, an organic light-emitting device 20 has a first capping layer 210, the first electrode 110, the organic layer 150, and the second electrode 190 structure, wherein the layers are sequentially stacked in this stated order. Referring to FIG. 3, an organic light-emitting device 30 has the first electrode 110, the organic layer 150, the second electrode 190, and a second capping layer 220 structure, wherein the layers are sequentially stacked in this stated order. Referring to FIG. 4, an organic light-emitting device 40 has the first capping layer 210, the first electrode 110, the organic layer 150, the second electrode 190, and the second capping layer 220 structure, wherein the layers are stacked in this stated order.

The first electrode 110, the organic layer 150, and the second electrode 190 illustrated in FIGS. 2 to 4 may be substantially the same as those illustrated in FIG. 1.

In the organic light-emitting devices 20 and 40, light emitted from the emission layer in the organic layer 150 may pass through the first electrode 110 (which may be a semi-transmissive electrode or a transmissive electrode) and through the first capping layer 210 to the outside. In the organic light-emitting devices 30 and 40, light emitted from the emission layer in the organic layer 150 may pass through the second electrode 190 (which may be a semi-transmissive electrode or a transmissive electrode) and through the second capping layer 220 to the outside.

The first capping layer 210 and the second capping layer 220 may improve the external luminescence efficiency based on the principle of constructive interference.

The first capping layer 210 and the second capping layer 220 may each independently be a capping layer including an organic material, an inorganic capping layer including an inorganic material, or a composite capping layer including an organic material and an inorganic material.

At least one of the first capping layer 210 and the second capping layer 220 may each independently include at least one material selected from carbocyclic compounds, heterocyclic compounds, amine-based compounds, porphine derivatives, phthalocyanine derivatives, naphthalocyanine derivatives, alkali metal complexes, and alkaline earth metal complexes. The carbocyclic compound, the heterocyclic compound, and the amine-based compound may optionally be substituted with a substituent containing at least one element selected from O, N, S, Se, Si, F, Cl, Br, and I.

In an embodiment, at least one of the first capping layer 210 and the second capping layer 220 may each independently include an amine-based compound.

In one or more embodiments, at least one of the first capping layer 210 and the second capping layer 220 may each independently include a compound represented by Formula 201 or a compound represented by 202.

In one or more embodiments, at least one of the first capping layer 210 and the second capping layer 220 may each independently include a compound selected from Compounds HT28 to HT33 and Compound CP1 to CP5, but the present disclosure is not limited thereto:

CP1

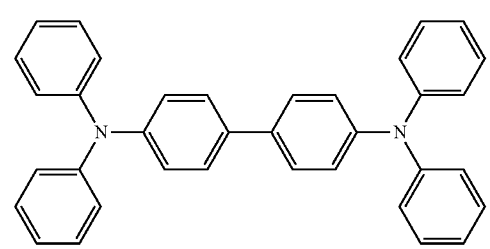

CP2

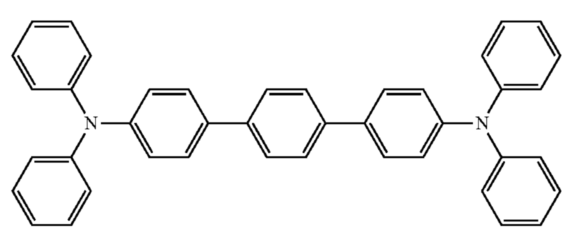

-continued

CP3

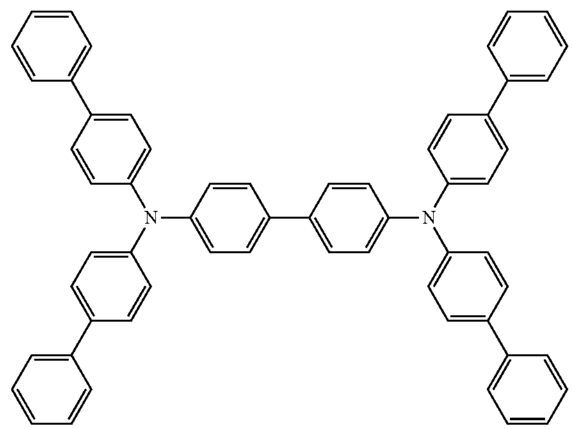

CP4

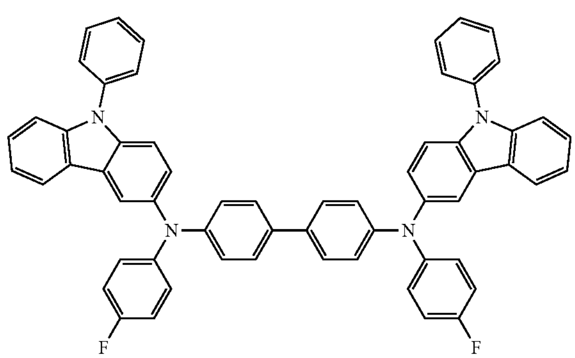

CP5

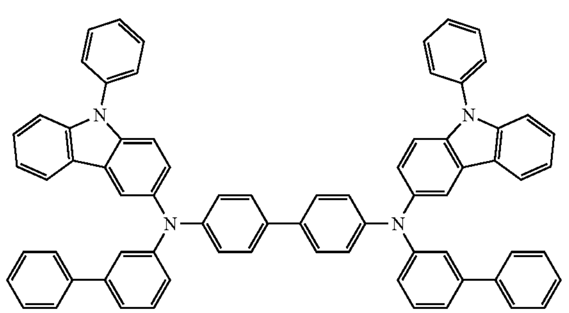

Hereinbefore, the organic light-emitting device has been described with reference to FIGS. 1 to 4, but the present disclosure is not limited thereto.

The layers constituting the hole transport region, the emission layer, and the layers constituting the electron transport region may be formed in a set or specific region by using one or more suitable methods such as vacuum deposition, spin coating, casting, Langmuir-Blodgett (LB) deposition, ink-jet printing, laser printing, and laser-induced thermal imaging.

When the layers constituting the hole transport region, the emission layer, and the layers constituting the electron transport region are each formed by vacuum deposition, the vacuum deposition may be performed at a deposition temperature in a range of about 100° C. to about 500° C. at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

When the layers constituting the hole transport region, the emission layer, and the layers constituting the electron transport region are each formed by spin coating, the spin coating may be performed at a coating rate of about 2,000 revolutions per minute (rpm) to about 5,000 rpm and at a heat treatment temperature of about 80° C. to about 200° C., depending on the material to be included in each layer and the structure of each layer to be formed.

Apparatus

The organic light-emitting device may be included in various suitable apparatuses.

In some embodiments, an apparatus may include a source electrode, a drain electrode, and thin film transistor including an active layer; and the organic light-emitting device. A first electrode of the organic light-emitting device may be electrically coupled to one of the source electrode and the drain electrode of the thin-film transistor.

The thin-film transistor may further include a gate electrode, a gate insulating film, or the like.

The active layer may include a crystalline silicon, an amorphous silicon, an organic semiconductor, and an oxide semiconductor, but the present disclosure is not limited thereto.

The apparatus may further include a sealing portion for sealing the organic light-emitting device. The sealing portion may enable image realization from the organic light-emitting device and prevent or reduce permeation of air and moisture into the organic light-emitting device. The sealing portion may be a sealing substrate including a transparent glass or a plastic substrate. The sealing portion may be a thin film encapsulating layer including a plurality of organic layers and/or a plurality of inorganic layers. When the sealing portion is a thin film encapsulating layer, the apparatus as a whole may be flexible.

In some embodiments, the apparatus may be an emission apparatus, an authentication apparatus, or an electronic apparatus.

The emission apparatus may be used in various suitable displays, light sources, or the like.

The authentication apparatus may be, for example, a biometric authentication apparatus that identifies an individual according biometric information (e.g., a fingertip, a pupil, or the like). The authentication apparatus may further include a biometric information collecting unit, in addition to the organic light-emitting device described herein above.

The electronic apparatus may be applicable to a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device), a fish finder, various suitable measurement devices, gauges (e.g., gauges of an automobile, an airplane, a ship), a projector, but the present disclosure is not limited thereto. General definitions of at least some of the substituents The term "first-row transition metal," as used herein, refers to an element belonging to the d-block of Period 4 of the Periodic Table of Elements. Examples thereof include scandium (Sc), titanium (Ti), vanadium (V), chromium (Cr), manganese (Mn), iron (Fe), cobalt (Co), nickel (Ni), copper (Cu), and zinc (Zn).

The term "second-row transition metal," as used herein, refers to an element belonging to the d-block of Period 5 of the Periodic Table of Elements. Examples thereof include yttrium (Y), zirconium (Zr), niobium (Nb), molybdenum (Mo), technetium (Tc), ruthenium (Ru), rhodium (Rh), palladium (Pd), silver (Ag), and cadmium (Cd).

The term "third-row transition metal," as used herein, refers to an element belonging to the d- and f-blocks of Period 6 of the Periodic Table of Elements. Examples thereof include lanthanum (La), samarium (Sm), europium (Eu), terbium (Tb), thulium (Tm), ytterbium (Yb), lutetium (Lu), hafnium (Hf), tantalum (Ta), tungsten (W), rhenium (Re), osmium (Os), iridium (Ir), platinum (Pr), gold (Au), and mercury (Hg).

The term "$C_1$-$C_{60}$ alkyl group," as used herein, refers to a linear or branched aliphatic hydrocarbon monovalent group having 1 to 60 carbon atoms. Examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a hydrocarbon group having at least one carbon-carbon double bond at a main chain (e.g., in the middle) or at a terminal end (e.g., the terminus) of the $C_2$-$C_{60}$ alkyl group. Examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a hydrocarbon group having at least one carbon-carbon triple bond at a main chain (e.g., in the middle) or at a terminal end (e.g., the terminus) of the $C_2$-$C_{60}$ alkyl group. Examples thereof include an ethynyl group and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_3$-$C_{10}$ cycloalkyl group," as used herein, refers to a monovalent saturated hydrocarbon monocyclic group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent monocyclic group including at least one heteroatom selected from N, O, Si, P, and S as a ring-forming atom and 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one double bond in its ring, and is not aromatic. Examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent monocyclic group including at least one heteroatom selected from N, O, Si, P, and S as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_6$-$C_6$ aryl group," as used herein, refers to a monovalent group having a carbocyclic aromatic system having 6 to 60 carbon atoms. The term "$C_6$-$C_{60}$ arylene group," as used herein, refers to a divalent group having a carbocyclic aromatic system having 6 to 60 carbon atoms. Examples of the $C_5$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include two or more rings, the respective rings may be fused (e.g., combined together). The term "$C_7$-$C_{60}$ alkyl aryl group," as used herein, refers to a $C_6$-$C_{60}$ aryl group substituted with at least one $C_1$-$C_{60}$ alkyl group.

The term "$C_1$-$C_{60}$ heteroaryl group," as used herein, refers to a monovalent group having a heterocyclic aromatic system having at least one heteroatom selected from N, O, Si, P, and S as a ring-forming atom and 1 to 60 carbon atoms. The term "$C_1$-$C_{60}$ heteroarylene group," as used herein, refers to a divalent group having a heterocyclic aromatic system having at least one heteroatom selected from N, O, Si, P, and S as a ring-forming atom and 1 to 60 carbon atoms. Examples of the $C_1$-$C_6$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include two or more rings, the respective rings may be fused (e.g., combined together). The term "$C_7$-$C_{60}$ alkyl heteroaryl group," as used herein, refers to a $C_6$-$C_{60}$ heteroaryl group substituted with at least one $C_1$-$C_{60}$ alkyl group.

The term "$C_6$-$C_6$ aryloxy group," as used herein, is represented by —$OA_{102}$ (wherein $A_{102}$ is the $C_6$-$C_{60}$ aryl group). The term "$C_6$-$C_{60}$ arylthio group," as used herein, is represented by —$SA_{103}$ (wherein $A_{103}$ is the $C_6$-$C_{60}$ aryl group).

The term "$C_1$-$C_{60}$ heteroaryloxy group," as used herein, is represented by —$OA_{104}$ (wherein $A_{104}$ is a $C_1$-$C_{60}$ heteroaryl group). The term "$C_1$-$C_{60}$ heteroarylthio group," as used herein, is represented by —$SA_{105}$ (wherein $A_{105}$ is a $C_1$-$C_{60}$ heteroaryl group).

The term "monovalent non-aromatic condensed polycyclic group," as used herein, refers to a monovalent group that has two or more rings condensed (e.g., combined together) and only carbon atoms as ring forming atoms (e.g., 8 to 60 carbon atoms), wherein the entire molecular structure is non-aromatic. Examples of the monovalent non-aromatic condensed polycyclic group may include a fluorenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group that has two or more condensed rings and at least one heteroatom selected from N, O, Si, P, and S, in addition to carbon atoms (e.g., 1 to 60 carbon atoms), as a ring-forming atom, wherein the entire molecular structure is non-aromatic. Examples of the monovalent non-aromatic condensed heteropolycyclic group may include a carbazolyl group. The term "divalent non-aromatic condensed heteropolycyclic group," as used herein, refers to a divalent group having substantially the same structure as the monovalent non-aromatic condensed heteropolycyclic group.

The term "$C_5$-$C_{60}$ carbocyclic group," as used herein, refers to a monocyclic or polycyclic group having 5 to 60 carbon atoms only as ring-forming atoms. The $C_5$-$C_{60}$ carbocyclic group may be an aromatic carbocyclic group or a non-aromatic carbocyclic group. The term "$C_5$-$C_{60}$ carbocyclic group," as used herein, refers to a ring (e.g., a benzene group), a monovalent group (e.g., a phenyl group), or a divalent group (e.g., a phenylene group). Also, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group," as used herein, refers to a group having substantially the same structure as the $C_5$-$C_{60}$ carbocyclic group, except that at least one heteroatom selected from N, O, Si, P, and S is used as a ring-forming atom, in addition to carbon atoms (e.g., 1 to 60 carbon atoms).

In the present specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from:

- deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;
- a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_1$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_6$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_6$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_6$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_5$-$C_{60}$ aryloxy group, a $C_6$-$C_{60}$ arylthio group, a $C_1$-Ceo heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and
- —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_6$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_1$-$C_{60}$ heteroaryl group, a $C_2$-$C_{60}$ alkyl heteroaryl group, a $C_1$-$C_{60}$ heteroaryloxy group, a $C_1$-$C_6$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

"Ph," as used herein, represents a phenyl group, "Me," as used herein, represents a methyl group, "Et," as used herein, represents an ethyl group, "ter-Bu" or "$Bu^t$," as used herein, represents a tert-butyl group, and "OMe," as used herein, represents a methoxy group.

The term "biphenyl group," as used herein, refers to a phenyl group substituted with at least one phenyl group. The "biphenyl group" belongs to "a substituted phenyl group" having a "$C_6$-$C_{60}$ aryl group" as a substituent.

The term "terphenyl group," as used herein, refers to a phenyl group substituted with at least one phenyl group. The "terphenyl group" belongs to "a substituted phenyl group" having a "$C_6$-$C_{60}$ aryl group substituted with a $C_6$-$C_{60}$ aryl group" as a substituent.

The symbols * and *', as used herein, unless defined otherwise, refer to a binding site to an adjacent atom in a corresponding formula.

Hereinafter, compounds and an organic light-emitting device according to one or more embodiments will be described in more detail with reference to Synthesis Examples and Examples. The wording "B was used instead of A" used in describing Synthesis Examples means that an amount of B used was identical to an amount of A used in terms of molar equivalents.

EXAMPLES

Synthesis Example 1: Synthesis of Compound 1

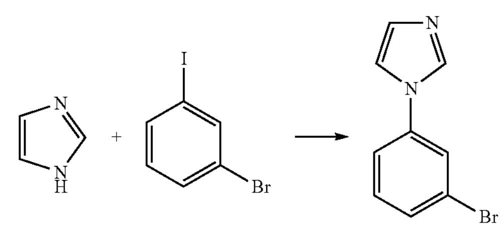

1-1

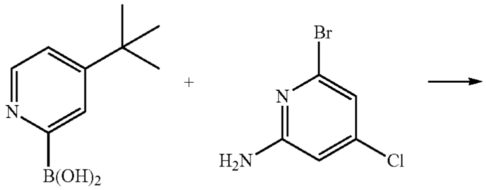

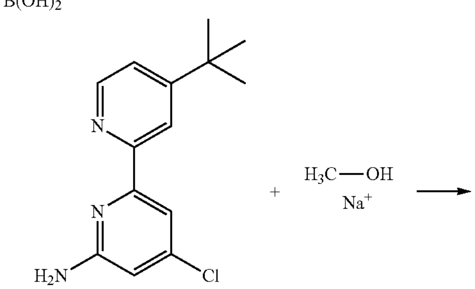

1-2

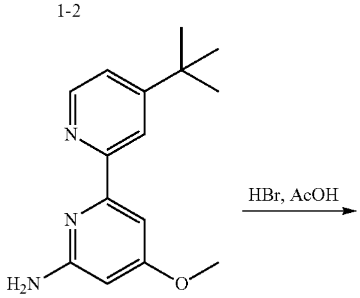

1-3

-continued

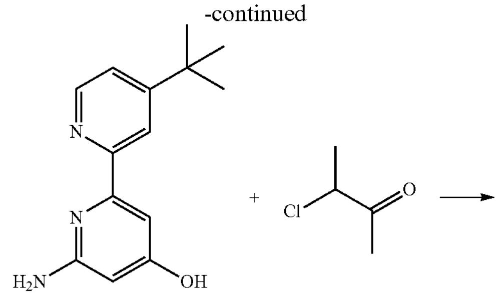

1-4

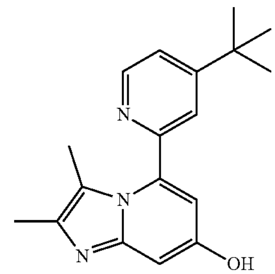

1-5

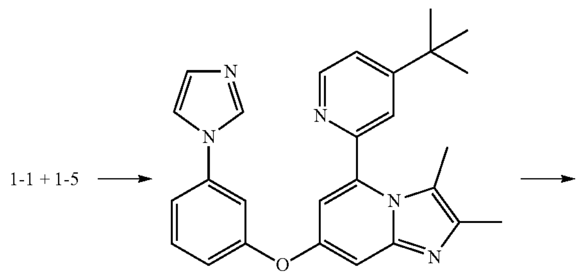

1-6

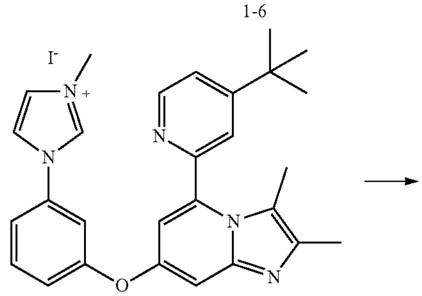

1-7

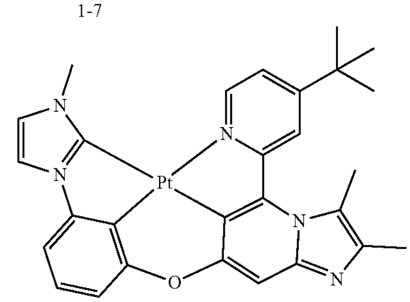

1

(1) Synthesis of Intermediate Compound 1-1

3-iodobromobenzene (1.0 eq), imidazole (1.2 eq), CuI (0.01 eq), $K_2CO_3$ (2.0 eq), and L-proline (0.02 eq) were dissolved in 0.1 molar (M) dimethyl sulfonate, and the mixture was stirred at a temperature of 130° C. for 24 hours.

The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 1-1 was obtained (yield: 72%).

(2) Synthesis of Intermediate Compound 1-2

6-bromo-4-chloropyridine-2-amine (1.0 eq), (4-(tert-butyl)pyridine-2yl)boronic acid (1.2 eq), $K_2CO_3$ (2.0 eq), and $Pd(PPh_3)_4$ (0.02 eq) were dissolved in toluene (0.1 M), followed by stirring at a temperature of 120° C. for 12 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 1-2 was obtained (yield: 84%).

(3) Synthesis of Intermediate Compound 1-3

Intermediate Compound 1-2, sodium methoxide (2.0 eq), methanol (0.1 eq), CuCl (0.05 eq), and formate (0.5 eq) were stirred at a temperature of 115° C. for 2 hours. The reaction mixture was cooled to room temperature, then 1.6 M hydrochloride aqueous solution was added thereto, and an extraction process was performed thereon three times using diethylether and water to thereby obtain an organic layer. The obtained organic layer was dried using anhydrous magnesium sulfate, followed by concentration. Then, through column chromatography, Intermediate Compound 1-3 was obtained (yield: 75%).

(4) Synthesis of Intermediate Compound 1-4

Intermediate Compound 1-3 (1.0 eq) was dissolved in a mixture of hydrobromic acid aqueous solution and acetate (at 3:7, 1 M), followed by stirring at a temperature of 120° C. for 12 hours. Once the reaction mixture was cooled to room temperature, the mixture was neutralized with sodium hydroxide aqueous solution (5 M). The reaction mixture underwent an extraction process three times using dichloromethane and water to thereby obtain an organic layer. The obtained organic layer was dried using anhydrous magnesium sulfate, followed by concentration. Then, through column chromatography, Intermediate Compound 1-4 was obtained (yield: 45%).

(5) Synthesis of Intermediate Compound 1-5

Intermediate Compound 1-4 (1.0 eq) was dissolved in ethanol (0.1 M), and 3-chlorobutane-2-one (1.1 eq) was slowly added dropwise thereto, followed by stirring at a temperature of 80° C. for 24 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 1-5 was obtained (yield: 58%).

(6) Synthesis of Intermediate Compound 1-6

Intermediate Compound 1-1 (1.0 eq), Intermediate Compound 1-5 (1.2 eq), CuI (0.01 eq), $K_2CO_3$ (2.0 eq), and L-proline (0.02 eq) were dissolved in 0.1 M dimethyl sulfonate, and the mixture was stirred at a temperature of 130° C. for 24 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 1-6 was obtained (yield: 66%).

(7) Synthesis of Intermediate Compound 1-7

Intermediate Compound 1-6 (1.0 eq) was dissolved in iodomethane (1 M), followed by stirring at a temperature of 70° C. for 12 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 1-7 was obtained (yield: 66%).

(8) Synthesis of Compound 1

Intermediate Compound 1-7 (1.0 eq), dichloro(1,2-dicyclooctadiene)platinum ($Pt(COD)Cl_2$) (1.1 eq), and sodium acetate (2.0 eq) was dissolved in dioxane (0.1 M), followed by stirring at a temperature of 120° C. for 72 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration and synthesis through column chromatography using Compound 1 (yield: 22%). The result was identified using $^1H$ nuclear magnetic resonance (NMR), $^{13}C$ NMR, and liquid chromatography-mass spectrometry (LCMS).

$^1H$ NMR (400 MHz, DMSO-d6): δ=8.67 (s, 1H), 8.59 (d, 1H, $J_{H-H}$=10.2 Hz), 7.85 (m, 1H), 7.44-7.27 (m, 4H), 7.19 (s, 1H), 6.81 (d, 1H, $J_{H-H}$=10.2 Hz), 3.72 (s, 3H), 2.55 (s, 3H), 2.23 (s, 3H), 1.32 (s, 9H)

$^{13}C$ NMR (100.6 MHz, DMSO-d6): δ=155.5, 152.5, 151.7, 148.3, 147.5, 143.5, 143.1, 141, 138.6, 137.6, 135.8, 128.3, 126.2, 123.5, 123, 122.4, 120.8, 118.9, 118.0, 115.9, 114, 34.4, 13.1, 7.8

LCMS. Calcd for C24H19N5OPt([M]+): m/z 588.12. Found: m/z 588.17.

Synthesis Example 2: Synthesis of Compound 10

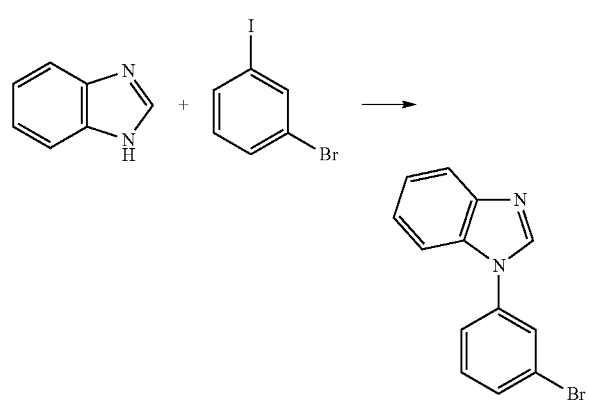

10-1

-continued

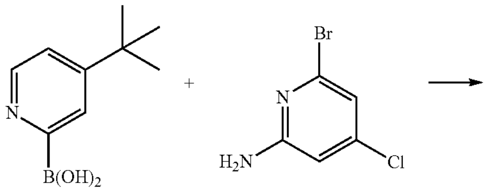

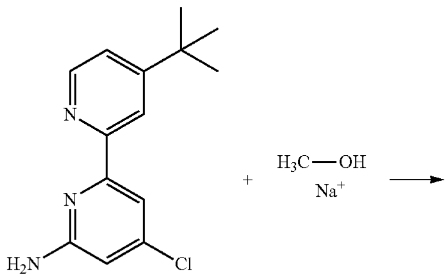

1-2

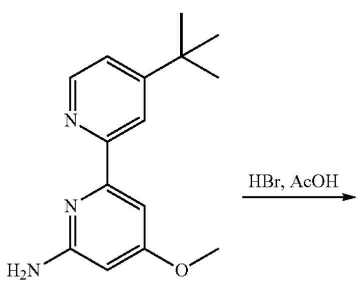

1-3

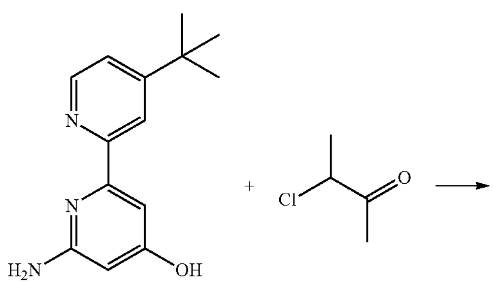

1-4

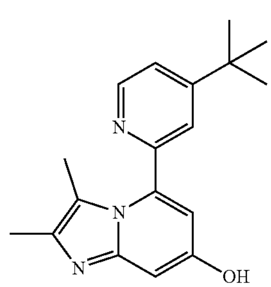

1-5

10-1 + 1-5 →

-continued

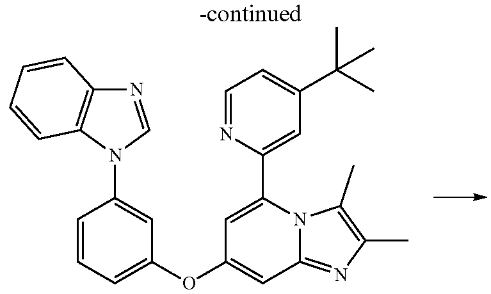

10-6

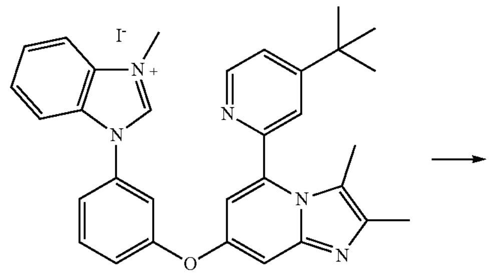

10-7

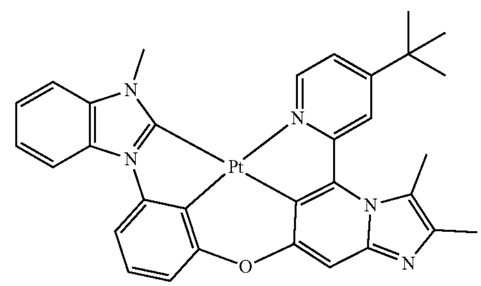

10

(1) Synthesis of Intermediate Compound 10

3-iodobromobenzene (1.0 eq), benzimidazole (1.2 eq), CuI (0.01 eq), $K_2CO_3$ (2.0 eq), and L-proline (0.02 eq) were dissolved in 0.1 M dimethyl sulfonate, and the mixture was stirred at a temperature of 130° C. for 24 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 10-1 was obtained (yield: 72%).

(2) Synthesis of Intermediate Compound 10-6

Intermediate Compound 10-1 (1.0 eq), Intermediate Compound 1-5 (1.2 eq), CuI (0.01 eq), $K_2CO_3$ (2.0 eq), and L-proline (0.02 eq) were dissolved in 0.1 M dimethyl sulfonate, and the mixture was stirred at a temperature of 130° C. for 24 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 10-6 was obtained (yield: 66%).

(3) Synthesis of Intermediate Compound 10-7

Intermediate Compound 10-6 (1.0 eq) was dissolved in iodomethane (1 M), followed by stirring at a temperature of 70° C. for 12 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 10-7 was obtained (yield: 66%).

(4) Synthesis of Compound 10

Intermediate Compound 10-7 (1.0 eq), dichloro(1,2-dicyclooctadiene)platinum ($Pt(COD)Cl_2$) (1.1 eq), and sodium acetate (2.0 eq) was dissolved in dioxane (0.1 M), followed by stirring at a temperature of 120° C. for 72 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration and synthesis through column chromatography using Compound 10 (yield: 22%). The result was identified using $^{1}$NMR, $^{13}$C NMR, and LCMS.

$^{1}$H NMR (400 MHz, DMSO-d6): 5=8.67 (s, 1H), 8.59 (d, 1H, $J_{H-H}$=10.2 Hz), 7.85 (m, 1H), 7.70 (m, 2H), 7.44-7.27 (m, 4H), 7.26 (m, 1H), 6.81 (d, 1H, $J_{H-H}$=10.2 Hz), 3.72 (s, 3H), 2.55 (s, 3H), 2.23 (s, 3H), 1.32 (s, 9H)

$^{13}$C NMR (100.6 MHz, DMSO-d6): δ=155.5, 152.5, 151.7, 149.1, 148.3, 147.5, 143.5, 143.3, 143.1, 142.1, 141, 140.1, 138.6, 137.6, 135.8, 128.3, 126.2, 123.5, 123, 122.4, 120.8, 118.9, 118.0, 115.9, 114, 34.4, 13.1, 7.8

LCMS. Calcd for C24H19N5OPt([M]+): m/z 658.59. Found: m/z 638.14.

Synthesis Example 3: Synthesis of Compound 19

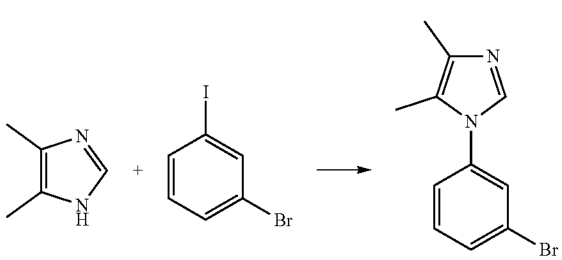

19-1

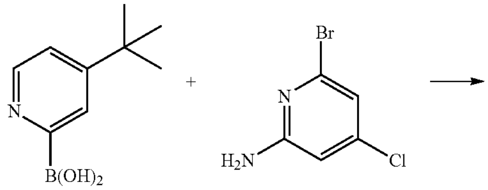

-continued

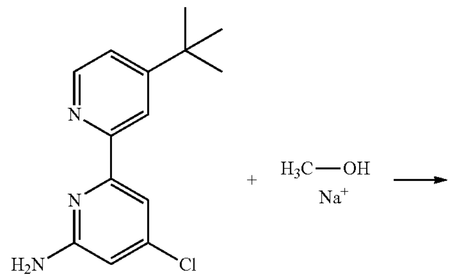

1-2

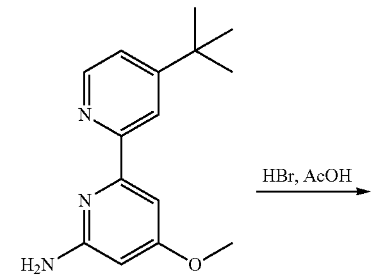

1-3

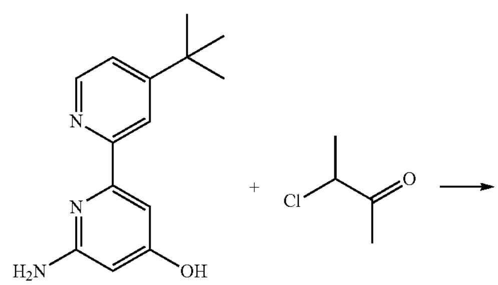

1-4

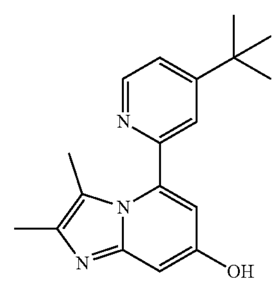

1-5

19-1 + 1-5 →

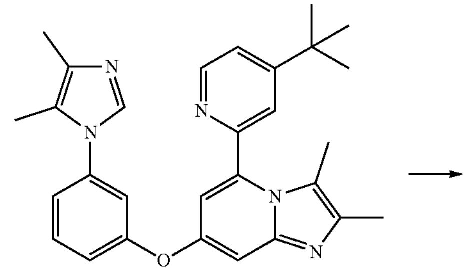

19-6

-continued

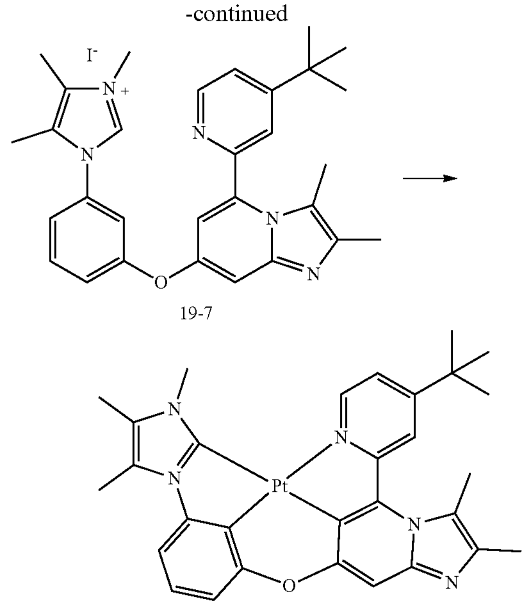

19-7

19

(1) Synthesis of Intermediate Compound 19-1

3-iodobromobenzene (1.0 eq), 4,5-dimethyl-1H-imidazole (1.2 eq), CuI (0.01 eq), $K_2CO_3$ (2.0 eq), and L-proline (0.02 eq) were dissolved in 0.1 M dimethyl sulfonate, and the mixture was stirred at a temperature of 130° C. for 24 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 19-1 was obtained (yield: 72%).

(2) Synthesis of Intermediate Compound 19-6

Intermediate Compound 19-1 (1.0 eq), Intermediate Compound 1-5 (1.2 eq), CuI (0.01 eq), $K_2CO_3$ (2.0 eq), and L-proline (0.02 eq) were dissolved in 0.1 M dimethyl sulfonate, and the mixture was stirred at a temperature of 130° C. for 24 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 19-6 was obtained (yield: 66%).

(3) Synthesis of Intermediate Compound 19-7

Intermediate Compound 19-6 (1.0 eq) was dissolved in iodomethane (1 M), followed by stirring at a temperature of 70° C. for 12 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 19-7 was obtained (yield: 66%).

4) Synthesis of Compound 1

Intermediate Compound 19-7 (1.0 eq), dichloro(1,2-dicyclooctadiene)platinum (Pt(COD)$Cl_2$) (1.1 eq), and sodium acetate (2.0 eq) was dissolved in dioxane (0.1 M), followed by stirring at a temperature of 120° C. for 72 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration and synthesis through column chromatography using Compound 19 (yield: 22%). The result was identified using $^{1}$NMR, $^{13}$C NMR, and LCMS.

$^{1}$H NMR (400 MHz, DMSO-d6): δ=8.67 (s, 1H), 8.59 (d, 1H, $J_{H-H}$=10.2 Hz), 7.85 (m, 1H), 7.44-7.27 (m, 3H), 6.81 (d, 1H, $J_{H-H}$=10.2 Hz), 3.72 (s, 3H), 2.74 (s, 3H), 2.65 (s, 3H), 2.55 (s, 3H), 2.23 (s, 3H), 1.32 (s, 9H)

$^{13}$C NMR (100.6 MHz, DMSO-d6): 5=155.5, 152.5, 151.7, 149.1, 148.3, 147.5, 143.5, 143.3, 143.1, 142.1, 138.6, 137.6, 135.8, 128.3, 126.2, 123.5, 123, 122.4, 120.8, 118.9, 118.0, 115.9, 114, 34.4, 13.1, 7.8

LCMS. Calcd for C24H19N5OPt([M]+): m/z 616.59. Found: m/z 161.16.

Synthesis Example 4: Synthesis of Compound 28

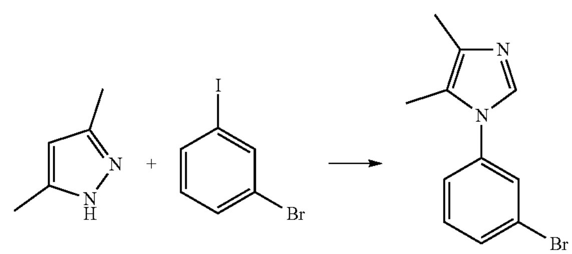

28-1

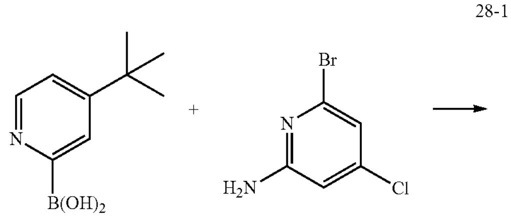

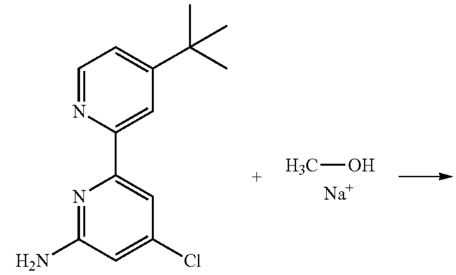

1-2

-continued

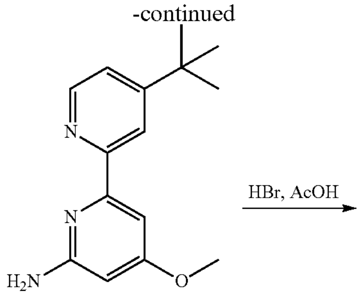

1-3

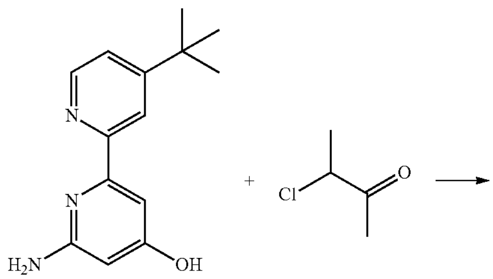

1-4

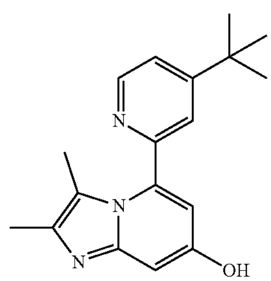

1-5

28-1 + 1-5 →

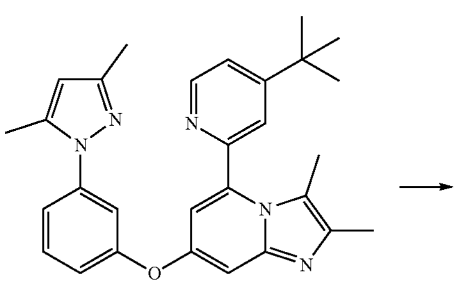

28-6

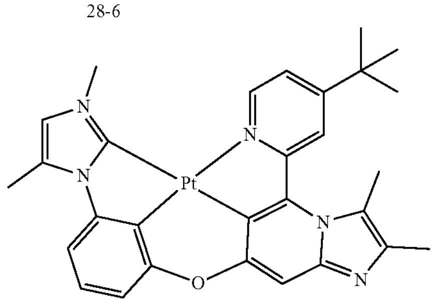

28

(1) Synthesis of Intermediate Compound 28-1

3-iodobromobenzene (1.0 eq), 3,5-dimethyl-1H-pyrazole (1.2 eq), CuI (0.01 eq), $K_2CO_3$ (2.0 eq), and L-proline (0.02 eq) were dissolved in 0.1 M dimethyl sulfonate, and the mixture was stirred at a temperature of 130° C. for 24 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 19-1 was obtained (yield: 72%).

(2) Synthesis of Intermediate Compound 28-6

Intermediate Compound 28-1 (1.0 eq), Intermediate Compound 1-5 (1.2 eq), CuI (0.01 eq), $K_2CO_3$ (2.0 eq), and L-proline (0.02 eq) were dissolved in 0.1 M dimethyl sulfonate, and the mixture was stirred at a temperature of 130° C. for 24 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 28-6 was obtained (yield: 66%).

3) Synthesis of Compound 28

Intermediate Compound 28-6 (1.0 eq), dichloro(1,2-dicyclooctadiene)platinum ($Pt(COD)Cl_2$) (1.1 eq), and sodium acetate (2.0 eq) was dissolved in dioxane (0.1 M), followed by stirring at a temperature of 120° C. for 72 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration and synthesis through column chromatography using Compound 28 (yield: 22%). The result was identified using $^1$NMR, $^{13}$C NMR, and LCMS.

$^1$H NMR (400 MHz, DMSO-d6): 5=8.67 (s, 1H), 8.59 (d, 1H, $J_{H-H}$=10.2 Hz), 7.85 (m, 1H), 7.44-7.27 (m, 4H), 5.74 (1H, $J_{H-H}$=10.2 Hz), 2.55 (s, 3H), 2.23 (s, 3H), 2.12 (s, 6H), 1.32 (s, 9H)

$^{13}$C NMR (100.6 MHz, DMSO-d6): δ=155.5, 152.5, 151.7, 148.3, 147.5, 143.5, 143.1, 141, 138.6, 137.6, 135.8, 128.3, 126.2, 123.5, 123, 122.4, 120.8, 118.9, 118.0, 115.9, 114, 34.4, 13.1, 7.8

LCMS. Calcd for C24H19N5OPt([M]+): m/z 588.12. Found: m/z 588.17.

Synthesis Example 5: Synthesis of Compound 55

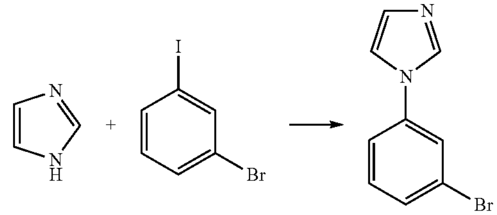

1-1

-continued

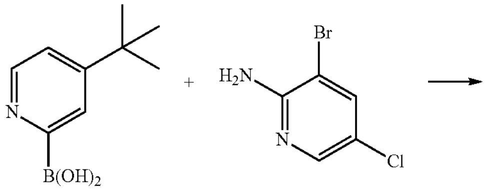

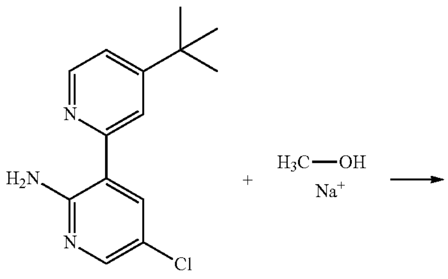

55-2

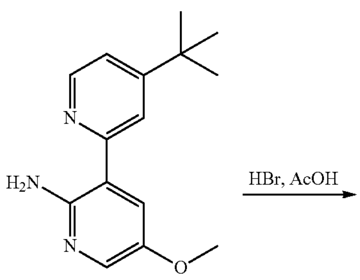

55-3

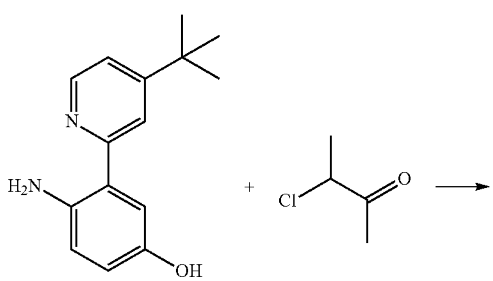

55-4

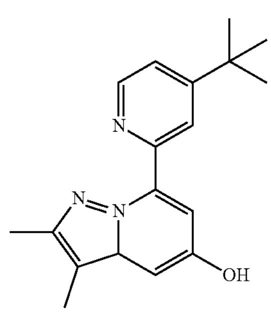

55-5

-continued

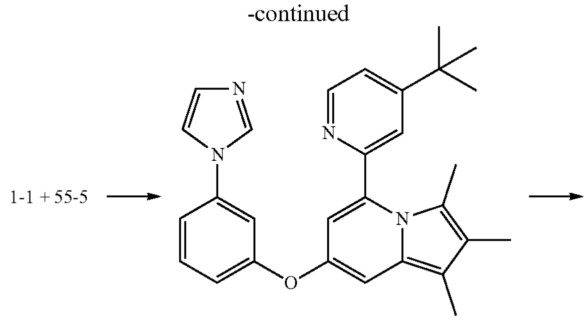

55-6

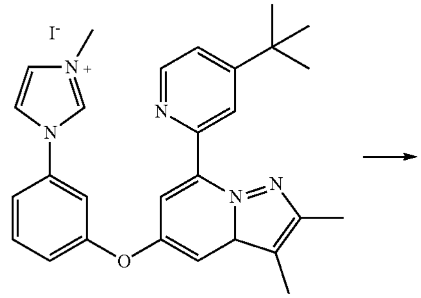

55-7

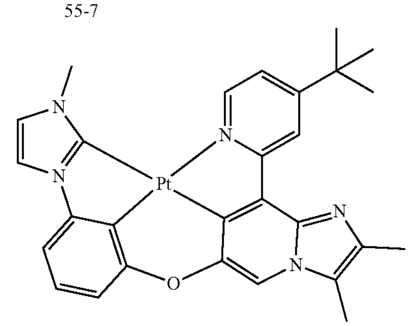

55

(1) Synthesis of Intermediate Compound 55-2

3-bromo-5-chloropyridine-2-amine (1.0 eq), (4-(tert-butyl)pyridine-2yl)boronic acid (1.2 eq), $K_2CO_3$ (2.0 eq), and $Pd(PPh_3)_4$ (0.02 eq) were dissolved in toluene (0.1 M), followed by stirring at a temperature of 120° C. for 12 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 55-2 was obtained (yield: 84%).

(2) Synthesis of Intermediate Compound 55-3

Intermediate Compound 55-2, sodium methoxide (2.0 eq), methanol (0.1 eq), CuCl (0.05 eq), and formate (0.5 eq) were stirred at a temperature of 115° C. for 2 hours. The reaction mixture was cooled to room temperature, then 1.6 M hydrochloride aqueous solution was added thereto, and an extraction process was performed thereon three times using diethylether and water to thereby obtain an organic layer. The obtained organic layer was dried using anhydrous magnesium sulfate, followed by concentration. Then, through column chromatography, Intermediate Compound 55-3 was obtained (yield: 75%).

(3) Synthesis of Intermediate Compound 55-4

Intermediate Compound 55-3 (1.0 eq) was dissolved in a mixture of hydrobromic acid aqueous solution and acetate (at 3:7, 1 M), followed by stirring at a temperature of 120° C. for 12 hours. Once the reaction mixture was cooled to room temperature, the mixture was neutralized with sodium hydroxide aqueous solution (5 M). The reaction mixture underwent an extraction process three times using dichloromethane and water to thereby obtain an organic layer. The obtained organic layer was dried using anhydrous magnesium sulfate, followed by concentration. Then, through column chromatography, Intermediate Compound 55-4 was obtained (yield: 45%).

(4) Synthesis of Intermediate Compound 55-5

Intermediate Compound 55-4 (1.0 eq) was dissolved in ethanol (0.1 M), and 3-chlorobutane-2-one (1.1 eq) was slowly added dropwise thereto, followed by stirring at a temperature of 80° C. for 24 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 55-5 was obtained (yield: 58%).

(5) Synthesis of Intermediate Compound 55-6

Intermediate Compound 1-1 (1.0 eq), Intermediate Compound 55-5 (1.2 eq), CuI (0.01 eq), $K_2CO_3$ (2.0 eq), and L-proline (0.02 eq) were dissolved in 0.1 M dimethyl sulfonate, and the mixture was stirred at a temperature of 130° C. for 24 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 55-6 was obtained (yield: 66%).

(6) Synthesis of Intermediate Compound 55-7

Intermediate Compound 55-6 (1.0 eq) was dissolved in iodomethane (1 M), followed by stirring at a temperature of 70° C. for 12 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration. Then, through column chromatography, Intermediate Compound 55-7 was obtained (yield: 66%).

(7) Synthesis of Compound 55

Intermediate Compound 55-7 (1.0 eq), dichloro(1,2-dicyclooctadiene)platinum ($Pt(COD)Cl_2$) (1.1 eq), and sodium acetate (2.0 eq) was dissolved in dioxane (0.1 M), followed by stirring at a temperature of 120° C. for 72 hours. The reaction mixture was cooled to room temperature, and then an extraction process was performed thereon three times using dichloromethane and water to thereby obtain an organic layer. The obtained organic layer was dried using anhydrous magnesium sulfate, followed by concentration and synthesis through column chromatography using Compound 55 (yield: 22%). The result was identified using $^1H$ NMR, $^{13}C$ NMR, and LCMS.

$^1H$ NMR (400 MHz, DMSO-d6): δ=8.67 (s, 1H), 8.59 (d, 1H, $J_{H-H}$=10.2 Hz), 7.85 (m, 1H), 7.44-7.27 (m, 4H), 7.19 (s, 1H), 6.81 (d, 1H, $J_{H-H}$=10.2 Hz), 3.72 (s, 3H), 2.55 (s, 3H), 2.23 (s, 3H), 1.32 (s, 9H)

$^{13}C$ NMR (100.6 MHz, DMSO-d6): δ=155.5, 152.5, 151.7, 148.3, 147.5, 143.5, 143.1, 141, 138.6, 137.6, 135.8, 128.3, 126.2, 123.5, 123, 122.4, 120.8, 118.9, 118.0, 115.9, 114, 34.4, 13.1, 7.8

LCMS. Calcd for C24H19N5OPt([M]+): m/z 588.12. Found: m/z 588.17

Example 1

As an anode, a substrate on which ITO/Ag/ITO were deposited was cut to a size of 50 millimeters (mm)×50 mm×0.7 mm, sonicated in isopropyl alcohol and pure water for 5 minutes in each solvent, cleaned with ultraviolet rays for 30 minutes, and then ozone, and mounted on a vacuum deposition apparatus.

Compound 2-TNATA was vacuum-deposited on the ITO substrate to form a hole injection layer having a thickness of 60 nm. Then, NPB was vacuum-deposited on the hole injection layer to form a hole transport layer having a thickness of 30 nm.

Compound H56, as a host, and Compound 55, as a dopant, were co-deposited on the hole transport layer to a weight ratio of 98:2, thereby forming an emission layer having a thickness of 30 nm.

Next, BAlq was deposited on the emission layer to form a hole blocking layer having a thickness of 5 nm. Then, $Alq_3$ was deposited on the hole blocking layer to form an electron transport layer having a thickness of 25 nm. LiF was then deposited on the electron transport layer to form an electron injection layer having a thickness of 0.5 nm. Lastly, aluminum (AI) was deposited on the electron injection layer to form a cathode having a thickness of 150 nm, thereby completing the manufacture of an light-emitting device.

Examples 2 to 5 and Comparative Examples 1 and 4

Organic light-emitting devices were manufactured in substantially the same manner as in Example 1, except that compounds shown in Table 2 were used in the formation of the emission layer.

Evaluation Example

The driving voltage (V), current density ($mA/cm^2$) luminescence efficiency (cd/A), maximum emission wavelength (nm), and lifespan ($T_{90}$) at 1,000 $cd/m^2$ of the organic light-emitting devices manufactured in Examples 1 to 5 and Comparative Examples 1 to 4 were measured by using Keithley source-measure unit (SMU) 236 and a luminance meter PR650. The results thereof are shown in Table 2. In Table 2, the lifespan ($T_{90}$) indicates a time (hour) for the luminance of each light-emitting device to decline to 90% of its initial luminance.

TABLE 2
| | dopant in Emission layer | Luminance (cd/m$^2$) | Driving voltage (V) | Current density (mA/cm$^2$) | Efficiency (cd/A) | Maximum emission wavelength (nm) | Device Lifespan ($T_{90}$, hours) |
|---|---|---|---|---|---|---|---|
| Example 1 | 1 | 15 | 3.3 | 50 | 34 | 550 | 200 |
| Example 2 | 10 | 16 | 3.3 | 50 | 35 | 560 | 200 |
| Example 3 | 19 | 17 | 3.3 | 50 | 37 | 560 | 200 |
| Example 4 | 28 | 13 | 3.3 | 50 | 35 | 540 | 200 |
| Example 5 | 55 | 18 | 3.3 | 50 | 34 | 550 | 200 |
| Comparative Example 1 | X | 15 | 5.5 | 50 | 33 | 538 | 100 |
| Comparative Example 2 | Y | 15 | 3.4 | 50 | 20.1 | 452 | 32 |
| Comparative Example 3 | Z | 15 | 4.1 | 50 | 6.5 | 502 | 77 |
| Comparative Example 4 | W | 15 | 4.3 | 50 | 9.5 | 496 | 12 |
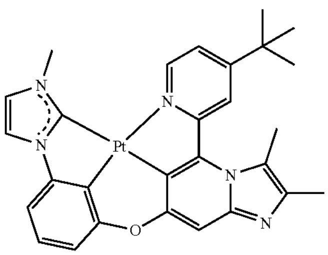
1
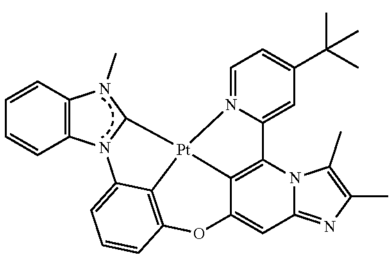
10
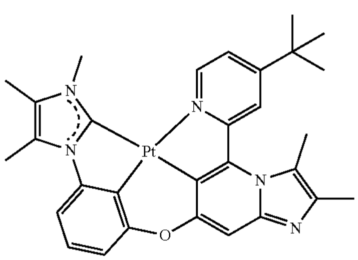
19
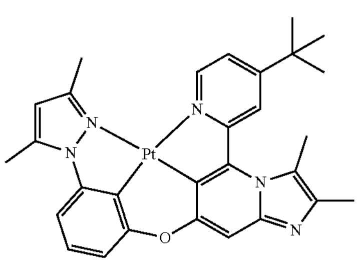
28

TABLE 2-continued
| dopant in Emission layer | Luminance (cd/m$^2$) | Driving voltage (V) | Current density (mA/cm$^2$) | Efficiency (cd/A) | Maximum emission wavelength (nm) | Device Lifespan ($T_{90}$, hours) |
|---|---|---|---|---|---|---|
| 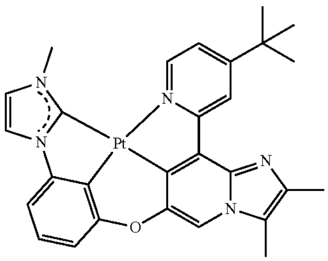 55 | | | | | | |
| 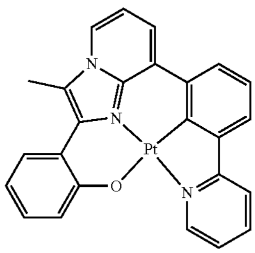 X | | | | | | |
| 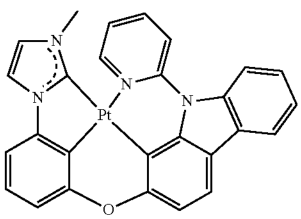 Y | | | | | | |
| 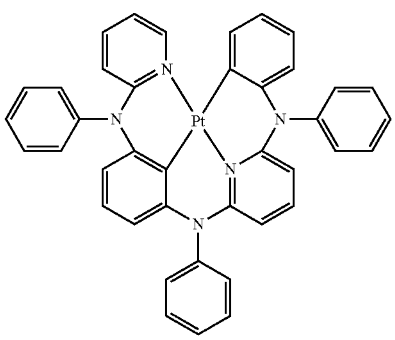 Z | | | | | | |
| 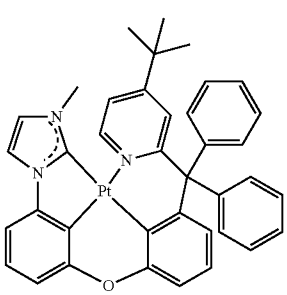 W | | | | | | |

Referring to the results of Table 2, it was found that the organic light-emitting devices of Examples 1 to 5 exhibited excellent efficiency and/or lifespan, as compared with the organic light-emitting devices of Comparative Examples 1 to 4.

As described herein above, according to one or more of the above embodiments, an organic light-emitting device may have high efficiency and long lifespan.

It should be understood that embodiments described herein should be considered in a descriptive sense only and not for purposes of limitation. Descriptions of features or aspects within each embodiment should be considered as available for other similar features or aspects in other embodiments.

It will be understood that, although the terms “first,” “second,” “third,” etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described herein below could be termed a second element, component, region, layer or section, without departing from the spirit and scope of the present disclosure.

Spatially relative terms, such as “beneath,” “below,” “lower,” “under,” “above,” “upper,” and the like, may be used herein for ease of explanation to describe one element or feature’s relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as “below” or “beneath” or “under” other elements or features would then be oriented “above” the other elements or features. Thus, the example terms “below” and “under” can encompass both an orientation of above and below. The device may be otherwise oriented (e.g., rotated 90 degrees or at other orientations) and the spatially relative descriptors used herein should be interpreted accordingly.

As used herein, the terms “substantially,” “about,” and similar terms are used as terms of approximation and not as terms of degree, and are intended to account for the inherent deviations in measured or calculated values that would be recognized by those of ordinary skill in the art. Further, the use of “may” when describing embodiments of the present disclosure refers to “one or more embodiments of the present disclosure.” As used herein, the terms “use,” “using,” and “used” may be considered synonymous with the terms “utilize,” “utilizing,” and “utilized,” respectively. Also, the term “exemplary” is intended to refer to an example or illustration.

Also, any numerical range recited herein is intended to include all subranges of the same numerical precision subsumed within the recited range. For example, a range of “1.0 to 10.0” is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the figures, it will be understood by those of ordinary skill in the art that various changes in form and details may be made therein without departing from the spirit and scope as defined by the following claims, and equivalents thereof.

What is claimed is:

1. An organometallic compound represented by Formula 1:

$$M_{11}(L_{11})_{n11}(L_{12})_{n12} \qquad \text{Formula 1}$$

wherein, in Formula 1, $M_{11}$ is selected from a first-row transition metal, a second-row transition metal, and a third-row transition metal, $L_{11}$ is a ligand represented by Formula 1-1, $L_{12}$ is selected from a monodentate ligand and a bidentate ligand, n11 is 1, and n12 is selected from 0, 1, and 2:

Formula 1-1

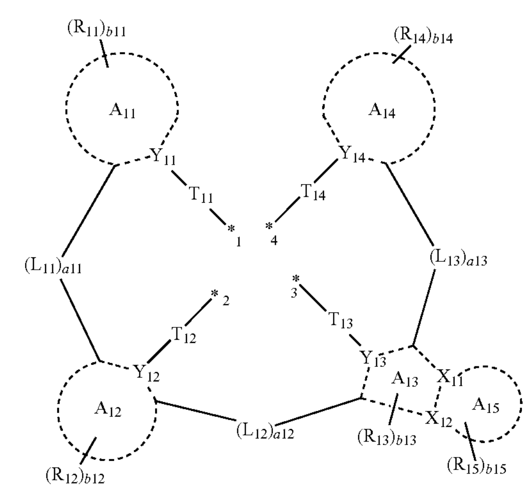

wherein, in Formula 1-1, $X_{11}$ and $X_{12}$ are each independently N or C, provided that at least one selected from $X_{11}$ and $X_{12}$ is N, $Y_{11}$, $Y_{12}$, $Y_{14}$ are each independently N or C, $Y_{13}$ is C, $T_{11}$ to $T_{14}$ are each independently selected from a single bond, *—O—*', *—S—*', *—C($R_{16}$)($R_{17}$)—*', *—Si($R_{16}$)($R_{17}$)—*', *—B($R_{16}$)—*', *—N($R_{16}$)—*', and *—P($R_{16}$)—*', $L_{11}$ and $L_{12}$ are each independently selected from *—O—*', *—S—*', *—C($R_{18}$)($R_{19}$)—*', *—C($R_{18}$)═*', *═C($R_{18}$)—*', *—C($R_{18}$)═C($R_{19}$)—*', *—C(═O)—*', *—C(═S)—*', *—C≡C—*', *—B($R_{18}$)—*', *—N($R_{18}$)—*', *—P($R_{18}$)—*', *—Si($R_{18}$)($R_{19}$)—*', *—P($R_{18}$)($R_{19}$)*', and *—Ge($R_{18}$)($R_{19}$)—*', $L_{13}$ is selected from *—O—*', *—S—*', *—C($R_{18}$)($R_{19}$)—*', *—C($R_{18}$)═*', *═C($R_{18}$)*', *—C($R_{18}$)($R_{19}$)—*', *—C(═O)—*', *—C(═S)—*', *—C≡C—*', *—B($R_{18}$)—*', *—P($R_{18}$)—*', *—Si($R_{18}$)($R_{19}$)—*', *—P($R_{18}$)($R_{19}$)—*', and *—Ge($R_{18}$)($R_{19}$)*', a11 is selected from 0, 1, 2, and 3, a12 and a13 are each independently selected from 1, 2, and 3, and when a11 is 0, $(L_{11})_{a11}$ is a single bond, $A_{13}$ is a 6-membered N-containing heterocyclic group, $A_{15}$ is an imidazole group, $A_{11}$ is i) a first ring, ii) a condensed ring in which at least two first rings are condensed, or iii) a condensed ring in which at least one first ring and at least one second ring are condensed, the first ring is selected from a cyclopentane group, a cyclopentene group, a cyclopentadiene group, a furan group, a thiophene group, a pyrrole group, a borole group, a phosphole group, a silole group, a germole group, a selenophene group, an oxazole group, a dihydrooxazole group, an isoxazole group, a dihydroisoxazole group, an oxadiazole group, a dihydrooxadiazole group, an isooxadiazole group, a dihydroisooxadiazole group, an oxatriazole group, a dihydrooxatriazole group, an isooxatriazole group, a dihydroisooxatriazole group, a thiazole group, a dihydrothiazole group, an isothiazole group, a dihydroisothiazole group, a thiadiazole group, a dihydrothiadiazole group, an isothiadiazole group, a dihydroisothiadiazole group, a thiatriazole group, a dihydrothiatriazole group, an isothiatriazole group, a dihydroisothiatriazole group, a pyrazole group, a dihydropyrazole group, a triazole group, a dihydrotriazole group, a tetrazole group, a dihydrotetrazole group, an azasilole group, a diazasilole group, and a triazasilole group, and the second ring is selected from a cyclohexane group, a cyclohexene group, a cyclohexadiene group, an adamantane group, a norbonane group, a norbonenegroup, a benzene group, a pyridine group, a dihydropyridine group, a tetrahydropyridine group, a pyrimidine group, a dihydropyrimidine group, a tetrahydropyrimidine group, a pyrazine group, a dihydropyrazine group, a tetrahydropyrazine group, a pyridazine group, a dihydropyridazine group, a tetrahydropyridazine group, a triazine group, a dihydrotriazine group, a tetrahydrotriazine group, and a triazinane group, $A_{12}$ and $A_{14}$ are each independently selected from a $C_5$-$C_{60}$ carbocyclic group and a $C_1$-$C_{60}$ heterocyclic group, $R_{11}$ is selected from deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, $-C(Q_1)(Q_2)(Q_3)$, $-Si(Q_1)(Q_2)(Q_3)$, $-B(Q_1)(Q_2)$, $-N(Q_1)(Q_2)$, $-P(Q_1)(Q_2)$, $-C(=O)(Q_1)$, $-S(=O)(Q_1)$, $-S(=O)_2(Q_1)$, $-P(=O)(Q_1)(Q_2)$, and $-P(=S)(Q_1)(Q_2)$, wherein two adjacent groups selected from $R_{11}$ to $R_{19}$ are optionally bound to form a substituted or unsubstituted $C_5$-$C_{30}$ carbocyclic group or a substituted or unsubstituted $C_1$-$C_{30}$ heterocyclic group, $R_{12}$ to $R_{19}$ are each independently selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, $-C(Q_1)(Q_2)(Q_3)$, $-Si(Q_1)(Q_2)(Q_3)$, $-B(Q_1)(Q_2)$, $-N(Q_1)(Q_2)$, $-P(Q_1)(Q_2)$, $-C(=O)(Q_1)$, $-S(=O)(Q_1)$, $-S(=O)_2(Q_1)$, $-P(=O)(Q_1)(Q_2)$, and $-P(=S)(Q_1)(Q_2)$, wherein two adjacent groups selected from $R_{11}$ to $R_{19}$ are optionally bound to form a substituted or unsubstituted $C_5$-$C_{30}$ carbocyclic group or a substituted or unsubstituted $C_1$-$C_{30}$ heterocyclic group, and b11 is an integer from 3 to 10, b12 to b15 are each independently an integer from 1 to 10, and wherein $Q_1$ to $Q_3$ are each independently selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, a cyano group, a $C_1$-$C_{60}$ alkyl group, a phenyl group, and a biphenyl group, a $C_6$-$C_{60}$ aryl group substituted with at least one selected from deuterium, —F, a cyano group, a $C_1$-$C_{10}$ alkyl group, a phenyl group, and a biphenyl group, and a $C_1$-$C_{60}$ heteroaryl group substituted with at least one selected from deuterium, —F, a cyano group, a $C_1$-$C_{10}$ alkyl group, a phenyl group, and a biphenyl group,

*1 to *4 each indicate a binding site to $M_{11}$, and wherein a group represented by

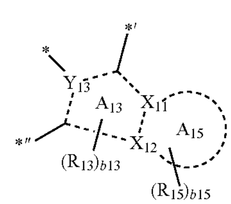

is represented by Formula 2-13:

Formula 2-13

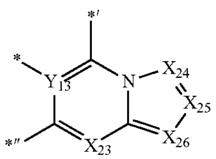

wherein, in Formula 2-13, $Y_{13}$ is defined the same as defined with respect to Formula 1-1, $X_{23}$ is N or $C(R_{23})$, $X_{24}$ is $C(R_{24})$, $X_{25}$ is $C(R_{25})$, $X_{26}$ is N, $R_{23}$ is defined the same as $R_{13}$ with respect to Formula 1-1, $R_{24}$ and $R_{25}$ are each independently a substituted or unsubstituted $C_1$-$C_{60}$ alkyl group,

* indicates a binding site to $T_{13}$,

*' indicates a binding site to $L_{13}$, and

*" indicates a binding site to $L_{12}$.

2. The organometallic compound of claim 1, wherein $M_{11}$ is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm).

3. The organometallic compound of claim 1, wherein $L_{11}$ and $L_{12}$ are each independently selected from *—O—*', *—S—*', *—C($R_{18}$)($R_{19}$)—*', and *—N($R_{18}$)—*'.

4. The organometallic compound of claim 1, wherein the sum of a11 to a13 is 2 or 3.

5. The organometallic compound of claim 1, wherein a11 is 0, and a12 and a13 are each 1.

6. The organometallic compound of claim 1, wherein $A_{13}$ is selected from a pyridine group, a dihydropyridine group, a tetrahydropyridine group, a piperidine group, a pyrimidine group, a dihydropyrimidine group, a tetrahydropyrimidine group, a hexahydropyrimidine group, a pyrazine group, a dihydropyrazine group, a tetrahydropyrazine group, a piperazine group, a pyridazine group, a dihydropyridazine group, a tetrahydropyridazine group, a triazine group, a dihydrotriazine group, a tetrahydrotriazine group, and a triazinane group.

7. The organometallic compound of claim 1, wherein $A_{12}$ and $A_{14}$ are each independently i) a first ring, ii) a second ring, iii) a condensed ring in which at least two first rings are condensed, iv) a condensed ring in which at least two second rings are condensed, or v) a condensed ring in which at least one first ring and at least one second ring are condensed, the first ring is selected from a cyclopentane group, a cyclopentene group, a cyclopentadiene group, a furan group, a thiophene group, a pyrrole group, a borole group, a phosphole group, a silole group, a germole group, a selenophene group, an oxazole group, a dihydrooxazole group, an isoxazole group, a dihydroisoxazole group, an oxadiazole group, a dihydrooxadiazole group, an isooxadiazole group, a dihydroisooxadiazole group, an oxatriazole group, a dihydrooxatriazole group, an isooxatriazole group, a dihydroisooxatriazole group, a thiazole group, a dihydrothiazole group, an isothiazole group, a dihydroisothiazole group, a thiadiazole group, a dihydrothiadiazole group, an isothiadiazole group, a dihydroisothiadiazole group, a thiatriazole group, a dihydrothiatriazole group, an isothiatriazole group, a dihydroisothiatriazole group, a pyrazole group, a dihydropyrazole group, an imidazole group, a dihydroimidazole group, a triazole group, a dihydrotriazole group, a tetrazole group, a dihydrotetrazole group, an azasilole group, a diazasilole group, and a triazasilole group, and the second ring is selected from a cyclohexane group, a cyclohexene group, a cyclohexadiene group, an adamantane group, a norbonane group, a norbonenegroup, a benzene group, a pyridine group, a dihydropyridine group, a tetrahydropyridine group, a pyrimidine group, a dihydropyrimidine group, a tetrahydropyrimidine group, a pyrazine group, a dihydropyrazine group, a tetrahydropyrazine group, a pyridazine group, a dihydropyridazine group, a tetrahydropyridazine group, a triazine group, a dihydrotriazine group, a tetrahydrotriazine group, and a triazinane group.

8. The organometallic compound of claim 1, wherein $A_{12}$ and $A_{14}$ are each independently represented by any one of Formulae 3-1 to 3-43:

3-1

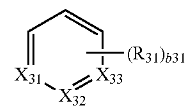

3-2

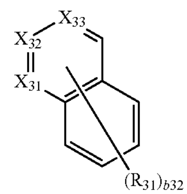

3-3

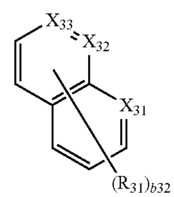

3-4

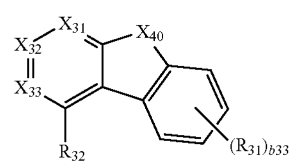

3-5

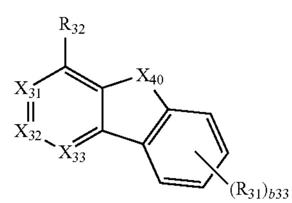

3-6

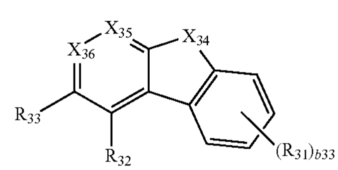

3-7

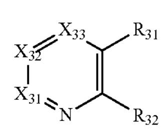

-continued
3-8
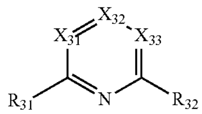
3-9
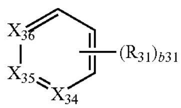
3-10
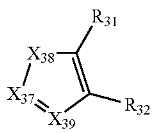
3-11
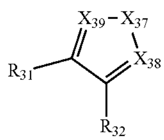
3-12
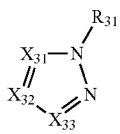
3-13
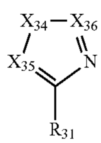
3-14
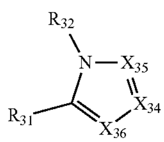
3-15
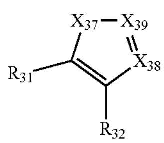
3-16
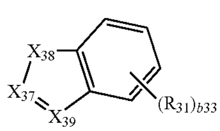
3-17
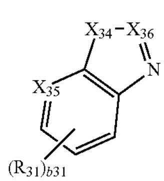
3-18
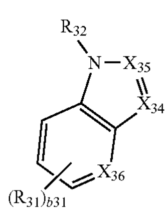
-continued
3-19
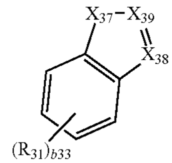
3-20
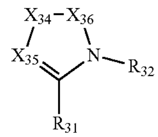
3-21
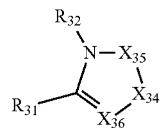
3-22
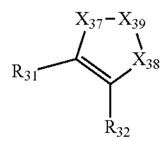
3-23
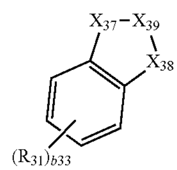
3-24
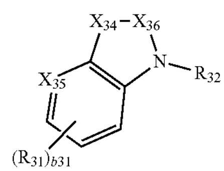
3-25
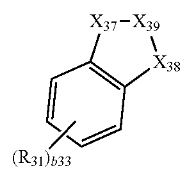
3-26
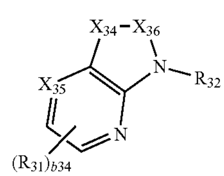
3-27
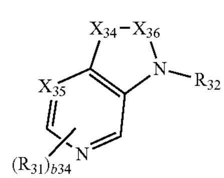

-continued 3-28
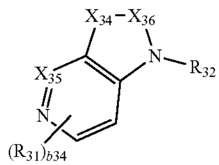

3-29
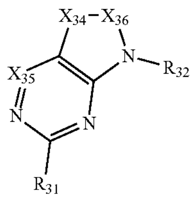

3-30
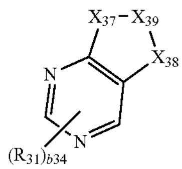

3-31
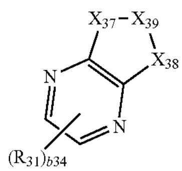

3-32
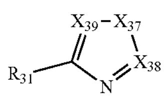

3-33
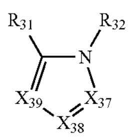

3-34
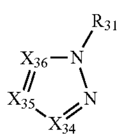

3-35
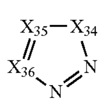

3-36
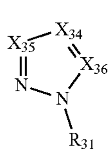

3-37
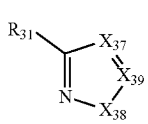

3-38
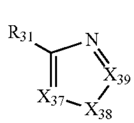

-continued 3-39
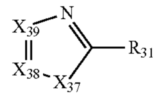

3-40
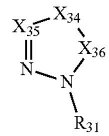

3-41
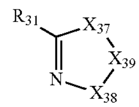

3-42
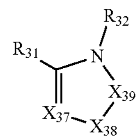

3-43
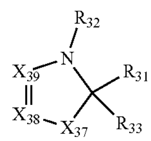

wherein, in Formulae 3-1 to 3-43, $X_{31}$ to $X_{33}$ are each independently selected from $C(R_{34})$ and C—*, provided that at least two selected from $X_{31}$ to $X_{33}$ are each C—*, $X_{34}$ is N—*, $X_{35}$ and $X_{36}$ are each independently selected from $C(R_{34})$ and C—*, provided that at least one selected from $X_{35}$ and $X_{36}$ is C*, $X_{37}$ and $X_{38}$ are each independently selected from O, S, $C(R_{34})$, N, $N(R_{35})$, and N—*, $X_{39}$ is selected from O, S, $C(R_{34})$, and C—*, provided that i) at least one selected from $X_{37}$ and $X_{38}$ is N—*, and $X_{39}$ is C*, or ii) $X_{37}$ and $X_{38}$ are each N—*, and $X_{39}$ is selected from O, S, and $C(R_{34})$, $X_{40}$ is selected from O, S, $N(R_{33})$, and $C(R_{33})(R_{34})$, $R_{31}$ to $R_{34}$ are each independently understood by referring to the description of $R_{11}$ in Formula 1, b31 is selected from 1, 2, and 3, b32 is selected from 1, 2, 3, 4, and 5, b33 is selected from 1, 2, 3, and 4, b34 is selected from 1 and 2, and

* indicates a binding site to an adjacent atom.

9. The organometallic compound of claim 1, wherein $R_{11}$ to $R_{19}$ are each independently selected from:

hydrogen, deuterium, —F, —Cl, —Br, —I, a cyano group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a cyano group, a phenyl group, a biphenyl group, and a terphenyl group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, and an indolocarbazolyl group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, and an indolocarbazolyl group, each substituted with at least one selected from deuterium, —F, —Cl, —Br, —I, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, an indolocarbazolyl group, $—C(Q_{31})(Q_{32})(Q_{33})$, $—Si(Q_{31})(Q_{32})(Q_{33})$, $—B(Q_{31})(Q_{32})$, $—N(Q_{31})(Q_{32})$, $—P(Q_{31})(Q_{32})$, $—C(=O)(Q_{31})$, $—S(=O)(Q_{31})$, $—S(=O)_2(Q_{31})$, $—P(=O)(Q_{31})(Q_{32})$, and $—P(=S)(Q_{31})(Q_{32})$; and —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), and —P(═S)($Q_1$)($Q_2$), wherein $Q_1$ to $Q_3$ and $Q_{31}$ to $Q_{33}$ are each independently selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, a cyano group, a $C_1$-$C_{60}$ alkyl group, a phenyl group, and a biphenyl group, a $C_6$-$C_{60}$ aryl group substituted with at least one selected from deuterium, —F, a cyano group, a $C_1$-$C_{60}$ alkyl group, a phenyl group, and a biphenyl group, and a $C_1$-$C_{60}$ heteroaryl group substituted with at least one selected from deuterium, —F, a cyano group, a $C_1$-$C_{60}$ alkyl group, a phenyl group, and a biphenyl group.

10. The organometallic compound of claim 1, wherein $L_{12}$ is a ligand represented by one of Formulae 7-1 to 7-11:

7-1

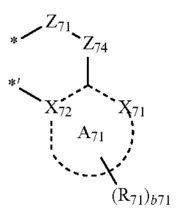

7-2

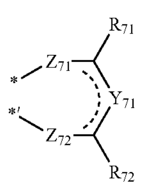

7-3

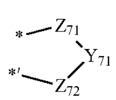

7-4

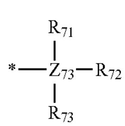

7-5

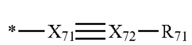

7-6

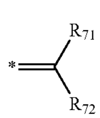

7-7

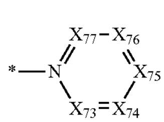

-continued 7-8

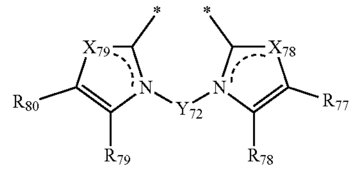

7-9

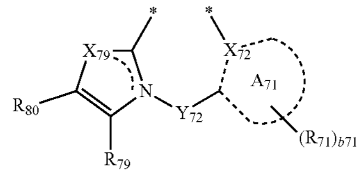

7-10

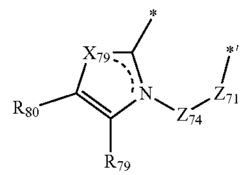

7-11

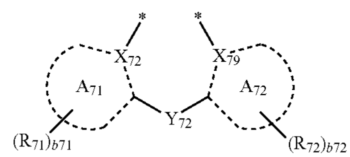

wherein, in Formulae 7-1 to 7-11, $A_{71}$ and $A_{72}$ are each independently selected from a $C_5$-$C_{20}$ carbocyclic group and a $C_1$-$C_{20}$ heterocyclic group, $X_{71}$ and $X_{72}$ are each independently selected from C and N, $X_{73}$ is N or C($Q_{73}$), $X_{24}$ is N or C($Q_{74}$), $X_{75}$ is N or C($Q_{75}$), $X_{76}$ is N or C($Q_{76}$), $X_{27}$ is N or C($Q_{77}$), $X_{78}$ is O, S, or N($Q_{78}$), $X_{29}$ is O, S, or N($Q_{79}$), $Y_{71}$ and $Y_{72}$ are each independently selected from a single bond, a double bond, a substituted or unsubstituted $C_1$-$C_5$ alkylene group, a substituted or unsubstituted $C_2$-$C_5$ alkenylene group, and a substituted or unsubstituted $C_6$-$C_{10}$ arylene group, $Z_{71}$ and $Z_{72}$ are each independently selected from N, O, N($R_{75}$), P($R_{75}$)($R_{76}$), and As($R_{75}$)($R_{76}$), $Z_{73}$ is selected from P and As, $Z_{74}$ is selected from CO and $CH_2$, $R_{71}$ to $R_{80}$ and $Q_{73}$ to $Q_{79}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein $R_{71}$ and $R_{72}$ are optionally bound to form a ring, $R_{77}$ and $R_{78}$ are optionally bound to form a ring, $R_{78}$ and $R_{79}$ are optionally bound to form a ring, and $R_{79}$ and $R_{80}$ are optionally bound to form a ring, b71 and b72 are each independently selected from 1, 2, and 3, and

* and *' each indicate a binding site to an adjacent atom.

11. The organometallic compound of claim 1, wherein $M_{11}$ is selected from Pt and Pd, n11 is 1, and n12 is 0.

12. The organometallic compound of claim 1, wherein the organometallic compound represented by Formula 1 is selected from Group I:

36

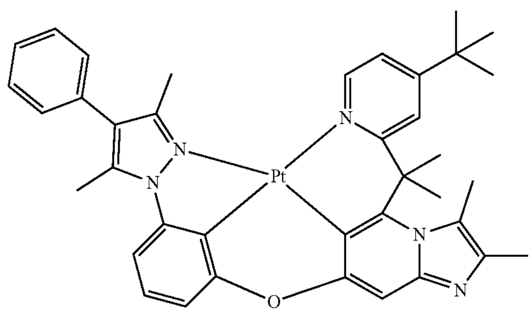

39

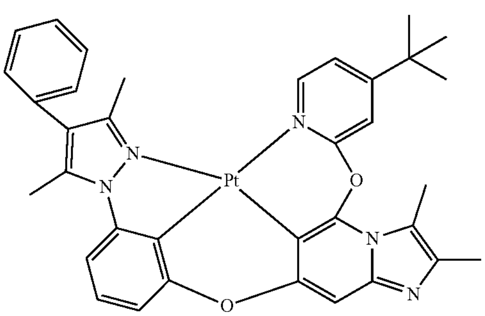

41

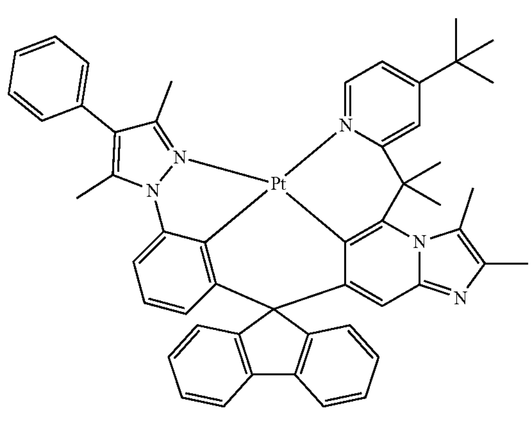

-continued

42

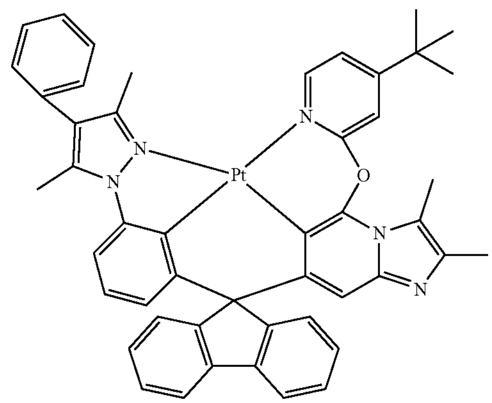

44

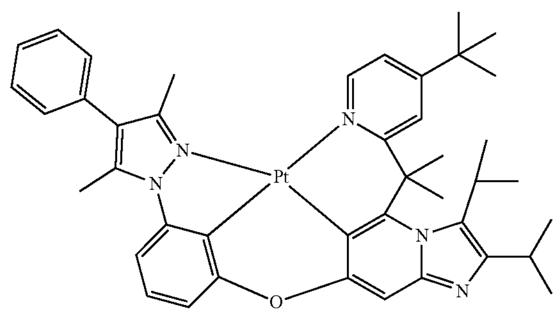

45

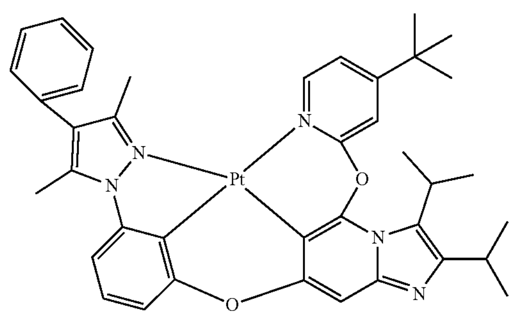

47

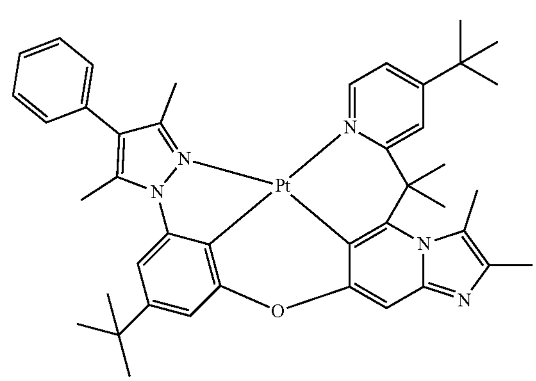

-continued

48

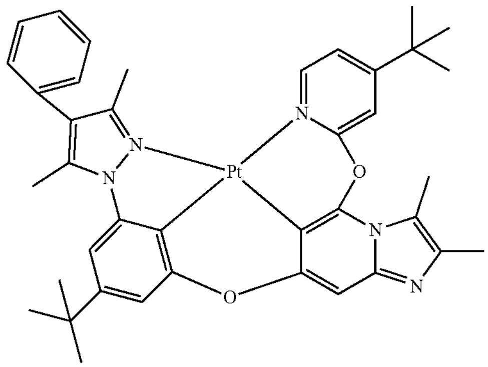

50

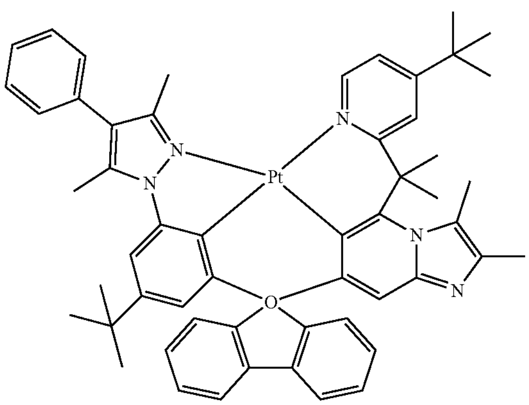

51

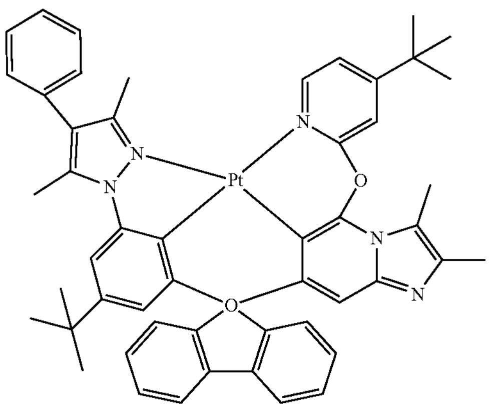

-continued

53

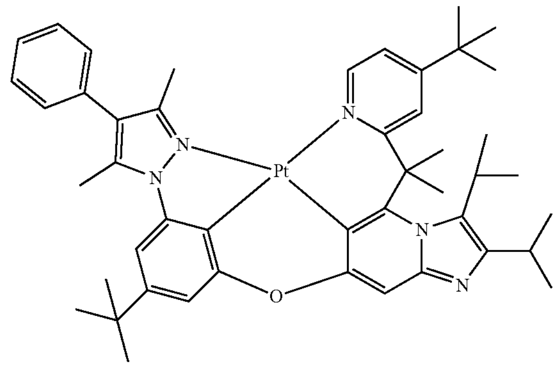

54

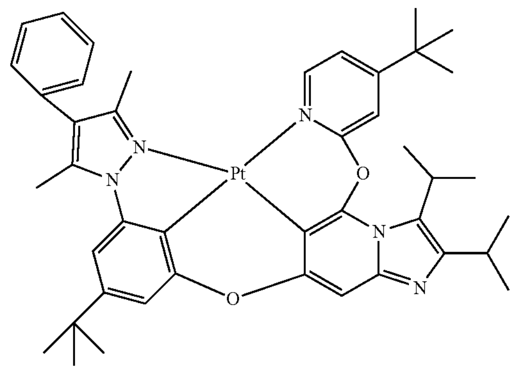

13. An organic light-emitting device comprising: a first electrode; a second electrode; and an organic layer between the first electrode and the second electrode and comprising an emission layer, wherein the organic layer comprises the organometallic compound of claim 1.

14. The organic light-emitting device of claim 13, wherein:

the first electrode is an anode, the second electrode is a cathode, and the organic layer further comprises a hole transport region between the first electrode and the emission layer and/or an electron transport region between the emission layer and the second electrode, the hole transport region comprises a hole injection layer, a hole transport layer, an emission auxiliary layer, an electron blocking layer, or a combination thereof, and the electron transport region comprises a hole blocking layer, an electron transport layer, an electron injection layer, or a combination thereof.

15. The organic light-emitting device of claim 13, wherein the emission layer comprises the organometallic compound.

16. An apparatus comprising a thin-film transistor which comprises a source electrode, a drain electrode, and an active layer; and the organic light-emitting device of claim 13, wherein the first electrode of the organic light-emitting device is electrically coupled to any one of the source electrode and the drain electrode of the thin-film transistor.

* * * * *